(12) United States Patent
Yamazaki et al.

(10) Patent No.: US 12,166,134 B2
(45) Date of Patent: Dec. 10, 2024

(54) SEMICONDUCTOR DEVICE

(71) Applicant: SEMICONDUCTOR ENERGY LABORATORY CO., LTD., Atsugi (JP)

(72) Inventors: Shunpei Yamazaki, Tokyo (JP); Toshimitsu Obonai, Tochigi (JP); Junichi Koezuka, Tochigi (JP); Kenichi Okazaki, Tochigi (JP)

(73) Assignee: Semiconductor Energy Laboratory Co., Ltd., Kanagawa-ken (JP)

(*) Notice: Subject to any disclaimer, the term of this patent is extended or adjusted under 35 U.S.C. 154(b) by 606 days.

(21) Appl. No.: 17/433,458

(22) PCT Filed: Feb. 19, 2020

(86) PCT No.: PCT/IB2020/051350
§ 371 (c)(1),
(2) Date: Aug. 24, 2021

(87) PCT Pub. No.: WO2020/178654
PCT Pub. Date: Sep. 10, 2020

(65) Prior Publication Data
US 2022/0149201 A1     May 12, 2022

(30) Foreign Application Priority Data

Mar. 1, 2019 (JP) .................. 2019-037916
Apr. 22, 2019 (JP) .................. 2019-081285

(51) Int. Cl.
H01L 29/786 (2006.01)
H01L 27/12 (2006.01)
(Continued)

(52) U.S. Cl.
CPC ...... H01L 29/7869 (2013.01); H01L 27/1225 (2013.01); H01L 29/045 (2013.01);
(Continued)

(58) Field of Classification Search
CPC ............ H01L 29/7869; H01L 27/1225; H01L 29/045; H01L 29/24; H01L 29/4908;
(Continued)

(56) References Cited

U.S. PATENT DOCUMENTS 9,406,760 B2   8/2016   Shimomura et al.
9,559,174 B2   1/2017   Shimomura et al.
(Continued)

FOREIGN PATENT DOCUMENTS

CN    104867981 A    8/2015
JP    2014-007399 A    1/2014
(Continued)

OTHER PUBLICATIONS

International Search Report (Application No. PCT/IB2020/051350) Dated May 26, 2020.
(Continued)

*Primary Examiner* — Samuel Park
(74) *Attorney, Agent, or Firm* — NIXON PEABODY LLP; Jeffrey L. Costellia

(57) ABSTRACT

A semiconductor device with favorable electrical characteristics is provided. A semiconductor device with high reliability is provided. A semiconductor device with stable electrical characteristics is provided. The semiconductor device includes a semiconductor layer, a first insulating layer, a second insulating layer, and a conductive layer. The semiconductor layer, the second insulating layer, and the conductive layer are stacked in this order over the first insulating layer. The semiconductor layer contains indium and oxygen and has a composition falling within a range obtained by connecting first coordinates (1:0:0), second coordinates (2:1:0), third coordinates (14:7:1), fourth coordinates (7:2:2), fifth coordinates (14:4:21), sixth coordinates (2:0:3), and the first coordinates in this order with a straight (Continued)

line in a ternary diagram showing atomic ratios of indium to an element M and zinc. In addition, the element M is one or more of gallium, aluminum, yttrium, and tin.

20 Claims, 57 Drawing Sheets

(51) Int. Cl.
| | | |
|---|---|---|
| *H01L 29/04* | (2006.01) | |
| *H01L 29/24* | (2006.01) | |
| *H01L 29/49* | (2006.01) | |
| *G02F 1/1368* | (2006.01) | |
| *H10K 59/121* | (2023.01) | |

(52) U.S. Cl.
CPC .......... *H01L 29/24* (2013.01); *H01L 29/4908* (2013.01); *G02F 1/1368* (2013.01); *H10K 59/1213* (2023.02)

(58) Field of Classification Search
CPC ............ H01L 29/78648; G02F 1/1368; H10K 59/1213; G09F 9/30; H05B 33/02; H05B 33/14
See application file for complete search history.

(56) References Cited

U.S. PATENT DOCUMENTS

| | | |
|---|---|---|
| 10,032,928 B2 | 7/2018 | Shimomura et al. |
| 10,043,659 B2 | 8/2018 | Yamazaki et al. |
| 10,692,452 B2 | 6/2020 | Kobayashi et al. |
| 10,777,687 B2 | 9/2020 | Endo et al. |
| 2015/0243738 A1* | 8/2015 | Shimomura ......... C01G 15/006 252/519.1 |
| 2017/0062620 A1* | 3/2017 | Yamazaki ......... H01L 29/78696 |
| 2017/0338107 A1 | 11/2017 | Yamazaki et al. |
| 2018/0204532 A1 | 7/2018 | Kobayashi et al. |
| 2021/0065640 A1 | 3/2021 | Kobayashi et al. |

FOREIGN PATENT DOCUMENTS

| | | |
|---|---|---|
| JP | 2016-189479 A | 11/2016 |
| JP | 2017-212442 A | 11/2017 |
| JP | 2018-116274 A | 7/2018 |
| KR | 2015-0099467 A | 8/2015 |

OTHER PUBLICATIONS

Written Opinion (Application No. PCT/IB2020/051350) Dated May 26, 2020.

Nakamura.M et al., "The phase relations in the In2O3—Ga2ZnO4—ZnO system at 1350° C.", Journal of Solid State Chemistry, Aug. 1, 1991, vol. 93, No. 2, pp. 298-315.

Kimizuka.N et al., "Syntheses and Single-Crystal Data of Homologous Compounds, In2O3(ZnO)m (m = 3, 4, and 5), InGaO3(ZnO)3, and Ga2O3(ZnO)m (m = 7, 8, 9, and 16) in the In2O3—ZnGa2O4—ZnO System", Journal of Solid State Chemistry, Apr. 1, 1995, vol. 116, No. 1, pp. 170-178.

* cited by examiner

FIG. 5A
| Amorphous | Crystalline | Crystal |
|---|---|---|
| completely amorphous | ·CAAC<br>·nc<br>·CAC<br><br>excluding single crystal and poly crystal | ·single crystal<br>·poly crystal |
FIG. 5B
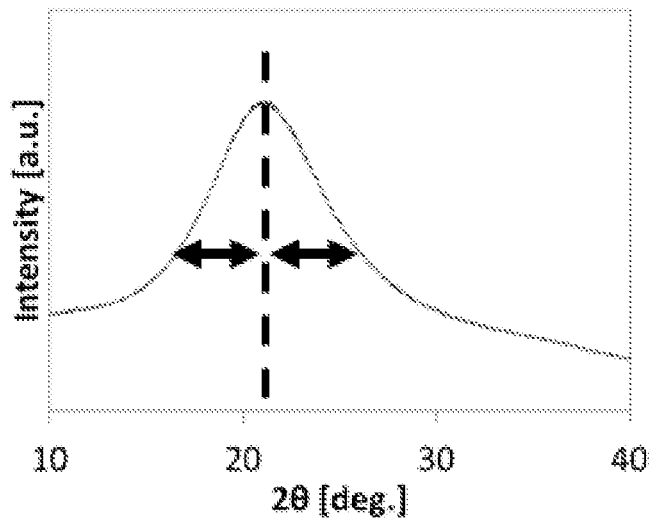
FIG. 5C
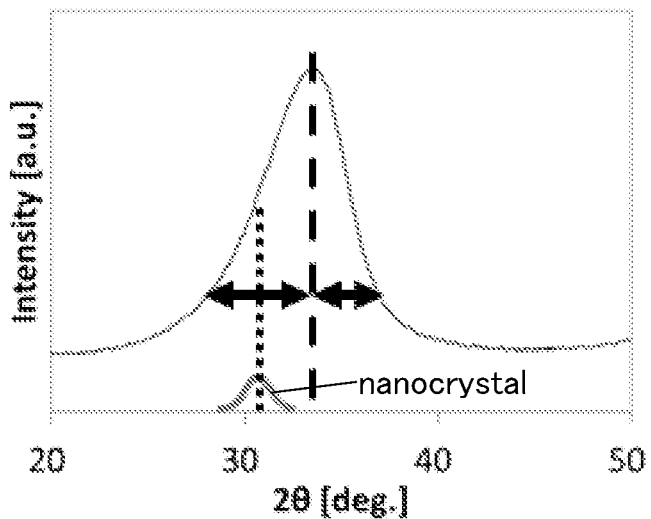

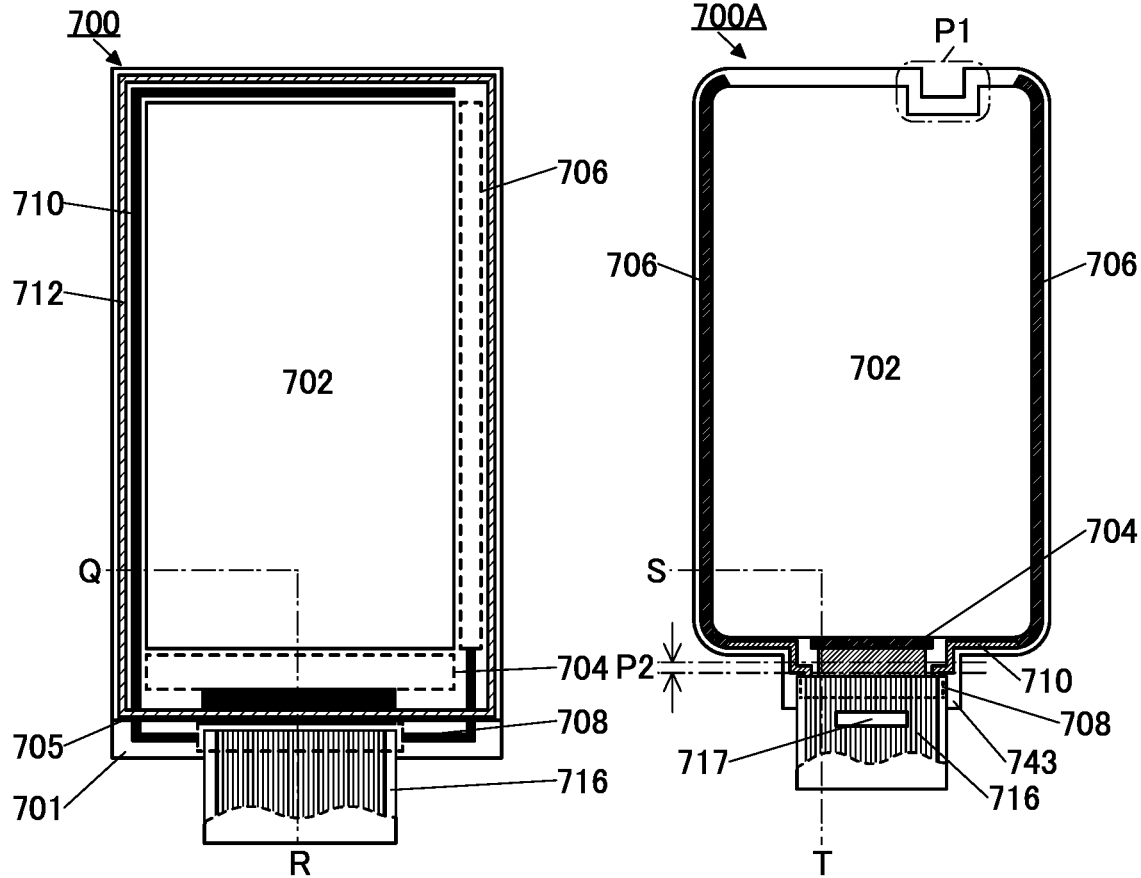
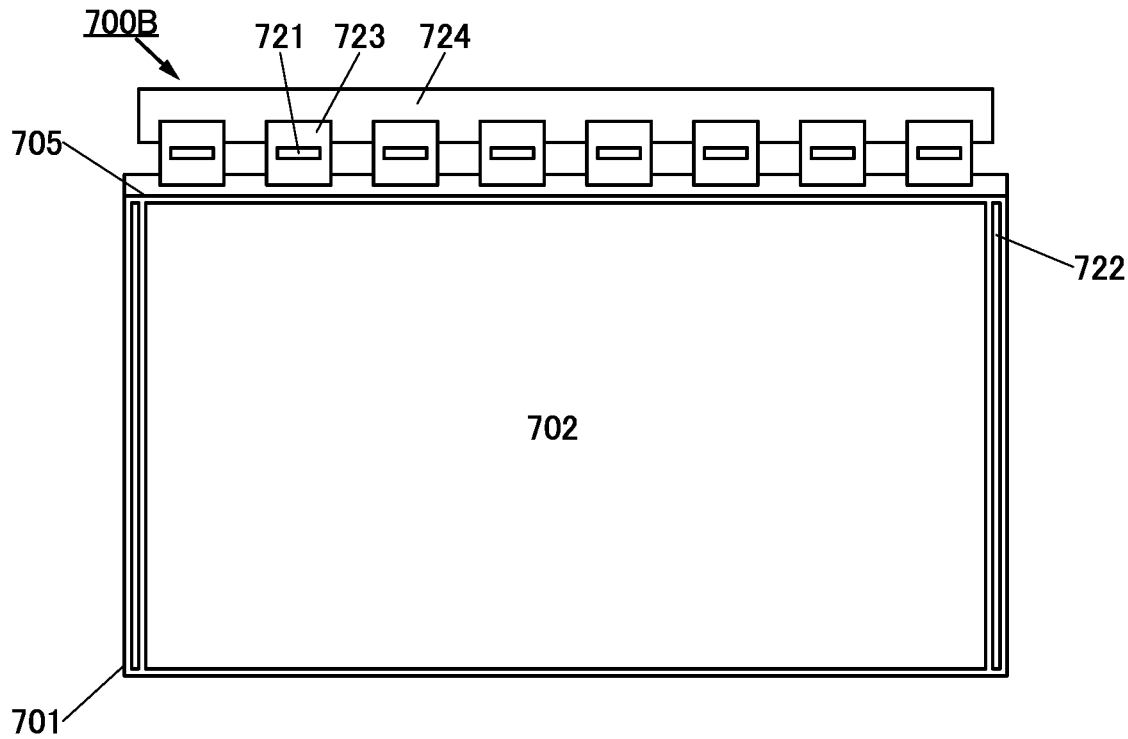

9100

9200

9101

9201

9102

9201

9201

SEMICONDUCTOR DEVICE

TECHNICAL FIELD

One embodiment of the present invention relates to a semiconductor device and a manufacturing method thereof. One embodiment of the present invention relates to a display device.

Note that one embodiment of the present invention is not limited to the above technical field. Examples of the technical field of one embodiment of the present invention disclosed in this specification and the like include a semiconductor device, a display device, a light-emitting apparatus, a power storage device, a memory device, an electronic device, a lighting device, an input device, an input/output device, a driving method thereof, and a manufacturing method thereof. A semiconductor device generally means a device that can function by utilizing semiconductor characteristics.

BACKGROUND ART

As a semiconductor material that can be used in a transistor, an oxide semiconductor using a metal oxide has been attracting attention. For example, Patent Document 1 discloses a semiconductor device including a plurality of oxide semiconductor layers that are stacked, in which an oxide semiconductor layer serving as a channel in the plurality of oxide semiconductor layers contains indium and gallium to have a higher proportion of indium than that of gallium, thereby making field-effect mobility (simply referred to as mobility or µFE in some cases) to be increased.

Non-Patent Document 1 and Non-Patent Document 2 each disclose an oxide semiconductor material, $InGaO_3(ZnO)m$ (m is a natural number).

A metal oxide that can be used for a semiconductor layer can be formed by a sputtering method or the like, and thus can be used for a semiconductor layer of a transistor included in a large display device. In addition, capital investment can be reduced because part of production equipment for transistors using polycrystalline silicon or amorphous silicon can be utilized through retrofit. Furthermore, a transistor using a metal oxide has high field-effect mobility compared to the case of using amorphous silicon; therefore, a high-performance display device provided with a driver circuit can be achieved.

REFERENCE

Patent Document

[Patent Document 1] Japanese Published Patent Application No. 2014-7399

Non-Patent Document

[Non-Patent Document 1] M. Nakamura, N. Kimizuka, and T. Mohri, "The Phase Relations in the $In_2O_3$—$Ga_2ZnO_4$—ZnO System at 1350° C.", *J. Solid State Chem.*, Vol. 93, 1991, pp. 298-315.
[Non-Patent Document 2] N. Kimizuka, M. Isobe, and M. Nakamura, "Syntheses and Single-Crystal Data of Homologous Compounds, $In_2O_3(ZnO)_m$ (m=3, 4, and 5), $InGaO_3(ZnO)_3$, and $Ga_2O_3(ZnO)m$ (m=7, 8, 9, and 16) in the $In_2O_3$—$ZnGa_2O_4$—ZnO System," *J. Solid State Chem.*, 1995, Vol. 116, p. 170-178.

SUMMARY OF THE INVENTION

Problems to be Solved by the Invention

An object of one embodiment of the present invention is to provide a semiconductor device having favorable electrical characteristics. An object of one embodiment of the present invention is to provide a highly reliable semiconductor device. An object of one embodiment of the present invention is to provide a semiconductor device which has stable electrical characteristics. An object of one embodiment of the present invention is to provide a highly reliable display device.

Note that the description of these objects does not preclude the existence of other objects. One embodiment of the present invention does not have to achieve all these objects. Objects other than these can be derived from the description of the specification, the drawings, the claims, and the like.

Means for Solving the Problems

One embodiment of the present invention is a semiconductor device including a semiconductor layer, a first insulating layer, a second insulating layer, and a conductive layer. The semiconductor layer, the second insulating layer, and the conductive layer are stacked in this order over the first insulating layer. The semiconductor layer contains indium and oxygen and preferably has a composition falling within a range obtained by connecting first coordinates (1:0:0), second coordinates (2:1:0), third coordinates (14:7:1), fourth coordinates (7:2:2), fifth coordinates (14:4:21), sixth coordinates (2:0:3), and the first coordinates in this order with a straight line in a ternary diagram showing atomic ratios of indium to an element M and zinc. In addition, the element M is any one or more of gallium, aluminum, yttrium, and tin.

One embodiment of the present invention is a semiconductor device including a semiconductor layer, a first insulating layer, a second insulating layer, and a conductive layer. The semiconductor layer, the second insulating layer, and the conductive layer are stacked in this order over the first insulating layer. The semiconductor layer contains indium and oxygen and preferably has a composition falling within a range obtained by connecting first coordinates (7:1:0), second coordinates (2:1:0), third coordinates (14:7:1), fourth coordinates (7:2:2), fifth coordinates (14:4:21), sixth coordinates (2:0:3), seventh coordinates (7:0:1), and the first coordinates in this order with a straight line in a ternary diagram showing atomic ratios of indium to an element M and zinc. In addition, the element M is any one or more of gallium, aluminum, yttrium, and tin.

One embodiment of the present invention is a semiconductor device including a semiconductor layer, a first insulating layer, a second insulating layer, and a conductive layer. The semiconductor layer, the second insulating layer, and the conductive layer are stacked in this order over the first insulating layer. The semiconductor layer contains indium, zinc, and oxygen and preferably has a composition falling within a range obtained by connecting first coordinates (44:11:10), second coordinates (4:1:6), third coordinates (2:0:3), fourth coordinates (11:0:2), and the first coordinates in this order with a straight line in a ternary diagram showing atomic ratios of indium to an element M and zinc. In addition, the element M is any one or more of gallium, aluminum, yttrium, and tin.

One embodiment of the present invention is a semiconductor device including a semiconductor layer, a first insulating layer, a second insulating layer, and a conductive layer. The semiconductor layer, the second insulating layer, and the conductive layer are stacked in this order over the first insulating layer. The semiconductor layer contains indium, zinc, and oxygen and preferably has a composition falling within a range obtained by connecting first coordinates (44:11:10), second coordinates (4:1:4), third coordinates (1:0:1), fourth coordinates (11:0:2), and the first coordinates in this order with a straight line in a ternary diagram showing atomic ratios of indium to an element M and zinc. In addition, the element M is any one or more of gallium, aluminum, yttrium, and tin.

In the semiconductor device, it is preferable that the semiconductor layer include a region not overlapping with the conductive layer and that the region include any one or more of phosphorus, boron, magnesium, aluminum, and silicon.

In the semiconductor device, the second insulating layer is preferably in contact with the region.

The semiconductor device further includes a third insulating layer, and the third insulating layer is preferably in contact with a top surface and a side surface of the conductive layer, a side surface of the second insulating layer, and a top surface and a side surface of the semiconductor layer. Furthermore, the second insulating layer preferably contains oxygen, and the third insulating layer preferably contains nitrogen.

In the semiconductor device, the second insulating layer preferably contains silicon oxide, and the third insulating layer preferably contains silicon nitride.

Effect of the Invention

According to one embodiment of the present invention, a semiconductor device having favorable electrical characteristics can be provided. Alternatively, a highly reliable semiconductor device can be provided. Alternatively, a semiconductor device with stable electrical characteristics can be provided. Alternatively, a display device having high reliability can be provided.

Note that the description of these effects does not preclude the existence of other effects. One embodiment of the present invention does not have to have all of these effects. Effects other than these can be derived from the description of the specification, the drawings, the claims, and the like.

BRIEF DESCRIPTION OF THE DRAWINGS

FIG. 5A is a diagram showing classification of crystal structures of IGZO. FIG. 5B is a graph showing an XRD spectrum of quartz substrate. FIG. 5C is a graph showing an XRD spectrum of crystalline IGZO.

FIG. 18A, FIG. 18B, and FIG. 18C are each a top view of a display device.

MODE FOR CARRYING OUT THE INVENTION

Figure 1A:
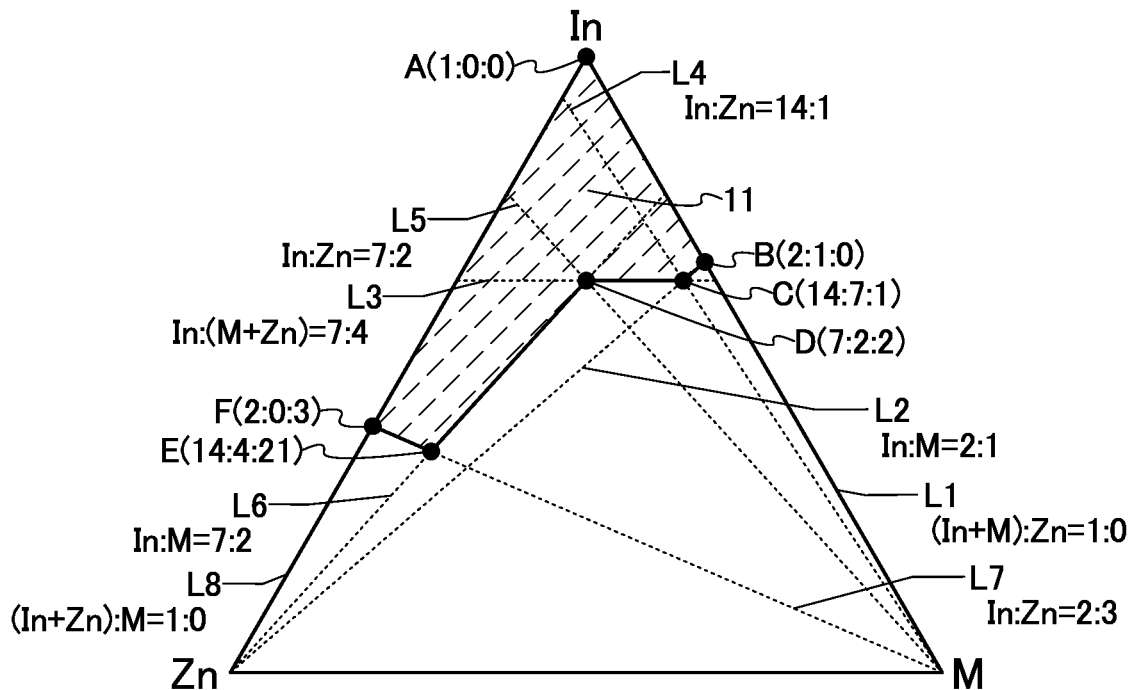
FIG. 1A and FIG. 1B are each a diagram showing a composition of a metal oxide.

Hereinafter, embodiments will be described with reference to the drawings. Note that the embodiments can be implemented in many different modes, and it will be readily understood by those skilled in the art that modes and details thereof can be changed in various ways without departing from the spirit and scope thereof. Thus, the present invention should not be construed as being limited to the following description of the embodiments.

In each drawing described in this specification, the size, the layer thickness, or the region of each component is exaggerated for clarity in some cases.

Ordinal numbers such as "first," "second," and "third" used in this specification and the like are used in order to avoid confusion among components, and the terms do not limit the components numerically.

In this specification and the like, terms for describing arrangement, such as "over" and "under," are used for convenience to describe the positional relation between components with reference to drawings. The positional relation between components is changed as appropriate in accordance with a direction in which each component is described. Thus, terms for the description are not limited to those used in this specification, and the description can be rephrased appropriately depending on the situation.

In this specification and the like, functions of a source and a drain of a transistor are sometimes interchanged with each other when a transistor of opposite polarity is employed or the direction of current is changed in circuit operation, for example. Therefore, the terms "source" and "drain" can be used interchangeably.

In this specification and the like, the channel length direction of a transistor refers to one of directions parallel to the straight line that connects a source region and a drain region in the shortest distance. In other words, the channel length direction corresponds to one of directions of current flowing in a semiconductor layer when a transistor is in an on state. The channel width direction refers to a direction orthogonal to the channel length direction. Note that each of the channel length direction and the channel width direction is not fixed to one direction in some cases depending on the structure and the shape of a transistor.

In this specification and the like, "electrically connected" includes the case where connection is made through an "object having any electric function". There is no particular limitation on the "object having any electric function" as long as electric signals can be transmitted and received between components that are connected through the object. Examples of the "object having any electric action" include a switching element such as a transistor, a resistor, an inductor, a capacitor, and other elements with a variety of functions as well as an electrode and a wiring.

In this specification and the like, the term "film" and the term "layer" can be interchanged with each other. For example, in some cases, the term "conductive layer" and the term "insulating layer" can be interchanged with the term "conductive film" and the term "insulating film," respectively.

Unless otherwise specified, off-state current in this specification and the like refers to a drain current of a transistor in an off state (also referred to as a non-conducting state or a cutoff state). Unless otherwise specified, an off state refers to a state where the voltage $V_{gs}$ between a gate and source is lower than the threshold voltage Vth in an n-channel transistor (higher than Vth in a p-channel transistor).

In this specification and the like, a display panel that is one embodiment of a display device has a function of displaying (outputting) an image or the like on (to) a display surface.

Therefore, the display panel is one embodiment of an output device.

In this specification and the like, a structure in which a connector such as an FPC (Flexible Printed Circuit) or a TCP (Tape Carrier Package) is attached to a substrate of a display panel, or a structure in which an IC is mounted on a substrate by a COG (Chip On Glass) method or the like is referred to as a display panel module or a display module, or simply as a display panel or the like in some cases.

Note that in this specification and the like, a touch panel that is one embodiment of a display device has a function of displaying an image or the like on a display surface and a function of a touch sensor capable of sensing the contact, press, approach, or the like of a sensing target such as a finger or a stylus with or to the display surface. Thus, the touch panel is one embodiment of an input/output device.

A touch panel can also be referred to as, for example, a display panel (or a display device) with a touch sensor, or a display panel (or a display device) having a touch sensor function. A touch panel can include a display panel and a touch sensor panel. Alternatively, a touch panel can have a function of a touch sensor in the display panel or on the surface of the display panel.

In this specification and the like, a touch panel with a substrate in which a connector and an IC are implemented is referred to as a touch panel module or a display module, or simply as a touch panel or the like in some cases.

Embodiment 1

In this embodiment, a metal oxide that can be favorably used for a semiconductor device of one embodiment of the present invention is described.

The semiconductor device which is one embodiment of the present invention includes a metal oxide (hereinafter also referred to as an oxide semiconductor) functioning as a semiconductor in a channel formation region. Use of the metal oxide is preferable because a transistor using the metal oxide has more favorable switching characteristics and extremely lower off-state current than a transistor using a semiconductor including silicon or the like.

Here, the composition of the metal oxide greatly affects the electrical characteristics and reliability of a transistor. Note that the metal oxide preferably contains indium. Furthermore, the metal oxide preferably has a high content of indium. When the metal oxide has a higher content of indium, the carrier mobility (electron mobility) of the metal oxide can be increased. Therefore, a transistor in which a metal oxide having a high content of indium is used in a channel formation region has high field-effect mobility and accordingly makes a large amount of current to flow. Moreover, a semiconductor device using the transistor can be driven at high speed. Accordingly, in a display device including such a semiconductor device, a transistor in a pixel portion and a transistor used in a driver circuit portion can be formed over the same substrate. In addition, by using such a transistor in the pixel portion, a high-quality image can be provided.

The metal oxide preferably contains an element M in addition to indium. The element M preferably has a high bonding energy with oxygen. It is particularly preferable that the element M have a higher bonding energy with oxygen than indium. When the metal oxide contains the element M having a higher bonding energy with oxygen than indium, oxygen vacancies are less likely to be formed in the metal oxide. As the element M, one or more of gallium, aluminum, silicon, boron, yttrium, tin, copper, vanadium, beryllium, titanium, iron, nickel, germanium, zirconium, molybdenum, lanthanum, cerium, neodymium, hafnium, tantalum, tungsten, and magnesium can be used. In particular, one or more of gallium, aluminum, yttrium, and tin can be used as the element M. The element M has a function of increasing the energy gap of the metal oxide.

In particular, gallium can be favorably used as the element M. When the metal oxide contains gallium having a higher bonding energy with oxygen than indium, oxygen vacancies are less likely to be formed in the metal oxide. Many oxygen vacancies existing in the metal oxide used in a channel formation region leads to reductions in the electrical characteristics and the reliability of a transistor. Accordingly, use of a metal oxide containing indium and gallium can achieve a highly reliable transistor having high field-effect mobility.

The metal oxide preferably contains zinc in addition to indium. Alternatively, the metal oxide preferably contains indium, the element M, and zinc. Zinc has a function of increasing the crystallinity of the metal oxide. The metal oxide having crystallinity can be favorably used in a channel formation region. For example, a metal oxide having a CAAC (c-axis aligned crystal) structure, which is described later, a polycrystalline structure, a microcrystalline (nc: nanocrystal) structure, or the like can be used in a channel formation region. Use of the metal oxide having crystallinity in a channel formation region can reduce the density of defect states in the channel formation region and achieve a highly reliable transistor.

As the crystallinity of the metal oxide becomes higher, the density of defect states in a film can be reduced. In contrast, use of a metal oxide having low crystallinity in a channel formation region can achieve a transistor in which a large amount of current can flow.

<Composition of Metal Oxide>

The composition of the metal oxide is specifically described. The atomic ratio of indium to the element M and zinc in the metal oxide is shown as a composition below.

FIG. 1A, FIG. 1B, FIG. 2A, and FIG. 2B each show a preferable range of the atomic ratio of indium to the element M and zinc contained in the metal oxide. Each of FIG. 1A, FIG. 1B, FIG. 2A, and FIG. 2B is also referred to as a ternary diagram, a triangular coordinate view, or a triangular diagram, showing atomic ratios of indium to the element M and zinc with use of a regular triangle with vertices of indium, the element M, and zinc. Note that in FIG. 1A, FIG. 1B, FIG. 2A, and FIG. 2B, the oxygen atomic ratio is not mentioned.

Figure 3A:
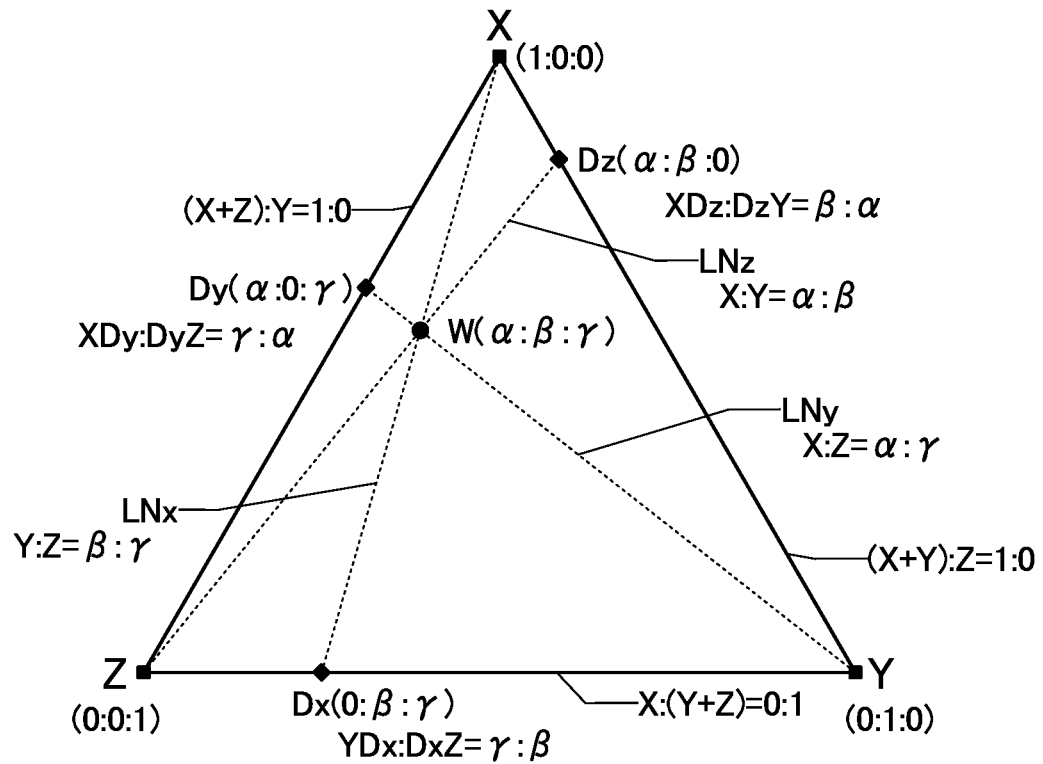
FIG. 3A and FIG. 3B are each a diagram showing a composition of a metal oxide.
Figure 3B:
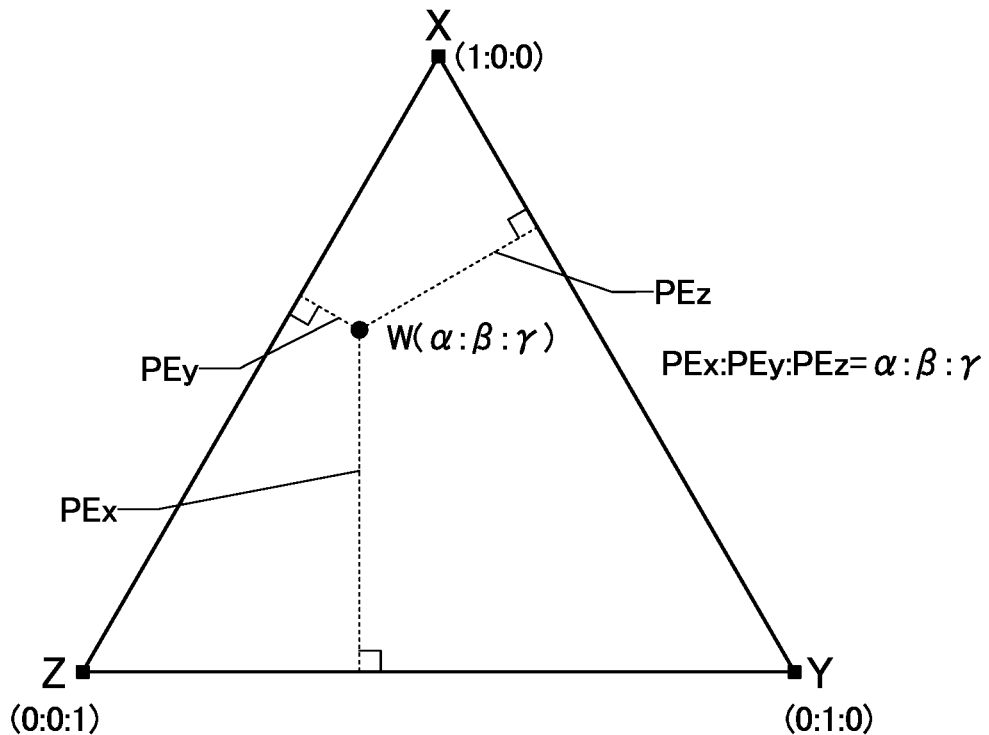
Figure 4:
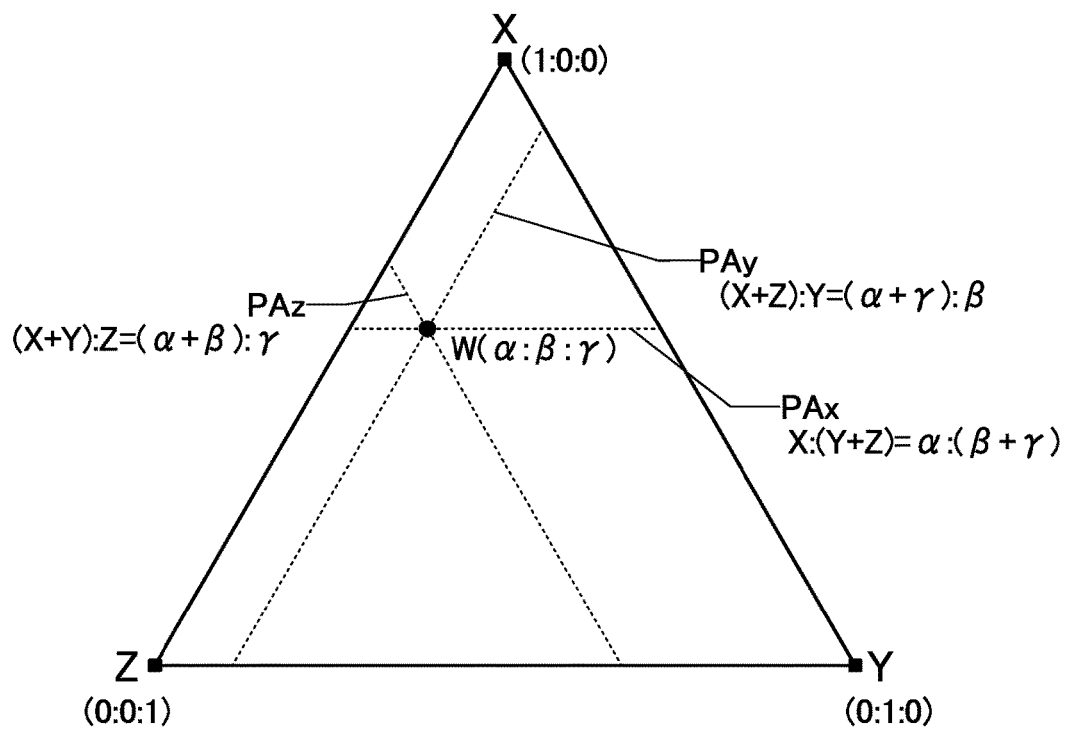
FIG. 4 is a diagram showing a composition of a metal oxide.

First, atomic ratios of the elements are described with reference to FIG. 3A, FIG. 3B, and FIG. 4. Each of FIG. 3A, FIG. 3B, and FIG. 4 shows an example of a metal oxide containing an element X, an element Y, and an element Z. Each of ternary diagrams shown in FIG. 3A, FIG. 3B, and FIG. 4 shows a regular triangle with vertices of a point X, a point Y, and a point Z, and a coordinate point W ($\alpha:\beta:\gamma$) as an example of a composition of the metal oxide.

The coordinate point W ($\alpha:\beta:\gamma$) indicates that the atomic ratio of the element X to the element Y and the element Z, i.e., X:Y:Z, is $\alpha:\beta:\gamma$. As the position of the coordinate point is close to the vertex of one element, the value of the element in the atomic ratio increases, whereas as the position of the coordinate point is far from the vertex of the element, the value of the element in the atomic ratio decreases. Here, the coordinates of the point X are (1:0:0), which indicates that the atomic ratio of the element X to the element Y and the element Z, i.e., X:Y:Z, is 1:0:0, that is, the metal oxide contains the element X and contains neither the element Y nor the element Z. The coordinates of the point Y are (0:1:0), which indicates that the atomic ratio of the element X to the element Y and the element Z. i.e., X:Y:Z, is 0:1:0, that is, the metal oxide contains the element Y and contains neither the element X nor the element Z. The coordinates of the point Z are (0:0:1), which indicates that the atomic ratio of the element X to the element Y and the element Z. i.e., X:Y:Z, is 0:0:1, that is, the metal oxide contains the element Z and contains neither the element X nor the element Y.

Note that in this specification and the like, the atomic ratio of the element X to the element Y and the element Z is represented by X:Y:Z in some cases. Furthermore, the atomic ratio of the sum of the element X and the element Y to the element Z is represented by (X+Y):Z in some cases. Other combinations of the elements may also be represented in a similar manner.

In FIG. 3A, a line LNx, a line LNy, and a line LNz are drawn. The line LNx is a straight line that connects the point X and a point Dx (0:$\beta:\gamma$) dividing the length of a side YZ into $\gamma:\beta$. The line LNx can also be referred to as an aggregate of points where the atomic ratio of the element Y to the element Z that is Y:Z satisfies $\beta:\gamma$. The line LNy is a straight line that connects the point Y and a point Dy ($\alpha:0:\gamma$) dividing the length of a side XZ into $\gamma:\alpha$. The line LNy can also be referred to as an aggregate of points where the atomic ratio of the element X to the element Z that is X:Z satisfies $\alpha:\gamma$. The line LNz is a straight line that connects the point Z and a point Dz ($\alpha:\beta:0$) dividing the length of a side XY into $\beta:\alpha$. The line LNz can also be referred to as an aggregate of points where the atomic ratio of the element X to the element Y that is X:Z satisfies $\alpha:\beta$. Each of the line LNx, the line LNy, and the line LNz intersects with the coordinate point W ($\alpha:\beta:\gamma$).

Note that in this specification and the like, a "straight line that connects Point A and Point B" can be replaced with a "line segment that connects Point A and Point B".

Here, the coordinate point W (α:β:γ) can also be referred to as an intersection of the line LNx and the line LNy. The coordinate point W (a:β:γ) can also be referred to as an intersection of the line LNy and the line LNz. The coordinate point W (α:β:γ) can also be referred to as an intersection of the line LNx and the line LNz.

Note that the side XY is an aggregate of points where the atomic ratio of the sum of the element X and the element Y to the element Z that is (X+Y):Z satisfies 1:0. That is, the side XY indicates that the metal oxide contains one or more of the element X and the element Y and does not contain the element Z. The side YZ is an aggregate of points where the atomic ratio of the element X to the sum of the element Y and the element Z that is X:(Y+Z) satisfies 0:1. That is, the side YZ indicates that the metal oxide contains one or more of the element Y and the element Z and does not contain the element X. The side XZ is an aggregate of points where the atomic ratio of the sum of the element X and the element Z to the element Y that is (X+Z):Y satisfies 1:0. That is, the side XZ indicates that the metal oxide contains one or more of the element X and the element Z and does not contain the element Y.

As a specific example, a case of the coordinate point W (5:1:3) is described. In the case of the coordinate point W (5:1:3), the ratio of the length of a line segment XDz and the length of a line segment DzY is 1:5. The ratio of the length of a line segment YDx and the length of a line segment DxZ is 3:1. The ratio of the length of a line segment XDy and the length of a line segment DyZ is 3:5. The line LNx is a point where satisfying the atomic ratio of the element Y to the element Z that is Y:Z satisfies 1:3. The line LNy is an aggregate of points where the atomic ratio of the element X to the element Z that is X:Z satisfies 5:3. The line LNz is an aggregate of points where the atomic ratio of the element X and the element Y that is X:Y satisfies 5:1.

In FIG. 3B, a line PEx, a line PEy, and a line Pez are drawn. The line PEx is a perpendicular line drawn from the coordinate point W (α:β:γ) to the side YZ. The line PEy is a perpendicular line drawn from the coordinate point W (α:β:γ) to the side XZ. The line PEz is a perpendicular line drawn from the coordinate point W (α:β:γ) to the side XY. Here, the ratio of the length of the line PEx to the length of the line PEy and the length of the line PEz is α:β:γ.

As a specific example, the case of the coordinate point W (5:1:3) is described. In the case of the coordinate point W (5:1:3), the ratio of the length of the line PEx to the length of the line PEy and the length of the line PEz is 5:1:3.

In FIG. 4A, a line PAx, a line PAy, and a line Paz are drawn. The line PAx is a straight line parallel to the side YZ and intersects with the coordinate point W (α:β:γ). The line PAy is a straight line parallel to the side XZ and intersects with the coordinate point W (α:β:γ). The line PAz is a straight line parallel to the side XY and intersects with the coordinate point W (α:β:γ). Furthermore, the line PAx can also be referred to as an aggregate of points where the atomic ratio of the element X to the sum of the element Y and the element Z that is X:(Y+Z) satisfies α:(β+γ). The line PAy can also be referred to as an aggregate of points where the atomic ratio of the sum of the element X and the element Z to the element Y that is (X+Z):Y satisfies (α+γ):β. The line PAz can also be referred to as an aggregate of points where the atomic ratio of the sum of the element X and the element Y to the element that is Z(X+Y):Z satisfies (α+β):γ.

As a specific example, a case of the coordinate point W (5:1:3) is described. In the case of the coordinate point W (5:1:3), the line PAx is an aggregate of points where the atomic ratio of the element X to the sum of the element Y and the element Z that is X:(Y+Z) satisfies 5:4. The line PAy is an aggregate of points where the atomic ratio of the sum of the element X and the element Z to the element Y that is (X+Z):Y satisfies 8:1. The line PAz is an aggregate of points where the atomic ratio of the sum of the element X and the element Y to the element Z that is (X+Y):Z satisfies 2:1.

Hereinafter, the composition of a metal oxide that can be favorably used in a channel formation region of a transistor is specifically described.

[Composition 1 of Metal Oxide]

The metal oxide preferably contains indium and oxygen. The metal oxide may further contain one or more of the element M and zinc. FIG. 1A shows the composition of the metal oxide that can be favorably used in a channel formation region of a transistor. The atomic ratio of indium to the element M and zinc in the metal oxide preferably falls within a range 11 in the ternary diagram shown in FIG. 1A. The range 11 is an inside of a polygon obtained by connecting a coordinate point A (1:0:0), a coordinate point B (2:1:0), a coordinate point C (14:7:1), a coordinate point D (7:2:2), a coordinate point E (14:4:21), a coordinate point F (2:0:3), and the coordinate point A in this order by a straight line. Note that the range 11 also includes each coordinate point and each side. The use of a metal oxide having a composition in the range 11 in a channel formation region can allow a transistor to have high reliability and high field-effect mobility.

Note that in the case where a plurality of elements are contained as the element M, the atomic ratio of the sum of the elements is used as the atomic ratio of the element M. In the case where gallium and tin are contained as the element M, for example, the atomic ratio of the sum of gallium and tin is used as the atomic ratio of the element M.

Here, the coordinate point B (2:1:0) is an intersection of a line L1 that is an aggregate of points satisfying (In+M):Zn=1:0 and a line L2 that is an aggregate of points satisfying In:M=2:1. The coordinate point C (14:7:1) is an intersection of the line L2 and a line L3 that is an aggregate of points satisfying In:(M+Zn)=7:4. The coordinate point C is also an intersection of the line L2 and a line L4 that is an aggregate of points satisfying In:Zn=14:1. The coordinate point D (7:2:2) is an intersection of the line L3 and a line L5 that is an aggregate of points satisfying In:Zn=7:2. The coordinate point D is also an intersection of the line L3 and a line L6 that is an aggregate of points satisfying In:M=7:2. The coordinate point E (14:4:21) is an intersection of the line L6 and a line L7 that is an aggregate of points satisfying In:Zn=2:3. The coordinate point F (2:0:3) is an intersection of the line L7 and a line L8 that is an aggregate of points satisfying (In+Zn):M=1:0.

Note that in this specification and the like, the atomic ratio of indium to the element M and zinc is denoted by In:M:Zn in some cases. The atomic ratio of the sum of indium and the element M to zinc is denoted by (In+M):Zn in some cases. The same applies to other combinations of the elements.

A side AB is on the line L1, a side BC is on the line L2, a side CD is on the line L3, a side DE is on the line L6, a side EF is on the line L7, and a side FA is on the line L8. That is, the range 11 can also be referred to as an inside of a polygon surrounded by the line L1, the line L2, the line L3, the line L6, the line L7, and the line L8.

For the composition of the metal oxide, as shown in the range 11, it is preferable to satisfy the ratio In:M=2:1 corresponding to the line L2 or to have the content of indium higher than the ratio In:M=2:1. That is, the atomic ratio of indium to the element M, In/M, is preferably higher than or equal to 2. Since the metal oxide having a high content of indium has high carrier mobility (electron mobility), a transistor using the metal oxide having a high content of indium in a channel formation region has high field-effect mobility and thus can allow a large amount of current to flow.

Note that a high content of the element M may increase defect states, and the amount of change in the threshold voltage in a reliability test may become large. One of indicators of evaluating the reliability of a transistor is a GBT (Gate Bias Temperature) stress test in which a state of applying an electric field to a gate is maintained. Among the GBT stress tests, a test in which a state where a positive potential relative to a source potential and a drain potential is supplied to a gate is maintained at high temperatures is referred to as PBTS (Positive Bias Temperature stress) test, and a test in which a state where a negative potential is supplied to a gate is maintained at high temperatures is referred to as a NBTS (Negative Bias Temperature stress) test. The PBTS test and the NBTS test conducted in a state where irradiation with light such as white LED light is performed are respectively referred to as a PBTIS (positive bias temperature illumination stress test) and an NBTIS (Negative Bias Temperature Illumination Stress) test.

In particular, in an n-channel transistor using a metal oxide, a positive potential is applied to a gate in a state where the transistor is in an on state (a state where current flows). Accordingly, the amount of change in the threshold voltage in the PBTS test is one of important items to be focused on as an indicator of the reliability of the transistor.

Here, the use of a metal oxide not containing the element M or having a low content of the element M can reduce the amount of change in the threshold voltage in the PBTS test. In the case where the element M is contained, as the composition of the metal oxide, the content of the element M is preferably lower than the content of indium. Furthermore, it is preferable that the atomic ratio of indium to the element M, In/M, be 2 or more. Thus, a highly reliable transistor can be achieved.

One of the factors of change in the threshold voltage in the PBTS test is a defect state at the interface between a semiconductor layer and a gate insulating layer or in the vicinity of the interface. As the density of defect states increases, degradation in the PBTS test becomes significant. However, generation of the defect states can be inhibited by reducing the content of the element M in a portion of the semiconductor layer in contact with the gate insulating layer.

The following can be given, for example, as the reason why degradation in the PBTS test can be inhibited when the element M is not contained, or the content of the element M is made small. The element M contained in the semiconductor layer has a property of attracting oxygen more easily than another metal element (e.g., indium or zinc) does. Therefore, when, at the interface between a metal oxide film containing a large quantity of the elements M and the insulating layer containing an oxide, the element M is bonded to excess oxygen in the insulating layer, trap sites of carriers (here, electrons) are probably likely to be generated easily. This might cause the change in the threshold voltage when carriers are trapped at the interface between the semiconductor layer and the gate insulating layer in a state where a positive potential is applied to a gate.

Accordingly, the use of a metal oxide in which the atomic ratio of indium to the element M, In/M, is 2 or more in a channel formation region can inhibit generation of defect states, and thus a transistor with high reliability and high field-effect mobility can be provided.

For the composition of the metal oxide, as shown in the range 11, it is preferable to satisfy the ratio In:(M+Zn)=7:4 corresponding to the line L3 or to have the content of indium higher than the ratio In:(M+Zn)=7:4. That is, the atomic ratio of indium to the sum of the element M and zinc, In/(M+Zn), is preferably higher than or equal to 7/4. Since the metal oxide having a high content of indium has high carrier mobility (electron mobility), a transistor using the metal oxide having a high content of indium in a channel formation region has high field-effect mobility and allows a large amount of current to flow. Thus, the use of a metal oxide with the atomic ratio in the above range in a channel formation region can achieve a transistor having high field-effect mobility.

For the composition of the metal oxide, as shown in the range 11, it is preferable to satisfy the ratio In:M=7:2 corresponding to the line L6 or to have the content of indium higher than the ratio In:M=7:2. That is, the atomic ratio of indium to the element M, In/M, is preferably higher than or equal to 7/2. The use of a metal oxide with the atomic ratio in the above range in a channel formation region can inhibit generation of defect states and can allow a transistor to have high reliability and high field-effect mobility.

For the composition of the metal oxide, as shown in the range 11, it is preferable to satisfy the ratio In:Zn=2:3 corresponding to the line L7 or to have the content of indium higher than the ratio In:Zn=2:3. That is, the atomic ratio of indium to zinc, In/Zn, is preferably higher than or equal to 2/3. When the content of zinc is high, the metal oxide becomes polycrystal in some cases. A crystal grain boundary of polycrystal becomes a defect state, which serves as a carrier trap or a carrier generation source; thus, a transistor using a metal oxide of polycrystal exhibits a large variation in electrical characteristics, leading to a reduction in reliability in some cases. Accordingly, with the atomic ratio in the above range, the metal oxide can be inhibited from being polycrystal. Furthermore, the use of the metal oxide in a channel formation region can allow a transistor to have high reliability.

As the metal oxide, an In-M-Zn oxide having a composition in the range 11 can be used. As an In-M-Zn oxide, for example, the ratio where In:M:Zn=5:1:1, In:M:Zn=5:1:2, In:M:Zn=5:1:3, In:M:Zn=5:1:4, In:M:Zn=5:1:5, In:M:Zn=5:1:6, In:M:Zn=10:1:1, In:M:Zn=10:1:2, In:M:Zn=10:1:3, In:M:Zn=10:1:4, In:M:Zn=10:1:5, In:M:Zn=10:1:6, In:M:Zn=10:1:7, In:M:Zn=10:1:8, In:M:Zn=10:1:10, In:M:Zn=10:1:12, or In:M:Zn=10:1:15, or a neighborhood thereof can be favorably used. Indium oxide can be used as the metal oxide. Moreover, as the metal oxide, an In-M oxide can be used. As an In-M oxide, for example, the ratio where In:M=2:1, In:M=7:2, In:M=5:1, In:M=7:1, or In:M=10:1, or a neighborhood thereof can be favorably used. Furthermore, as the metal oxide, an In—Zn oxide can be used. As an In—Zn oxide, for example, In:Zn=2:3, In:Zn=3:2, In:Zn=7:2, In:Zn=4:1, In:Zn=11:2, In:Zn=7:1, In:Zn=14:1, or a neighborhood thereof can be favorably used.

As an analysis method of the composition of a metal oxide, for example, energy dispersive X-ray spectroscopy (EDX), X-ray photoelectron spectroscopy (XPS), inductively coupled plasma-mass spectrometry (ICP-MS), inductively coupled plasma-atomic emission spectroscopy (ICP-AES), or the like can be used. Note that as for an element whose content is low, the actual content may be different from the content obtained by analysis because of the influence of the analysis accuracy. In the case where the content of the element M is low, for example, the content of the element M obtained by analysis may be lower than the actual content.

Note that in the case where the metal oxide is formed by a sputtering method, the atomic ratio of a target may be different from the atomic ratio of the metal oxide. In particular, as for zinc, the atomic ratio in the metal oxide is lower than the atomic ratio in the target in some cases. Specifically, the atomic ratio of zinc contained in the metal oxide may be approximately 40% to 90% of the atomic ratio of zinc contained in the target. The target used here is preferably polycrystalline.

[Composition 2 of Metal Oxide]

Figure 1B:
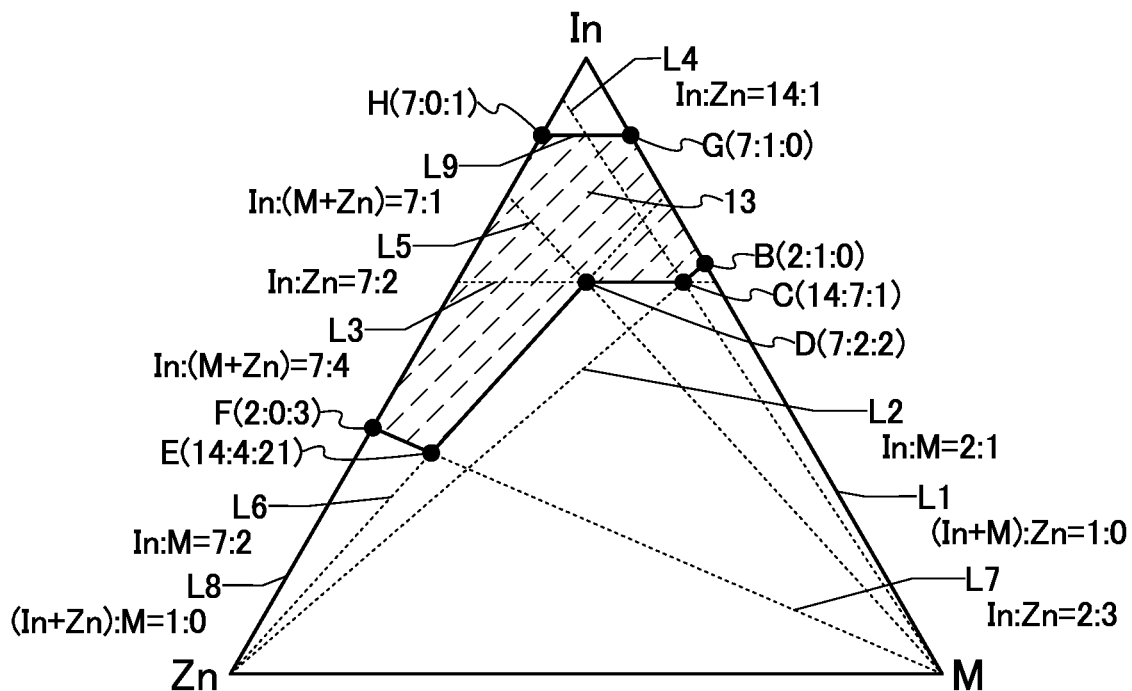

The metal oxide preferably contains indium, oxygen, and one or more of the element M and zinc. FIG. 1B shows the composition of the metal oxide that can be favorably used in a channel formation region of a transistor. The atomic ratio of indium to the element M and zinc in the metal oxide preferably falls within a range 13 in the ternary diagram shown in FIG. 1B. The range 13 is an inside of a polygon obtained by connecting a coordinate point G (7:1:0), the coordinate point B (2:1:0), the coordinate point C (14:7:1), the coordinate point D (7:2:2), the coordinate point E (14:4:21), the coordinate point F (2:0:3), a coordinate point H (7:0:1), and the coordinate point G in this order with a straight line. Note that the range 13 also includes each coordinate point and each side. The use of a metal oxide having a composition within the range 13 in a channel formation region can achieve a highly reliable transistor having high field-effect mobility.

Here, the coordinate point G (7:1:0) is an intersection of the line L1 that is an aggregate of points satisfying (In+M):Zn=1:0 and a line L9 that is an aggregate of points satisfying In:(M+Zn)=7:1. The coordinate point H (7:0:1) is an intersection of the line L9 and the line L8 that is an aggregate of points satisfying (In+Zn):M=1:0. The above description can be referred to for the coordinate point B to the coordinate point F; therefore, a detailed description thereof is omitted.

A side GB is on the line L1, the side BC is on the line L2, the side CD is on the line L3, the side DE is on the line L6, the side EF is on the line L7, a side FH is on the line L8, and a side HG is on the line L9. That is, the range 13 can also be referred to as an inside of a polygon surrounded by the line L1, the line L2, the line L3, the line L6, the line L7, the line L8, and the line L9.

For the composition of the metal oxide, as shown in the range 13, it is preferable to satisfy the ratio In:(M+Zn)=7:1 corresponding to the line L9 or to have the content of In lower than the ratio In:(M+Zn)=7:1. That is, the atomic ratio of indium to the sum of the element M and zinc, In/(M+Zn), is preferably lower than or equal to 7. When the content of indium is high, the metal oxide has a bixbyite crystal structure in some cases. Alternatively, the metal oxide has a crystal structure in which a bixbyite crystal structure and a layered crystal structure coexist, in some cases. In the case where a plurality of crystal structures coexist, a crystal grain boundary might be formed between different crystal structures. The crystal grain boundary becomes a defect state, which serves as a carrier trap or a carrier generation source; thus, a transistor using a metal oxide having a crystal grain boundary exhibits a large variation in electrical characteristics, leading to a reduction in reliability in some cases. Accordingly, with the atomic ratio in the above range, the metal oxide can be inhibited from having a bixbyite crystal structure and thus is likely to have a layered crystal structure. Furthermore, the use of the metal oxide in a channel formation region can allow a transistor to have high reliability.

For the composition of the metal oxide, as shown in the range 13, it is preferable to satisfy the ratio In:M=2:1 corresponding to the line L2 or to have the content of indium higher than the ratio In:M=2:1. That is, the atomic ratio of indium to the element M, In/M, is preferably higher than or equal to 2. The use of a metal oxide with the atomic ratio in the above range in a channel formation region can inhibit generation of defect states and can allow a transistor to have high reliability and high field-effect mobility.

For the composition of the metal oxide, as shown in the range 13, it is preferable to satisfy the ratio In:(M+Zn)=7:4 corresponding to the line L3 or to have the content of indium higher than the ratio In:(M+Zn)=7:4. That is, the atomic ratio of indium to the sum of the element M and zinc, In/(M+Zn), is preferably higher than or equal to 7/4. The use of a metal oxide with the atomic ratio in the above range in a channel formation region can allow a transistor to have high field-effect mobility.

For the composition of the metal oxide, as shown in the range 13, it is preferable to satisfy the ratio In:M=7:2 corresponding to the line L6 or to have the content of indium higher than the ratio In:M=7:2. That is, the atomic ratio of indium to the element M, In/M, is preferably higher than or equal to 7/2. The use of a metal oxide with the atomic ratio in the above range in a channel formation region can inhibit generation of defect states and can allow a transistor to have high reliability and high field-effect mobility.

For the composition of the metal oxide, as shown in the range 13, it is preferable to satisfy the ratio In:Zn=2:3 corresponding to the line L7 or to have the content of indium higher than the ratio In:Zn=2:3. That is, the atomic ratio of indium to zinc, In/Zn, is preferably higher than or equal to 2/3. With the atomic ratio in the above range, the metal oxide can be inhibited from being polycrystal. Furthermore, the use of the metal oxide in a channel formation region can allow a transistor to have high reliability.

As the metal oxide, an In-M-Zn oxide having a composition within the range 13 can be used. As an In-M-Zn oxide, for example, the ratio where In:M:Zn=5:1:1, In:M:Zn=5:1:2, In:M:Zn=5:1:3, In:M:Zn=5:1:4, In:M:Zn=5:1:5, In:M:Zn=5:1:6, In:M:Zn=10:1:1, In:M:Zn=10:1:2, In:M:Zn=10:1:3, In:M:Zn=10:1:4, In:M:Zn=10:1:5, In:M:Zn=10:1:6, In:M:Zn=10:1:7, In:M:Zn=10:1:8, In:M:Zn=10:1:10, In:M:Zn=10:1:12, or In:M:Zn=10:1:15, or a neighborhood thereof can be favorably used. Moreover, as the metal oxide, an In-M oxide can be used. As an In-M oxide, for example, the ratio where In:M=2:1, In:M=7:2, In:M=5:1, or In:M=7:1, or a neighborhood thereof can be favorably used. Furthermore, as the metal oxide, an In—Zn oxide can be used. As an In—Zn oxide, for example, the ratio where In:Zn=2:3, In:Zn=3:2, In:Zn=7:2, In:Zn=4:1, In:Zn=11:2, or In:Zn=7:1, or a neighborhood thereof can be favorably used.

[Composition 3 of Metal Oxide]

Figure 2A:
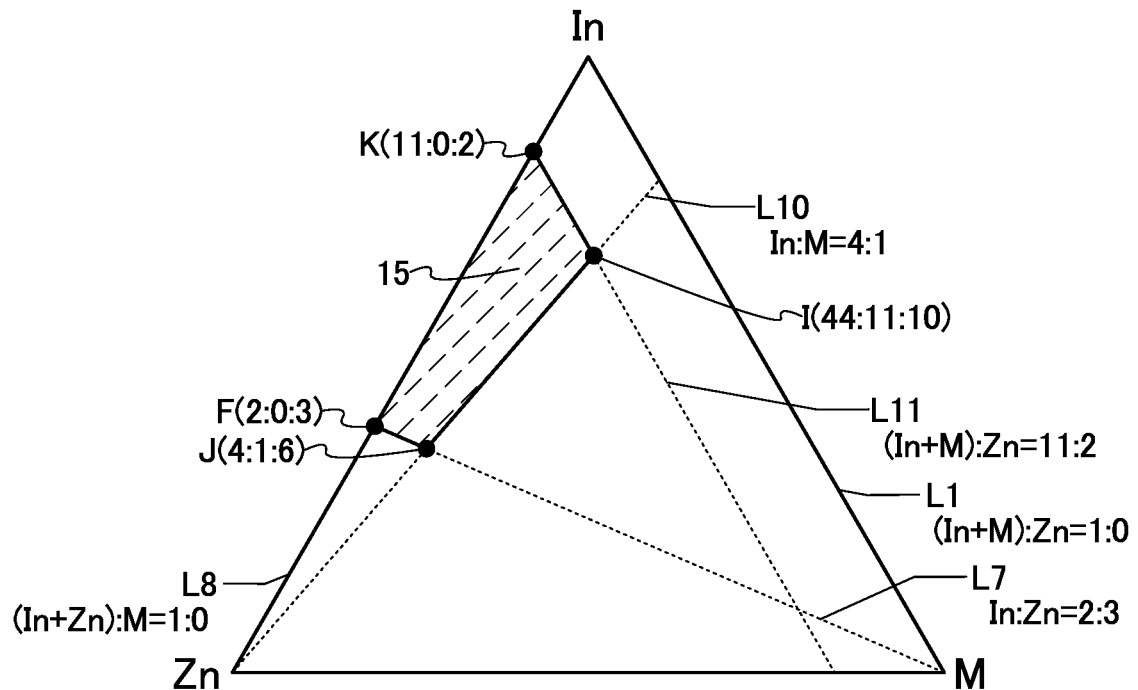
FIG. 2A and FIG. 2B are each a diagram showing a composition of a metal oxide.

The metal oxide preferably contains indium, zinc, and oxygen. The metal oxide may further contain the element M. FIG. 2A shows the composition of the metal oxide that can be favorably used in a channel formation region of a transistor. The atomic ratio of indium to the element M and zinc in the metal oxide preferably falls within a range 15 in the ternary diagram shown in FIG. 2A. The range 15 is an inside of a polygon obtained by connecting a coordinate point I (44:11:10), a coordinate point J (4:1:6), a coordinate point F (2:0:3), a coordinate point K (11:0:2), and the coordinate point I in this order with a straight line. Note that the range 15 also includes each coordinate point and each side. The use of a metal oxide having a composition within the range 15 in a channel formation region can allow a transistor to have high reliability and high field-effect mobility.

Here, the coordinate point I (44:11:10) is an intersection of a line L10 that is an aggregate of points satisfying In:M=4:1 and a line L11 that is an aggregate of points satisfying (In+M):Zn=11:2. The coordinate point J (4:1:6) is an intersection of the line L7 and the line L10. The coordinate point K (11:0:2) is an intersection of the line L11 and the line L8. The above description can be referred to for the coordinate point F; therefore, a detailed description thereof is omitted.

A side IJ is on the line L10, a side JF is on the line L7, a side FK is on the line L8, and a side KI is on the line L11. That is, the range 15 can also be referred to as an inside of a polygon surrounded by the line L10, the line L7, the line L8, and the line L11.

For the composition of the metal oxide, as shown in the range 15, it is preferable to satisfy the ratio In:M=4:1 corresponding to the line L10 or to have the content of In higher than the ratio In:M=4:1. That is, the atomic ratio of indium to the element M, In/M, is preferably higher than or equal to 4. The use of a metal oxide with the atomic ratio in the above range in a channel formation region can inhibit generation of defect states and can allow a transistor to have high reliability and high field-effect mobility.

For the composition of the metal oxide, as shown in the range 15, it is preferable to satisfy the ratio In:Zn=2:3 corresponding to the line L7 or to have the content of indium higher than the ratio In:Zn=2:3. That is, the atomic ratio of indium to zinc, In/Zn, is preferably higher than or equal to 2/3. With the atomic ratio in the above range, the metal oxide can be inhibited from being polycrystal. Furthermore, the use of the metal oxide in a channel formation region can allow a transistor to have high reliability.

For the composition of the metal oxide, as shown in the range 15, it is preferable to satisfy the ratio (In+M):Zn=11:2 corresponding to the line L11 or to have the content of zinc higher than the ratio (In+M):Zn=11:2. That is, the atomic ratio of the sum of indium and the element M to zinc, (In+M)/Zn, is preferably lower than or equal to 11/2. The metal oxide containing zinc tends to have a layered crystal structure. Furthermore, as the content of zinc is higher, the metal oxide has higher crystallinity.

As the metal oxide, an In-M-Zn oxide having a composition within the range 15 can be used. As an In-M-Zn oxide, for example, the ratio where In:M:Zn=5:1:2, In:M:Zn=5:1:3, In:M:Zn=5:1:4, In:M:Zn=5:1:5, In:M:Zn=5:1:6, In:M:Zn=10:1:2, In:M:Zn=10:1:3, In:M:Zn=10:1:4, In:M:Zn=10:1:5, In:M:Zn=10:1:6, In:M:Zn=10:1:7, In:M:Zn=10:1:8, In:M:Zn=10:1:10, In:M:Zn=10:1:12, or In:M:Zn=10:1:15, or a neighborhood thereof can be favorably used. Furthermore, as the metal oxide, an In—Zn oxide can be used. As an In—Zn oxide, for example, the ratio where In:Zn=2:3, In:Zn=3:2, In:Zn=7:2, In:Zn=4:1, In:Zn=11:2, or In:Zn=7:1, or a neighborhood thereof can be favorably used.

It is preferable that the metal oxide have a composition in the above range and be a CAAC-OS (c-axis Aligned Crystalline Oxide Semiconductor), an nc-OS (nanocrystalline oxide semiconductor), or a CAC-OS (Cloud-Aligned Composite Oxide Semiconductor).

Here, a CAC-OS and a CAAC-OS that are metal oxides that can be used for a transistor are described.

[Composition of Metal Oxide]

A CAC-OS has a conducting function in part of the material and has an insulating function in another part of the material; as a whole, the CAC-OS has a function of a semiconductor. In the case where the CAC-OS or the CAC-metal oxide is used in an active layer of a transistor, the conducting function is a function of allowing electrons (or holes) serving as carriers to flow, and the insulating function is a function of not allowing electrons serving as carriers to flow. By the complementary action of the conducting function and the insulating function, a switching function (On/Off function) can be given to the CAC-OS or the CAC-metal oxide. In the CAC-OS or the CAC-metal oxide, separation of the functions can maximize each function.

The CAC-OS or the CAC-metal oxide includes conductive regions and insulating regions. The conductive regions have the above-described conducting function, and the insulating regions have the above-described insulating function. Furthermore, in some cases, the conductive regions and the insulating regions in the material are separated at the nanoparticle level. Furthermore, in some cases, the conductive regions and the insulating regions are unevenly distributed in the material. Furthermore, in some cases, the conductive regions are observed to be coupled in a cloud-like manner with their boundaries blurred.

In the CAC-OS or the CAC-metal oxide, the conductive regions and the insulating regions each have a size greater than or equal to 0.5 nm and less than or equal to 10 nm, preferably greater than or equal to 0.5 nm and less than or equal to 3 nm and are dispersed in the material in some cases.

The CAC-OS or the CAC-metal oxide includes components having different band gaps. For example, the CAC-OS or the CAC-metal oxide includes a component having a wide gap due to the insulating region and a component having a narrow gap due to the conductive region. In the case of the structure, when carriers flow, carriers mainly flow in the component having a narrow gap. Furthermore, the component having a narrow gap complements the component having a wide gap, and carriers also flow in the component having a wide gap in conjunction with the component having a narrow gap. Therefore, in the case where the above-described CAC-OS or CAC-metal oxide is used in a channel region of a transistor, high current drive capability in the on state of the transistor, that is, a high on-state current and high field-effect mobility can be obtained.

In other words, the CAC-OS or the CAC-metal oxide can also be referred to as a matrix composite or a metal matrix composite.

[Structure of Metal Oxide]

Oxide semiconductors can be classified into a single crystal oxide semiconductor and a non-single-crystal oxide semiconductor. Examples of the non-single-crystal oxide semiconductors include a CAAC-OS, a polycrystalline oxide semiconductor, an nc-OS, an amorphous-like oxide semiconductor (a-like OS), and an amorphous oxide semiconductor.

Oxide semiconductors might be classified in a manner different from the above-described one when classified in terms of the crystal structure. The classification of the crystal structures of oxide semiconductor is explained with FIG. 5A. FIG. 5A is a diagram showing the classification of crystal structures of an oxide semiconductor, typically IGZO (a metal oxide containing In, Ga, and Zn).

As shown in FIG. 5A, IGZO is roughly classified into Amorphous, Crystalline, and Crystal. Amorphous includes completely amorphous structure. Crystalline includes CAAC (c-axis-aligned crystalline), nc (nanocrystalline), and CAC (Cloud-Aligned Composite). Note that Crystalline excludes single crystal and poly crystal described later. Crystal includes single crystal and poly crystal.

Note that the structure shown in the thick frame in FIG. 5A is a structure that belongs to new crystalline phase. This structure is positioned in a boundary region between Amorphous and Crystal. In other words, Amorphous, which is energetically unstable, and Crystalline are completely different structures.

A crystal structure of a film or a substrate can be analyzed with an X-ray diffraction (XRD) pattern. Here, XRD spectra of quartz glass and IGZO, which has a crystal structure classified into crystalline (also referred to as crystalline IGZO), are shown in FIG. 5B and FIG. 5C. FIG. 5B shows an XRD spectrum of quartz glass and FIG. 5C shows an XRD spectrum of crystalline IGZO. Note that the crystalline IGZO shown in FIG. 5C has a composition of In:Ga:Zn=4:2:3 [atomic ratio]. Furthermore, the crystalline IGZO shown in FIG. 5C has a thickness of 500 nm.

As indicated by arrows in FIG. 5B, the XRD spectrum of the quartz glass shows a substantially bilaterally symmetrical peak. In contrast, as indicated by arrows in FIG. 5C, the XRD spectrum of the crystalline IGZO shows a bilaterally asymmetrical peak. The bilaterally asymmetrical peak of the XRD spectrum clearly shows the existence of crystal. In other words, the structure cannot be regarded as Amorphous unless it has a bilaterally symmetrical peak in the XRD spectrum. Note that in FIG. 5C, a microcrystal (nanocrystal) is explicitly shown at 2θ of 31° or in the vicinity thereof. The bilaterally asymmetrical peak in the XRD spectrum is probably due to the microcrystal.

Specifically, in the XRD spectrum shown in FIG. 5C, the crystalline IGZO has a peak at 2θ=34° or in the vicinity thereof. Furthermore, the nanocrystal has a peak at 2θ=31° or in the vicinity thereof. In the case where an oxide semiconductor film is evaluated using an X-ray diffraction pattern, as shown in FIG. 5C, the width of the spectrum on the lower angle side than 2θ=34° of the peak or in the vicinity thereof becomes larger. This indicates that the oxide semiconductor film includes a microcrystal having a peak at 2θ=31° or in the vicinity thereof.

The CAAC-OS has c-axis alignment and a plurality of nanocrystals connected in the a-b plane direction, and its crystal structure has distortion. Note that the distortion refers to a portion where the direction of a lattice arrangement changes between a region with a regular lattice arrangement and another region with a regular lattice arrangement in a region where the plurality of nanocrystals are connected.

The nanocrystal is basically a hexagon but is not always a regular hexagon and is a non-regular hexagon in some cases. Furthermore, a pentagonal or heptagonal lattice arrangement, for example, is included in the distortion in some cases. Note that a clear crystal grain boundary (also referred to as grain boundary) cannot be observed even in the vicinity of distortion in the CAAC-OS. That is, formation of a crystal grain boundary is inhibited by the distortion of lattice arrangement. This is probably because the CAAC-OS can tolerate distortion owing to a low density of arrangement of oxygen atoms in the a-b plane direction, an interatomic bond length changed by substitution of a metal element, and the like.

A crystal structure in which a clear grain boundary is observed is what is called a polycrystal structure. It is highly probable that the grain boundary becomes a recombination center and traps carriers and thus decreases the on-state current or field-effect mobility of a transistor. Thus, the CAAC-OS in which no clear grain boundary is observed is one of crystalline oxides having a crystal structure suitable for a semiconductor layer of a transistor. Note that Zn is preferably contained to form the CAAC-OS. For example, an In—Zn oxide and an In—Ga—Zn oxide are suitable because they can inhibit generation of a grain boundary as compared with an In oxide.

The CAAC-OS tends to have a layered crystal structure (also referred to as a layered structure) in which a layer containing indium and oxygen (hereinafter, In layer) and a layer containing the element M, zinc, and oxygen (hereinafter, (M,Zn) layer) are stacked. Note that indium and the element M can be replaced with each other, and when the element M in the (M,Zn) layer is replaced with indium, the layer can also be referred to as an (In,M,Zn) layer. Furthermore, when indium in the In layer is replaced with the element M, the layer can be referred to as an (In,M) layer.

The CAAC-OS is an oxide semiconductor with high crystallinity. Meanwhile, in the CAAC-OS, a reduction in electron mobility due to a crystal grain boundary is less likely to occur because a clear crystal grain boundary cannot be observed. Moreover, since the crystallinity of an oxide semiconductor might be decreased by entry of impurities, formation of defects, or the like, the CAAC-OS can be regarded as an oxide semiconductor that has small amounts of impurities and defects (e.g., oxygen vacancies). Thus, an oxide semiconductor including the CAAC-OS is physically stable. Therefore, the oxide semiconductor including the CAAC-OS is resistant to heat and has high reliability. In addition, the CAAC-OS is stable with respect to high temperature in the manufacturing process (what is called thermal budget). Accordingly, the use of the CAAC-OS for the OS transistor can extend the degree of freedom of the manufacturing process.

In the nc-OS, a microscopic region (e.g., a region with a size greater than or equal to 1 nm and less than or equal to 10 nm, in particular, a region with a size greater than or equal to 1 nm and less than or equal to 3 nm) has a periodic atomic arrangement. Furthermore, there is no regularity of crystal orientation between different nanocrystals in the nc-OS. Thus, the orientation in the whole film is not observed. Accordingly, the nc-OS cannot be distinguished from an a-like OS or an amorphous oxide semiconductor by some analysis methods.

The a-like OS is an oxide semiconductor having a structure between those of the nc-OS and the amorphous oxide semiconductor. The a-like OS contains a void or a low-density region. That is, the a-like OS has low crystallinity as compared with the nc-OS and the CAAC-OS.

An oxide semiconductor has various structures with different properties. Two or more of the amorphous oxide semiconductor, the polycrystalline oxide semiconductor, the a-like OS, the nc-OS, and the CAAC-OS may be included in an oxide semiconductor of one embodiment of the present invention.

[Transistor Including Oxide Semiconductor]

Next, the case where the above oxide semiconductor is used for a transistor is described.

Note that when the above oxide semiconductor is used for a transistor, a transistor with high field-effect mobility can be achieved. In addition, a transistor having high reliability can be achieved.

An oxide semiconductor having a low carrier concentration is preferably used in a transistor. In the case where the carrier concentration of an oxide semiconductor film is lowered, the impurity concentration in the oxide semiconductor film is lowered to decrease the density of defect states. In this specification and the like, a state with a low impurity concentration and a low density of defect states is referred to as a highly purified intrinsic or substantially highly purified intrinsic state.

A highly purified intrinsic or substantially highly purified intrinsic oxide semiconductor film has a low density of defect states and thus has a low density of trap states in some cases.

Charge trapped by the trap states in the oxide semiconductor takes a long time to disappear and may behave like fixed charge. Thus, a transistor whose channel formation region is formed in an oxide semiconductor with a high density of trap states has unstable electrical characteristics in some cases.

Accordingly, in order to obtain stable electrical characteristics of a transistor, reducing the impurity concentration in an oxide semiconductor is effective. In order to reduce the impurity concentration in the oxide semiconductor, it is preferable that the impurity concentration in an adjacent film be also reduced. Examples of impurities include hydrogen, nitrogen, alkali metal, alkaline earth metal, iron, nickel, and silicon.

[Impurities]

Here, the influence of each impurity in the oxide semiconductor is described.

When silicon or carbon, which is one of Group 14 elements, is contained in the oxide semiconductor, defect states are formed in the oxide semiconductor. Thus, the concentration of silicon or carbon in the oxide semiconductor and the concentration of silicon or carbon in the vicinity of an interface with the oxide semiconductor (the concentration obtained by secondary ion mass spectrometry (SIMS)) are each set to lower than or equal to $2\times10^{18}$ atoms/cm$^3$, preferably lower than or equal to $2\times10^{17}$ atoms/cm$^3$.

When the oxide semiconductor contains an alkali metal or an alkaline earth metal, defect states are formed and carriers are generated in some cases. Thus, a transistor using an oxide semiconductor that contains an alkali metal or an alkaline earth metal is likely to have normally-on characteristics. Accordingly, it is preferable to reduce the concentration of an alkali metal or an alkaline earth metal in the oxide semiconductor. Specifically, the concentration of an alkali metal or an alkaline earth metal in the oxide semiconductor that is obtained by SIMS is set to lower than or equal to $1\times10^{18}$ atoms/cm$^3$, preferably lower than or equal to $2\times10^{16}$ atoms/cm$^3$.

When the oxide semiconductor contains nitrogen, the oxide semiconductor easily becomes n-type by generation of electrons serving as carriers and an increase in carrier concentration. As a result, a transistor using an oxide semiconductor containing nitrogen as a semiconductor is likely to have normally-on characteristics. Hence, nitrogen in the oxide semiconductor is preferably reduced as much as possible; the nitrogen concentration in the oxide semiconductor that is obtained by SIMS is set, for example, lower than $5\times10^{19}$ atoms/cm$^3$, preferably lower than or equal to $5\times10^{18}$ atoms/cm$^3$, further preferably lower than or equal to $1\times10^{18}$ atoms/cm$^3$, still further preferably lower than or equal to $5\times10^{17}$ atoms/cm$^3$.

Hydrogen contained in the oxide semiconductor reacts with oxygen bonded to a metal atom to be water, and thus forms an oxygen vacancy in some cases. Entry of hydrogen into the oxygen vacancy generates an electron serving as a carrier in some cases. Furthermore, bonding of part of hydrogen to oxygen bonded to a metal atom causes generation of an electron serving as a carrier in some cases. Thus, a transistor using an oxide semiconductor containing hydrogen is likely to have normally-on characteristics. Accordingly, hydrogen in the oxide semiconductor is preferably reduced as much as possible. Specifically, the hydrogen concentration in the oxide semiconductor that is obtained by SIMS is set to lower than $1\times10^{20}$ atoms/cm$^3$, preferably lower than $1\times10^{19}$ atoms/cm$^3$, further preferably lower than $5\times10^{18}$ atoms/cm$^3$, still further preferably lower than $1\times10^{18}$ atoms/cm$^3$.

When an oxide semiconductor with sufficiently reduced impurities is used for the channel formation region of the transistor, stable electrical characteristics can be given.

[Composition 4 of Metal Oxide]

Figure 2B:
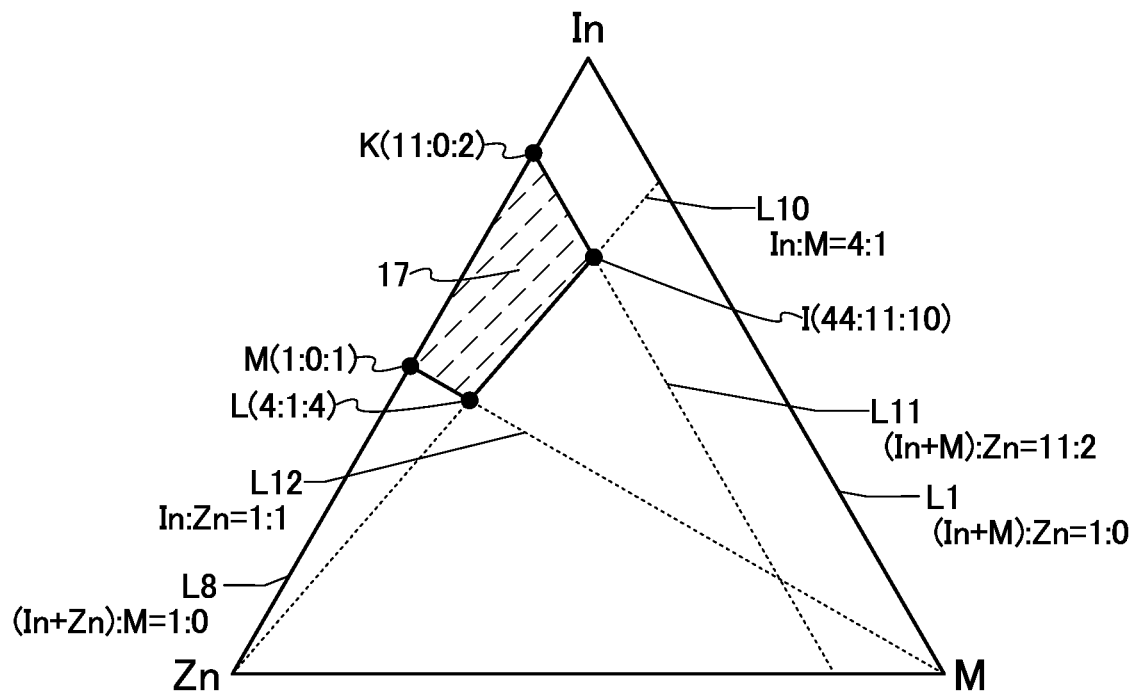

The metal oxide preferably contains indium, zinc, and oxygen. The metal oxide may further contain the element M. FIG. 2B shows the composition of the metal oxide that can be favorably used in a channel formation region of a transistor. The atomic ratio of indium to the element M and zinc in the metal oxide preferably falls within a range 17 in the ternary diagram shown in FIG. 2B. The range 17 is an inside of a polygon obtained by connecting the coordinate point I (44:11:10), a coordinate point L (4:1:4), a coordinate point M (1:0:1), the coordinate point K (11:0:2), and the coordinate point I in this order with a straight line. Note that the range 17 also includes each coordinate point and each side. The use of a metal oxide having a composition in the range 17 within a channel formation region can allow a transistor to have high reliability and high field-effect mobility.

Here, the coordinate point L (4:1:4) is an intersection of the line L10 and a line L12 that is an aggregate of points satisfying In:Zn=1:1. The coordinate point M (1:0:1) is an intersection of the line L12 and the line L8. The above description can be referred to for the coordinate point I and the coordinate point K; therefore, a detailed description thereof is omitted.

A side IL is on the line L10, a side LM is on the line L12, a side MK is on the line L8, and the side KI is on the line L11. That is, the range 17 can also be referred to as an inside of a polygon surrounded by the line L10, the line L12, the line L8, and the line L11.

For the composition of the metal oxide, as shown in the range 17, it is preferable to satisfy the ratio In:M=4:1 corresponding to the line L10 or to have the content of In higher than the ratio In:M=4:1. That is, the atomic ratio of indium to the element M, In/M, is preferably higher than or equal to 4. The use of a metal oxide with the atomic ratio in the above range in a channel formation region can inhibit generation of defect states and can allow a transistor to have high reliability and high field-effect mobility.

For the composition of the metal oxide, as shown in the range 17, it is preferable to satisfy the ratio In:Zn=1:1 corresponding to the line L12 or to have the content of indium higher than the ratio In:Zn=1:1. That is, the atomic ratio of indium to zinc, In/Zn, is preferably higher than or equal to 1. With the atomic ratio in the above range, the metal oxide can be inhibited from being polycrystal. Since the metal oxide is less likely to be polycrystal, a margin of conditions for forming the metal oxide can be enlarged. Furthermore, the use of the metal oxide in a channel formation region can allow a transistor to have high reliability.

For the composition of the metal oxide, as shown in the range 17, it is preferable to satisfy the ratio (In+M):Zn=11:2 corresponding to the line L11 or to have the content of zinc higher than the ratio (In+M):Zn=11:2. That is, the atomic ratio of the sum of indium and the element M to zinc, (In+M)/Zn, is preferably lower than or equal to 11/2. A metal oxide having the atomic ratio in the above range has high crystallinity. Furthermore, the use of the metal oxide in a channel formation region can allow a transistor to have high reliability.

As the metal oxide, an In-M-Zn oxide having a composition within the range 17 can be used. As an In-M-Zn oxide, for example, the ratio where In:M:Zn=5:1:2, In:M:Zn=5:1:3, In:M:Zn=5:1:4, In:M:Zn=5:1:5, In:M:Zn=10:1:2, In:M:Zn=10:1:3, In:M:Zn=10:1:4, In:M:Zn=10:1:5, In:M:Zn=10:1:6, In:M:Zn=10:1:7, In:M:Zn=10:1:8, or In:M:Zn=10:1:10, or a neighborhood thereof can be favorably used. Furthermore, as the metal oxide, an In—Zn oxide can be used. As an In—Zn oxide, for example, the ratio where In:Zn=2:3, In:Zn=3:2, In:Zn=7:2, In:Zn=4:1, In:Zn=11:2, or In:Zn=7:1, or a neighborhood thereof can be favorably used.

At least part of the structure examples, the drawings corresponding thereto, and the like exemplified in this embodiment can be implemented in combination with the other structure examples, the other drawings, and the like as appropriate.

At least part of this embodiment can be implemented in combination with the other embodiments described in this specification as appropriate.

Embodiment 2

In this embodiment, a structure example of a semiconductor device to which the metal oxide described in Embodiment 1 is used will be described. In this embodiment, as an example of the semiconductor device, a transistor using a metal oxide in a semiconductor layer where a channel is formed will be described. A transistor is described below as an example of the semiconductor device.

Structure Example 1

Structure Example 1-1

Figure 6A:
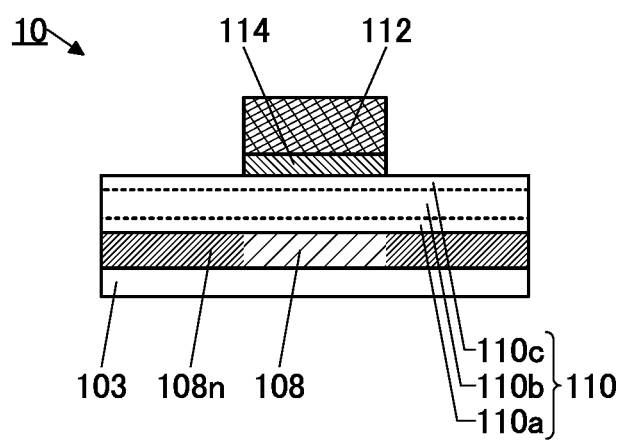
FIG. 6A and FIG. 6B each illustrate a structure example of a transistor.

FIG. 6A shows a schematic cross-sectional view of a transistor 10 in the channel length direction.

The transistor 10 includes an insulating layer 103, a semiconductor layer 108, an insulating layer 110, a metal oxide layer 114, and a conductive layer 112. The insulating layer 110 functions as a gate insulating layer. The conductive layer 112 functions as a gate electrode.

The conductive layer 112 is preferably formed using a conductive film containing a metal or an alloy, in which case electric resistance can be reduced. Note that a conductive film containing an oxide may be used as the conductive layer 112.

The metal oxide layer 114 has a function of supplying oxygen to the insulating layer 110. In the case where a conductive film containing a metal or an alloy that is easily oxidized is used for the conductive layer 112, the metal oxide layer 114 can also function as a barrier layer that prevents the conductive layer 112 from being oxidized by oxygen in the insulating layer 110. Note that the metal oxide layer 114 may be removed before formation of the conductive layer 112 so that the conductive layer 112 and the insulating layer 110 are in contact with each other.

The insulating layer 103 is preferably formed using an insulating film containing an oxide. It is particularly preferable to use an oxide film for a portion in contact with the semiconductor layer 108.

The semiconductor layer 108 contains a metal oxide exhibiting semiconductor characteristics (hereinafter also referred to as an oxide semiconductor). The semiconductor layer 108 is preferably formed using a metal oxide having the composition described in Embodiment 1. Using the metal oxide in a channel formation region enables a transistor to have high reliability and high field-effect mobility.

A region in the semiconductor layer 108 overlapping with the conductive layer 112 functions as a channel formation region. Furthermore, the semiconductor layer 108 preferably includes a pair of low-resistance regions 108n with the channel formation region sandwiched therebetween. Each of the low-resistance regions 108n has higher carrier concentration than the channel formation region and function as a source region or a drain region.

The low-resistance regions 108n can also be referred to as regions with lower resistance, regions having a higher carrier concentration, regions having a larger amount of oxygen vacancies, regions having a higher hydrogen concentration, or regions having a higher impurity concentration than the channel formation region.

The insulating layer 110 has a stacked-layer structure in which an insulating film 110a, an insulating film 110b, and an insulating film 110c are stacked in this order on the insulating film 103 side. The insulating film 110a includes a region in contact with the channel formation region of the semiconductor layer 108. The insulating film 110c includes a region in contact with the metal oxide layer 114. The insulating film 110b is positioned between the insulating film 110a and the insulating film 110c.

It is preferable that the insulating film 110a, the insulating film 110b, and the insulating film 110c be each an insulating film containing an oxide. In that case, the insulating film 110a, the insulating film 110b, and the insulating film 110c are preferably deposited successively with the same deposition apparatus.

For example, as the insulating film 110a, the insulating film 110b, and the insulating film 110c, it is possible to use an insulating layer including one or more kinds of a silicon oxide film, a silicon oxynitride film, a silicon nitride oxide film, an aluminum oxide film, a hafnium oxide film, an yttrium oxide film, a zirconium oxide film, a gallium oxide film, a tantalum oxide film, a magnesium oxide film, a lanthanum oxide film, a cerium oxide film, and a neodymium oxide film.

The insulating layer 110 that is in contact with the semiconductor layer 108 preferably has a stacked-layer structure of oxide insulating films, and further preferably includes a region containing oxygen in excess of that in the stoichiometric composition. In other words, the insulating layer 110 includes an insulating film capable of releasing oxygen. It is also possible to supply oxygen into the insulating layer 110 by forming the insulating layer 110 in an oxygen atmosphere, performing heat treatment, plasma treatment, or the like on the deposited insulating layer 110 in an oxygen atmosphere, or depositing an oxide film over the insulating layer 110 in an oxygen atmosphere, for example.

For example, the insulating film 110a, the insulating film 110b, and the insulating film 110c can be formed by a sputtering method, a chemical vapor deposition (CVD) method, a vacuum evaporation method, a pulsed laser deposition (PLD) method, an atomic layer deposition (ALD) method, or the like. Examples of the CVD method include a plasma-enhanced chemical vapor deposition (PECVD) method and a thermal CVD method.

In particular, the insulating film 110a, the insulating film 110b, and the insulating film 110c are preferably formed by a plasma CVD method.

The insulating film 110a is deposited over the semiconductor layer 108, and thus is preferably a film deposited under conditions where the semiconductor layer 108 is damaged as little as possible. For example, the insulating film 110a can be formed at a sufficiently low deposition rate.

For example, when a silicon oxynitride film is formed as the insulating film 110a by a plasma CVD method, damage to the semiconductor layer 108 can be extremely small by formation under a low-power condition.

For example, a source gas that contains a silicon-containing deposition gas such as silane or disilane and an oxidizing gas such as oxygen, ozone, dinitrogen monoxide, or nitrogen dioxide can be used as a deposition gas for depositing a silicon oxynitride film. The film formation gas may contain a dilution gas such as argon, helium, or nitrogen in addition to the source gas.

For example, when the proportion of the flow rate of the deposition gas in the total flow rate of the film formation gas (hereinafter also simply referred to as flow rate ratio) is low, the deposition rate can be made low, which allows formation of a dense film with few defects.

The insulating film 110b is preferably a film deposited under conditions where the deposition rate is higher than that of the insulating film 110a. Thus, the productivity can be improved.

For example, the insulating film 110b can be deposited under conditions where the deposition rate is increased by setting the flow rate ratio of the deposition gas to be higher than that of the insulating film 110a.

The insulating film 110c is preferably an extremely dense film whose surface has fewer defects and is less likely to adsorb an impurity contained in the air such as water. For example, like the insulating film 110a, the insulating film 110c can be deposited under conditions where the deposition rate is sufficiently low.

Since the insulating film 110c is deposited over the insulating film 110b, the deposition of the insulating film 110c affects the semiconductor layer 108 less than the deposition of the insulating film 110a. Thus, the insulating film 110c can be deposited under conditions where the power is higher than that for the insulating film 110a. The reduced flow rate ratio of the deposition gas and the relatively high-power film formation enable formation of a dense film in which defects on its surface are reduced.

That is, for the insulating layer 110, it is possible to use a stacked-layer film deposited under conditions in which the deposition rate is higher in the order of the insulating film 110b, the insulating film 110a, and the insulating film 110c. In wet etching or dry etching under the same condition, the insulating film 110b, the insulating film 110a, and the insulating film 110c of the insulating layer 110 have higher etching rate in this order.

The insulating film 110b is preferably formed to be thicker than the insulating film 110a and the insulating film 110c. The time taken for the deposition process of the insulating layer 110 can be shortened by forming the insulating film 110b, which is deposited at the highest deposition rate, to be thick.

Here, the boundary between the insulating film 110a and the insulating film 110b and the boundary between the insulating film 110b and the insulating film 110c are sometimes unclear and thus are clearly shown by dashed lines in FIG. 6A and the like. Note that since the insulating film 110a and the insulating film 110b have different film densities, the boundary therebetween can be observed as a difference in contrast in a transmission electron microscopy (TEM) image or the like of a cross section of the insulating layer 110 in some cases. Similarly, the boundary between the insulating film 110b and the insulating film 110c can be observed as a difference in contrast in some cases.

It is preferable to use a metal oxide film having crystallinity as the semiconductor layer 108. For example, a metal oxide film having a CAAC (c-axis aligned crystal) structure, which is described later, a polycrystalline structure, a microcrystalline (nc) structure, or the like can be used. By using a metal oxide film having crystallinity as the semiconductor layer 108, the density of defect states in the semiconductor layer 108 can be reduced, whereby a semiconductor device with high reliability can be achieved.

As the semiconductor layer 108 has higher crystallinity, the density of defect states in the film can be lower. In contrast, by using a metal oxide film with low crystallinity, a transistor in which a large amount of current can flow can be achieved.

The crystallinity of the semiconductor layer 108 can be analyzed with X-ray diffraction (XRD), a transmission electron microscope (TEM), electron diffraction (ED), or the like.

In the case where the metal oxide film is deposited by a sputtering method, the crystallinity of the deposited metal oxide film can be increased as the substrate temperature (the stage temperature) at the time of deposition is higher. The crystallinity of the deposited metal oxide film can be increased as the proportion of a flow rate of an oxygen gas to the whole deposition gas (also referred to as oxygen flow rate ratio) used at the time of deposition is higher.

Structure Example 1-2

Figure 6B:
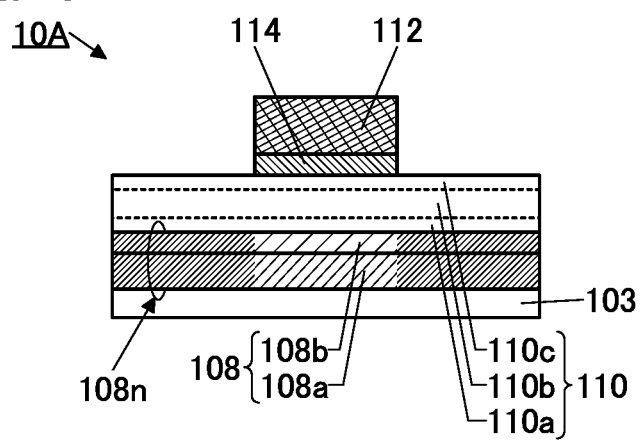

FIG. 6B is a schematic cross-sectional view of a transistor 10A. The transistor 10A is different from the transistor 10 mainly in the structure of the semiconductor layer 108.

The semiconductor layer 108 included in the transistor 10A has a stacked-layer structure in which a semiconductor layer 108a and a semiconductor layer 108b are stacked from the insulating film 103 side. The metal oxide film shown in Embodiment 1 is preferably used as each of the semiconductor layer 108a and the semiconductor layer 108b. Alternatively, the metal oxide film shown in Embodiment 1 is preferably used at least one of the semiconductor layer 108a and the semiconductor layer 108b.

Note that for simplicity, a low-resistance region included in the semiconductor layer 108a and a low-resistance region included in the semiconductor layer 108b are collectively referred to as the low-resistance regions 108n and denoted by the same hatching pattern. The semiconductor layer 108a and the semiconductor layer 108b actually differ in their compositions; therefore, the low-resistance regions 108n have different electric resistivities, carrier concentrations, amounts of oxygen vacancies, hydrogen concentrations, impurity concentrations, or the like in some cases.

The semiconductor layer 108b is in contact with a top surface of the semiconductor layer 108a and a bottom surface of the insulating film 110a. It is possible to use the metal oxide film that is shown in Embodiment 1 and can be used as the semiconductor layer 108 for the semiconductor layer 108b.

On the other hand, the semiconductor layer 108a can be formed using a metal oxide film that has a higher atomic ratio of the element M than the semiconductor layer 108b.

The element M has a higher bonding strength with oxygen than indium; therefore, when a metal oxide film having a high atomic ratio of the element M is used as the semiconductor layer 108a, oxygen vacancies are less likely to be formed. When many oxygen vacancies exist in the semiconductor layer 108a, the electrical characteristics and reliability of the transistor are reduced. Therefore, when a metal oxide film that has a higher atomic ratio of the element M than the semiconductor layer 108b is used as the semiconductor layer 108a, the transistor 10A with favorable electrical characteristics and high reliability can be achieved.

It is preferable to use, as the semiconductor layer 108a, a metal oxide film which includes a region having an atomic ratio of zinc equal to an atomic ratio of zinc in the semiconductor layer 108b or a region having an atomic ratio of zinc lower than an atomic ratio of zinc in the semiconductor layer 108b. When a metal oxide film in which oxygen vacancies are less likely to be generated is used as the semiconductor layer 108a, degradation in an NBTIS test can be reduced.

A metal oxide film that has a relatively high content percentage of the element M is used as the semiconductor layer 108a positioned on the insulating film 103 side in the transistor 10A shown in FIG. 6B, whereby oxygen vacancies in the semiconductor layer 108 are reduced. Furthermore, when a metal oxide film that has a low content percentage of the element M or does not contain the element M is used for the semiconductor layer 108b positioned on the insulating layer 110 side, the defect density of the interface between the semiconductor layer 108 and the insulating layer 110 is reduced, so that a transistor can achieve both extremely high electrical characteristics and extremely high reliability.

Here, the semiconductor layer 108b is preferably formed thinner than the semiconductor layer 108a. Even when the semiconductor layer 108b is as extremely thin as 0.5 nm or more and 10 nm or less, for example, the defect density of the interface with the insulating layer 110 can be reduced. In contrast, the semiconductor layer 108a in which oxygen vacancies are less likely to be generated is made to be relatively thick, whereby the transistor can have higher reliability.

For example, the thickness of the semiconductor layer 108a can be 1.5 to 20 times, preferably 2 to 15 times, further preferably 3 to 10 times the thickness of the semiconductor layer 108b. The thickness of the oxide semiconductor layer 108b is greater than or equal to 0.5 nm and less than or equal to 30 nm, preferably greater than or equal to 1 nm and less than or equal to 20 nm, further preferably greater than or equal to 2 nm and less than or equal to 10 nm.

It is preferable to use the above-described metal oxide film having crystallinity as each of the semiconductor layer 108a and the semiconductor layer 108b. A metal oxide film having high crystallinity or a metal oxide film having low crystallinity may be used as both the semiconductor layer 108a and the semiconductor layer 108b. Alternatively, the semiconductor layer 108a and the semiconductor layer 108b may have different crystallinities. For example, the semiconductor layer 108a may have higher crystallinity than the semiconductor layer 108b, or the semiconductor layer 108b may have higher crystallinity than the semiconductor layer 108a. The crystallinity of the metal oxide film used as each of the semiconductor layer 108a and the semiconductor layer 108b can be determined on the basis of the required electrical characteristics and reliability of the transistor and specifications of a deposition apparatus or the like.

Structure Example 1-3

Figure 7A:
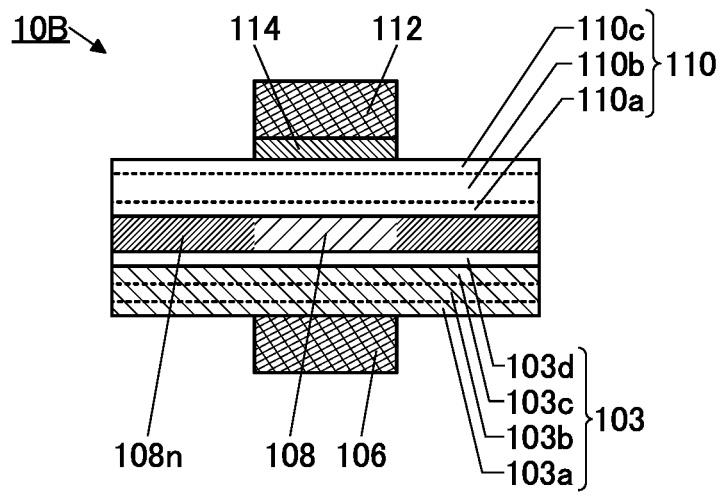
FIG. 7A and FIG. 7B each illustrate a structure example of a transistor.

FIG. 7A is a schematic cross-sectional view of a transistor 10B. The transistor 10B is different from the transistor 10 mainly in the structure of the insulating layer 103 and the existence of a conductive layer 106.

The conductive layer 106 includes a region overlapping with the semiconductor layer 108, the insulating layer 110, the metal oxide layer 114, and the conductive layer 112 with the insulating layer 103 therebetween. The conductive layer 106 functions as a first gate electrode (also referred to as a back gate electrode). The insulating layer 103 functions as a first gate insulating layer. In this case, the conductive layer 112 functions as a second gate electrode, and the insulating layer 110 functions as a second gate insulating layer.

For example, when the same potential is supplied to the conductive layer 112 and the conductive layer 106, the amount of current which can flow in the transistor 10B in an on state can be increased. In the transistor 10B, a potential for controlling the threshold voltage can be supplied to one of the conductive layer 112 and the conductive layer 106, and a potential for controlling an on/off state of the transistor 10B can be supplied to the other of the conductive layer 112 and the conductive layer 106.

The insulating layer 103 has a stacked-layer structure in which an insulating film 103a, an insulating film 103b, an insulating film 103c, and an insulating film 103d are stacked from the conductive layer 106 side. The insulating film 103a is in contact with the conductive layer 106. The insulating film 103d is in contact with the semiconductor layer 108.

The insulating layer 103 functioning as the second gate insulating layer preferably satisfies at least one of the following characteristics, further preferably satisfies all of the following characteristics: high withstand voltage, low stress, unlikeliness of releasing hydrogen and water, a small number of defects, and prevention of diffusion of metal elements contained in the conductive layer 106.

An insulating film containing nitrogen is preferably used as the insulating film 103a, the insulating film 103b, and the insulating film 103c positioned on the conductive layer 106 side among the four insulating films included in the insulating layer 103. Meanwhile, the insulating film 103d in contact with the semiconductor layer 108 is preferably formed using an insulating film containing oxygen. The four insulating films included in the insulating layer 103 are preferably formed successively without exposure to the air with a plasma CVD apparatus.

As each of the insulating film 103a, the insulating film 103b, and the insulating film 103c, an insulating film containing nitrogen such as a silicon nitride film, a silicon nitride oxide film, an aluminum nitride film, or a hafnium nitride film can be used. Furthermore, as the insulating film 103c, an insulating film that can be used as the insulating layer 110 can also be used.

The insulating layer 103a and the insulating layer 103c are preferably dense films that can prevent diffusion of impurities from below them. It is preferable that the insulating film 103a be able to block a metal element contained in the conductive layer 106 and that the insulating film 103c be able to block hydrogen and water contained in the insulating film 103b. Thus, an insulating film that is formed at a lower deposition rate than the insulating film 103b can be used as each of the insulating film 103a and the insulating film 103c.

In contrast, it is preferable that an insulating film having low stress and being deposited at a high deposition rate is used as the insulating film 103b. The insulating film 103b is preferably formed thicker than each of the insulating film 103a and the insulating film 103c.

For example, even in the case where silicon nitride films deposited by a plasma CVD method are used as the insulating film 103a, the insulating film 103b, and the insulating film 103c, the film density of the insulating film 103b is smaller than the film densities of the other two insulating films. Thus, in a transmission electron microscope image of a cross section of the insulating layer 103, difference in contrast can be observed in some cases. Note that the boundary between the insulating film 103a and the insulating film 103b and the boundary between the insulating film 103b and the insulating film 103c are sometimes unclear and thus are clearly shown by dashed lines in FIG. 7A and the like.

As the insulating film 103d in contact with the semiconductor layer 108, it is preferable to use a dense insulating film on a surface of which an impurity such as water is less likely to be adsorbed. In addition, it is preferable to use an insulating film which includes as few defects as possible and in which impurities such as water and hydrogen are reduced. For example, an insulating film similar to the insulating film 110c included in the insulating layer 110 can be used as the insulating film 103d.

Note that in the case where a metal film or an alloy film whose constituent element is less likely to be diffused into the insulating layer 103 is used as the conductive layer 106, a structure may be employed in which the insulating film 103a is not provided and the three insulating films of the insulating film 103b, the insulating film 103c, and the insulating film 103d are stacked.

With the insulating layer 103 having such a stacked-layer structure, the transistor can have extremely high reliability.

Structure Example 1-4

Figure 7B:
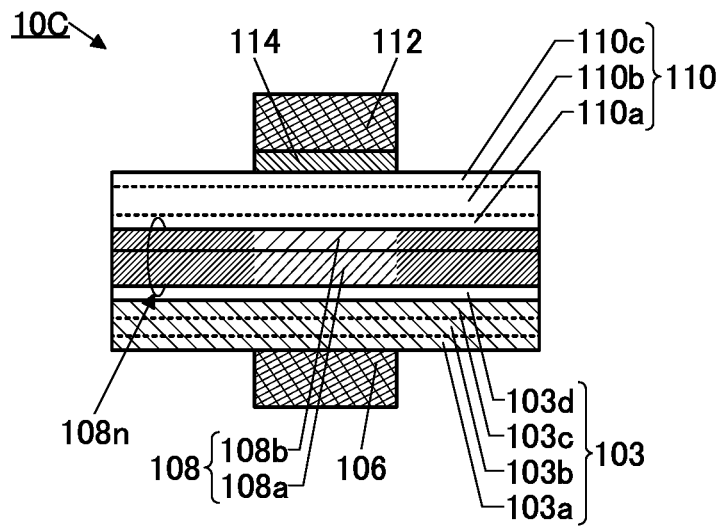

FIG. 7B is a schematic cross-sectional view of a transistor 10C. The transistor 10C is an example in which the conductive layer 106 and the insulating layer 103, which are exemplified in the transistor 10B described in Structure example 1-3, are added to the transistor 10A described in Structure example 1-2.

With such a structure, a transistor having favorable electrical characteristics and extremely high reliability can be achieved.

Structure Example 2

A more specific structure example of a transistor is described below.

Structure Example 2-1

Figure 8A:
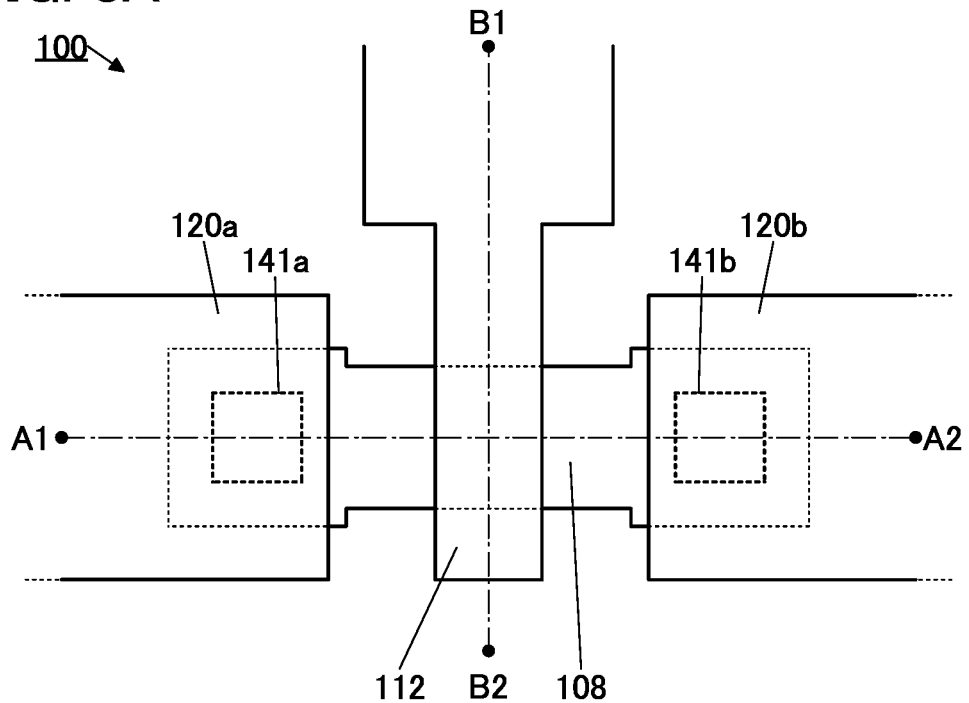
FIG. 8A is a top view of a transistor.
Figure 8B:
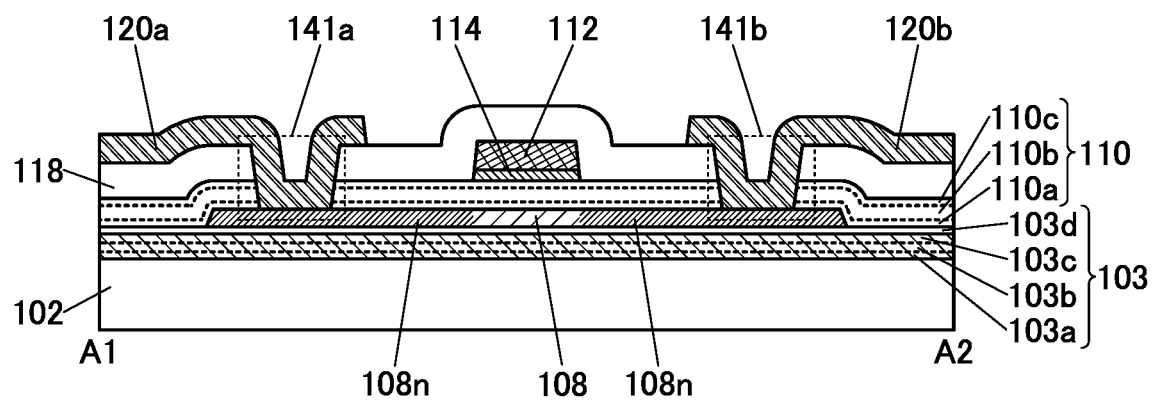
FIG. 8B and FIG. 8C are cross-sectional views of the transistor.
Figure 8C:
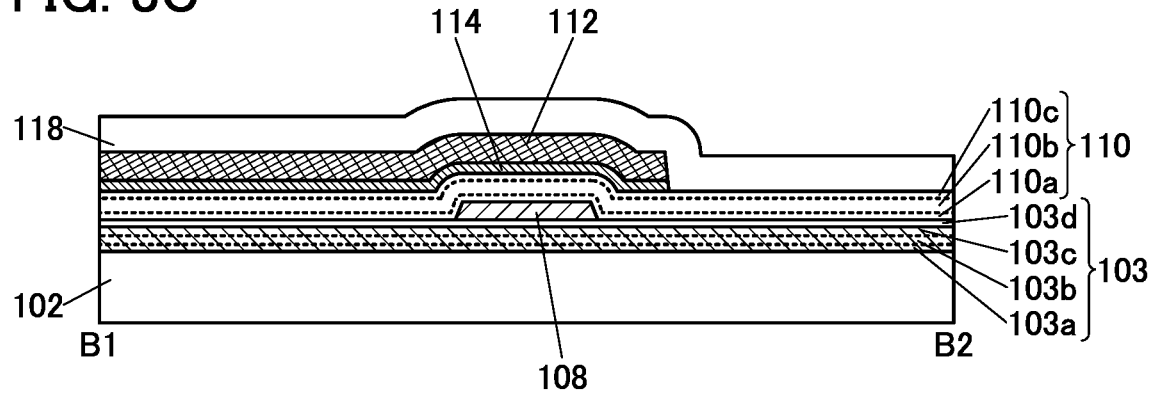

FIG. 8A is a top view of a transistor 100, FIG. 8B corresponds to a cross-sectional view of a cut plane along the dashed-dotted line A1-A2 shown in FIG. 8A, and FIG. 8C corresponds to a cross-sectional view of a cut plane along the dashed-dotted line B1-B2 shown in FIG. 8A. Note that in FIG. 8A, some components (e.g., a gate insulating layer) of the transistor 100 are not illustrated. In addition, the direction of the dashed-dotted line A1-A2 corresponds to the channel length direction, and the direction of the dashed-dotted line B1-B2 corresponds to the channel width direction. Furthermore, some components are not illustrated in top views of transistors in the following drawings, as in FIG. 8A.

The transistor 100 is provided over a substrate 102 and includes the insulating layer 103, the semiconductor layer 108, the insulating layer 110, the metal oxide layer 114, the conductive layer 112, an insulating layer 118, and the like. The semiconductor layer 108 having an island shape is provided over the insulating layer 103. The insulating layer 110 is provided in contact with a top surface of the insulating layer 103 and a top surface and a side surface of the semiconductor layer 108. The metal oxide layer 114 and the conductive layer 112 are provided to be stacked in this order over the insulating layer 110 and each include a portion overlapping the semiconductor layer 108. The insulating layer 118 is provided to cover a top surface of the insulating layer 110, a side surface of the metal oxide layer 114, and a top surface of the conductive layer 112.

The insulating layer 103 has a stacked-layer structure in which the insulating film 103a, the insulating film 103b, the insulating film 103c, and the insulating film 103d are stacked from the substrate 102 side. The insulating layer 110 has a stacked-layer structure in which the insulating film 110a, the insulating film 110b, and the insulating film 110c are stacked from the semiconductor layer 108 side.

As illustrated in FIG. 8A and FIG. 8B, the transistor 100 may include a conductive layer 120a and a conductive layer 120b over the insulating layer 118. The conductive layer 120a and the conductive layer 120b function as a source electrode or a drain electrode. The conductive layer 120a and the conductive layer 120b are electrically connected to the low-resistance regions 108n through an opening 141a and an opening 141b, respectively, which are provided in the insulating layer 118 and the insulating layer 110.

Part of the conductive layer 112 functions as a gate electrode. Part of the insulating layer 110 functions as a gate insulating layer. The transistor 100 is what is called a top-gate transistor, in which the gate electrode is provided over the semiconductor layer 108.

The conductive layer 112 and the metal oxide layer 114 are processed to have substantially the same top surface shapes.

Note that in this specification and the like, the expression "having substantially the same top surface shapes" means that at least outlines of stacked layers partly overlap with each other. For example, the case of processing an upper layer and a lower layer with use of the same mask pattern or mask patterns that are partly the same is included. However, in some cases, the outlines do not completely overlap with each other and the upper layer is positioned on an inner side of the lower layer or the upper layer is positioned on an outer side of the lower layer; such a case is also represented by the expression "the top-view shapes are substantially the same."

The metal oxide layer 114 positioned between the insulating layer 110 and the conductive layer 112 functions as a barrier film that prevents diffusion of oxygen contained in the insulating layer 110 to the conductive layer 112 side. The metal oxide layer 114 also functions as a barrier film that prevents diffusion of hydrogen and water contained in the conductive layer 112 to the insulating layer 110 side. The metal oxide layer 114 is preferably formed using, for example, a material that is less likely to transmit oxygen and hydrogen than at least the insulating layer 110.

Even in the case where a metal material that is likely to absorb oxygen, such as aluminum or copper, is used for the conductive layer 112, the metal oxide layer 114 can prevent diffusion of oxygen from the insulating layer 110 into the conductive layer 112. Furthermore, even in the case where the conductive layer 112 contains hydrogen, diffusion of hydrogen from the conductive layer 112 into the semiconductor layer 108 through the insulating layer 110 can be prevented. Consequently, carrier density in a channel formation region of the semiconductor layer 108 can be extremely low.

For the metal oxide layer 114, an insulating material or a conductive material can be used. When having an insulating property, the metal oxide layer 114 functions as part of the gate insulating layer. Meanwhile, when having conductivity, the metal oxide layer 114 functions as part of the gate electrode.

The metal oxide layer 114 is preferably formed using an insulating material with a higher permittivity than that of silicon oxide. It is particularly preferable to use an aluminum oxide film, a hafnium oxide film, a hafnium aluminate film, or the like, in which case the driving voltage can be reduced.

For the metal oxide layer 114, a conductive oxide such as indium oxide, indium tin oxide (ITO), or indium tin oxide containing silicon (ITSO) can also be used, for example. A conductive oxide containing indium is particularly preferable because of its high conductivity.

For the metal oxide layer 114, an oxide material containing one or more elements that are the same as those of the semiconductor layer 108 is preferably used. It is particularly preferable to use an oxide semiconductor material that can be used for the semiconductor layer 108. In that case, a metal oxide film formed using the same sputtering target as that for the semiconductor layer 108 is preferably used as the metal oxide layer 114 because an apparatus can be shared.

The metal oxide layer 114 is preferably formed using a sputtering apparatus. For example, in the case where an oxide film is formed using a sputtering apparatus, forming the oxide film in an atmosphere containing an oxygen gas can suitably supply oxygen into the insulating layer 110 or the semiconductor layer 108.

The semiconductor layer 108 includes a region overlapping with the conductive layer 112 and a pair of low-resistance regions 108n between which the region is sandwiched. A region of the semiconductor layer 108 that overlaps with the conductive layer 112 functions as a channel formation region of the transistor 100. Meanwhile, the low-resistance region 108n functions as a source region or a drain region of the transistor 100.

The low-resistance region 108n can be regarded as a region having lower resistance than the channel formation region, a region having a higher carrier concentration than the channel formation region, a region having a higher oxygen defect density than the channel formation region, a region having a higher impurity concentration than the channel formation region, or an n-type region.

The low-resistance region 108n of the semiconductor layer 108 is a region containing an impurity element. Examples of the impurity element are hydrogen, boron, carbon, nitrogen, fluorine, phosphorus, sulfur, arsenic, aluminum, a rare gas, or the like. Note that typical examples of a rare gas include helium, neon, argon, krypton, and xenon. In particular, boron or phosphorus is preferably included. Two or more of these elements may be contained.

As described later, treatment for adding the impurity to the low-resistance regions 108n can be performed through the insulating layer 110 using the conductive layer 112 as a mask.

It is preferable that the low-resistance regions 108n each include a region having an impurity concentration higher than or equal to $1\times10^{19}$ atoms/cm$^3$ and lower than or equal to $1\times10^{23}$ atoms/cm$^3$, preferably higher than or equal to $5\times10^{19}$ atoms/cm$^3$ and lower than or equal to $5\times10^{22}$ atoms/cm$^3$, further preferably higher than or equal to $1\times10^{20}$ atoms/cm$^3$ and lower than or equal to $1\times10^{22}$ atoms/cm$^3$.

The concentration of the impurity contained in the low-resistance regions 108n can be analyzed by an analysis method such as secondary ion mass spectrometry (SIMS) or X-ray photoelectron spectroscopy (XPS), for example. In the case of using XPS analysis, ion sputtering from the top surface side or the back surface side is combined with XPS analysis, whereby the concentration distribution in the depth direction can be found.

The impurity element preferably exists in an oxidized state in the low-resistance regions 108n. For example, it is preferable to use an element that is easily oxidized, such as boron, phosphorus, magnesium, aluminum, or silicon, as the impurity element. Since such an element that is easily oxidized can exist stably in an oxidized state by being bonded to oxygen in the semiconductor layer 108, the element can be inhibited from being released even when a high temperature (e.g., higher than or equal to 400° C., higher than or equal to 600° C., or higher than or equal to 800° C.) is applied in a later step. Furthermore, the impurity element takes oxygen in the semiconductor layer 108 away, and many oxygen vacancies are generated in the low-resistance regions 108n. The oxygen vacancies are bonded to hydrogen in a film to serve as carrier supply sources; thus, the low-resistance regions 108n are in an extremely low-resistance state.

For example, in the case where boron is used as the impurity element, boron contained in the low-resistance regions 108n can exist in a state of being bonded to oxygen. This can be confirmed when a spectrum peak attributed to a $B_2O_3$ bond is observed in XPS analysis. Furthermore, in XPS analysis, the intensity of a spectrum peak attributed to a state where a boron element exists alone is so low that the spectrum peak is not observed or is buried in background noise detected around the lower measurement limit.

The insulating layer 110 includes a region in contact with the channel formation region of the semiconductor layer 108, i.e., a region overlapping with the conductive layer 112. The insulating layer 110 further includes regions that are in contact with the low-resistance regions 108n of the semiconductor layer 108 and do not overlap with the conductive layer 112.

In some cases, the regions of the insulating layer 110, which overlap with the low-resistance regions 108n, contain the above impurity element. In this case, as in the low-resistance regions 108n, the impurity element in the insulating layer 110 preferably exists in a state of being bonded to oxygen. Since such an element that is easily oxidized can exist stably in a state of being bonded to oxygen in the insulating layer 110 to be oxidized, the element can be inhibited from being released even when a high temperature is applied in a later step. Furthermore, particularly in the case where oxygen (also referred to as excess oxygen) that might be released by heating is included in the insulating layer 110, excess oxygen and the impurity element are bonded to each other and stabilized, so that oxygen can be inhibited from being supplied from the insulating layer 110 to the low-resistance regions 108n. Furthermore, since oxygen is less likely to be diffused into part of the insulating layer 110 containing the oxidized impurity element, supply of oxygen to the low-resistance regions 108n from layers above the insulating layer 110 therethrough is suppressed and an increase in the resistance of the low-resistance regions 108n can also be prevented.

The insulating layer 118 functions as a protective layer protecting the transistor 100. For example, an inorganic insulating material such as an oxide or a nitride can be used for the insulating layer 110. More specifically, for example, an inorganic insulating material such as silicon oxide, silicon oxynitride, silicon nitride, silicon nitride oxide, aluminum oxide, aluminum oxynitride, aluminum nitride, hafnium oxide, or hafnium aluminate can be used.

Structure Example 2-2

Figure 9A:
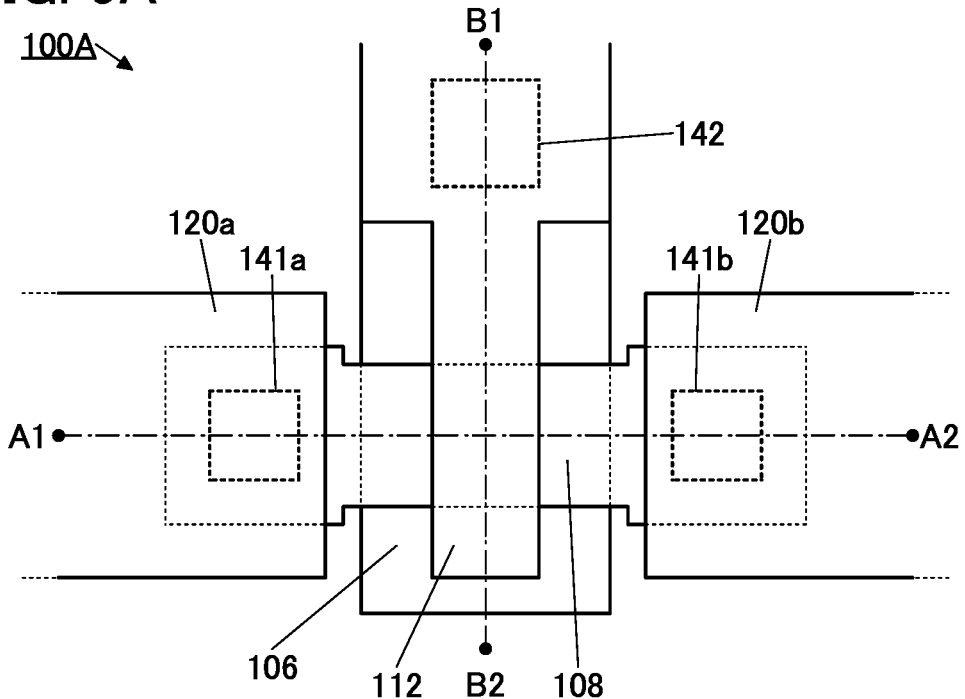
FIG. 9A is a top view of a transistor.
Figure 9B:
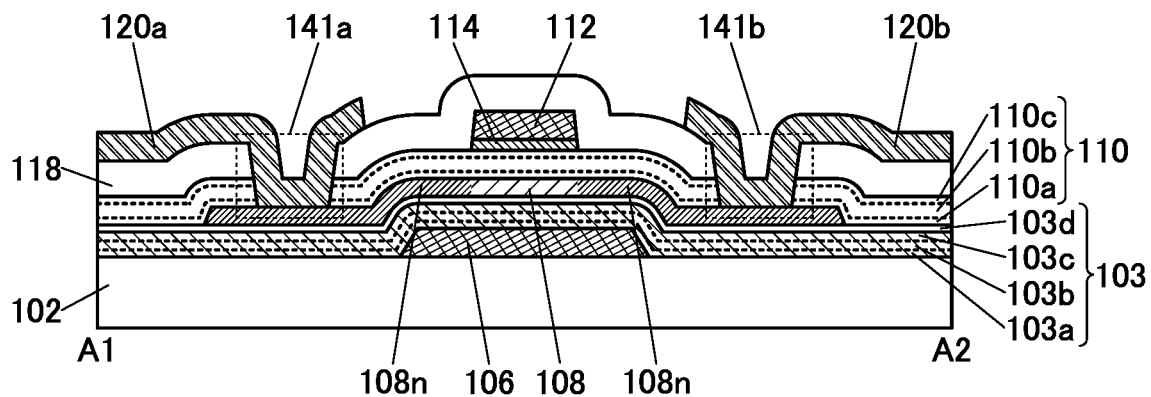
FIG. 9B and FIG. 9C are cross-sectional views of the transistor.
Figure 9C:
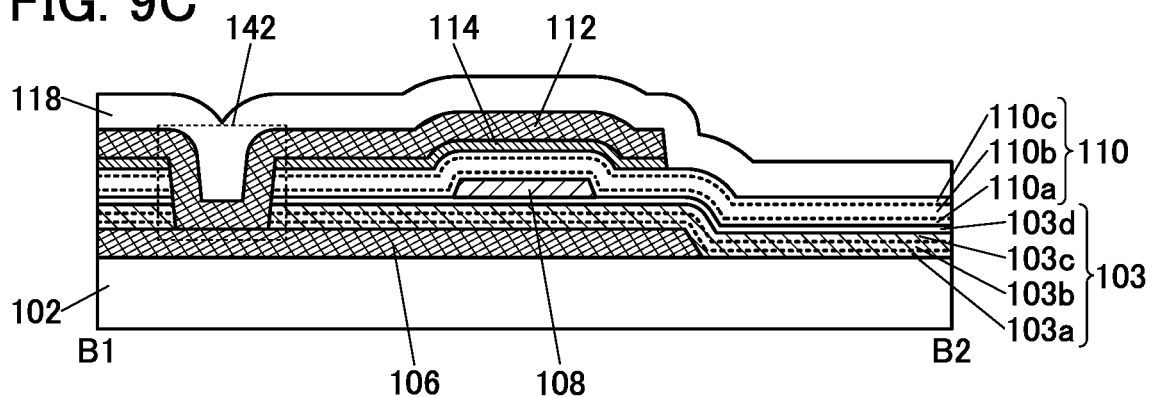

FIG. 9A is a top view of a transistor 100A, FIG. 9B is a cross-sectional view of the transistor 100A in the channel length direction, and FIG. 9C is a cross-sectional view of the transistor 100A in the channel width direction.

The transistor 100A is different from Structure example 2-1 mainly in including the conductive layer 106 between the substrate 102 and the insulating layer 103. The conductive layer 106 includes a region overlapping with the semiconductor layer 108 and the conductive layer 112.

In the transistor 100A, the conductive layer 112 has a function of a second gate electrode (also referred to as a top gate electrode), and the conductive layer 106 has a function of a first gate electrode (also referred to as a bottom gate electrode). In addition, part of the insulating layer 110 functions as a second gate insulating layer, and part of the insulating layer 103 functions as a first gate insulating layer.

A portion of the semiconductor layer 108 that overlaps with at least one of the conductive layer 112 and the conductive layer 106 functions as a channel formation region. Note that for easy explanation, a portion of the semiconductor layer 108 that overlaps with the conductive layer 112 is sometimes referred to as a channel formation region; however, a channel can also be actually formed in a portion not overlapping with the conductive layer 112 and overlapping with the conductive layer 106 (a portion including the low-resistance regions 108n).

As illustrated in FIG. 9C, the conductive layer 106 may be electrically connected to the conductive layer 112 through an opening 142 provided in the metal oxide layer 114, the insulating layer 110, and the insulating layer 103. In that case, the same potential can be supplied to the conductive layer 106 and the conductive layer 112.

For the conductive layer 106, a material similar to that for the conductive layer 112, the conductive layer 120a, or the conductive layer 120b can be used. Specifically, a material containing copper is preferably used for the conductive layer 106, in which case wiring resistance can be reduced.

As illustrated in FIG. 9A and FIG. 9C, the conductive layer 112 and the conductive layer 106 preferably extend beyond an end portion of the semiconductor layer 108 in the channel width direction. In that case, as illustrated in FIG. 9C, the semiconductor layer 108 in the channel width direction is entirely covered with the conductive layer 112 and the conductive layer 106 with the insulating layer 110 and the insulating layer 103 therebetween.

With such a structure, the semiconductor layer 108 can be electrically surrounded by electric fields generated by the pair of gate electrodes. At this time, it is particularly preferable that the same potential be applied to the conductive layer 106 and the conductive layer 112. In that case, electric fields for inducing a channel can be effectively applied to the semiconductor layer 108, whereby the on-state current of the transistor 100A can be increased. Thus, the transistor 100A can also be miniaturized.

Note that a structure in which the conductive layer 112 and the conductive layer 106 are not connected to each other may be employed. In that case, a constant potential may be supplied to one of the pair of gate electrodes, and a signal for driving the transistor 100A may be supplied to the other. In this case, the potential supplied to one of the gate electrodes enables control of the threshold voltage at the time of driving the transistor 100A with the other gate electrode.

Structure Example 2-3

Figure 10A:
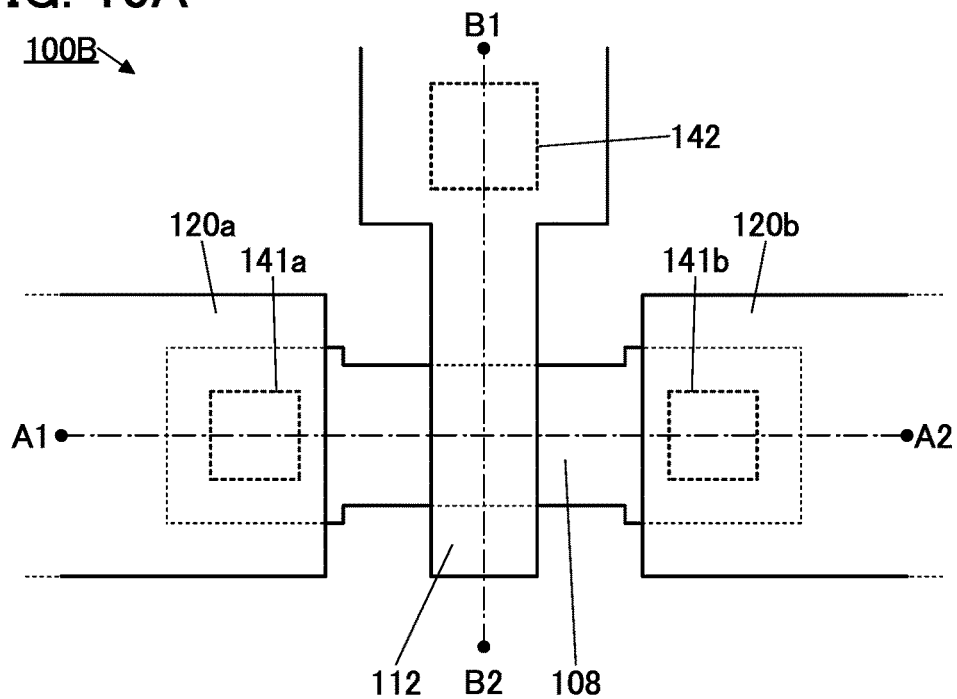
FIG. 10A is a top view of a transistor.
Figure 10B:
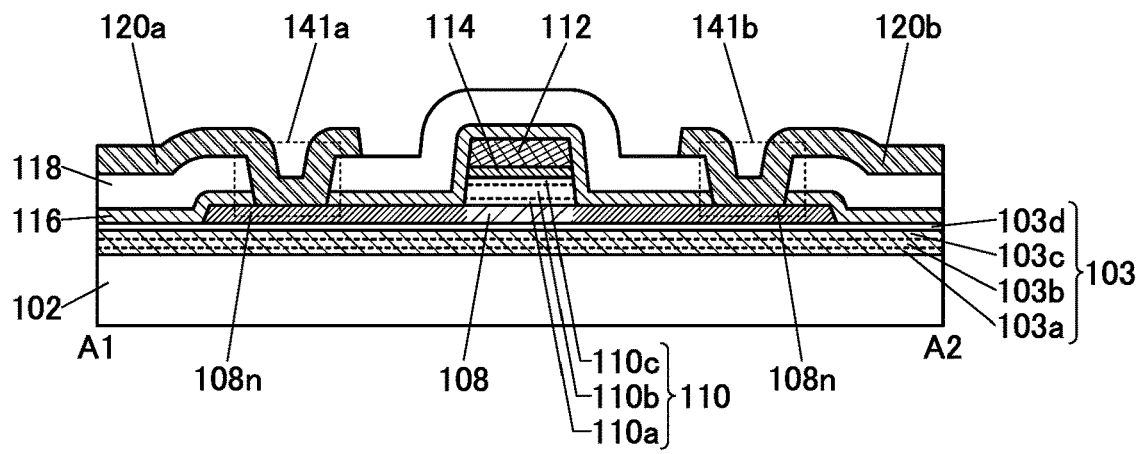
FIG. 10B and FIG. 10C are cross-sectional views of the transistor.
Figure 10C:
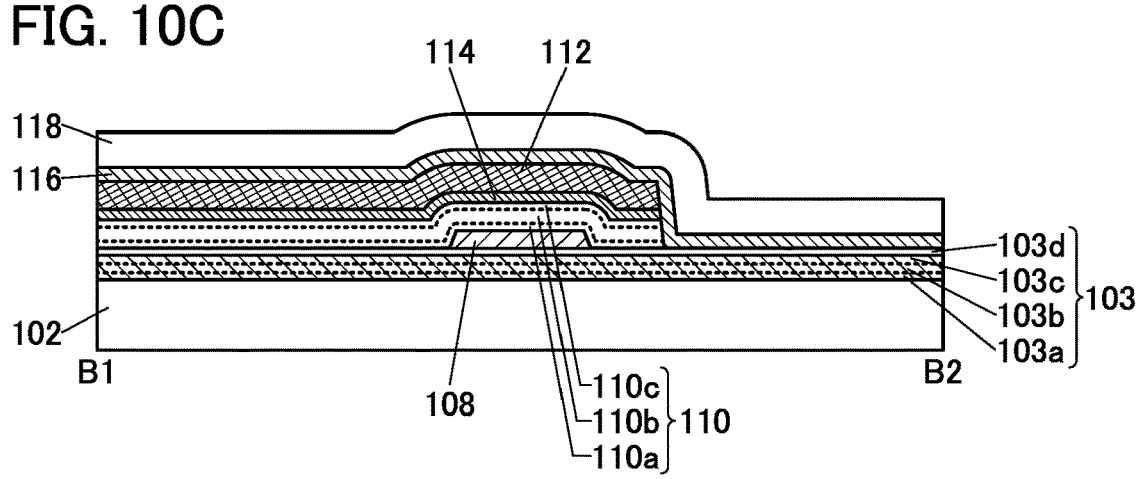

FIG. 10A is a top view of a transistor 100B, FIG. 10B is a cross-sectional view of the transistor 100B in the channel length direction, and FIG. 10C is a cross-sectional view of the transistor 100B in the channel width direction.

The transistor 100B is different from the transistor 100 described in Structure example 2-1 mainly in a structure of the insulating layer 110 and including an insulating layer 116.

The insulating layer 110 is processed to have substantially the same top surface shape as the conductive layer 112 and the metal oxide layer 114. The insulating layer 110 can be formed with use of a resist mask for processing the conductive layer 112 and the metal oxide layer 114, for example.

The insulating layer 116 is provided in contact with a top surface and a side surface of the semiconductor layer 108 which are not covered with the conductive layer 112, the metal oxide layer 114, and the insulating layer 110. The insulating layer 116 is provided to cover a top surface of the insulating layer 103, a side surface of the insulating layer 110, a side surface of the metal oxide layer 114, and a top surface and a side surface of the conductive layer 112.

The insulating layer 116 has a function of reducing the resistance of the low-resistance regions 108n. The insulating layer 116 can be formed using an insulating film which can supply impurities to the low-resistance regions 108n by performance of heating at the time of or after the deposition of the insulating layer 116. Alternatively, the insulating layer 116 can be formed using an insulating film that can cause generation of oxygen vacancies in the low-resistance regions 108n by performance of heating at the time of or after formation of the insulating layer 116.

For example, as the insulating layer 116, an insulating film functioning as a supply source that supplies impurities to the low-resistance regions 108n can be used. In that case, the insulating layer 116 is preferably a film from which hydrogen is released by heating. When such an insulating layer 116 is formed in contact with the semiconductor layer 108, impurities such as hydrogen can be supplied to the low-resistance regions 108n, so that the resistance of the low-resistance regions 108n can be reduced.

The insulating layer 116 is preferably a film deposited using a gas containing an impurity element such as hydrogen as a deposition gas used for the deposition. In addition, by decreasing the substrate temperature of the insulating layer 116, a large amount of impurity elements can be effectively supplied to the semiconductor layer 108. The substrate temperature of the insulating layer 116 is preferably higher than or equal to 200° C. and lower than or equal to 500° C., further preferably higher than or equal to 220° C. and lower than or equal to 450° C., still further preferably higher than or equal to 230° C. and lower than or equal to 430° C., yet still further preferably higher than or equal to 250° C. and lower than or equal to 400° C., for example.

When the insulating layer 116 is formed under a reduced pressure while heating is performed, release of oxygen from regions to be the low-resistance regions 108n in the semiconductor layer 108 can be promoted. When an impurity such as hydrogen is supplied to the semiconductor layer 108 where many oxygen vacancies are formed, the carrier concentration of the low-resistance regions 108n is increased, and the resistance of the low-resistance regions 108n can be lowered more effectively.

For the insulating layer 116, for example, an insulating film containing a nitride, such as silicon nitride, silicon nitride oxide, silicon oxynitride, aluminum nitride, or aluminum nitride oxide can be favorably used. In particular, because of having a blocking property against hydrogen and oxygen, silicon nitride can prevent both a diffusion of hydrogen from the outside into the semiconductor layer and a release of oxygen from the semiconductor layer to the outside, and thus a highly reliable transistor can be achieved.

The insulating layer 116 may be an insulating film having a function of absorbing oxygen in the semiconductor layer 108 and generating oxygen vacancies. It is particularly preferable to use a metal nitride such as aluminum nitride, for example, for the insulating layer 116.

In the case of using a metal nitride, it is preferable to use a nitride of aluminum, titanium, tantalum, tungsten, chromium, or ruthenium. In particular, aluminum or titanium is preferably included. For example, an aluminum nitride film formed by a reactive sputtering method using aluminum as a sputtering target and a nitrogen-including gas as a deposition gas can be a film having both an extremely high insulating property and an extremely high blocking property against hydrogen and oxygen when the flow rate of the nitrogen gas with respect to the total flow rate of the deposition gas is appropriately controlled. Thus, when such an insulating film including a metal nitride is provided in contact with the semiconductor layer, the resistance of the semiconductor layer can be lowered, and release of oxygen from the semiconductor layer and diffusion of hydrogen into the semiconductor layer can be favorably prevented.

In the case of using aluminum nitride as the metal nitride, the thickness of the insulating layer containing aluminum nitride is preferably 5 nm or more. A film with such a small thickness can have both a high blocking property against hydrogen and oxygen and a function of lowering the resistance of the semiconductor layer. Note that there is no upper limit of the thickness of the insulating layer; however, the thickness is preferably less than or equal to 500 nm, further preferably less than or equal to 200 nm, still further preferably less than or equal to 50 nm in consideration of productivity.

In the case of using an aluminum nitride film as the insulating layer 116, it is preferable to use a film that satisfies the composition formula $AlN_x$ (x is a real number greater than 0 and less than or equal to 2, and preferably, x is a real number greater than 0.5 and less than or equal to 1.5). In that case, a film having an excellent insulating property and high thermal conductivity can be obtained, and thus dissipation of heat generated in driving the transistor 100B can be increased.

Alternatively, an aluminum titanium nitride film, a titanium nitride film, or the like can be used as the insulating layer 116.

Such an insulating layer 116 is provided in contact with the low-resistance regions 108n, whereby the insulating layer 116 absorbs oxygen in the low-resistance regions 108n and oxygen vacancies can be formed in the low-resistance regions 108n. Furthermore, when heat treatment is performed after the insulating layer 116 is formed, a larger amount of oxygen vacancies can be formed in the low-resistance regions 108n, and a reduction in the resistance can be promoted. In the case where a film containing a metal oxide is used as the insulating layer 116, as the result of absorption of oxygen in the semiconductor layer 108 by the insulating layer 116, a layer containing an oxide of a metal element included in the insulating layer 116 (e.g., aluminum) may be formed between the insulating layer 116 and the low-resistance regions 108n.

Here, in the case where a metal oxide film containing indium is used as the semiconductor layer 108, a region where indium oxide is precipitated or a region having a high indium concentration is sometimes formed in the low-resistance region 108n in the vicinity of the interface with the insulating layer 116. Accordingly, the low-resistance regions 108n can have an extremely low resistance. Whether such a region exists can be observed by X-ray photoelectron spectroscopy (XPS), for example, in some cases.

Structure Example 2-4

Figure 11A:
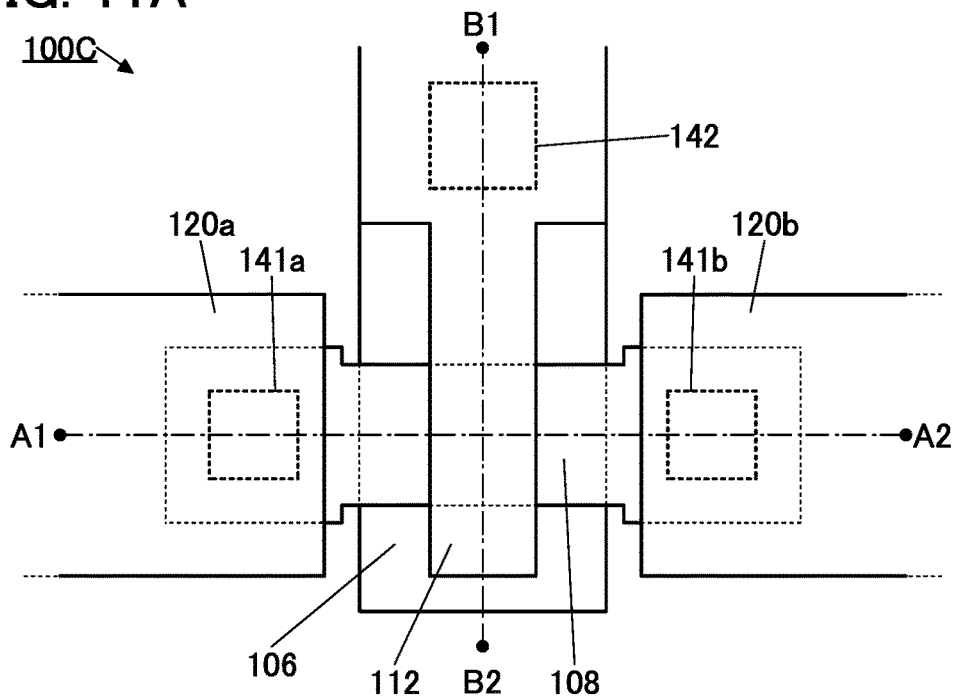
FIG. 11A is a top view of a transistor.
Figure 11B:
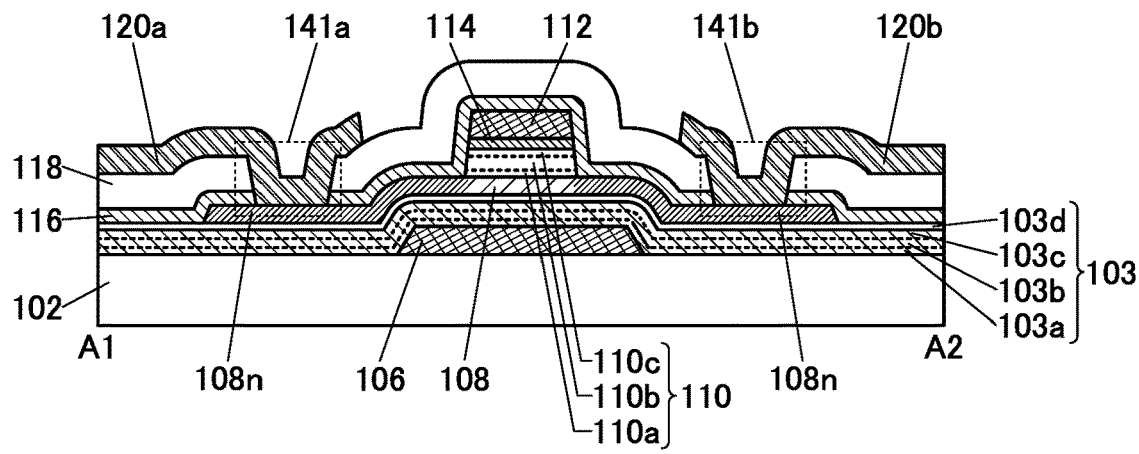
FIG. 11B and FIG. 11C are cross-sectional views of the transistor.
Figure 11C:
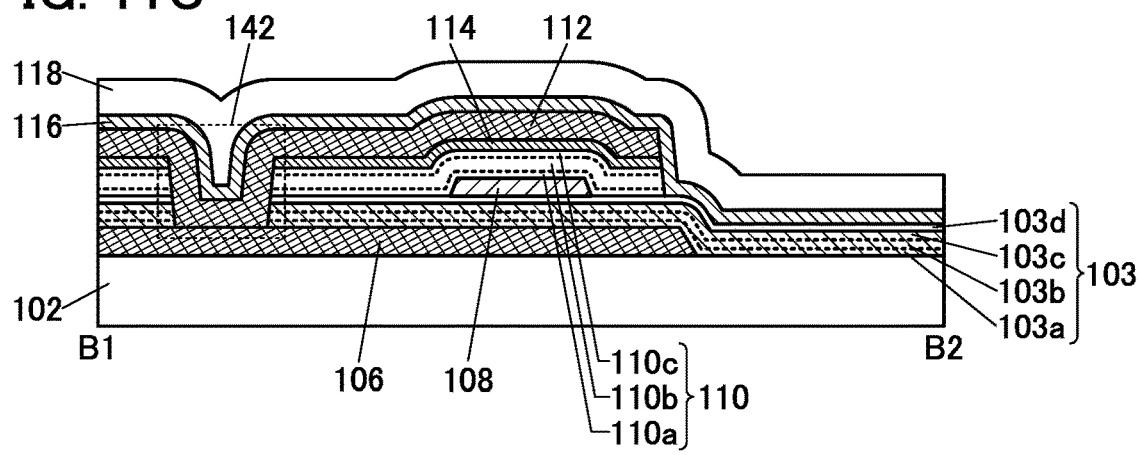

FIG. 11A is a top view of a transistor 100C, FIG. 11B is a cross-sectional view of the transistor 100C in the channel length direction, and FIG. 11C is a cross-sectional view of the transistor 100C in the channel width direction.

The transistor 100C is an example in which the transistor 100B described in Structure example 2-3 is provided with the conductive layer 106 described in Structure example 2-2 as functioning as the second gate electrode.

With such a structure, a transistor having high on-state current can be provided. Alternatively, a transistor whose threshold voltage is controllable can be provided.

Modification Example 1 of Structure Example 2

Although the semiconductor layer 108 is a single layer in Structure examples 2-1 to 2-4, the semiconductor layer 108 preferably has a stacked-layer structure in which the semiconductor layer 108a and the semiconductor layer 108b are stacked.

Figure 12A:
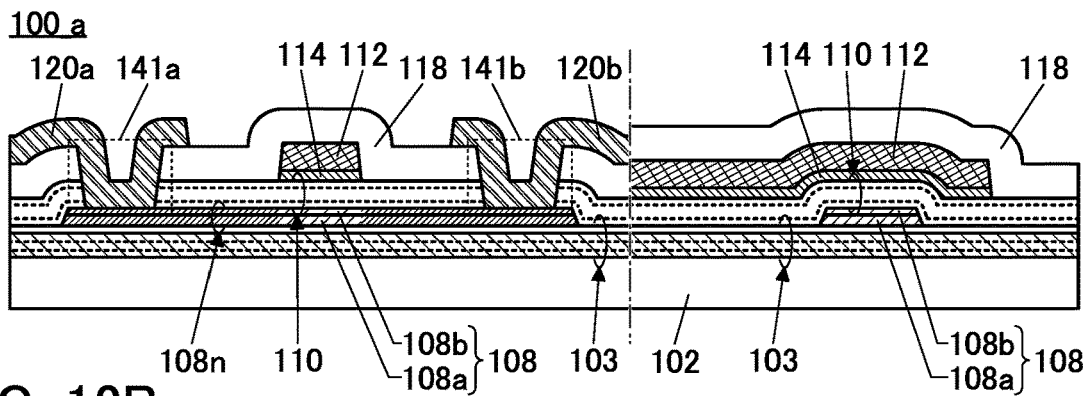
FIG. 12A, FIG. 12B, FIG. 12C, and FIG. 12D are cross-sectional views of transistors.

A transistor 100_a illustrated in FIG. 12A is an example in which the semiconductor layer 108 of the transistor 100 described in Structure example 2-1 has the stacked-layer structure. In FIG. 12A, a cross section in the channel length direction is shown on the left side of the dashed-dotted lines, and a cross section in the channel width direction is shown on the right side.

Figure 12B:
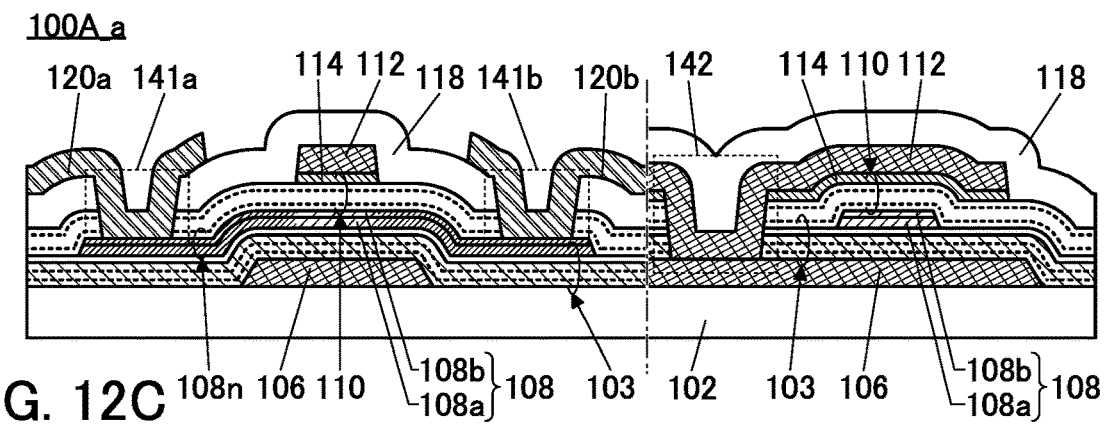
Figure 12C:
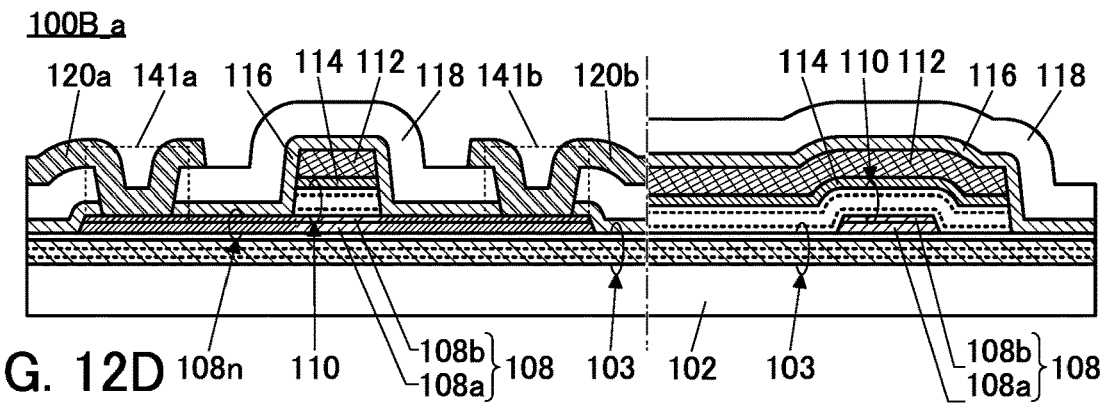
Figure 12D:
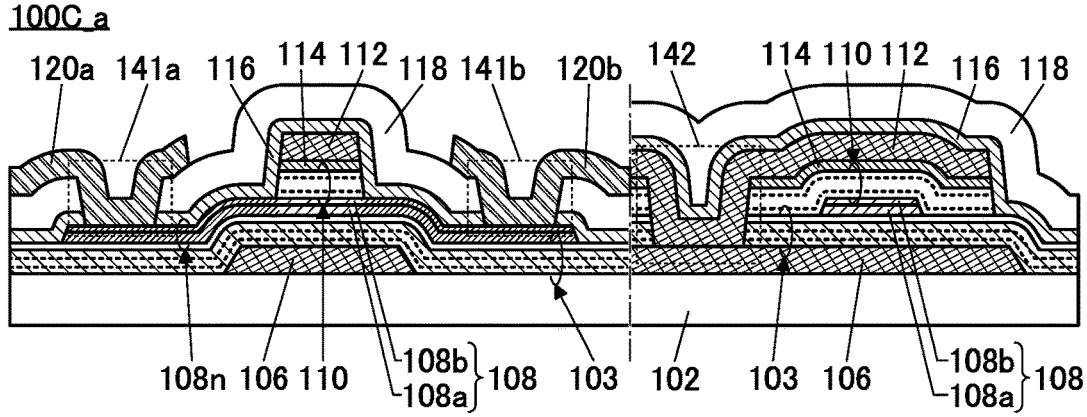

Similarly, a transistor 100A_a in FIG. 12B, a transistor 100B_a in FIG. 12C, and a transistor 100C_a in FIG. 12D are examples in which the semiconductor layers 108 of the transistor 100A, the transistor 100B, and the transistor 100C each have the stacked-layer structure.

Modification Example 2 of Structure Example 2

As described above, the metal oxide layer 114 positioned between the insulating layer 110 and the conductive layer 112 can be removed after oxygen is supplied to the insulating layer 110.

Figure 13A:
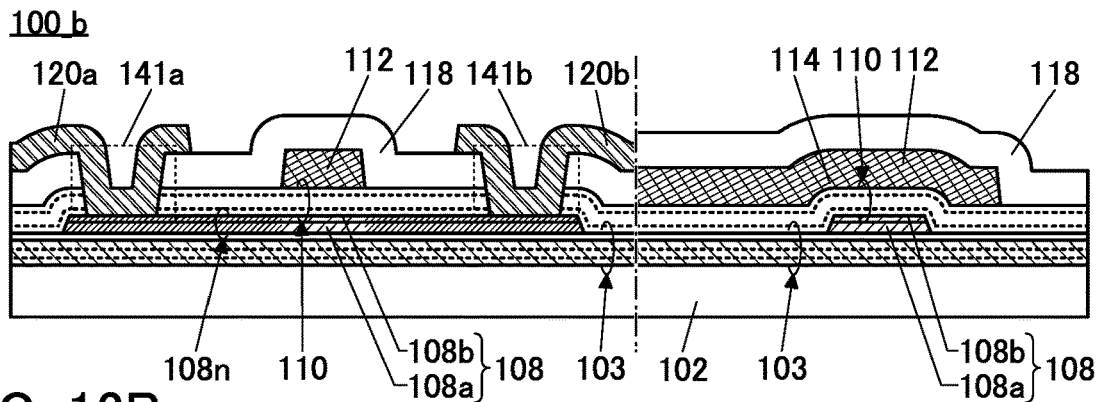
FIG. 13A, FIG. 13B, FIG. 13C, and FIG. 13D are cross-sectional views of transistors.

A transistor 100_b illustrated in FIG. 13A is an example in which the metal oxide layer 114 of the transistor 100_a in FIG. 12A is removed.

Figure 13B:
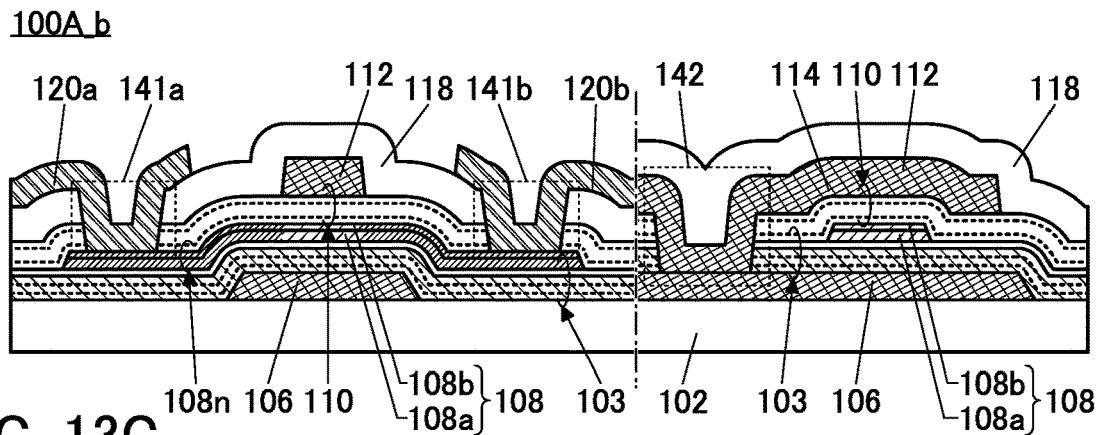
Figure 13C:
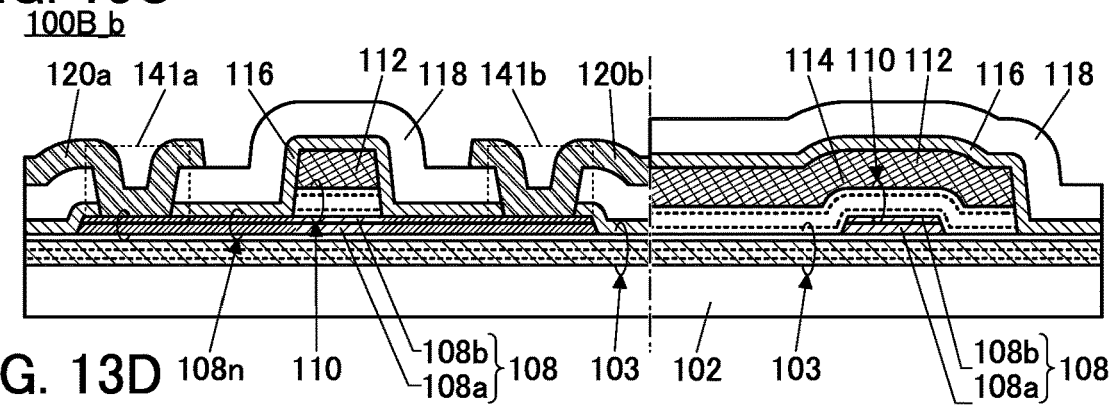
Figure 13D:
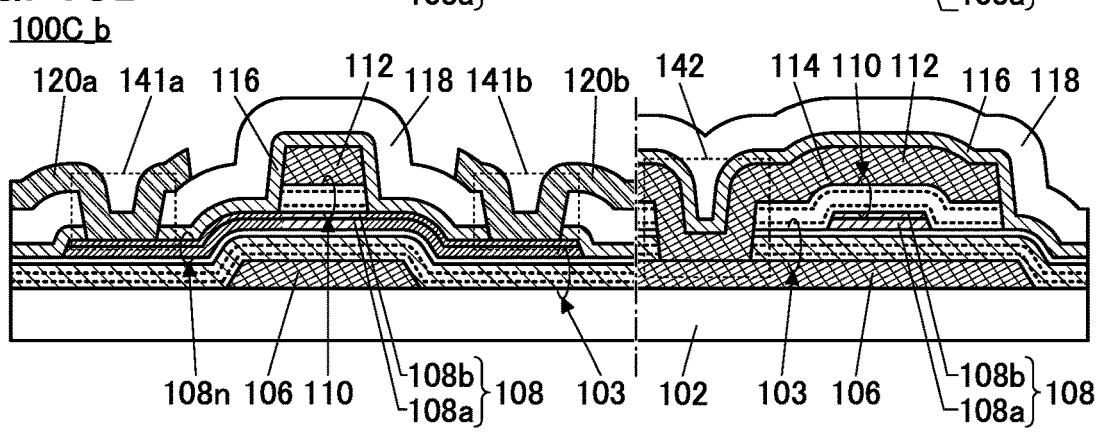

Similarly, a transistor 100A_b in FIG. 13B, a transistor 100B_b in FIG. 13C, and a transistor 100C_b in FIG. 13D are examples in which the metal oxide layers 114 of the transistor 100A_a, the transistor 100B_a, and the transistor 100C_a are removed.

Manufacturing Method Example 1

A manufacturing method example of a transistor of one embodiment of the present invention will be described below. Here, description will be made giving, as an example, the transistor 100A illustrated in Structure example 2-2.

Note that thin films that form the semiconductor device (insulating films, semiconductor films, conductive films, and the like) can be formed by a sputtering method, a chemical vapor deposition (CVD) method, a vacuum evaporation method, a pulsed laser deposition (PLD) method, an atomic layer deposition (ALD) method, or the like. Examples of the CVD method include a plasma-enhanced chemical vapor deposition (PECVD: Plasma Enhanced CVD) method and a thermal CVD method. As an example of the thermal CVD method, a metal organic chemical vapor deposition (MOCVD: Metal Organic CVD) method can be given.

The thin films that form the semiconductor device (insulating films, semiconductor films, conductive films, and the like) can be formed by a method such as spin coating, dipping, spray coating, ink-jetting, dispensing, screen printing, offset printing, a doctor knife, slit coating, roll coating, curtain coating, or knife coating.

When the thin films that form the semiconductor device are processed, a photolithography method or the like can be used for the processing. Besides, a nanoimprinting method, a sandblasting method, a lift-off method, or the like may be used for the processing of the thin films. Island-shaped thin films may be directly formed by a film formation method using a blocking mask such as a metal mask.

There are two typical examples of a photolithography method. In one of the methods, a resist mask is formed over a thin film that is to be processed, the thin film is processed by etching or the like, and the resist mask is removed. In the other method, after a photosensitive thin film is formed, exposure and development are performed, so that the thin film is processed into a desired shape.

For light used for exposure in a photolithography method, for example, an i-line (with a wavelength of 365 nm), a g-line (with a wavelength of 436 nm), an h-line (with a wavelength of 405 nm), or combined light of any of them can be used. Besides, ultraviolet light, KrF laser light, ArF laser light, or the like can be used. Exposure may be performed by liquid immersion exposure technique. Furthermore, as the light used for the exposure, extreme ultraviolet (EUV) light or X-rays may be used. Instead of the light used for the exposure, an electron beam can also be used. It is preferable to use extreme ultraviolet light, X-rays, or an electron beam because extremely minute processing can be performed. Note that in the case of performing exposure by scanning of a beam such as an electron beam, a photomask is not needed.

For etching of the thin film, a dry etching method, a wet etching method, a sandblast method, or the like can be used.

In each of drawings in FIG. 14 to FIG. 16, cross sections of the transistor 100A at one step in the manufacturing process, in the channel length direction and in the channel width direction, are arranged side by side.

[Formation of Conductive Layer 106]

Figure 14A:
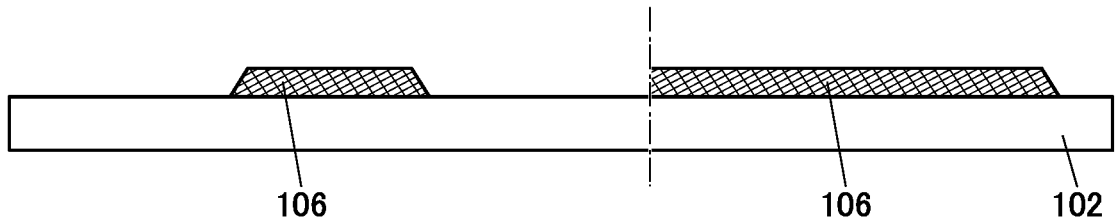
FIG. 14A, FIG. 14B, FIG. 14C, FIG. 14D, and FIG. 14E are diagrams illustrating a method for manufacturing a transistor.

A conductive film is deposited over the substrate 102 and processed by etching, whereby the conductive layer 106 functioning as a gate electrode is formed (FIG. 14A).

At this time, as illustrated in FIG. 14A, the conductive layer 106 is preferably processed so as to have an end portion with a tapered shape. In that case, the step coverage of the insulating layer 103 formed in the next step can be improved.

When a conductive film containing copper is used as the conductive film to be the conductive layer 106, wiring resistance can be reduced. For example, a conductive film containing copper is preferably used in the case of a large display device or a display device with a high resolution. Even in the case where a conductive film containing copper is used as the conductive layer 106, diffusion of copper to the semiconductor layer 108 side can be suppressed by the insulating layer 103, whereby a highly reliable transistor can be obtained.

[Formation of Insulating Layer 103]

Figure 14B:
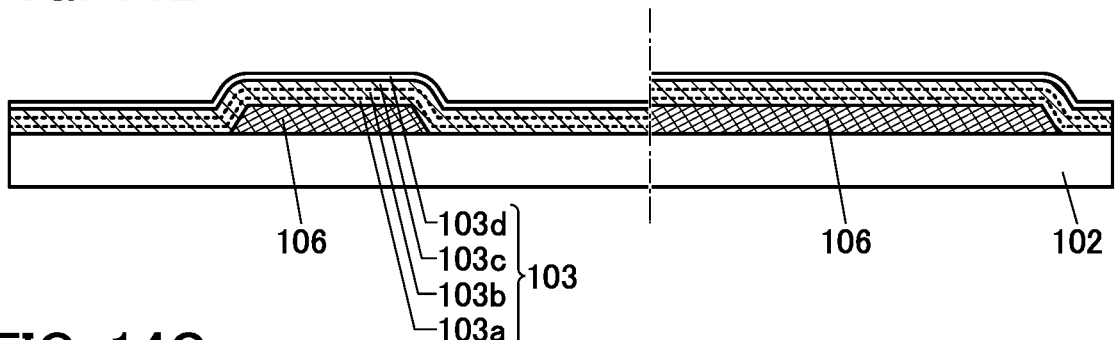

Then, the insulating layer 103 is formed to cover the substrate 102 and the conductive layer 106 (FIG. 14B). The insulating layer 103 can be formed by a PECVD method, an ALD method, a sputtering method, or the like.

Here, the insulating layer 103 is formed by stacking the insulating film 103a, the insulating film 103b, the insulating film 103c, and the insulating film 103d.

In particular, each of the insulating films included in the insulating layer 103 is preferably formed by a PECVD method. For the method for forming the insulating layer 103, the description in Structure example 1 can be referred to.

After the insulating layer 103 is formed, treatment for supplying oxygen to the insulating layer 103 may be performed. For example, plasma treatment, heat treatment, or the like in an oxygen atmosphere can be performed. Alternatively, oxygen may be supplied to the insulating layer 103 by a plasma ion doping method or an ion implantation method.

[Formation of Semiconductor Layer 108]

Figure 14C:
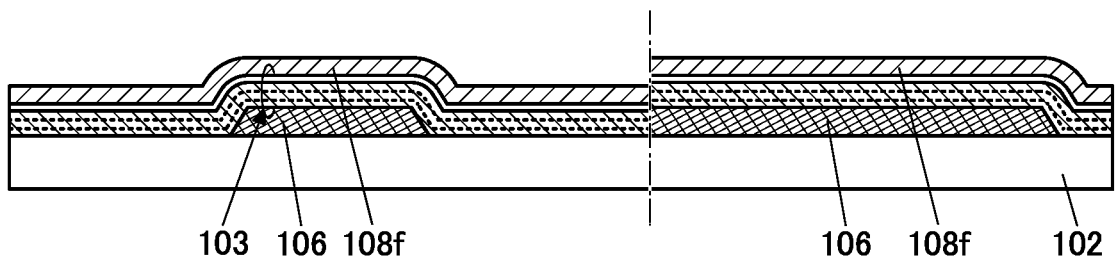

Next, a metal oxide film 108f is formed over the insulating layer 103 (FIG. 14C).

The metal oxide film 108f is preferably formed by a sputtering method using a metal oxide target.

The metal oxide film 108f is preferably a dense film with as few defects as possible. The metal oxide film 108f is preferably a highly purified film in which impurities such as hydrogen and water are reduced as much as possible. It is particularly preferable to use a metal oxide film having crystallinity as the metal oxide film 108f.

In addition, an oxygen gas and an inert gas (such as a helium gas, an argon gas, or a xenon gas) may be mixed in depositing the metal oxide film. When the oxygen flow rate ratio is higher, the crystallinity of the metal oxide film can be higher, and a highly reliable transistor can be obtained. In contrast, when the oxygen flow rate ratio is lower, the crystallinity of the metal oxide film is lower and a transistor with a higher on-state current can be obtained.

In depositing the metal oxide film, as the substrate temperature becomes higher, a denser metal oxide film having higher crystallinity can be formed. On the other hand, as the substrate temperature becomes lower, a metal oxide film having lower crystallinity and higher electric conductivity can be formed.

The metal oxide film is formed under the deposition conditions where the substrate temperature is higher than or equal to room temperature and lower than or equal to 250° C., preferably higher than or equal to room temperature and lower than or equal to 200° C., further preferably higher than or equal to room temperature and lower than or equal to 140° C. For example, when the substrate temperature is higher than or equal to room temperature and lower than 140° C., high productivity is achieved, which is preferable. When the metal oxide film is deposited with the substrate temperature set at room temperature or without intentional heating, the crystallinity can be made low.

It is preferable to perform any one or more of treatment for desorbing water, hydrogen, an organic component, or the like adsorbed onto a surface of the insulating layer 103 and treatment for supplying oxygen into the insulating layer 103 before deposition of the metal oxide film 108f. For example, heat treatment can be performed at a temperature higher than or equal to 70° C. and lower than or equal to 200° C. in a reduced-pressure atmosphere. Alternatively, plasma treatment may be performed in an oxygen-containing atmosphere. Alternatively, oxygen may be supplied to the insulating layer 103 by plasma treatment in an atmosphere containing an oxidizing gas such as dinitrogen monoxide ($N_2O$). When plasma treatment containing a dinitrogen monoxide gas is performed, an organic substance on the surface of the insulating layer 103 can be favorably removed. It is preferable that the metal oxide film 108f be deposited successively after such treatment, without exposure of the surface of the insulating layer 103 to the air.

Note that in the case where the semiconductor layer 108 has a stacked-layer structure in which a plurality of semiconductor layers are stacked, an upper metal oxide film is preferably formed successively after formation of a lower metal oxide film without exposure of the surface of the lower metal oxide layer to the air.

Figure 14D:
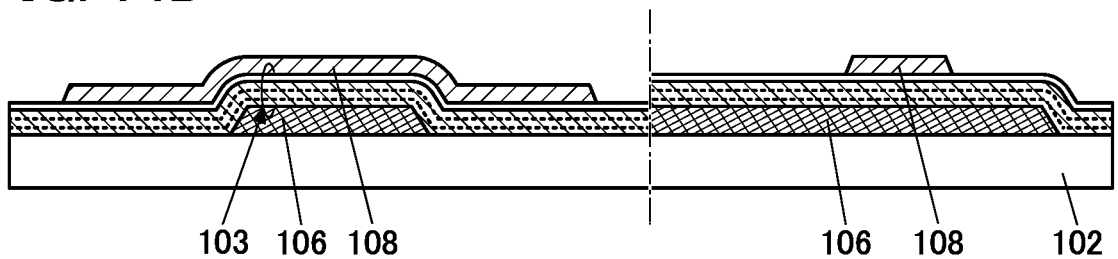

Next, the metal oxide film 108f is partly etched, so that the island-shaped semiconductor layer 108 is formed (FIG. 14D).

For processing of the metal oxide film 108f, either one or both of a wet etching method and a dry etching method are used. At this time of processing the metal oxide film 108f, part of the insulating layer 103 that does not overlap with the semiconductor layer 108 is etched and thinned in some cases. For example, in some cases, the insulating film 103d of the insulating layer 103 is removed by etching and the surface of the insulating film 103c is exposed.

Here, it is preferable that heat treatment be performed after the metal oxide film 108f is formed or processed into the semiconductor layer 108. By the heat treatment, hydrogen or water contained in the metal oxide film 108f or the semiconductor layer 108 or adsorbed on the surface of the metal oxide film 108f or the semiconductor layer 108 can be removed. Furthermore, the film quality of the metal oxide film 108f or the semiconductor layer 108 is improved (e.g., the number of defects is reduced or crystallinity is increased) by the heat treatment in some cases.

Furthermore, oxygen can be supplied from the insulating layer 103 to the metal oxide film 108f or the semiconductor layer 108 by heat treatment. At this time, it is further preferable that the heat treatment be performed before the metal oxide film 108f is processed into the semiconductor layer 108.

The temperature of the heat treatment can be typically higher than or equal to 150° C. and lower than the strain point of the substrate, higher than or equal to 200° C. and lower than or equal to 500° C., higher than or equal to 250° C. and lower than or equal to 450° C., or higher than or equal to 300° C. and lower than or equal to 450° C.

The heat treatment can be performed in an atmosphere containing a rare gas or nitrogen. Alternatively, heating may be performed in the atmosphere, and then heating may be performed in an oxygen-containing atmosphere. Alternatively, the heat treatment may be performed in a dry air atmosphere. It is preferable that the atmosphere of the above heat treatment contain hydrogen, water, or the like as little as possible. An electric furnace, an RTA (Rapid Thermal Anneal) apparatus, or the like can be used for the heat treatment. The use of the RTA apparatus can shorten the heat treatment time.

Note that the heat treatment is not necessarily performed. The heat treatment is not performed in this step, and instead heat treatment performed in a later step may also serve as the heat treatment in this step. In some cases, treatment at a high temperature (e.g., film formation step) or the like in a later step can serve as the heat treatment in this step.

[Formation of Insulating Layer 110]

Figure 14E:
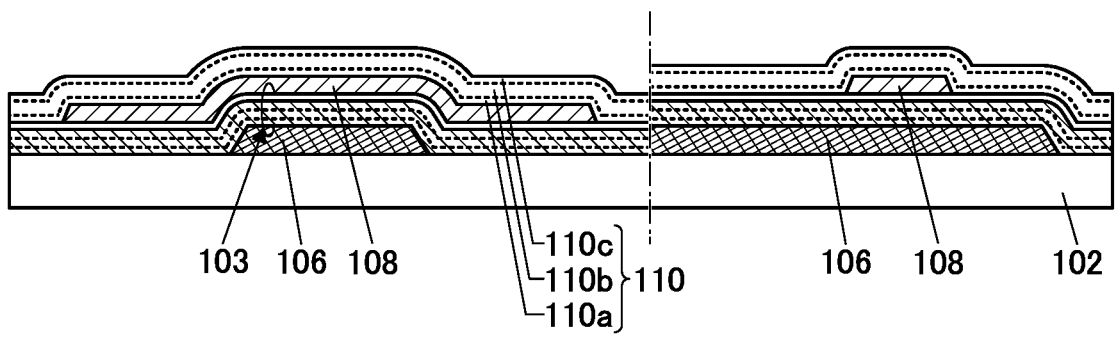

Next, the insulating layer 110 is formed to cover the insulating layer 103 and the semiconductor layer 108 (FIG. 14E).

Here, the insulating layer 110 is formed by stacking the insulating film 110a, the insulating film 110b, and the insulating film 110c in this order.

In particular, each of the insulating films included in the insulating layer 110 is preferably formed by a PECVD method. For the method for forming each of the insulating films included in the insulating layer 110, the description in Structure example 1 can be referred to.

It is preferable to perform plasma treatment on a surface of the semiconductor layer 108 before formation of the gate insulating layer 110. By the plasma treatment, impurities adsorbed onto the surface of the semiconductor layer 108, such as water, can be reduced. Therefore, impurities at the interface between the semiconductor layer 108 and the insulating layer 110 can be reduced, which enables the transistor to have high reliability. Performing the plasma treatment in this manner is particularly favorable in the case where the surface of the semiconductor layer 108 is exposed to the air after the formation of the semiconductor layer 108 and before the formation of the gate insulating layer 110. For example, plasma treatment can be performed in an atmosphere containing oxygen, ozone, nitrogen, dinitrogen monoxide, argon, or the like. The plasma treatment and the formation of the insulating layer 110 are preferably performed successively without exposure to the air.

After the insulating layer 110 is formed, heat treatment is preferably performed. By the heat treatment, hydrogen or water contained in the insulating layer 110 or adsorbed on its surface can be removed. At the same time, the number of defects in the insulating layer 110 can be reduced.

For the conditions of the heat treatment, the above description can be referred to.

Note that the heat treatment is not necessarily performed. The heat treatment is not performed in this step, and instead heat treatment performed in a later step may also serve as the heat treatment in this step. In some cases, treatment at a high temperature (e.g., film formation step) or the like in a later step can serve as the heat treatment in this step.

[Formation of Metal Oxide Film 114f]

Figure 15A:
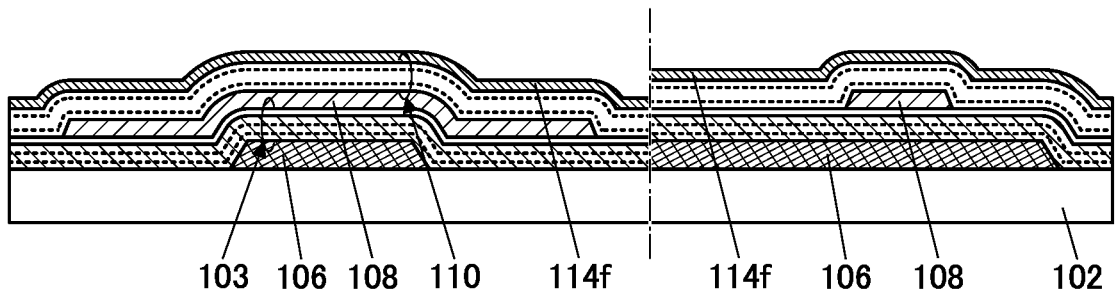
FIG. 15A, FIG. 15B, FIG. 15C, and FIG. 15D are diagrams illustrating a method for manufacturing a transistor.

Next, a metal oxide film 114f is formed over the insulating layer 110 (FIG. 15A).

The metal oxide film 114f is preferably formed in an oxygen-containing atmosphere, for example. It is particularly preferable that the metal oxide film 114f be deposited by a sputtering method in an oxygen-containing atmosphere. In that case, oxygen can be supplied to the insulating layer 110 at the time of forming the metal oxide film 114f.

The above description can be referred to for the case where the metal oxide film 114f is formed by a sputtering method using an oxide target containing a metal oxide as in the case of the semiconductor layer 108.

For example, as deposition conditions of the metal oxide film 114f, a metal oxide film may be formed by a reactive sputtering method with a metal target using oxygen as a deposition gas. When aluminum is used for the metal target, for example, an aluminum oxide film can be deposited.

At the time of depositing the metal oxide film 114f, the amount of oxygen supplied into the insulating layer 110 can be increased with a higher proportion of the oxygen flow rate to the total flow rate of the deposition gas introduced into a deposition chamber of a deposition apparatus (a higher oxygen flow rate ratio) or with higher oxygen partial pressure in the deposition chamber. The oxygen flow rate ratio or the oxygen partial pressure is, for example, higher than or equal to 50% and lower than or equal to 100%, preferably higher than or equal to 65% and lower than or equal to 100%, further preferably higher than or equal to 80% and lower than or equal to 100%, still further preferably higher than or equal to 90% and lower than or equal to 100%. It is particularly preferable that the oxygen flow rate ratio be 100% and the oxygen partial pressure in the deposition chamber be as close to 100% as possible.

When the metal oxide film 114f is deposited by a sputtering method in an oxygen-containing atmosphere in the above manner, oxygen can be supplied to the insulating layer 110 and release of oxygen from the insulating layer 110 can be prevented during the deposition of the metal oxide film 114f. As a result, an extremely large amount of oxygen can be enclosed in the insulating layer 110.

After the deposition of the metal oxide film 114f, heat treatment is preferably performed. By the heat treatment, oxygen contained in the insulating layer 110 can be supplied to the semiconductor layer 108. When the heat treatment is performed while the metal oxide film 114f covers the insulating layer 110, oxygen can be prevented from being released from the insulating layer 110 to the outside, and a large amount of oxygen can be supplied to the semiconductor layer 108. Thus, the amount of oxygen vacancies in the semiconductor layer 108 can be reduced, leading to a highly reliable transistor.

For the conditions of the heat treatment, the above description can be referred to.

Note that the heat treatment is not necessarily performed. The heat treatment is not performed in this step, and instead heat treatment performed in a later step may also serve as the heat treatment in this step. In some cases, treatment at a high temperature (e.g., film formation step) or the like in a later step can serve as the heat treatment in this step.

After formation of the metal oxide film 114f or the heat treatment, the metal oxide film 114f may be removed.

[Formation of Opening 142]

Figure 15B:
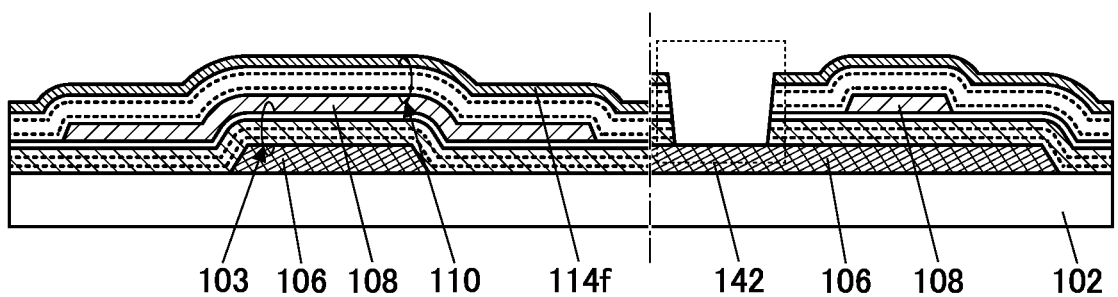

Next, parts of the metal oxide film 114f, the insulating layer 110, and the insulating layer 103 are etched to form the opening 142 reaching the conductive layer 106 (FIG. 15B). Accordingly, the conductive layer 112 to be formed later can be electrically connected to the conductive layer 106 through the opening 142.

[Formation of Conductive Layer 112 and Metal Oxide Layer 114]

Figure 15C:
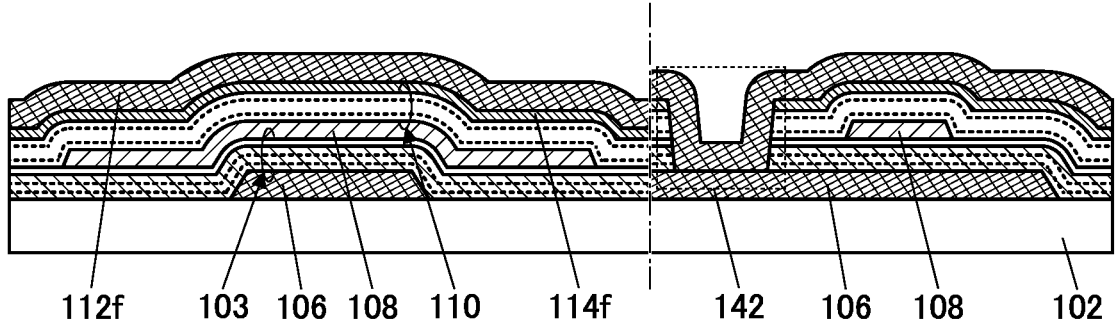

Next, a conductive film 112f to be the conductive layer 112 is deposited over the metal oxide film 114f (FIG. 15C).

For the conductive film 112f, a low-resistance metal or a low-resistance alloy material is preferably used. It is preferable that the conductive film 112f be formed using a material from which hydrogen is less likely to be released and in which hydrogen is less likely to be diffused. Furthermore, a material that is less likely to be oxidized is preferably used for the conductive film 112f.

For example, the conductive film 112f is preferably deposited by a sputtering method using a sputtering target containing a metal or an alloy.

For example, the conductive film 112f is preferably a stacked-layer film including a low-resistance conductive film and a conductive film which is less likely to be oxidized and in which hydrogen is less likely to be diffused.

Next, the conductive film 112f and the metal oxide film 114f are partly etched to form the conductive layer 112 and the metal oxide layer 114. The conductive film 112f and the metal oxide film 114f are preferably processed using the same resist mask. Alternatively, the metal oxide film 114f may be etched using the conductive layer 112 after etching as a hard mask.

In particular, a wet etching method is preferably employed for etching the conductive film 112f and the metal oxide film 114f.

In such a manner, the conductive layer 112 and the metal oxide layer 114 that have substantially the same top surface shapes can be formed.

As described above, the insulating layer 110 is not etched to make such a structure that the top surface and the side surface of the semiconductor layer 108 and the insulating layer 103 are covered, which prevents the semiconductor layer 108 and the insulating layer 103 from being partly etched and thinned in etching the conductive film 112f or the like.

[Treatment for Supplying Impurity Element]

Figure 15D:
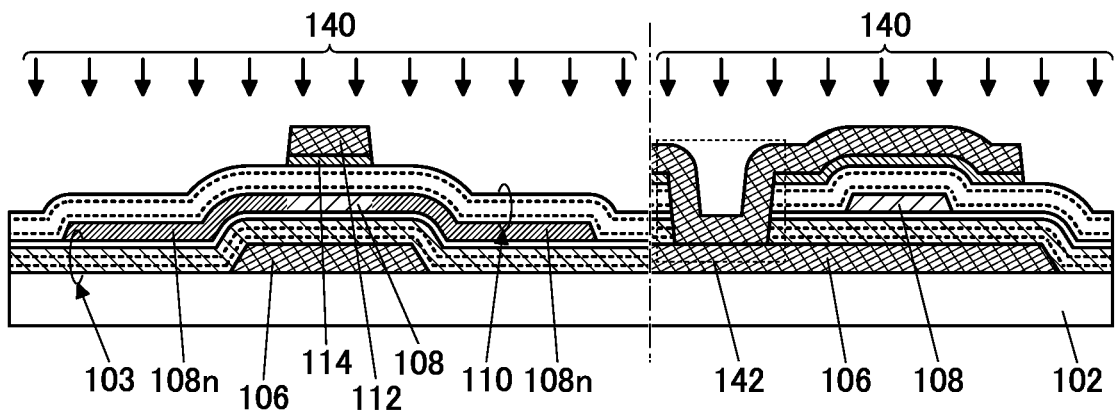

Next, treatment for supplying (adding or injecting) an impurity element 140 to the semiconductor layer 108 through the insulating layer 110 is performed with use of conductive layer 112 as a mask (FIG. 15D). Thus, the low-resistance regions 108n can be formed in regions of the semiconductor layer 108 that are not covered with the conductive layer 112. At this time, the region of the semiconductor layer 108 overlapping with the conductive layer 112 is not supplied with the impurity element 140 owing to the conductive layer 112 serving as the mask.

A plasma ion doping method or an ion implantation method can be suitably used for the supply of the impurity element 140. In these methods, the concentration profile in the depth direction can be controlled with high accuracy by the acceleration voltage and the dosage of ions, or the like. The use of a plasma ion doping method can increase productivity. In addition, the use of an ion implantation method with mass separation can increase the purity of an impurity element to be supplied.

In the treatment for supplying the impurity element 140, treatment conditions are preferably controlled such that the concentration is the highest at an interface between the semiconductor layer 108 and the insulating layer 110, a portion in the semiconductor layer 108 near the interface, or a portion in the insulating layer 110 near the interface. Accordingly, the impurity element 140 at an optimal concentration can be supplied to both the semiconductor layer 108 and the insulating layer 110 in one treatment.

Examples of the impurity element 140 include hydrogen, boron, carbon, nitrogen, fluorine, phosphorus, sulfur, arsenic, aluminum, magnesium, silicon, and a rare gas. Note that typical examples of a rare gas include helium, neon, argon, krypton, and xenon. It is particularly preferable to use boron, phosphorus, aluminum, magnesium, or silicon.

As a source gas of the impurity element 140, a gas containing any of the above impurity elements can be used. In the case where boron is supplied, typically, a $B_2H_6$ gas, a $BF_3$ gas, or the like can be used. In the case where phosphorus is supplied, typically, a $PH_3$ gas can be used. A mixed gas in which any of these source gases is diluted with a rare gas may be used.

Besides, any of $CH_4$, $N_2$, $NH_3$, $AlH_3$, $AlCl_3$, $SiH_4$, $Si_2H_6$, $F_2$, HF, $H_2$, $(C_5H_5)_2Mg$, a rare gas, and the like can be used as the source gas. An ion source is not limited to a gas, and a solid or a liquid that is vaporized by heating may be used.

Addition of the impurity element 140 can be controlled by setting the conditions such as the acceleration voltage and the dosage in consideration of the compositions, densities, thicknesses, and the like of the insulating layer 110 and the semiconductor layer 108.

For example, in the case where boron is added by an ion implantation method or a plasma ion doping method, the acceleration voltage can be, for example, higher than or equal to 5 kV and lower than or equal to 100 kV, preferably higher than or equal to 7 kV and lower than or equal to 70 kV, further preferably higher than or equal to 10 kV and lower than or equal to 50 kV. The dosage can be, for example, greater than or equal to $1 \times 10^{13}$ ions/cm$^2$ and less than or equal to $1 \times 10^{17}$ ions/cm$^2$, preferably greater than or equal to $1 \times 10^{14}$ ions/cm$^2$ and less than or equal to $5 \times 10^{16}$ ions/cm$^2$, further preferably greater than or equal to $1 \times 10^{15}$ ions/cm$^2$ and less than or equal to $3 \times 10^{16}$ ions/cm$^2$.

In the case where phosphorus ions are added by an ion implantation method or a plasma ion doping method, the acceleration voltage can be, for example, higher than or equal to 10 kV and lower than or equal to 100 kV, preferably higher than or equal to 30 kV and lower than or equal to 90 kV, further preferably higher than or equal to 40 kV and lower than or equal to 80 kV. The dosage can be, for example, greater than or equal to $1 \times 10^{13}$ ions/cm$^2$ and less than or equal to $1 \times 10^{17}$ ions/cm$^2$, preferably greater than or equal to $1 \times 10^{14}$ ions/cm$^2$ and less than or equal to $5 \times 10^{16}$ ions/cm$^2$, further preferably greater than or equal to $1 \times 10^{15}$ ions/cm$^2$ and less than or equal to $3 \times 10^{16}$ ions/cm$^2$.

Note that a method for supplying the impurity element 140 is not limited thereto; plasma treatment, treatment using thermal diffusion by heating, or the like may be used, for example. In a plasma treatment method, plasma is generated in a gas atmosphere containing an impurity element to be added and plasma treatment is performed, so that the impurity element can be added. A dry etching apparatus, an ashing apparatus, a plasma CVD apparatus, a high-density plasma CVD apparatus, or the like can be used as an apparatus for generating the plasma.

In one embodiment of the present invention, the impurity element 140 can be supplied to the semiconductor layer 108 through the insulating layer 110. Thus, even in the case where the semiconductor layer 108 has crystallinity, damage on the semiconductor layer 108 is reduced at the time of supplying the impurity element 140, and degradation of crystallinity can be inhibited. Therefore, this is suitable for the case where a reduction in crystallinity increases electrical resistance.

[Formation of Insulating Layer 118]

Figure 16A:
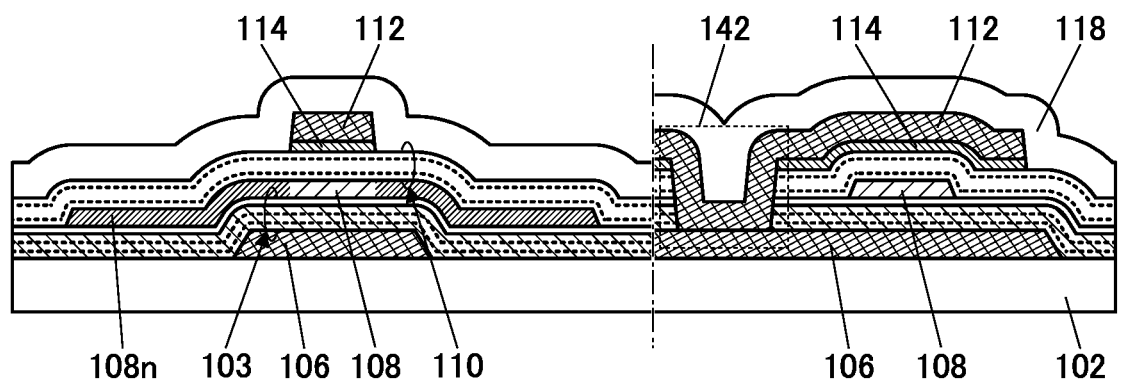
FIG. 16A and FIG. 16B are diagrams illustrating a method for manufacturing a transistor.

Next, the insulating layer 118 is formed to cover the insulating layer 110, the metal oxide layer 114, and the conductive layer 112 (FIG. 16A).

In the case where the insulating layer 118 is formed by a plasma CVD method, too high a substrate temperature might cause diffusion of the impurity contained in the low-resistance regions 108n and the like to a surrounding portion including the channel formation region of the semiconductor layer 108 or might increase the electric resistance of the low-resistance regions 108n. Therefore, the substrate temperature at the time of formation of the insulating layer 118 may be determined in consideration of these.

The substrate temperature of the insulating layer 118 is preferably higher than or equal to 150° C. and lower than or equal to 400° C., further preferably higher than or equal to 180° C. and lower than or equal to 360° C., still further preferably higher than or equal to 200° C. and lower than or equal to 250° C., for example. Formation of the insulating layer 118 at low temperatures enables the transistor to have favorable electrical characteristics even when it has a short channel length.

Heat treatment may be performed after the formation of the insulating layer 118. By the heat treatment, the low-resistance regions 108n can have low resistance more stably in some cases. For example, by the heat treatment, the impurity element 140 diffuses moderately and homogenized locally, so that the low-resistance regions 108n having an ideal concentration gradient of the impurity element can be formed. Note that when the temperature of the heat treatment is too high (e.g., higher than or equal to 500° C.), the impurity element 140 is also diffused into the channel formation region, so that the electrical characteristics or reliability of the transistor might be degraded.

For the conditions of the heat treatment, the above description can be referred to.

Note that the heat treatment is not necessarily performed. The heat treatment is not performed in this step, and instead heat treatment performed in a later step may also serve as the heat treatment in this step. In the case where treatment at a high temperature is performed in a later step (e.g., film formation step), such treatment can serve as the heat treatment in this step in some cases.

[Formation of Opening 141a and Opening 141b]

Next, the insulating layer 118 and the insulating layer 110 are partly etched, whereby the opening 141a and the opening 141b that reach the low-resistance regions 108n are formed.

[Formation of Conductive Layer 120a and Conductive Layer 120b]

Figure 16B:
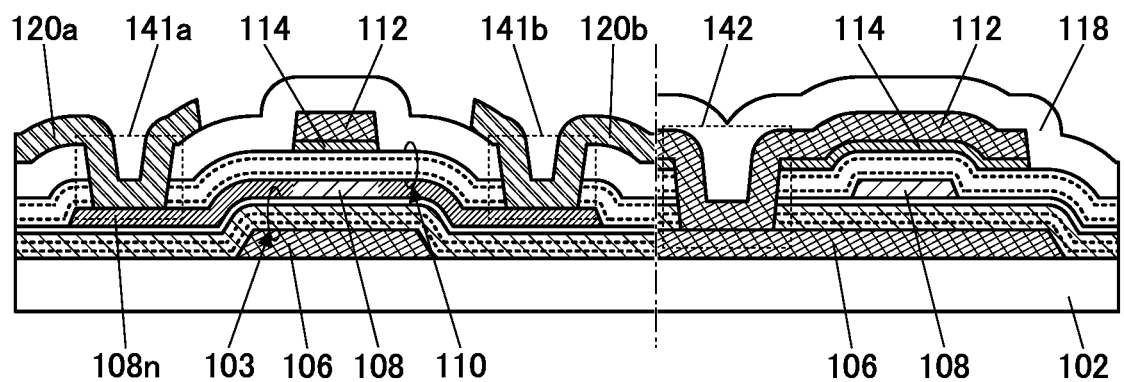

Next, a conductive film is deposited over the insulating layer 118 to cover the opening 141a and the opening 141b, and the conductive film is processed into a desired shape, so that the conductive layer 120a and the conductive layer 120b are formed (FIG. 16B).

Through the above process, the transistor 100A can be manufactured. In the case where the transistor 100A is used in a pixel of a display device, for example, this process may be followed by a step of forming one or more of a protective insulating layer, a planarization layer, a pixel electrode, and a wiring.

The above is the description of Manufacturing method example 1.

Note that in the case of manufacturing the transistor 100 shown in Structure example 1, the step of forming the conductive layer 106 and the step of forming the opening 142 in the above manufacturing method example 1 may be omitted. The transistor 100 and the transistor 100A can be formed over one substrate through the same process.

Manufacturing Method Example 2

An example that is partly different from the above manufacturing method example 1 will be described below. Here, the method is described using the transistor 100C, exemplified in the above structure example 2-4, as an example.

Note that description of the portions overlapping with the above manufacturing method example 1 is omitted and different portions will be described in detail.

Figure 17A:
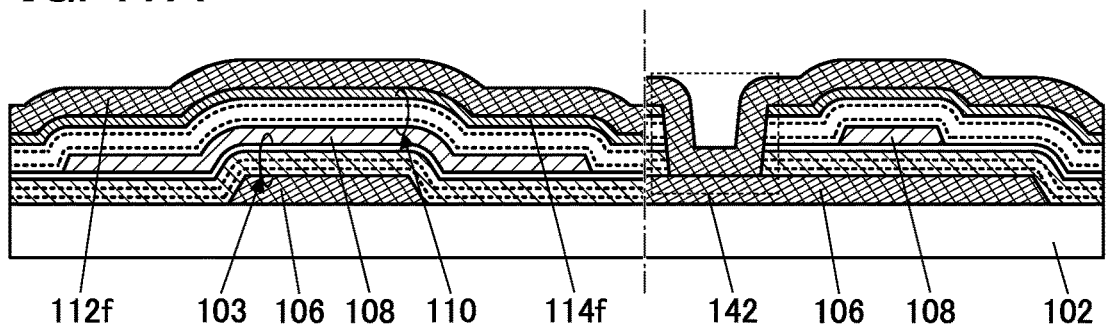
FIG. 17A, FIG. 17B, FIG. 17C, and FIG. 17D are diagrams illustrating a method for manufacturing a transistor.

First, as in Manufacturing method example 1, the conductive layer 106, the insulating layer 103, the semiconductor layer 108, the insulating layer 110, the metal oxide film 114f, and the conductive film 112f are sequentially formed. FIG. 17A is a cross-sectional view at this stage.

Figure 17B:
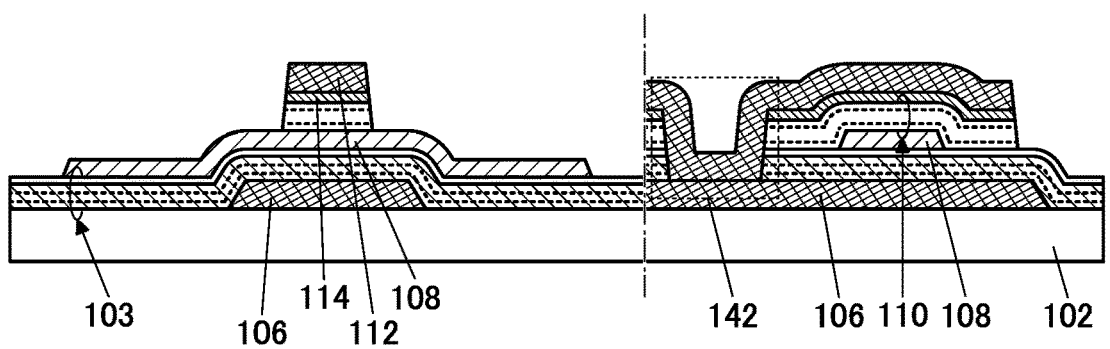

Next, the conductive film 112f and the metal oxide film 114f are partly etched to form the conductive layer 112 and the metal oxide layer 114, and the insulating layer 110 is partly etched so that part of the semiconductor layer 108 is exposed (FIG. 17B). In such a manner, the conductive layer 112, metal oxide layer 114, and insulating layer 110 that have substantially the same top surface shapes can be formed.

The insulating layer 110 is preferably etched using a resist mask for etching the conductive film 112f. The insulating layer 110 may be etched in the same step as the conductive film 112f and the metal oxide film 114f, or may be etched by a different etching method after the conductive film 112f and the metal oxide film 114f are etched.

For example, the conductive film 112f and the metal oxide film 114f are etched by a wet etching method using the same etchant, and then the insulating layer 110 can be etched by a dry etching method. In particular, when the conductive film 112f and the metal oxide film 114f are processed by a dry etching method, a generated reaction product containing a metal might lead to the contamination of the semiconductor layer 108 and the insulating layer 110. Therefore, before the insulating layer 110 is etched, the conductive film 112f and the metal oxide film 114f are preferably processed by a wet etching method.

Depending on the etching conditions, end portions of the conductive layer 112, the metal oxide layer 114, and the insulating layer 110 are not aligned with each other in some cases. For example, the end portion of at least one of the conductive layer 112 and the metal oxide layer 114 is positioned inside or outside the end portion of the insulating layer 110 in some cases.

In etching the insulating layer 110, part of the exposed semiconductor layer 108 is etched and thus thinned in some cases. In that case, the semiconductor layer 108 has a shape in which the low-resistance regions 108n are thinner than the channel formation region.

In addition, in etching the insulating layer 110, part of the insulating layer 103 that is not covered with the semiconductor layer 108 is etched and thus thinned in some cases. For example, the insulating film 103d of the insulating layer 103 might be removed.

Figure 17C:
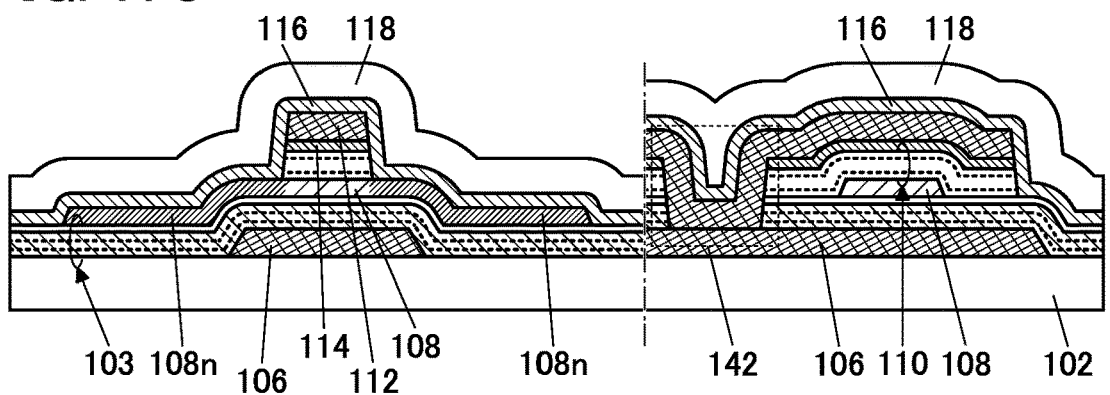

Next, the insulating layer 116 is formed in contact with the exposed portion of the semiconductor layer 108, and the insulating layer 118 is subsequently formed (FIG. 17C). By the formation of the insulating layer 116, the resistance of the exposed portion of the semiconductor layer 108 is reduced, so that the low-resistance region 108n is formed.

As the insulating layer 116, an insulating film that releases an impurity element having a function of reducing the resistance of the semiconductor layer 108 can be used. In particular, an inorganic insulating film that can release hydrogen, such as a silicon nitride film, a silicon nitride oxide film, or a silicon oxynitride film, is preferably used. Here, a plasma CVD method using a deposition gas containing hydrogen is preferably used because hydrogen can be supplied to the semiconductor layer 108 at the time of deposition of the insulating layer 116.

For example, in the case where silicon nitride is used for the insulating layer 116, the insulating layer 116 is preferably formed by a PECVD method using a mixed gas of a gas containing silicon, such as silane, and a gas containing nitrogen, such as ammonia or dinitrogen monoxide, as a deposition gas. In this case, it is preferable that the deposited silicon nitride contain hydrogen. Thus, hydrogen in the insulating layer 116 is diffused into the semiconductor layer 108, whereby the resistance of part of the semiconductor layer 108 can be easily reduced.

Alternatively, an insulating film having a function of generating oxygen vacancies in the semiconductor layer 108 can be used as the insulating layer 116. It is particularly preferable to use an insulating film containing a metal nitride. For example, it is preferable to form the insulating layer 116 by a reactive sputtering method using a sputtering target containing metal and, as a deposition gas, a mixed gas of a nitrogen gas and a rare gas or the like that is a dilution gas. Thus, the film quality of the insulating layer 116 can be easily controlled by controlling the flow rate ratio of the deposition gas.

For example, in the case where an aluminum nitride film formed by reactive sputtering using an aluminum target is used as the insulating layer 116, the flow rate of a nitrogen gas to the total flow rate of the deposition gas is preferably higher than or equal to 30% and lower than or equal to 100%, further preferably higher than or equal to 40% and lower than or equal to 100%, still further preferably higher than or equal to 50% and lower than or equal to 100%.

Here, the insulating layer 116 and the insulating layer 118 are preferably deposited successively without exposure to the air.

Heat treatment may be performed after the deposition of the insulating layer 116 or the deposition of the insulating layer 118. The heat treatment can promote the reduction in the low-resistance resistance of the region 108n.

For the conditions of the heat treatment, the above description can be referred to.

Note that the heat treatment is not necessarily performed. The heat treatment is not performed in this step, and instead heat treatment performed in a later step may also serve as the heat treatment in this step. In some cases, treatment at a high temperature (e.g., film formation step) or the like in a later step can serve as the heat treatment in this step.

Next, in the insulating layer 118 and the insulating layer 116, the opening 141a and the opening 141b that reach the low-resistance regions 108n are formed.

Figure 17D:
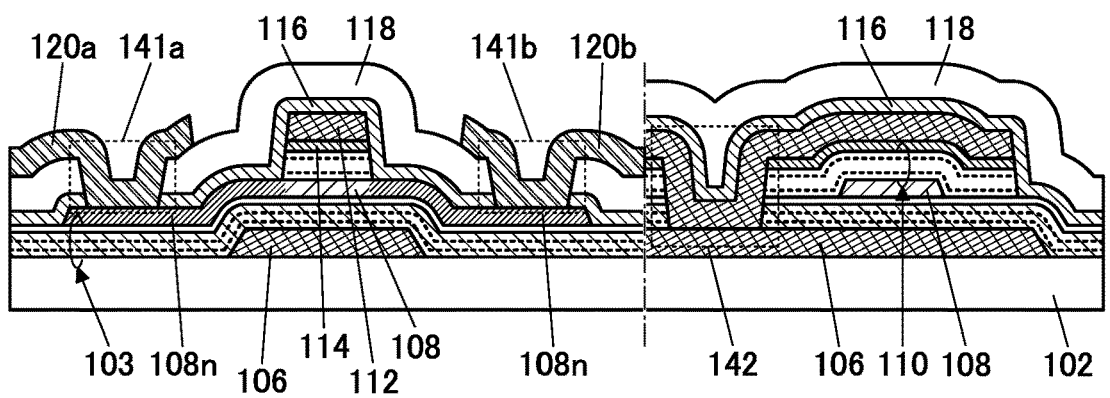

Next, as in Manufacturing method example 1, the conductive layer 120a and the conductive layer 120b are formed over the insulating layer 118 (FIG. 17D).

Through the above steps, the transistor 100C can be manufactured.

Note that in the case of manufacturing the transistor 100B shown in Structure example 2-3, the step of forming the conductive layer 106 and the step of forming the opening 142 in the above manufacturing method example 2 may be omitted. The transistor 100B and the transistor 100C can be formed over one substrate through the same process.

<Component in Semiconductor Device>

Components included in the semiconductor device of this embodiment will be described below.

[Substrate]

Although there is no particular limitation on a material and the like of the substrate 102, it is necessary that the substrate have heat resistance high enough to withstand at least heat treatment performed later. For example, a single crystal semiconductor substrate or a polycrystalline semiconductor substrate including silicon or silicon carbide as a material, a compound semiconductor substrate of silicon germanium or the like, an SOI substrate, a glass substrate, a ceramic substrate, a quartz substrate, a sapphire substrate, or the like may be used as the substrate 102. Alternatively, any of these substrates on which a semiconductor element is provided may be used as the substrate 102.

A flexible substrate may be used as the substrate 102, and the semiconductor device may be formed directly on the flexible substrate. A separation layer may be provided between the substrate 102 and the semiconductor device. The separation layer can be used when part or the whole of a semiconductor device completed thereover is separated from the substrate 102 and transferred onto another substrate. In that case, the semiconductor device can be transferred to even a substrate having low heat resistance or a flexible substrate.

[Conductive Film]

The conductive layer 112 and the conductive layer 106 functioning as gate electrodes, the conductive layer 120a functioning as one of a source electrode and a drain electrode, and the conductive layer 120b functioning as the other electrode can each be formed using a metal element selected from chromium, copper, aluminum, gold, silver, zinc, molybdenum, tantalum, titanium, tungsten, manganese, nickel, iron, and cobalt; an alloy containing any of these metal elements as its component; an alloy including a combination of any of these metal elements; or the like.

An oxide conductor or a metal oxide film such as an In—Sn oxide, an In—W oxide, an In—W—Zn oxide, an In—Ti oxide, an In—Ti—Sn oxide, an In—Zn oxide, an In—Sn—Si oxide, or an In—Ga—Zn oxide can also be applied to each of the conductive layer 112, the conductive layer 106, the conductive layer 120a, and the conductive layer 120b.

Here, an oxide conductor (OC) is described. For example, when oxygen vacancies are formed in a metal oxide having semiconductor characteristics and hydrogen is added to the oxygen vacancies, a donor level is formed in the vicinity of the conduction band. As a result, the conductivity of the metal oxide is increased, so that the metal oxide becomes a conductor. The metal oxide having become a conductor can be referred to as an oxide conductor.

In addition, the conductive layer 112 or the like may have a stacked-layer structure of a conductive film containing the oxide conductor (the metal oxide) and a conductive film containing a metal or an alloy. The use of the conductive film containing a metal or an alloy can reduce the wiring resistance. At this time, a conductive film containing an oxide conductor is preferably used as the conductive film on the side in contact with the insulating layer functioning as a gate insulating film.

Furthermore, among the above metal elements, it is particularly preferable that any one or more metal elements selected from titanium, tungsten, tantalum, and molybdenum be included in the conductive layer 112, the conductive layer 106, the conductive layer 120a, and the conductive layer 120b. It is particularly preferable to use a tantalum nitride film. The tantalum nitride film has conductivity and a high barrier property against copper, oxygen, or hydrogen and releases little hydrogen from itself; thus, the tantalum nitride film can be suitably used as a conductive film in contact with the semiconductor layer 108 or a conductive film near the semiconductor layer 108.

[Semiconductor Layer]

In the case where the semiconductor layer 108 is an In-M-Zn oxide, preferable examples of the atomic ratio of metal elements of a sputtering target for depositing the In-M-Zn oxide are In:M:Zn=5:1:1, In:M:Zn=5:1:2, In:M:Zn=5:1:3, In:M:Zn=5:1:4, In:M:Zn=5:1:5, In:M:Zn=5:1:6, In:M:Zn=10:1:1, In:M:Zn=10:1:2, In:M:Zn=10:1:3, In:M:Zn=10:1:4, In:M:Zn=10:1:5, In:M:Zn=10:1:6, In:M:Zn=10:1:7, In:M:Zn=10:1:8, In:M:Zn=10:1:10, In:M:Zn=10:1:12, In:M:Zn=10:1:15, and a neighborhood thereof. In the case where the semiconductor layer 108 is an indium oxide, an indium oxide can be used as a sputtering target for depositing the indium oxide. In the case where the semiconductor layer 108 is an In-M oxide, preferable examples of the atomic ratio of metal elements of a sputtering target used for depositing the In-M oxide are In:M=2:1, In:M=7:2, In:M=5:1, In:M=7:1, In:M=10:1, and a neighborhood thereof. In the case where the semiconductor layer 108 is an In—Zn oxide, preferable examples of the atomic ratio of a sputtering tailed used for depositing the In—Zn oxide are In:Zn=2:3, In:Zn=3:2, In:Zn=7:2, In:Zn=4:1, In:Zn=11:2, In:Zn=7:1, In:Zn=14:1, and a neighborhood thereof.

A target containing a polycrystalline oxide is preferably used as the sputtering target, in which case the semiconductor layer 108 having crystallinity is easily formed. Note that the atomic ratio in the deposited semiconductor layer 108 may vary in the range of ±40% from any of the above atomic ratios of the metal elements contained in the sputtering target. For example, in the case where the composition of the sputtering target used for the semiconductor layer 108 is In:Ga:Zn=5:1:3<atomic ratio>, the composition of the deposited semiconductor layer 108 is sometimes in the neighborhood of In:Ga:Zn=5:1:2.4<atomic ratio>.

A metal oxide that is deposited by a sputtering method using the above target at a substrate temperature higher than or equal to 100° C. and lower than or equal to 130° C. is likely to have either the nc structure or the CAAC structure, or a structure in which both structures are mixed. By contrast, a metal oxide deposited by a sputtering method at a substrate temperature set at room temperature (R.T.) is likely to have the nc structure. Note that room temperature (R.T.) here also includes a temperature in the case where a substrate is not heated.

The energy gap of the semiconductor layer 108 is 2 eV or more, preferably 2.5 eV or more. With use of such a metal oxide having a wider energy gap than silicon, the off-state current of the transistor can be reduced.

At least part of the structure examples, the drawings corresponding thereto, and the like exemplified in this embodiment can be implemented in combination with the other structure examples, the other drawings, and the like as appropriate.

At least part of this embodiment can be implemented in combination with the other embodiments described in this specification as appropriate.

Embodiment 3

In this embodiment, an example of a display device that includes the transistor exemplified in the above embodiment will be described.

Structure Example

FIG. 18A is a top view of a display device 700. The display device 700 includes a first substrate 701 and a second substrate 705 that are bonded to each other with a sealant 712. In a region sealed with the first substrate 701, the second substrate 705, and the sealant 712, a pixel portion 702, a source driver circuit portion 704, and a gate driver circuit portion 706 are provided over the first substrate 701. In the pixel portion 702, a plurality of display elements are provided.

An FPC terminal portion 708 to which an FPC 716 (FPC: Flexible printed circuit) is connected is provided in a portion of the first substrate 701 that is not overlapped by the second substrate 705. The pixel portion 702, the source driver circuit portion 704, and the gate driver circuit portion 706 are each supplied with a variety of signals and the like from the FPC 716 through the FPC terminal portion 708 and a signal line 710.

A plurality of gate driver circuit portions 706 may be provided. The gate driver circuit portion 706 and the source driver circuit portion 704 may be in the form of an IC chip obtained by packaging a circuit portion formed separately on a semiconductor substrate or the like. The IC chip can be mounted over the first substrate 701 or on the FPC 716.

The transistor that is the semiconductor device of one embodiment of the present invention can be used as transistors included in the pixel portion 702, the source driver circuit portion 704, and the gate driver circuit portion 706.

Examples of the display element provided in the pixel portion 702 include a liquid crystal element and a light-emitting element. As the liquid crystal element, a transmissive liquid crystal element, a reflective liquid crystal element, a transflective liquid crystal element, or the like can be used. As the light-emitting element, a self-luminous light-emitting element such as an LED (Light Emitting Diode), an OLED (Organic LED), a QLED (Quantum-dot LED), or a semiconductor laser can be used. It is also possible to use a MEMS (Micro Electro Mechanical Systems) shutter element, an optical interference type MEMS element, or a display element using a microcapsule method, an electrophoretic method, an electrowetting method, an Electronic Liquid Powder (registered trademark) method, or the like, for instance.

A display device 700A illustrated in FIG. 18B is an example of a display device that includes a flexible resin layer 743 instead of the first substrate 701 and can be used as a flexible display.

In the display device 700A, the pixel portion 702 does not have a rectangular shape but has arc-shaped corner portions. The display device 700A includes a notch portion in which part of the pixel portion 702 and part of the resin layer 743 are cut as illustrated in a region P1 in FIG. 18B. A pair of gate driver circuit portions 706 are provided on the opposite sides with the pixel portion 702 therebetween. The gate driver circuit portions 706 are provided along a curved outline at the corners of the pixel portion 702.

The resin layer 743 has a protrusion where the FPC terminal portion 708 is provided.

Furthermore, part of the resin layer 743 that includes the FPC terminal portion 708 can be bent backward in a region P2 in FIG. 18B. When part of the resin layer 743 is bent back, the display device 700A can be mounted on an electronic device with the FPC 716 underlying the rear side of the pixel portion 702, so that the space of the electronic device can be saved.

The FPC 716 connected to the display device 700A is mounted with an IC 717. The IC 717 functions as a source driver circuit, for example. In this case, the source driver circuit portion 704 in the display device 700A can be configured to include at least one of a protection circuit, a buffer circuit, a demultiplexer circuit, and the like.

A display device 700B illustrated in FIG. 18C is a display device that can be suitably used for an electronic device with a large screen. For example, the display device 700B can be suitably used for a television device, a monitor device, a personal computer (including a laptop type and a desktop type), a tablet terminal, digital signage, or the like.

The display device 700B includes a plurality of source driver ICs 721 and a pair of gate driver circuit portions 722.

The plurality of source driver ICs 721 are attached to respective FPCs 723. In each of the plurality of FPCs 723, one of terminals is connected to the first substrate 701, and the other terminal is connected to a printed circuit board 724. By bending the FPCs 723, the printed circuit board 724 can be placed on the back side of the pixel portion 702 so that the display device 700B can be mounted on an electronic device; thus, the electronic device can be downsized.

Meanwhile, the gate driver circuit portions 722 are provided over the first substrate 701. Thus, an electronic device with a narrow bezel can be achieved.

With such a structure, a large-size and high-resolution display device can be achieved. For example, such a structure can also be used for a display device whose screen diagonal is 30 inches or more, 40 inches or more, 50 inches or more, or 60 inches or more. Furthermore, a display device with extremely high resolution such as 4K2K or 8K4K can be achieved.

Cross-Sectional Structure Example

Figure 19:
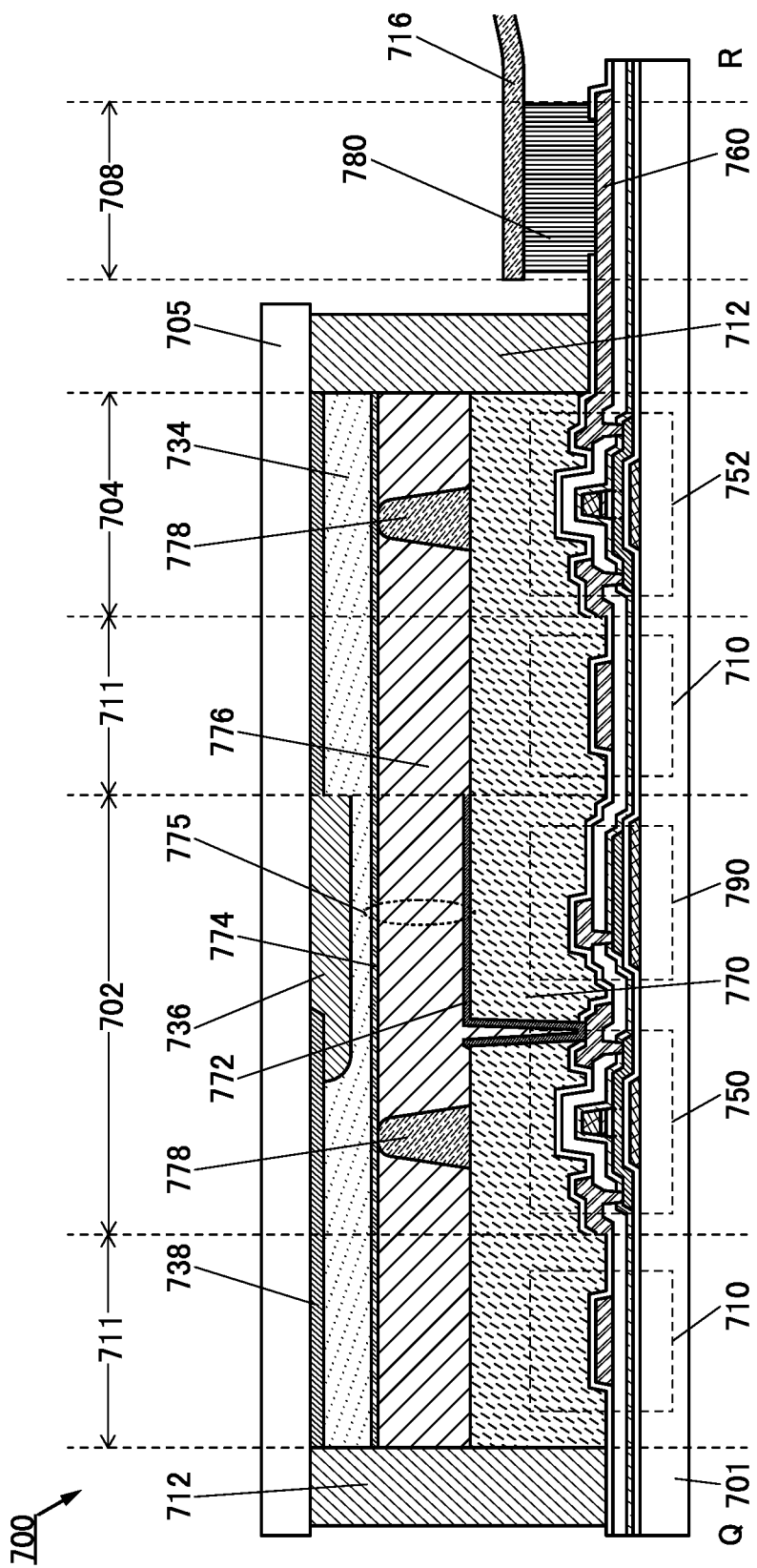
FIG. 19 is a cross-sectional view of a display device.
Figure 20:
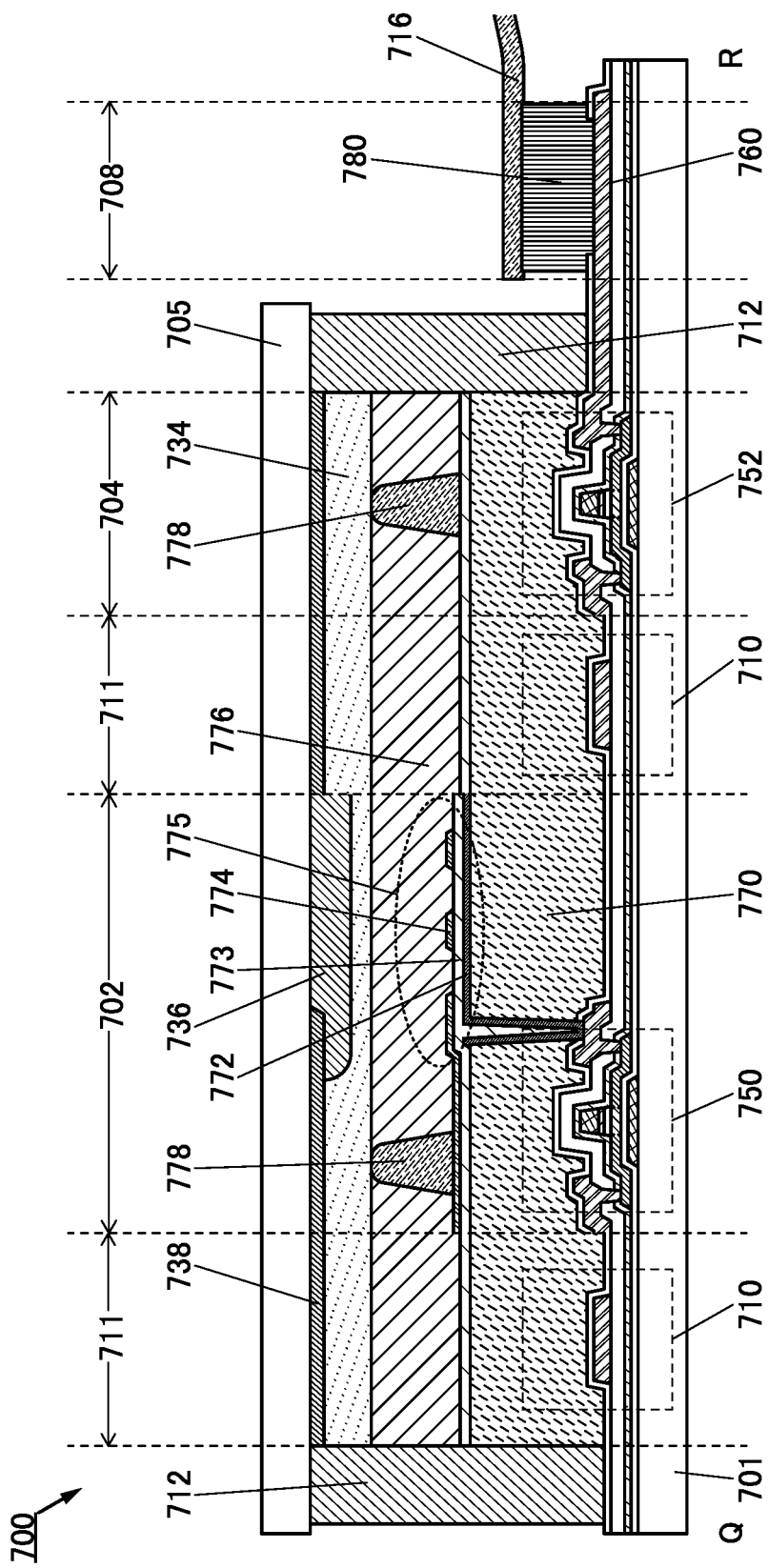
FIG. 20 is a cross-sectional view of a display device.
Figure 21:
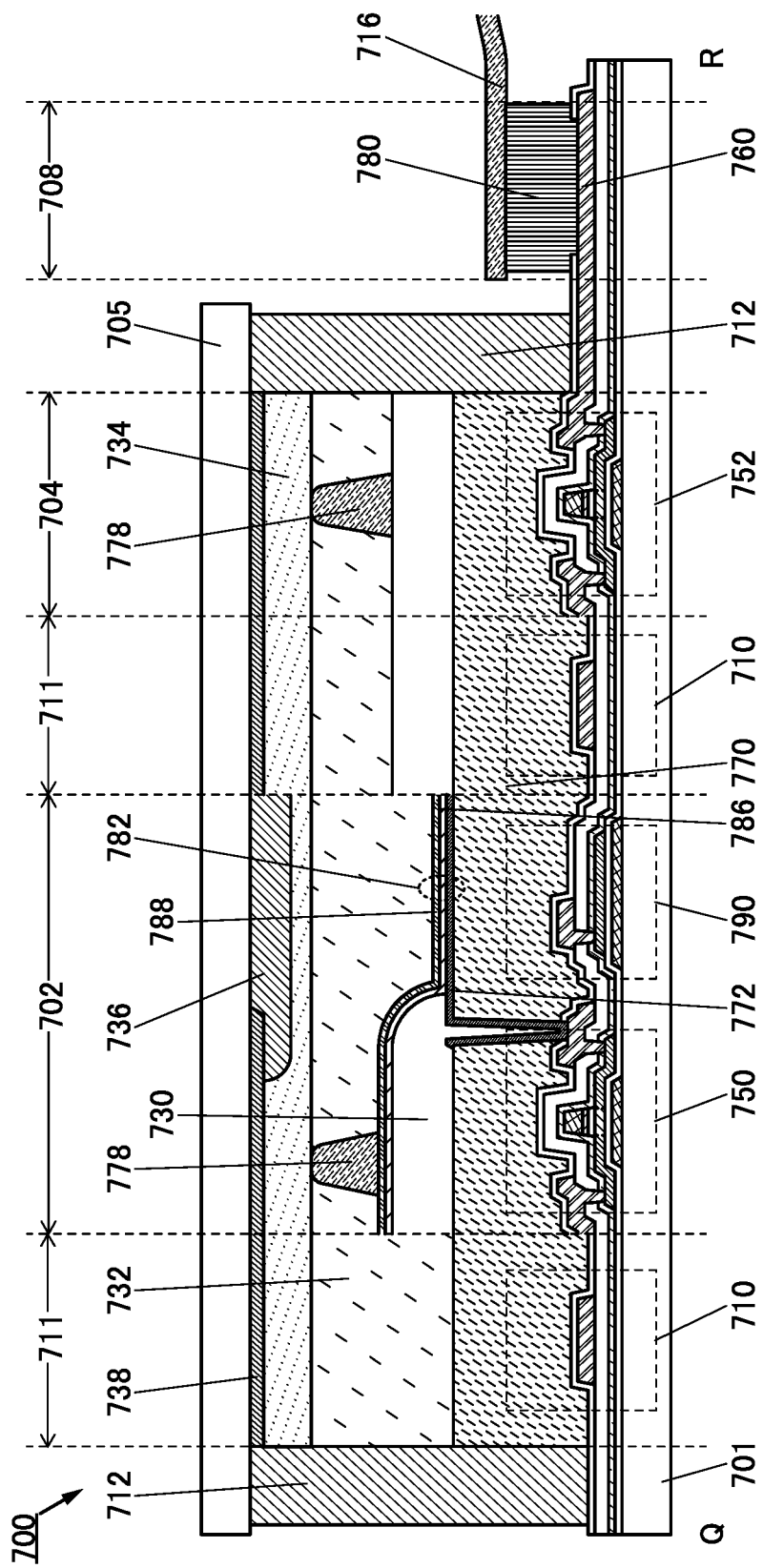
FIG. 21 is a cross-sectional view of a display device.
Figure 22:
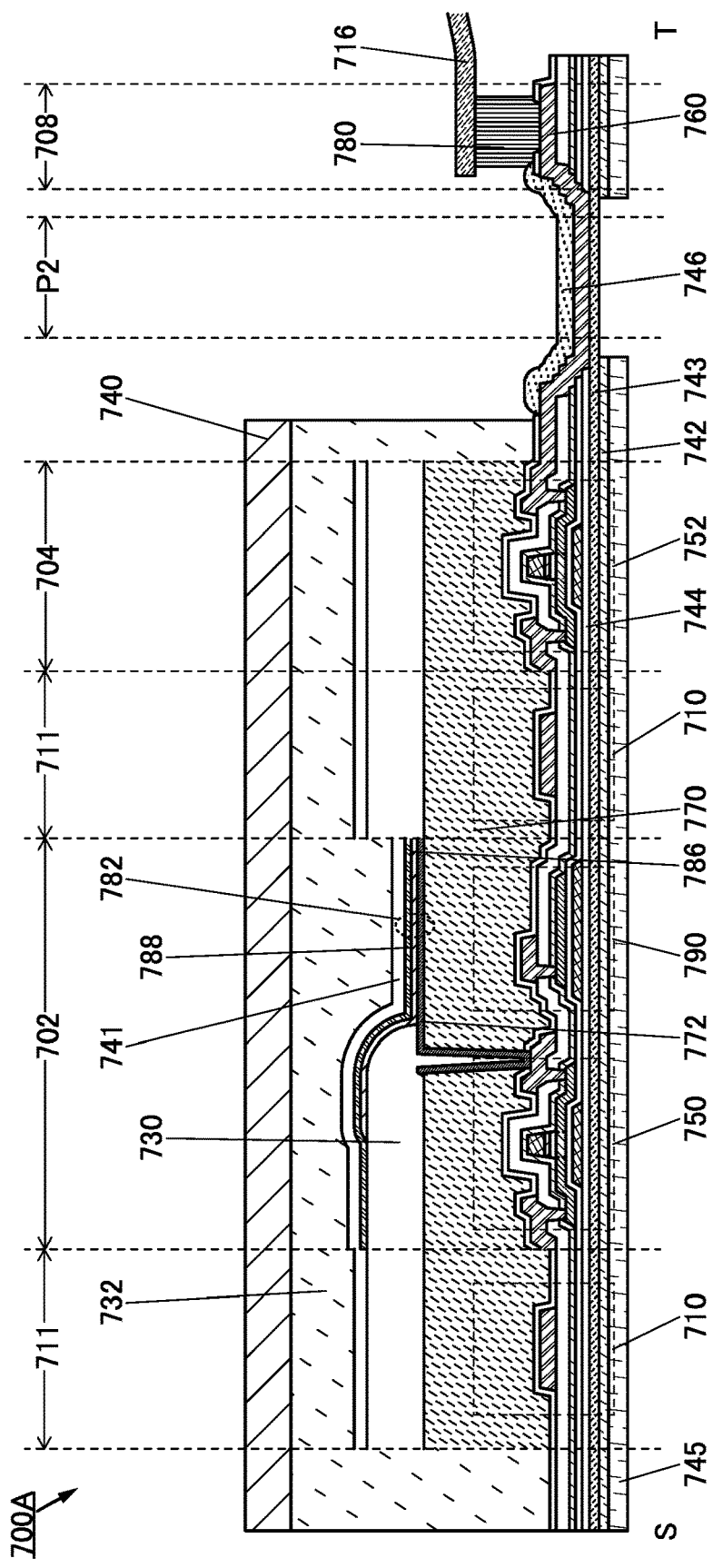
FIG. 22 is a cross-sectional view of a display device.

Structures using a liquid crystal element and an EL element as a display element are described below with reference to FIG. 19 to FIG. 22. Note that FIG. 19 to FIG. 21 are cross-sectional views along the dashed-dotted line Q-R in FIG. 18A. FIG. 22 is a cross-sectional view along the dashed-dotted line S-T in the display device 700A in FIG. 18B. FIG. 19 and FIG. 20 each show a structure using a liquid crystal element as a display element, and FIG. 21 and FIG. 22 each show a structure using an EL element.

[Description of Common Portions in Display Devices]

Display devices illustrated in FIG. 19 to FIG. 22 each include a lead wiring portion 711, the pixel portion 702, the source driver circuit portion 704, and the FPC terminal portion 708. The lead wiring portion 711 includes the signal line 710. The pixel portion 702 includes a transistor 750 and a capacitor 790. The source driver circuit portion 704 includes a transistor 752. FIG. 20 illustrates the case where the capacitor 790 is not provided.

The transistors exemplified in Embodiment 2 can be used as the transistor 750 and the transistor 752.

The transistor used in this embodiment includes a highly purified oxide semiconductor film in which formation of oxygen vacancies is inhibited. Such a transistor can have a low off-state current. Accordingly, an electrical signal such as an image signal can be held for a longer period, and the interval between writes of an image signal and the like can be set longer. As a result, the frequency of refresh operations can be reduced, resulting in an effect of reducing power consumption.

The transistor used in this embodiment can have comparatively high field-effect mobility and thus are capable of high-speed operation. For example, with use of such a transistor capable of high-speed operation for a display device, a transistor in a pixel portion and a transistor used in a driver circuit portion can be formed over one substrate. That is, a structure in which a driver circuit formed using a silicon wafer or the like is not used is possible, in which case the number of components of the display device can be reduced. Moreover, use of the transistor capable of high-speed operation also in the pixel portion can provide a high-quality image.

The capacitor 790 illustrated in each of FIG. 19, FIG. 21, and FIG. 22 includes a lower electrode formed by processing the same film as a first gate electrode of the transistor 750 and an upper electrode formed by processing the same metal oxide as the semiconductor layer. The upper electrode has reduced resistance like a source region and a drain region of the transistor 750. Part of an insulating film functioning as a first gate insulating layer of the transistor 750 is provided between the lower electrode and the upper electrode. That is, the capacitor 790 has a stacked-layer structure in which an insulating film functioning as a dielectric film is positioned between a pair of electrodes. A wiring obtained by processing the same film as a source electrode and a drain electrode of the transistor is connected to the upper electrode.

A planarization insulating film 770 is provided over the transistor 750, the transistor 752, and the capacitor 790.

The transistor 750 included in the pixel portion 702 and the transistor 752 included in the source driver circuit portion 704 may have different structures. For example, a top-gate transistor may be used as one of the transistors 750 and 752, and a bottom-gate transistor may be used as the other. Note that like in the source driver circuit portion 704, a transistor having the same structure as or a different structure from the transistor 750 may be used in the gate driver circuit portion 706.

The signal line 710 is formed using the same conductive film as the source electrodes, the drain electrodes, and the like of the transistors 750 and 752. In this case, a low-resistance material such as a material containing a copper element is preferably used because signal delay or the like due to the wiring resistance can be reduced and display on a large screen is possible.

The FPC terminal portion 708 includes a wiring 760 part of which functions as a connection electrode, an anisotropic conductive film 780, and the FPC 716. The wiring 760 is electrically connected to a terminal included in the FPC 716 through the anisotropic conductive film 780. Here, the wiring 760 is formed using the same conductive film as the source electrodes, the drain electrodes, and the like of the transistors 750 and 752.

As the first substrate 701 and the second substrate 705, a glass substrate or a flexible substrate such as a plastic substrate can be used, for example. In the case where a flexible substrate is used as the first substrate 701, an insulating layer having a barrier property against water or hydrogen is preferably provided between the first substrate 701 and the transistor 750, for example.

On the second substrate 705 side, a light-blocking film 738, a coloring film 736, and an insulating film 734 that is in contact with these films are provided.

[Structure Example of Display Device Using Liquid Crystal Element]

The display device 700 illustrated in FIG. 19 includes a liquid crystal element 775 and a spacer 778. The liquid crystal element 775 includes a conductive layer 772, a conductive layer 774, and a liquid crystal layer 776 positioned therebetween. The conductive layer 774 is provided on the second substrate 705 side and has a function of a common electrode. The conductive layer 772 is electrically connected to the source electrode or the drain electrode of the transistor 750. The conductive layer 772 is formed over the planarization insulating film 770 and functions as a pixel electrode.

A material that transmits visible light or a material that reflects visible light can be used for the conductive layer 772. As a light-transmitting material, for example, an oxide material containing indium, zinc, tin, or the like is preferably used. As a reflective material, for example, a material containing aluminum, silver, or the like is preferably used.

When a reflective material is used for the conductive layer 772, the display device 700 is a reflective liquid crystal display device. Meanwhile, when a light-transmitting material is used for the conductive layer 772, the display device 700 is a transmissive liquid crystal display device. For a reflective liquid crystal display device, a polarizing plate is provided on the viewer side. On the other hand, in the case of a transmissive liquid crystal display device, a pair of polarizing plates are provided such that the liquid crystal element is sandwiched therebetween.

The display device 700 illustrated in FIG. 20 is an example in which the liquid crystal element 775 in a horizontal electric field mode (e.g., FFS mode) is used. The conductive layer 774 functioning as a common electrode is provided over the conductive layer 772 with an insulating layer 773 therebetween. The alignment state of the liquid crystal layer 776 can be controlled by the electric field generated between the conductive layer 772 and the conductive layer 774.

In FIG. 20, a storage capacitor can be composed of a stacked-layer structure of the conductive layer 774, the insulating layer 773, and the conductive layer 772. Thus, another capacitor is not necessarily provided, and thus the aperture ratio can be increased.

Although not illustrated in FIG. 19 and FIG. 20, an alignment film in contact with the liquid crystal layer 776 may be provided. An optical member (an optical substrate) such as a polarizing member, a retardation member, or an anti-reflection member and a light source such as a backlight or a side light can be provided as appropriate.

For the liquid crystal layer 776, a thermotropic liquid crystal, a low-molecular liquid crystal, a high-molecular liquid crystal, a polymer dispersed liquid crystal (PDLC), a polymer network liquid crystal (PNLC), a ferroelectric liquid crystal, an anti-ferroelectric liquid crystal, or the like can be used. In the case where a horizontal electric field mode is employed, a liquid crystal exhibiting a blue phase for which an alignment film is not used may be used.

The mode of the liquid crystal element can be a TN (Twisted Nematic) mode, a VA (Vertical Alignment) mode, an IPS (In-Plane-Switching) mode, an FFS (Fringe Field Switching) mode, an ASM (Axially Symmetric aligned Micro-cell) mode, an OCB (Optically Compensated Birefringence) mode, an ECB (Electrically Controlled Birefringence) mode, a guest-host mode, or the like.

A scattering liquid crystal employing a polymer dispersed liquid crystal, a polymer network liquid crystal, or the like can be used for the liquid crystal layer 776. In this case, monochrome image display may be performed without providing the coloring film 736, or color display may be performed using the coloring film 736.

As a method for driving the liquid crystal element, a time-division display method (also referred to as a field-sequential driving method) by which color display is performed by a successive additive color mixing method may be used. In that case, a structure without the coloring film 736 can be employed. In the case where the time-division display method is employed, advantages such as the aperture ratio of each pixel or the resolution being increased can be obtained because subpixels that emit light of, for example, R (red), G (green), and B (blue), are not necessarily provided.

[Display Device Using Light-Emitting Element]

The display device 700 illustrated in FIG. 21 includes a light-emitting element 782. The light-emitting element 782 includes the conductive layer 772, an EL layer 786, and a conductive film 788. The EL layer 786 contains a light-emitting material such as an organic compound or an inorganic compound.

As the light-emitting material, a fluorescent material, a phosphorescent material, a thermally activated delayed fluorescence (TADF) material, an inorganic compound (e.g., a quantum dot material), or the like can be used.

In the display device 700 illustrated in FIG. 21, an insulating film 730 covering part of the conductive layer 772 is provided over the planarization insulating film 770. Here, the light-emitting element 782 is a top-emission light-emitting element, which includes the conductive film 788 with a light-transmitting property. Note that the light-emitting element 782 may have a bottom-emission structure in which light is emitted to the conductive layer 772 side, or a dual-emission structure in which light is emitted to both the conductive layer 772 side and the conductive film 788 side.

The coloring film 736 is provided at a position overlapping the light-emitting element 782, and the light-blocking film 738 is provided at a position overlapping the insulating film 730 and in the lead wiring portion 711 and the source driver circuit portion 704. The coloring film 736 and the light-blocking film 738 are covered with the insulating film 734. A space between the light-emitting element 782 and the insulating film 734 is filled with a sealing film 732. Note that a structure in which the coloring film 736 is not provided may be employed when the EL layer 786 is formed into an island shape for each pixel or into a stripe shape for each pixel column, i.e., the EL layer 786 is allowed to be formed in a side by side structure.

FIG. 22 shows a structure of a display device which can be suitably used to a flexible display. FIG. 22 is a cross-sectional view along the dashed-dotted line S-T in the display device 700A shown in FIG. 18B.

The display device 700A illustrated in FIG. 22 has a stacked structure including a support substrate 745, a bonding layer 742, the resin layer 743, and an insulating layer 744, instead of the first substrate 701 in FIG. 21. The transistor 750, the capacitor 790, and the like are provided over the insulating layer 744 over the resin layer 743.

The support substrate 745 includes an organic resin, glass, or the like and is thin enough to have flexibility. The resin layer 743 is a layer containing an organic resin such as polyimide or acrylic. The insulating layer 744 includes an inorganic insulating film of silicon oxide, silicon oxynitride, silicon nitride, or the like. The resin layer 743 and the support substrate 745 are bonded to each other with the adhesive layer 742. The resin layer 743 is preferably thinner than the support substrate 745.

The display device 700A in FIG. 22 includes a protective layer 740 instead of the second substrate 705 in FIG. 21. The protective layer 740 is bonded to the sealing film 732. A glass substrate, a resin film, or the like can be used as the protective layer 740. Alternatively, as the protective layer 740, an optical member such as a polarizing plate or a scattering plate, an input device such as a touch sensor panel, or a structure in which two or more of the above are stacked may be employed.

The EL layer 786 included in the light-emitting element 782 is provided in an island shape over the insulating film 730 and the conductive layer 772. The EL layer 786 is formed separately such that the subpixels have the respective emission colors, whereby color display can be achieved without the coloring film 736. A protective layer 741 is provided to cover the light-emitting element 782. The protective layer 741 has a function of preventing diffusion of impurities such as water into the light-emitting element 782. The protective layer 741 is preferably formed using an inorganic insulating film. It is further preferable to employ a stacked-layer structure including one or more inorganic insulating films and one or more organic insulating films.

FIG. 22 shows the region P2 that can be bent. The region P2 includes a portion where the support substrate 745, the adhesive layer 742, and the inorganic insulating film such as the insulating layer 744 are not provided. In the region P2, a resin layer 746 is provided to cover the wiring 760. When the bendable region P2 has a structure in which an inorganic insulating film is not provided as much as possible and has a structure in which only a conductive layer containing a metal or an alloy and a layer containing an organic material are stacked, a crack can be prevented from being caused at the time of folding. When the support substrate 745 is not provided in the region P2, part of the display device 700A can be bent with an extremely small radius of curvature.

[Structure Example of Display Device Provided with Input Device]

An input device may be provided in the display device 700 or the display device 700A illustrated in FIG. 19 to FIG. 22. An example of the input device includes a touch sensor.

A variety of types such as a capacitive type, a resistive type, a surface acoustic wave type, an infrared type, an optical type, and a pressure-sensitive type can be used as the sensor type, for example. Alternatively, two or more of these types may be combined and used.

Examples of the touch panel structure include a so-called in-cell touch panel in which an input device is provided between a pair of substrates, a so-called on-cell touch panel in which an input device is formed over the display device 700, and a so-called out-cell touch panel in which an input device is attached to the display device 700.

At least part of the structure examples, the drawings corresponding thereto, and the like exemplified in this embodiment can be implemented in combination with the other structure examples, the other drawings, and the like as appropriate.

At least part of this embodiment can be implemented in combination with the other embodiments described in this specification as appropriate.

Embodiment 4

In this embodiment, a display device that includes the semiconductor device of one embodiment of the present invention will be described with reference to FIG. 23.

Figure 23A:
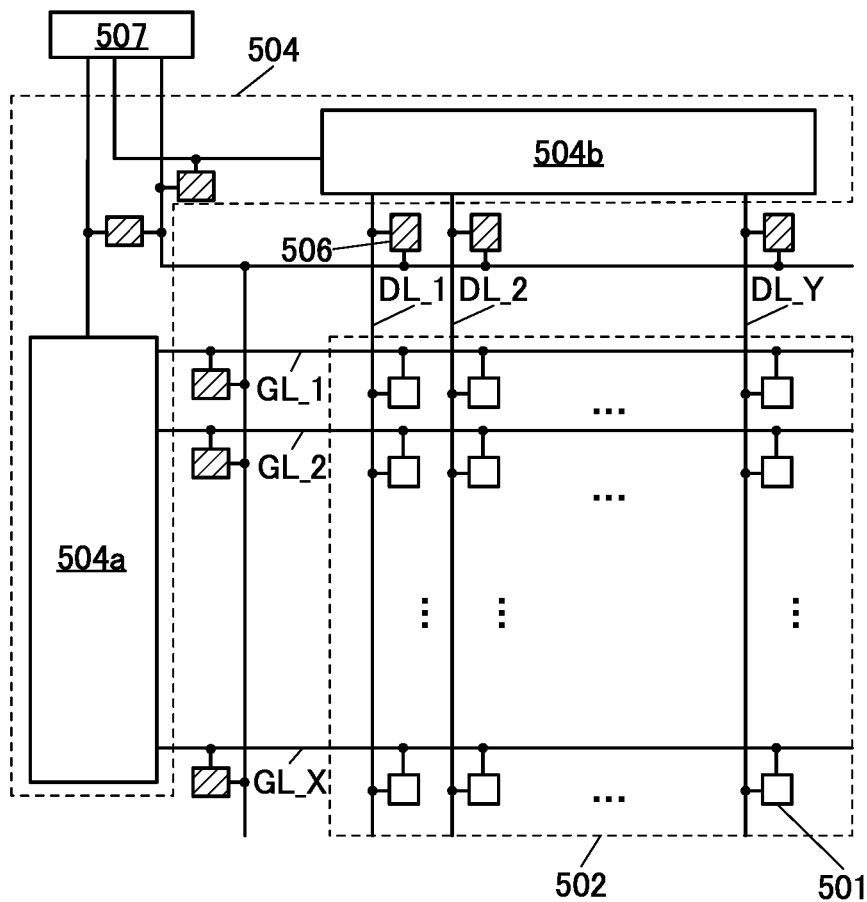
FIG. 23A is a block diagram of a display device.

A display device shown in FIG. 23A includes a pixel portion 502, a driver circuit portion 504, protection circuits 506, and a terminal portion 507. Note that a structure in which the protection circuits 506 are not provided may be employed.

The transistor of one embodiment of the present invention can be used as transistors included in the pixel portion 502 and the driver circuit portion 504. The transistor of one embodiment of the present invention may also be used in the protection circuits 506.

The pixel portion 502 includes a plurality of pixel circuits 501 arranged in X rows and Y columns (X and Y each independently represent a natural number of 2 or more). Each of the pixel circuits 501 includes a circuit for driving a display element.

The driver circuit portion 504 includes driver circuits such as a gate driver 504*a* that outputs a scan signal to gate lines GL_1 to GL_X and a source driver 504*b* that supplies a data signal to data lines DL_1 to DL_Y. The gate driver 504*a* includes at least a shift register. The source driver 504*b* is formed using a plurality of analog switches, for example. Alternatively, the source driver 504*b* may be formed using a shift register or the like.

The terminal portion 507 refers to a portion provided with terminals for inputting power, control signals, image signals, and the like to the display device from external circuits.

The protection circuit 506 is a circuit that, when a potential out of a certain range is applied to a wiring to which the protection circuit 506 is connected, establishes continuity between the wiring and another wiring. The protection circuit 506 shown in FIG. 23A is connected to a variety of wirings such as the gate lines GL_1 to GL_X that are wirings between the gate driver 504a and the pixel circuits 501 and the data lines DL_1 to DL_Y that are wirings between the source driver 504b and the pixel circuits 501, for example. Note that the protection circuits 506 are hatched in FIG. 23A to distinguish the protection circuits 506 from the pixel circuits 501.

The gate driver 504a and the source driver 504b may be provided over a substrate over which the pixel portion 502 is provided, or a substrate where a gate driver circuit or a source driver circuit is separately formed (e.g., a driver circuit board formed using a single crystal semiconductor film or a polycrystalline semiconductor film) may be mounted on a substrate where the pixel portion 502 is provided by COG or TAB (Tape Automated Bonding).

Figure 23B:
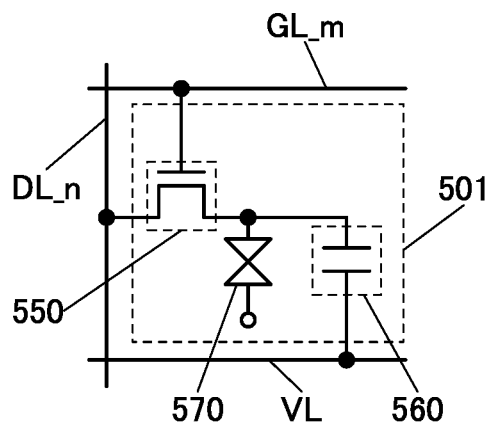
FIG. 23B and FIG. 23C are circuit diagrams of the display device.
Figure 23C:
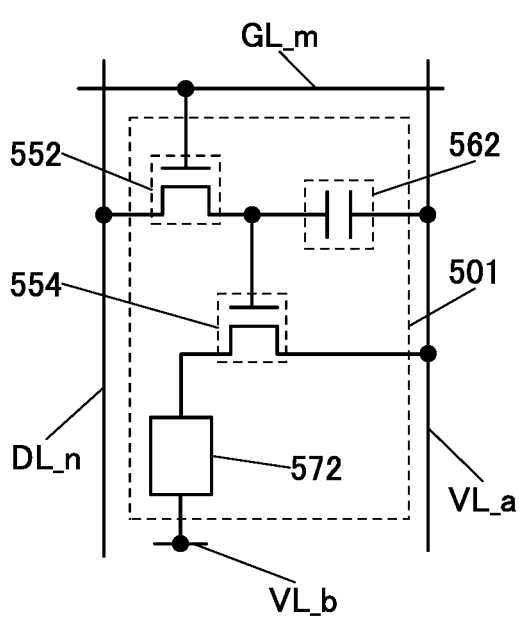

FIGS. 23B and 23C each illustrate a structure example of a pixel circuit that can be used for the pixel circuit 501.

The plurality of pixel circuits 501 shown in FIG. 23A can have a structure shown in FIG. 23B or FIG. 23C, for example.

The pixel circuit 501 shown in FIG. 23B includes a liquid crystal element 570, a transistor 550, and a capacitor 560. The data line DL_n, the gate line GL_m, a potential supply line VL, and the like are connected to the pixel circuit 501.

The potential of one of a pair of electrodes of the liquid crystal element 570 is set appropriately in accordance with the specifications of the pixel circuit 501. The alignment state of the liquid crystal element 570 is set depending on written data. Note that a common potential may be supplied to one of the pair of electrodes of the liquid crystal element 570 included in each of the plurality of pixel circuits 501. Alternatively, a potential supplied to one of the pair of electrodes of the liquid crystal element 570 of the pixel circuit 501 may differ between rows.

The pixel circuit 501 shown in FIG. 23(C) includes transistors 552 and 554, a capacitor 562, and a light-emitting element 572. The data line DL_n, the gate line GL_m, a potential supply line VL_a, a potential supply line VL_b, and the like are connected to the pixel circuit 501.

Note that a high power supply potential VDD is supplied to one of the potential supply line VL_a and the potential supply line VL_b, and a low power supply potential VSS is supplied to the other. Current flowing through the light-emitting element 572 is controlled in accordance with a potential supplied to a gate of the transistor 554, whereby the luminance of light emitted from the light-emitting element 572 is controlled.

At least part of the structure examples, the drawings corresponding thereto, and the like exemplified in this embodiment can be implemented in combination with the other structure examples, the other drawings, and the like as appropriate.

At least part of this embodiment can be implemented in combination with any of the other embodiments described in this specification as appropriate.

Embodiment 5

A pixel circuit including a memory for correcting gray levels displayed by pixels and a display device including the pixel circuit are described below. The transistor described in Embodiment 2 can be applied to transistors used in the pixel circuit shown below.

<Circuit Configuration>

Figure 24A:
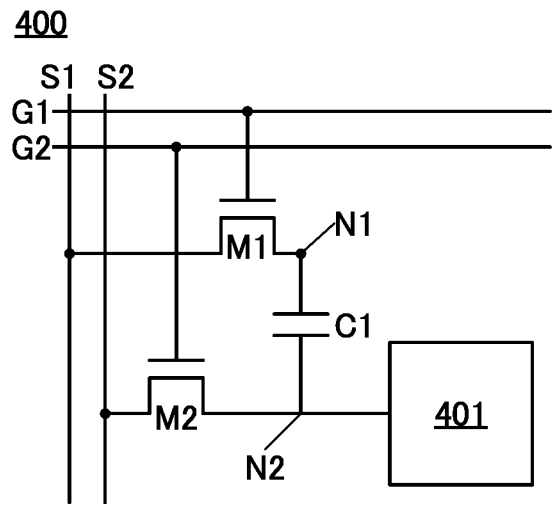
FIG. 24A, FIG. 24C, and FIG. 24D are circuit diagrams of a display device.

FIG. 24A is a circuit diagram of a pixel circuit 400. The pixel circuit 400 includes a transistor M1, a transistor M2, a capacitor C1, and a circuit 401. A wiring S1, a wiring S2, a wiring G1, and a wiring G2 are connected to the pixel circuit 400.

In the transistor M1, a gate is connected to the wiring G1, one of a source and a drain is connected to the wiring S1, and the other is connected to one electrode of the capacitor C1. In the transistor M2, a gate is connected to the wiring G2, one of a source and a drain is connected to the wiring S2, and the other is connected to the other electrode of the capacitor C1 and the circuit 401.

The circuit 401 is a circuit including at least one display element. Any of a variety of elements can be used as the display element, and typically, a light-emitting element such as an organic EL element or an LED element, a liquid crystal element, a MEMS (Micro Electro Mechanical Systems) element, or the like can be used.

A node connecting the transistor M1 and the capacitor C1 is denoted as a node N1, and a node connecting the transistor M2 and the circuit 401 is denoted as a node N2.

In the pixel circuit 400, the potential of the node N1 can be retained when the transistor M1 is turned off. The potential of the node N2 can be retained when the transistor M2 is turned off. When a predetermined potential is written to the node N1 through the transistor M1 with the transistor M2 being in an off state, the potential of the node N2 can be changed in accordance with displacement of the potential of the node N1 owing to capacitive coupling through the capacitor C1.

Here, the transistor using an oxide semiconductor, which is described in Embodiment 2, can be used as one or both of the transistor M1 and the transistor M2. Accordingly, owing to an extremely low off-state current, the potentials of the node N1 and the node N2 can be retained for a long time. Note that in the case where the period in which the potential of each node is retained is short (specifically, the case where the frame frequency is higher than or equal to 30 Hz, for example), a transistor using a semiconductor such as silicon may be used.

<Driving Method Example>

Figure 24B:
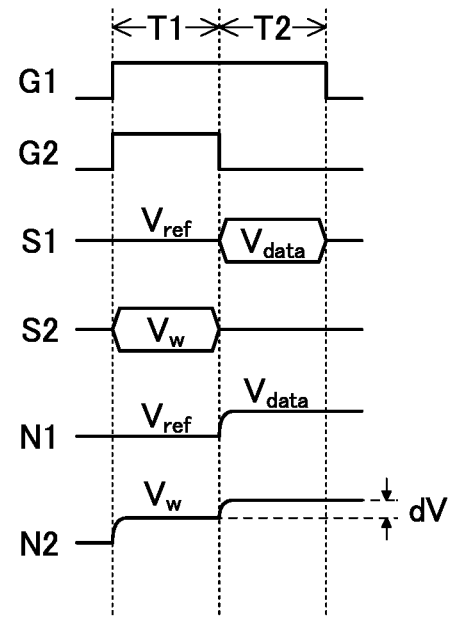
FIG. 24B is a timing chart of the display device.

Next, an example of a method of operating the pixel circuit 400 is described with reference to FIG. 24B. FIG. 24B is a timing chart of the operation of the pixel circuit 400. Note that for simplification of description, the influence of various kinds of resistance such as wiring resistance, parasitic capacitance of a transistor, a wiring, or the like, the threshold voltage of the transistor, and the like is not taken into account here.

In the operation shown in FIG. 24B, one frame period is divided into a period T1 and a period T2. The period T1 is a period in which a potential is written to the node N2, and the period T2 is a period in which a potential is written to the node N1.

[Period T1]

In the period T1, a potential for turning on the transistor is supplied to both the wiring G1 and the wiring G2. In addition, a potential $V_{ref}$ that is a fixed potential is supplied to the wiring S1, and a first data potential $V_w$ is supplied to the wiring S2.

The potential $V_{ref}$ is supplied from the wiring S1 to the node N1 through the transistor M1. The first data potential $V_w$ is supplied to the node N2 through the transistor M2. Accordingly, a potential difference $V_w - V_{ref}$ is retained in the capacitor C1.

[Period T2]

Next, in the period T2, a potential for turning on the transistor M1 is supplied to the wiring G1, and a potential for turning off the transistor M2 is supplied to the wiring G2. A second data potential $V_{data}$ is supplied to the wiring S1. The wiring S2 may be supplied with a predetermined constant potential or brought into a floating state.

The second data potential $V_{data}$ is supplied to the node N1 through the transistor M1. At this time, capacitive coupling due to the capacitor C1 changes the potential of the node N2 in accordance with the second data potential $V_{data}$ by a potential dV. That is, a potential that is the sum of the first data potential Vw and the potential dV is input to the circuit 401. Note that although the potential dV is shown as a positive value in FIG. 24B, the potential dV may be a negative value. That is, the second data potential $V_{data}$ may be lower than the potential $V_{ref}$.

Here, the potential dV is roughly determined by the capacitance of the capacitor C1 and the capacitance of the circuit 401. When the capacitance of the capacitor C1 is sufficiently larger than the capacitance of the circuit 401, the potential dV is a potential close to the second data potential $V_{data}$.

In the above manner, the pixel circuit 400 can generate a potential to be supplied to the circuit 401 including the display element, by combining two kinds of data signals; hence, a gray level can be corrected in the pixel circuit 400.

The pixel circuit 400 can also generate a potential exceeding the maximum potential which a source driver connected to the wiring S1 and the wiring S2 can supply. For example, in the case where a light-emitting element is used, high-dynamic range (HDR) display or the like can be performed. In the case where a liquid crystal element is used, overdriving or the like can be achieved.

Application Examples

[Example Using Liquid Crystal Element]

Figure 24C:
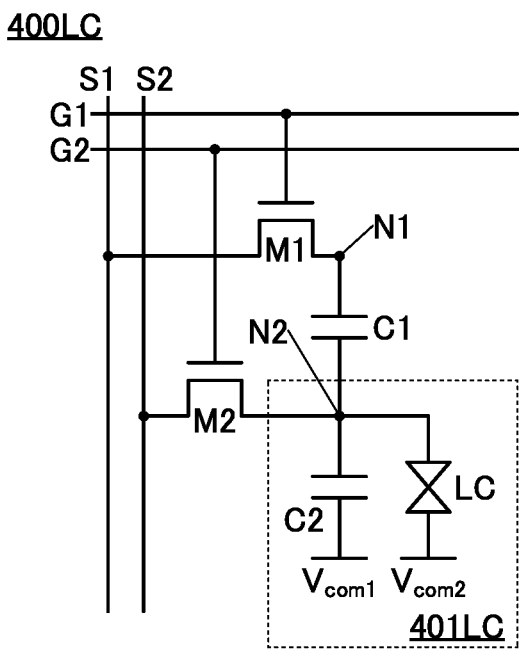

A pixel circuit 400LC shown in FIG. 24C includes a circuit 401LC. The circuit 401LC includes a liquid crystal element LC and a capacitor C2.

In the liquid crystal element LC, one electrode is connected to the node N2 and one electrode of the capacitor C2, and the other electrode is connected to a wiring supplied with a potential $V_{com2}$. The other electrode of the capacitor C2 is connected to a wiring supplied with a potential $V_{com1}$.

The capacitor C2 functions as a storage capacitor. Note that the capacitor C2 can be omitted when not needed.

In the pixel circuit 400LC, a high voltage can be supplied to the liquid crystal element LC; thus, high-speed display can be performed by overdriving or a liquid crystal material with a high driving voltage can be employed, for example. Moreover, by supply of a correction signal to the wiring S1 or the wiring S2, a gray level can be corrected in accordance with the operating temperature, the deterioration state of the liquid crystal element LC, or the like.

[Example Using Light-Emitting Element]

Figure 24D:
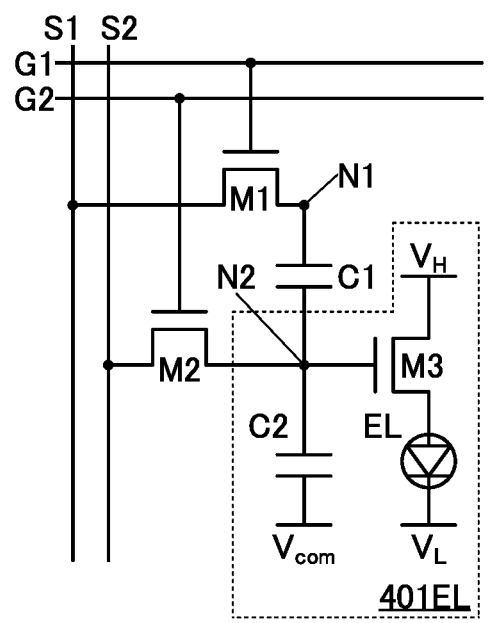

A pixel circuit 400EL shown in FIG. 24D includes a circuit 401EL. The circuit 401EL includes a light-emitting element EL, a transistor M3, and the capacitor C2.

In the transistor M3, a gate is connected to the node N2 and the one electrode of the capacitor C2, one of a source and a drain is connected to a wiring supplied with a potential $V_H$, and the other is connected to one electrode of the light-emitting element EL. The other electrode of the capacitor C2 is connected to a wiring supplied with a potential $V_{com}$. The other electrode of the light-emitting element EL is connected to a wiring supplied with a potential VL.

The transistor M3 has a function of controlling a current to be supplied to the light-emitting element EL. The capacitor C2 functions as a storage capacitor. The capacitor C2 can be omitted when not needed.

Note that although the structure in which the anode side of the light-emitting element EL is connected to the transistor M3 is described here, the transistor M3 may be connected to the cathode side. In that case, the values of the potential $V_H$ and the potential $V_L$ can be appropriately changed.

In the pixel circuit 400EL, a large amount of current can flow through the light-emitting element EL when a high potential is applied to the gate of the transistor M3, which enables HDR display, for example. Moreover, variation in the electrical characteristics of the transistor M3 and the light-emitting element EL can be corrected by supply of a correction signal to the wiring S1 or the wiring S2.

Note that the configuration is not limited to the circuits shown in FIG. 24C and FIG. 24D, and a structure to which a transistor, a capacitor, or the like is further added may be employed.

At least part of this embodiment can be implemented in combination with any of the other embodiments described in this specification as appropriate.

Embodiment 6

In this embodiment, a display module that can be fabricated using one embodiment of the present invention will be described.

Figure 25A:
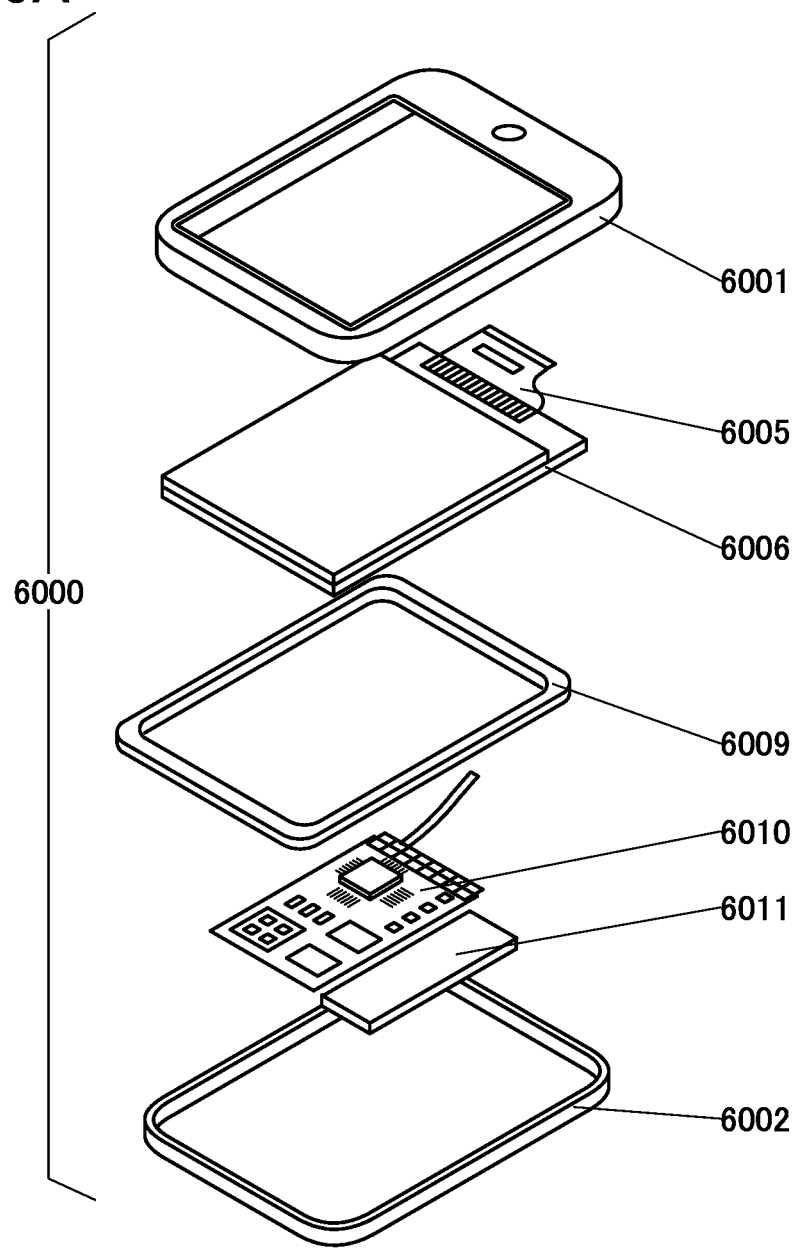
FIG. 25A and FIG. 25B illustrate a structure example of a display module.

In a display module 6000 shown in FIG. 25A, a display device 6006 to which an FPC 6005 is connected, a frame 6009, a printed circuit board 6010, and a battery 6011 are provided between an upper cover 6001 and a lower cover 6002.

A display device fabricated using one embodiment of the present invention can be used as the display device 6006, for example. With the display device 6006, a display module with extremely low power consumption can be achieved.

The shape and size of the upper cover 6001 and the lower cover 6002 can be changed as appropriate in accordance with the size of the display device 6006.

The display device 6006 may have a function of a touch panel.

The frame 6009 may have a function of protecting the display device 6006, a function of blocking electromagnetic waves generated by the operation of the printed circuit board 6010, a function of a heat dissipation plate, or the like.

The printed circuit board 6010 includes a power supply circuit, a signal processing circuit for outputting a video signal and a clock signal, a battery control circuit, and the like.

Figure 25B:
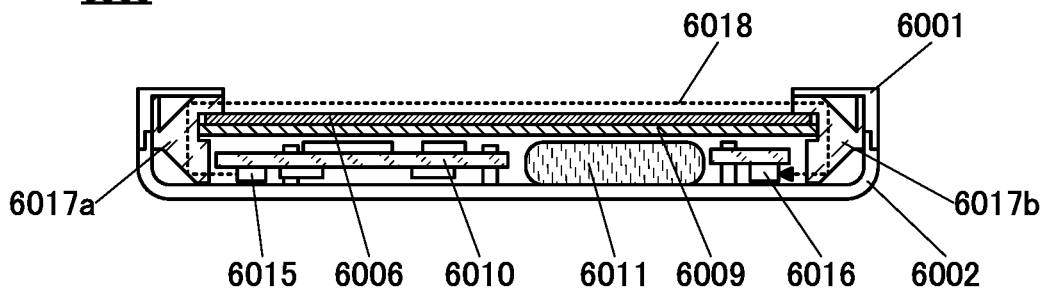

FIG. 25B is a schematic cross-sectional view of the display module 6000 having an optical touch sensor.

The display module 6000 includes a light-emitting portion 6015 and a light-receiving portion 6016 that are provided on the printed circuit board 6010. Furthermore, a pair of light guide portions (a light guide portion 6017a and a light guide portion 6017b) are provided in regions surrounded by the upper cover 6001 and the lower cover 6002.

The display device 6006 overlaps the printed circuit board 6010 and the battery 6011 with the frame 6009 therebetween. The display device 6006 and the frame 6009 are fixed to the light guide portion 6017a and the light guide portion 6017b.

Light 6018 emitted from the light-emitting portion 6015 travels over the display device 6006 through the light guide portion 6017a and reaches the light-receiving portion 6016 through the light guide portion 6017b. For example, blocking of the light 6018 by a sensing target such as a finger or a stylus enables detection of touch operation.

A plurality of light-emitting portions 6015 are provided along two adjacent sides of the display device 6006, for example. A plurality of light-receiving portions 6016 are provided at the positions on the opposite side of the light-emitting portions 6015. Accordingly, information about the position of touch operation can be obtained.

As the light-emitting portion 6015, a light source such as an LED element can be used, for example, and it is particularly preferable to use a light source emitting infrared rays. As the light-receiving portion 6016, a photoelectric element that receives light emitted from the light-emitting portion 6015 and converts it into an electric signal can be used. A photodiode that can receive infrared rays can be suitably used.

With use of the light guide portion 6017a and the light guide portion 6017b which transmit the light 6018, the light-emitting portion 6015 and the light-receiving portion 6016 can be placed under the display device 6006, and a malfunction of the touch sensor due to external light reaching the light-receiving portion 6016 can be suppressed. Particularly when a resin that absorbs visible light and transmits infrared rays is used, a malfunction of the touch sensor can be suppressed more effectively.

At least part of this embodiment can be implemented in combination with the other embodiments described in this specification as appropriate.

Embodiment 7

In this embodiment, examples of an electronic device for which the display device of one embodiment of the present invention can be used will be described.

Figure 26A:
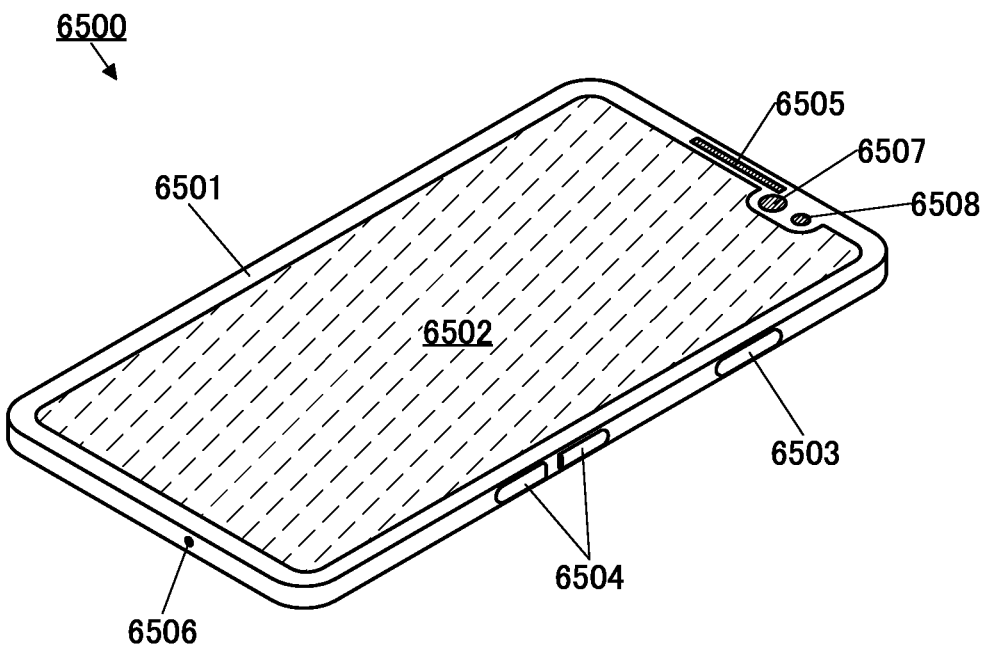
FIG. 26A and FIG. 26B illustrate a structure example of an electronic device.

An electronic device 6500 illustrated in FIG. 26A is a portable information terminal that can be used as a smartphone.

The electronic device 6500 includes a housing 6501, a display portion 6502, a power button 6503, buttons 6504, a speaker 6505, a microphone 6506, a camera 6507, a light source 6508, and the like. The display portion 6502 has a touch panel function.

The display device of one embodiment of the present invention can be used in the display portion 6502.

Figure 26B:
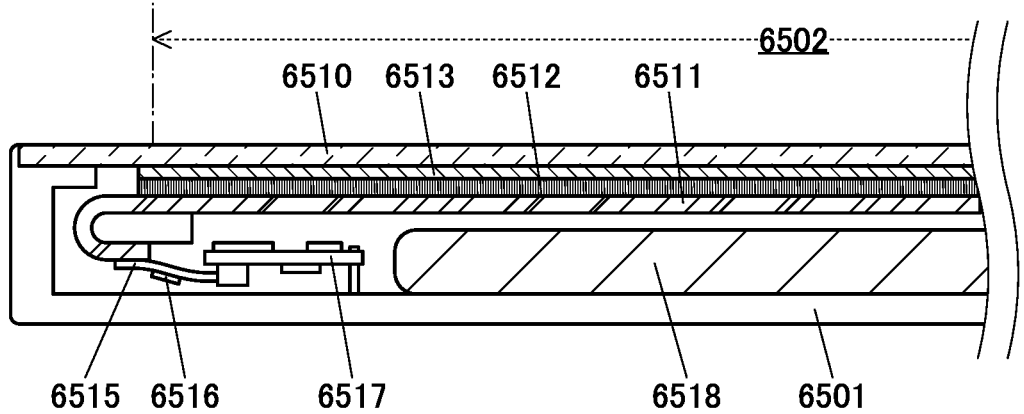

FIG. 26B is a schematic cross-sectional view including an end portion of the housing 6501 on the microphone 6506 side.

A protective member 6510 having a light-transmitting property is provided on the display surface side of the housing 6501, and a display panel 6511, an optical member 6512, a touch sensor panel 6513, a printed circuit board 6517, a battery 6518, and the like are provided in a space surrounded by the housing 6501 and the protective member 6510.

The display panel 6511, the optical member 6512, and the touch sensor panel 6513 are fixed to the protective member 6510 with a bonding layer not illustrated.

Part of the display panel 6511 is bent in a region outside the display portion 6502. An FPC 6515 is connected to the bent part. An IC 6516 is mounted on the FPC 6515. The FPC 6515 is connected to a terminal provided for the printed circuit board 6517.

A flexible display panel of one embodiment of the present invention can be used as the display panel 6511. Thus, an extremely lightweight electronic device can be achieved.

Furthermore, since the display panel 6511 is extremely thin, the battery 6518 with a high capacity can be provided without an increase in the thickness of the electronic device. Moreover, part of the display panel 6511 is bent to provide a connection portion with the FPC 6515 on the back side of the pixel portion, whereby an electronic device with a narrow bezel can be obtained.

At least part of this embodiment can be implemented in combination with the other embodiments described in this specification as appropriate.

Embodiment 8

In this embodiment, electronic devices each including a display device fabricated using one embodiment of the present invention will be described.

Electronic devices exemplified below each include a display device of one embodiment of the present invention in a display portion. Thus, the electronic devices achieve high resolution. In addition, the electronic devices can each achieve both high resolution and a large screen.

A display portion in an electronic device of one embodiment of the present invention can display a video with a resolution of, for example, full high definition, 4K2K, 8K4K, 16K8K, or higher.

Examples of the electronic devices include a digital camera, a digital video camera, a digital photo frame, a cellular phone, a portable game machine, a portable information terminal, and an audio reproducing device, in addition to electronic devices with comparatively large screens, such as a television device, a notebook personal computer, a monitor device, digital signage, a pachinko machine, and a game machine.

An electronic device using one embodiment of the present invention can be incorporated along a flat surface or a curved surface of an inside wall or an outside wall of a house or a building, an interior or an exterior of a car, or the like.

Figure 27A:
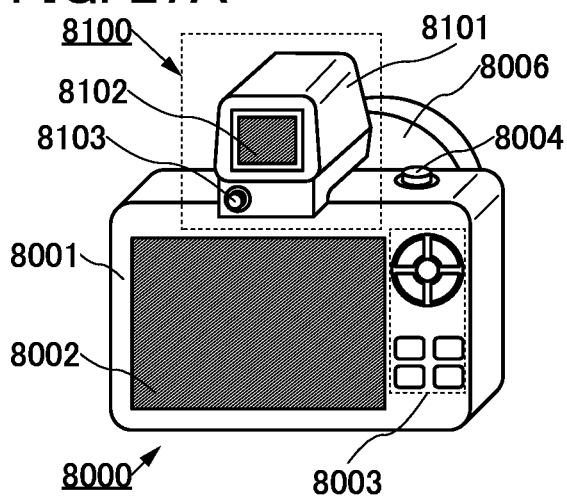
FIG. 27A, FIG. 27B, FIG. 27C, FIG. 27D, and FIG. 27E each illustrate a structure example of an electronic device.

FIG. 27A is a diagram showing appearance of a camera 8000 to which a finder 8100 is attached.

The camera 8000 includes a housing 8001, a display portion 8002, operation buttons 8003, a shutter button 8004, and the like. A detachable lens 8006 is attached to the camera 8000.

Note that the lens 8006 and the housing may be integrated with each other in the camera 8000.

The camera 8000 can take images by the press of the shutter button 8004 or touch on the display portion 8002 serving as a touch panel.

The housing 8001 includes a mount including an electrode, so that, in addition to the finder 8100, a stroboscope or the like can be connected to the housing.

The finder 8100 includes a housing 8101, a display portion 8102, a button 8103, and the like.

The housing 8101 is attached to the camera 8000 with a mount engaging with a mount of the camera 8000. The finder 8100 can display an image or the like received from the camera 8000 on the display portion 8102.

The button 8103 serves as a power button or the like.

The display portion 8002 of the camera 8000 and the display portion 8102 of the finder 8100 can use the display device of one embodiment of the present invention. Note that a finder may be incorporated in the camera 8000.

Figure 27B:
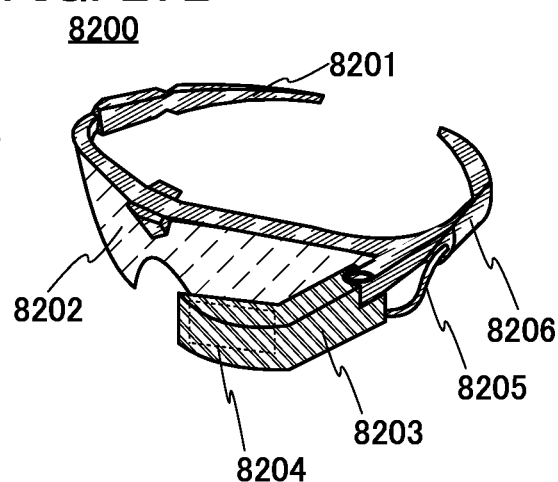

FIG. 27B is a diagram showing appearance of a head-mounted display 8200.

The head-mounted display 8200 includes a mounting portion 8201, a lens 8202, a main body 8203, a display portion 8204, a cable 8205, and the like. A battery 8206 is incorporated in the mounting portion 8201.

The cable 8205 supplies electric power from the battery 8206 to the main body 8203. The main body 8203 includes a wireless receiver or the like and can display received image data on the display portion 8204. The main body 8203 is provided with a camera, and data on the movement of the user's eyeball and eyelid can be used as an input means.

The mounting portion 8201 may include a plurality of electrodes capable of sensing current flowing in response to the movement of the user's eyeball in a position in contact with the user, to have a function of recognizing the user's line of sight. A function of monitoring the user's pulse with the use of current flowing through the electrodes may be achieved. The mounting portion 8201 may include various sensors such as a temperature sensor, a pressure sensor, and an acceleration sensor to have a function of displaying the user's biological information on the display portion 8204 or a function of changing an image displayed on the display portion 8204 in accordance with the movement of the user's head.

The display portion 8204 can use the display device of one embodiment of the present invention.

Figure 27C:
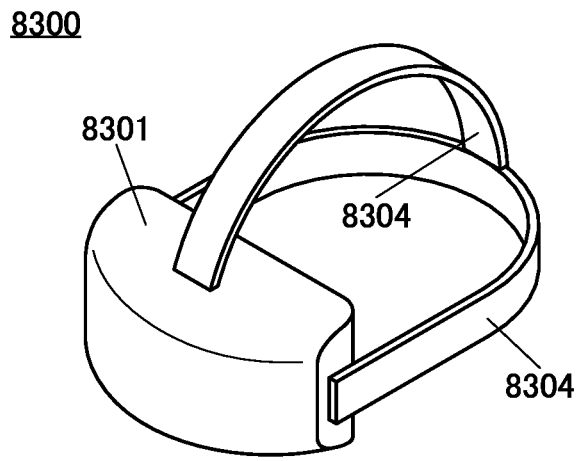
Figure 27D:
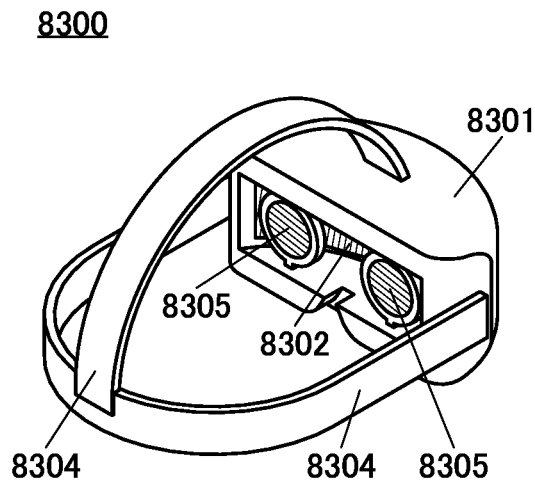
Figure 27E:
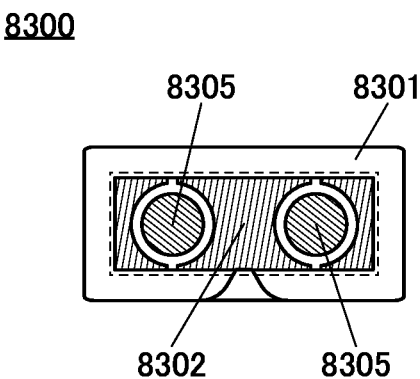

FIG. 27C, FIG. 27D, and FIG. 27E are diagrams showing appearance of a head-mounted display 8300. The head-mounted display 8300 includes a housing 8301, a display portion 8302, a band-shaped fixing unit 8304, and a pair of lenses 8305.

A user can see display on the display portion 8302 through the lenses 8305. Note that the display portion 8302 is preferably curved and placed, in which case the user can feel a high realistic sensation. When another image displayed in a different region of the display portion 8302 is viewed through the lenses 8305, three-dimensional display using parallax or the like can also be performed. Note that the configuration is not limited to that in which one display portion 8302 is provided, and two display portions 8302 may be provided so that one display portion is provided for one eye of the user.

Note that the display device of one embodiment of the present invention can be used in the display portion 8302. The display device including the semiconductor device of one embodiment of the present invention has an extremely high resolution; thus, even when an image is magnified by the lenses 8305 as in FIG. 27E, the user does not perceive pixels, and a more realistic image can be displayed.

Electronic devices illustrated in FIG. 28A to FIG. 28G include a housing 9000, a display portion 9001, a speaker 9003, an operation key 9005 (including a power switch or an operation switch), a connection terminal 9006, a sensor 9007 (a sensor having a function of measuring force, displacement, position, speed, acceleration, angular velocity, rotational frequency, distance, light, liquid, magnetism, temperature, a chemical substance, sound, time, hardness, electric field, current, voltage, electric power, radiation, flow rate, humidity, gradient, oscillation, a smell, or infrared rays), a microphone 9008, and the like.

The electronic devices illustrated in FIG. 28A to FIG. 28G have a variety of functions. For example, the electronic devices can have a function of displaying a variety of information (a still image, a moving image, a text image, and the like) on the display portion, a touch panel function, a function of displaying a calendar, date, time, and the like, a function of controlling processing with use of a variety of software (programs), a wireless communication function, and a function of reading out and processing a program or data stored in a recording medium. Note that the functions of the electronic devices are not limited thereto, and the electronic devices can have a variety of functions. The electronic devices may include a plurality of display portions. The electronic devices may each include a camera or the like and have a function of taking a still image or a moving image and storing the taken image in a recording medium (an external recording medium or a recording medium incorporated in the camera), a function of displaying the taken image on the display portion, or the like.

The details of the electronic devices illustrated in FIG. 28A to FIG. 28G are described below.

Figure 28A:
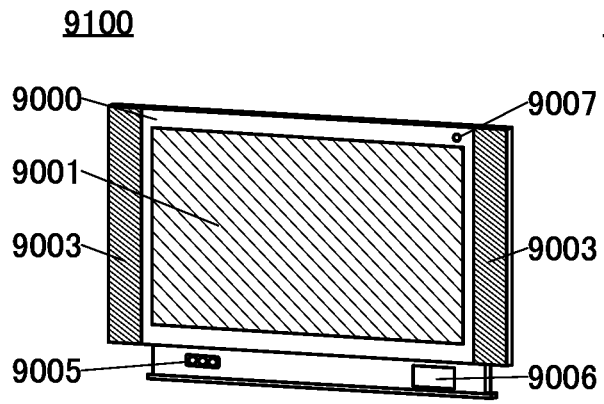
FIG. 28A, FIG. 28B, FIG. 28C, FIG. 28D, FIG. 28E, FIG. 28F and FIG. 28G each illustrate a structure example of an electronic device.

FIG. 28A is a perspective view showing a television device 9100. The television device 9100 can include the display portion 9001 having a large screen size of, for example, 50 inches or more, or 100 inches or more.

Figure 28D:
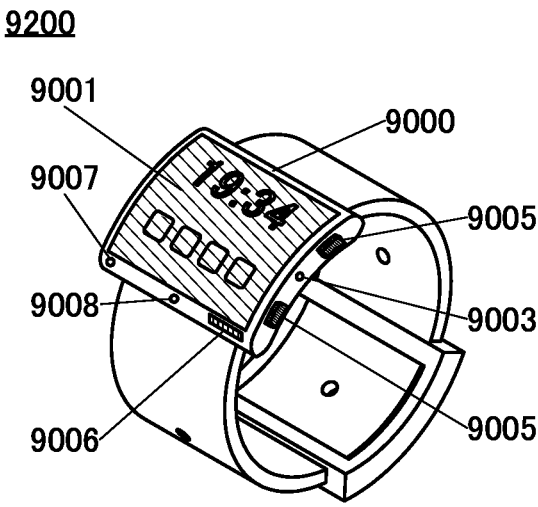
Figure 28B:
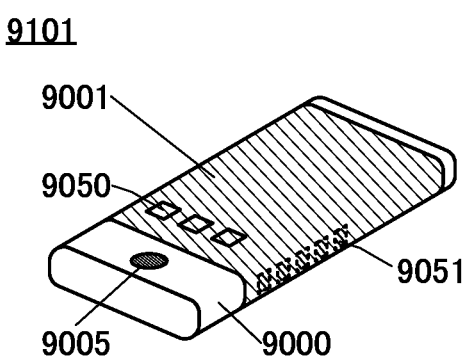

FIG. 28B is a perspective view showing a portable information terminal 9101. For example, the portable information terminal 9101 can be used as a smartphone. Note that the portable information terminal 9101 may be provided with the speaker 9003, the connection terminal 9006, the sensor 9007, or the like. The portable information terminal 9101 can display characters and image information on its plurality of surfaces. FIG. 28B shows an example in which three icons 9050 are displayed. Information 9051 indicated by dashed rectangles can be displayed on another surface of the display portion 9001. Examples of the information 9051 include notification of reception of an e-mail, a message of SNS, or an incoming call, the title and sender of an e-mail, a message of SNS, or the like, the date, the time, remaining battery, and the reception strength of an antenna. Alternatively, the icon 9050 or the like may be displayed in the position where the information 9051 is displayed.

Figure 28E:
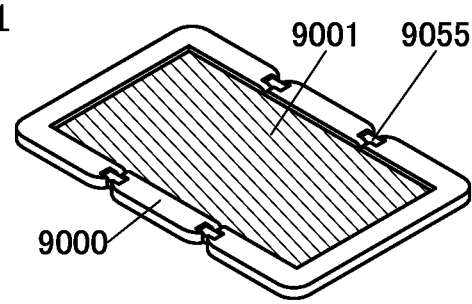
Figure 28C:
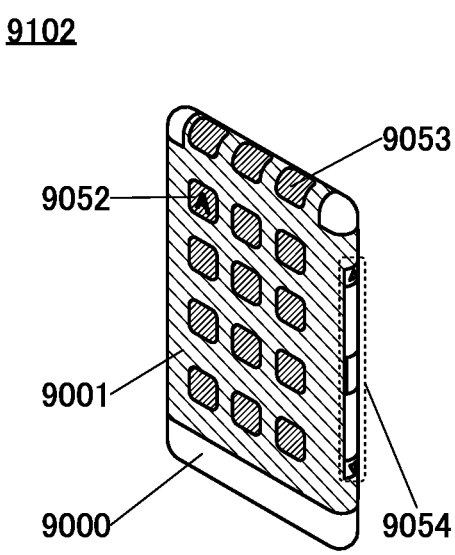

FIG. 28C is a perspective view showing a portable information terminal 9102. The portable information terminal 9102 has a function of displaying information on three or more surfaces of the display portion 9001. Here, an example in which information 9052, information 9053, and information 9054 are displayed on different surfaces is shown. For example, a user can check the information 9053 displayed in a position that can be observed from above the portable information terminal 9102, with the portable information terminal 9102 put in a breast pocket of his/her clothes. The user can see the display without taking out the portable information terminal 9102 from the pocket and decide whether to answer the call, for example.

FIG. 28D is a perspective view showing a watch-type portable information terminal 9200. For example, the portable information terminal 9200 can be used as a smart watch. The display surface of the display portion 9001 is curved and provided, and display can be performed along the curved display surface. Mutual communication between the portable information terminal 9200 and, for example, a headset capable of wireless communication enables hands-free calling. With the connection terminal 9006, the portable information terminal 9200 can perform mutual data transmission with another information terminal and charging. Note that the charging operation may be performed by wireless power feeding.

Figure 28F:
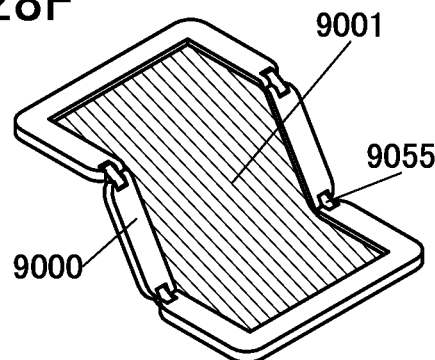
Figure 28G:
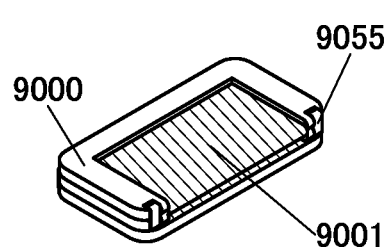

FIG. 28E, FIG. 28F, and FIG. 28G are perspective views showing a foldable portable information terminal 9201. FIG. 28E is a perspective view of an opened state of the portable information terminal 9201, FIG. 28G is a perspective view of a folded state thereof, and FIG. 28F is a perspective view of a state in the middle of change from one of FIG. 28E and FIG. 28G to the other. The portable information terminal 9201 is highly portable in the folded state and is highly browsable in the opened state because of a seamless large display region. The display portion 9001 of the portable information terminal 9201 is supported by three housings 9000 joined by hinges 9055. For example, the display portion 9001 can be folded with a radius of curvature greater than or equal to 1 mm and less than or equal to 150 mm.

Figure 29A:
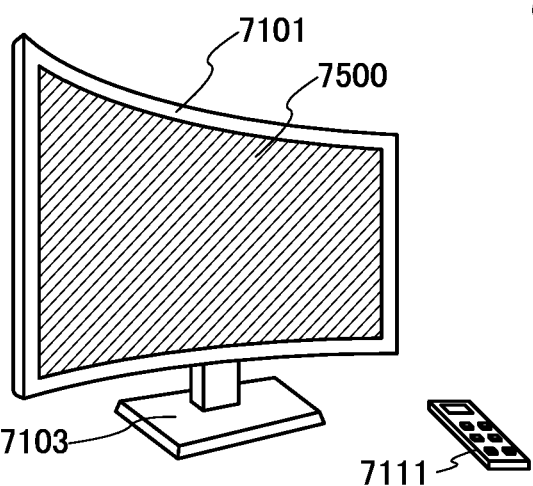
FIG. 29A, FIG. 29B, FIG. 29C, and FIG. 29D each illustrate a structure example of an electronic device.

FIG. 29A shows an example of a television device. In a television device 7100, a display portion 7500 is incorporated in a housing 7101. Here, a structure in which the housing 7101 is supported by a stand 7103 is shown.

Operation of the television device 7100 shown in FIG. 29A can be performed with an operation switch provided in the housing 7101 or a separate remote controller 7111. Alternatively, a touch panel may be used for the display portion 7500, and the television device 7100 may be operated by touch on the touch panel. The remote controller 7111 may include a display portion in addition to operation buttons.

Note that the television device 7100 may include a television receiver and a communication device for network connection.

Figure 29B:
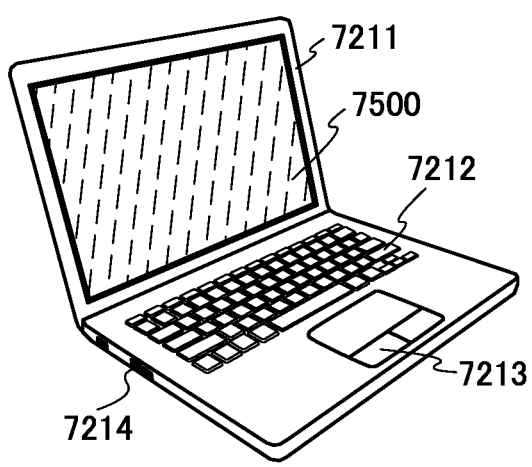

FIG. 29B shows a notebook personal computer 7200. The notebook personal computer 7200 includes a housing 7211, a keyboard 7212, a pointing device 7213, an external connection port 7214, and the like. The display portion 7500 is incorporated in the housing 7211.

Figure 29C:
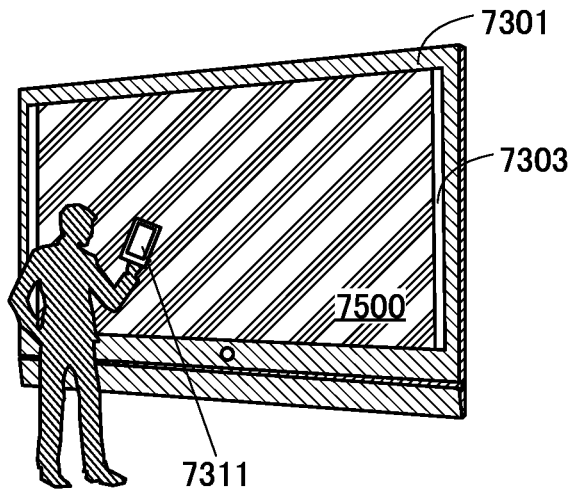
Figure 29D:
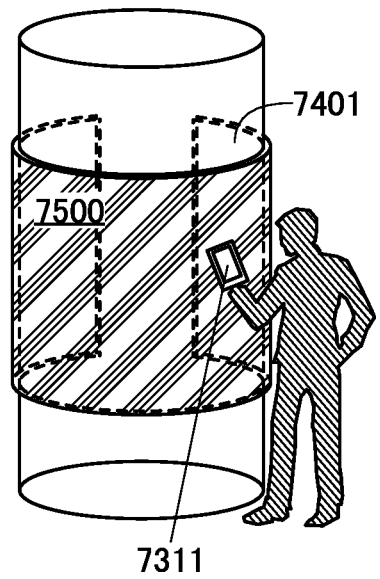

FIG. 29C and FIG. 29D show examples of digital signage.

Digital signage 7300 shown in FIG. 29C includes a housing 7301, the display portion 7500, a speaker 7303, and the like. Furthermore, the digital signage can include an LED lamp, operation keys (including a power switch or an operation switch), a connection terminal, a variety of sensors, a microphone, and the like.

FIG. 29(D) is digital signage 7400 attached to a cylindrical pillar 7401. The digital signage 7400 includes the display portion 7500 provided along a curved surface of the pillar 7401.

The larger display portion 7500 can increase the amount of information that can be provided at a time and attracts more attention, so that the effectiveness of the advertisement can be increased, for example.

A touch panel is preferably used for the display portion 7500 so that the user can operate the digital signage. Thus, the digital signage can be used not only for advertising but also for providing information that the user needs, such as route information, traffic information, and guidance information on a commercial facility.

As shown in FIG. 29C and FIG. 29D, it is preferable that the digital signage 7300 or the digital signage 7400 can work with an information terminal 7311 such as a user's smartphone through wireless communication. For example, information of an advertisement displayed on the display portion 7500 can be displayed on a screen of the information terminal 7311, or display on the display portion 7500 can be switched by operation of the information terminal 7311.

It is possible to make the digital signage 7300 or the digital signage 7400 execute a game with use of the information terminal 7311 as an operation means (controller). Thus, an unspecified number of users can join in and enjoy the game concurrently.

The display device of one embodiment of the present invention can be used for the display portion 7500 in FIG. 29A to FIG. 29D.

The electronic devices of this embodiment each include a display portion; however, one embodiment of the present invention can also be used in an electronic device without a display portion.

At least part of this embodiment can be implemented in combination with the other embodiments described in this specification as appropriate.

Example 1

In this example, the composition of a metal oxide film that can be used in a semiconductor device of one embodiment of the present invention was evaluated.

In this example, X-ray photoelectron spectroscopy (XPS) analysis was performed on metal oxide films fabricated with different methods, so that the compositions of the metal oxide films were evaluated. For the evaluation, samples (A1 to A5, Samples B1 and B2) in each of which a 100-nm-thick metal oxide film was formed over a glass substrate were used.

<Sample Fabrication>

In each of Samples A1 to A5, a metal oxide film was deposited by a sputtering method using an In—Ga—Zn oxide target (In:Ga:Zn=5:1:3 [atomic ratio]). In each of Samples B1 and B2, a metal oxide film was deposited by a sputtering method using an In—Zn oxide target (In:Zn=2:3 [atomic ratio]).

Table 1 shows deposition conditions of the metal oxide films in Samples A1 to A5 and Samples B1 and B2. Note that in Table 1, Target denotes the composition of the targets; Tsub, the substrate temperature in the deposition of the metal oxide film; $O_2/(Ar+O_2)$, the oxygen flow rate ratio; Pressure, the pressure; and Power, the power supply.

TABLE 1

| Sample | Target | Tsub | $O_2/(Ar + O_2)$ | Pressure | Power |
|---|---|---|---|---|---|
| A1 | In-Ga-Zn oxide (5:1:3) | RT | 10% | 0.6 Pa | 2.5 kW |
| A2 | | | 50% | | |
| A3 | | | 100% | | |
| A4 | | 130° C. | 10% | | |
| A5 | | | 100% | | |
| B1 | In-Zn oxide (2:3) | RT | 2% | | |
| B2 | | | 100% | | |

In fabrication of Sample A1, the substrate temperature in the deposition of the metal oxide film was set to room temperature (hereinafter, also referred to as RT). A mixed gas of an oxygen gas and an argon gas was used as a deposition gas, and the oxygen flow rate ratio was 10%. The deposition pressure was 0.6 Pa, and the power supply was 2.5 kW.

In fabrication of Sample A2, the substrate temperature in the deposition of the metal oxide film was set to room temperature (RT). A mixed gas of an oxygen gas and an argon gas was used as a deposition gas, and the oxygen flow rate ratio was 50%. The deposition pressure was 0.6 Pa, and the power supply was 2.5 kW.

In fabrication of Sample A3, the substrate temperature in the deposition of the metal oxide film was set to room temperature (RT). An oxygen gas (oxygen flow rate ratio: 100%) was used as a deposition gas. The deposition pressure was 0.6 Pa, and the power supply was 2.5 kW.

In fabrication of Sample A4, the substrate temperature in the deposition of the metal oxide film was set to 130° C. A mixed gas of an oxygen gas and an argon gas was used as a deposition gas, and the oxygen flow rate ratio was 10%. The deposition pressure was 0.6 Pa, and the power supply was 2.5 kW.

In fabrication of Sample A5, the substrate temperature in the deposition of the metal oxide film was set to 130° C. An oxygen gas (oxygen flow rate ratio: 100%) was used as a deposition gas. The deposition pressure was 0.6 Pa, and the power supply was 2.5 kW.

In fabrication of Sample B1, the substrate temperature in the deposition of the metal oxide film was set to room temperature (RT). A mixed gas of an oxygen gas and an argon gas was used as a deposition gas, and the oxygen flow rate ratio was 2%. The deposition pressure was 0.6 Pa, and the power supply was 2.5 kW.

In fabrication of Sample B2, the substrate temperature in the deposition of the metal oxide film was set to room temperature (RT). An oxygen gas (oxygen flow rate ratio: 100%) was used as a deposition gas. The deposition pressure was 0.6 Pa, and the power supply was 2.5 kW.

<X-Ray Photoelectron Spectroscopy Analysis>

Next, X-ray photoelectron spectroscopy (XPS) analysis was performed on Samples A1 to A5 and B1 and B2.

In the XPS analysis, a monochromatic Mg Kα ray (λ=1253.6 eV) was used for an X-ray source. The detection region was less than or equal to 8 mm square, and the extraction angle was set to 45°. The detection depth was estimated to be about 4 nm to 5 nm.

Table 2 shows the atomic ratio of indium (In) to gallium (Ga), zinc (Zn), and oxygen (O) in each sample (Sample), which was revealed from the XPS analysis. In Table 2, values relating to Samples A1 to A5 are normalized based on the atomic ratio of indium as 5.00, and values relating to Samples B1 and B2 are normalized based on the atomic ratio of indium as 2.00.

TABLE 2

| Sample | Target | In | Ga | Zn | O |
|---|---|---|---|---|---|
| A1 | In-Ga-Zn | 5.00 | 0.47 | 2.62 | 12.85 |
| A2 | oxide | 5.00 | 0.74 | 2.79 | 12.37 |
| A3 | (5:1:3) | 5.00 | 0.67 | 2.55 | 12.26 |
| A4 |  | 5.00 | 0.56 | 2.81 | 12.75 |
| A5 |  | 5.00 | 0.55 | 2.43 | 11.91 |
| B1 | In-Zn | 2.00 | — | 2.66 | 6.03 |
| B2 | oxixe (2:3) | 2.00 | — | 2.64 | 5.95 |

As shown in Table 2, it was found that, as for zinc, the value of the atomic ratio in the metal oxide film is lower than that in the target. In this example, as for zinc, the value of the atomic ratio in the metal oxide film was approximately higher than or equal to 81% and less than or equal to 94% of that in the target. As for gallium, such a tendency that the value of the atomic ratio in the metal oxide film is lower than that in the target was also found. However, since the curve-fitting In4d peak was removed in the quantification of gallium, the quantitative error is presumed to be made large. Thus, there is a possibility that the value of the gallium ratio shown in Table 2 is lower than the actual gallium content.

The structures shown in this example can be used in appropriate combination with any of the other embodiments and examples.

Example 2

In this example, the crystallinity of the composition of a metal oxide film that can be used for a semiconductor device of one embodiment of the present invention was evaluated.

In this example, X-ray diffraction (XRD) analysis was performed on metal oxide films fabricated with different methods, so that the crystallinity was evaluated. For the evaluation, samples (Samples C1 to C3, D1 to D3, and E1 to E3) in each of which a 100-nm-thick metal oxide film was formed over a glass substrate was used.

<Sample Fabrication>

In each of Samples C1 to C3, a metal oxide film was deposited by a sputtering method using an In—Ga—Zn oxide target (In:Ga:Zn=5:1:3 [atomic ratio]). In each of Samples D1 to D3, a metal oxide film was deposited by a sputtering method using an In—Zn oxide target (In:Zn=2:3 [atomic ratio]). In each of Samples E1 to E3, a metal oxide film was deposited by a sputtering method using an In—Zn oxide target (In:Zn=4:1 [atomic ratio]).

Table 3 shows deposition conditions of the metal oxide films of Samples C1 to C3, D1 to D3, and E1 to E3. Note that in Table 3, Target denotes the composition of the target; Tsub, the substrate temperature in the deposition of the metal oxide film; O$_2$/(Ar+O$_2$), the oxygen flow rate ratio; Pressure, the pressure; and Power, the power supply.

TABLE 3

| Sample | Target | Tsub | O$_2$/(Ar + O$_2$) | Pressure | Power |
|---|---|---|---|---|---|
| C1 | In-Ga-Zn | RT | 10% | 0.6 Pa | 2.5 kW |
| C2 | oxide |  | 30% |  |  |
| C3 | (5:1:3) |  | 50% |  |  |
| D1 | In-Zn | RT | 10% |  |  |
| D2 | oxide |  | 30% |  |  |
| D3 | (2:3) |  | 50% |  |  |
| E1 | In-Zn | RT | 10% |  |  |
| E2 | oxide |  | 30% |  |  |
| E3 | (4:1) |  | 50% |  |  |

<X-Ray Diffraction Analysis>

Next, X-ray diffraction (XRD) analysis was performed on Samples C1 to C3, D1 to D3, and E1 to E3.

In the XRD analysis, a θ-2θ scanning method which is a kind of an out-of-plane method was used. The θ-2θ scanning method is a method in which X-ray diffraction intensity is measured while an incident angle of an X-ray is changed and the angle of a detector facing an X-ray source is set equal to the incident angle. The θ-2θ scanning method is called a powder method in some cases. In the XRD analysis, a Cu Kα ray (λ=0.15418 nm) was used as an X-ray source, the scanning range at 2θ was 15 deg. to 50 deg., the step width was 0.01 deg., and the scanning speed was 6.0 deg./min.

Figure 30:
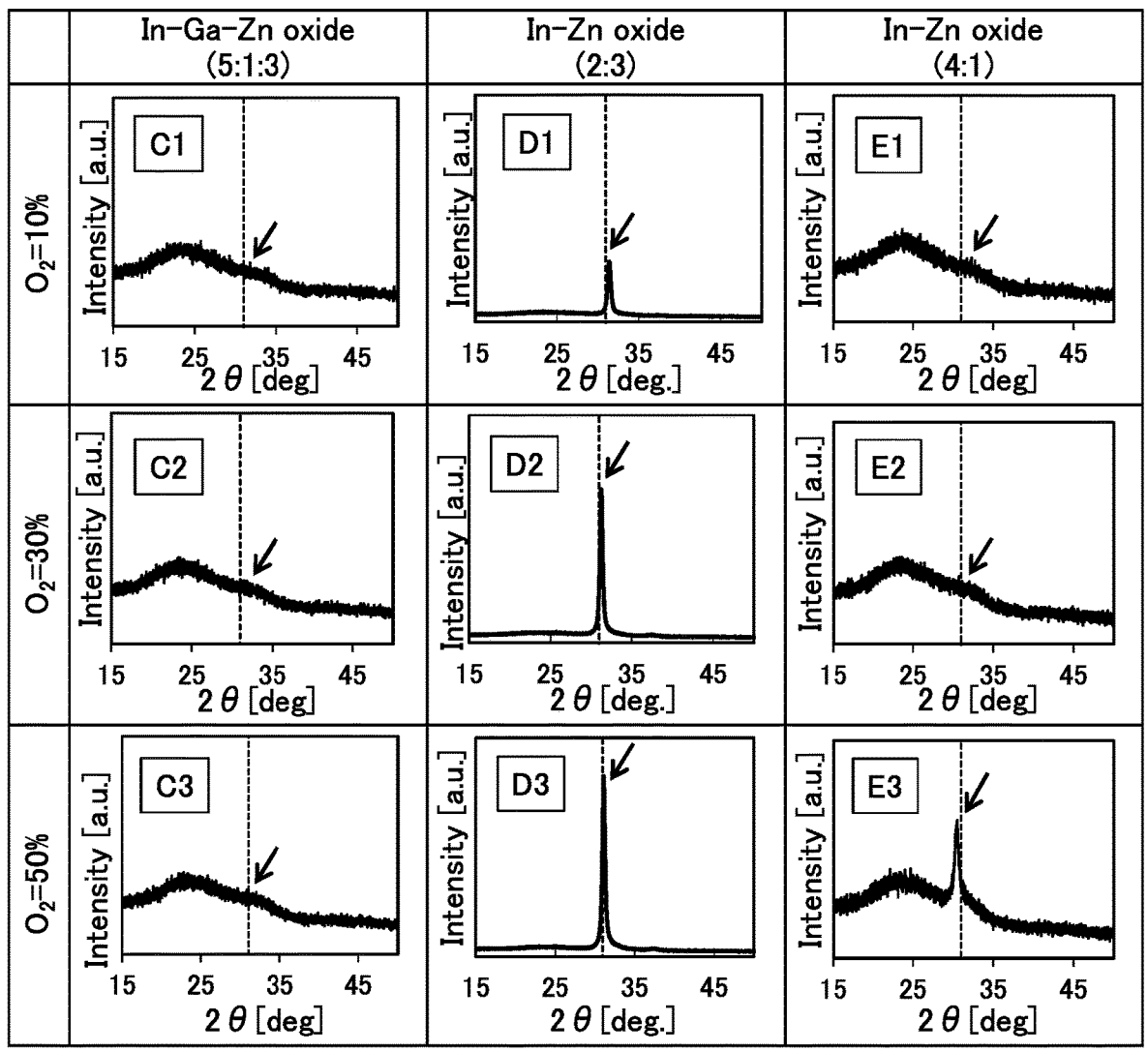
FIG. 30 is a diagram showing XRD analysis results.

FIG. 30 shows XRD analysis results. In FIG. 30, each horizontal axis represents the diffraction angle 2θ and each vertical axis represents the intensity of diffraction X-ray. In addition, dashed lines representing 2θ=31 deg. are shown as auxiliary lines in FIG. 30.

As shown in FIG. 30, a peak was observed in each sample when 2θ was around =31 deg., which demonstrates that each sample has crystallinity. Note that the vertical axes for Samples D1 to D3 in FIG. 30 have different scales from those for the other samples because the peak intensities observed in Samples D1 to D3 were high. Note that broad peaks where 2θ is at around 24 deg. are derived from the glass substrate.

The structures shown in this example can be used in appropriate combination with any of the other embodiments and examples.

Example 3

In this example, transistors (Samples F, G, and H) were fabricated, and drain current-gate voltage characteristics (ID-VG characteristics) thereof were evaluated. Note that transistors corresponding to the transistor 100 illustrated in FIG. 8 and the transistor 100A illustrated in FIG. 9 were fabricated. In this example, samples (F, G, and H) including the semiconductor layers 108 with different compositions were fabricated.

<Sample Fabrication>

First, a tungsten film with a thickness approximately 100 nm was deposited by a sputtering method over a glass substrate and processed to obtain a first gate electrode. Then, as a first gate insulating layer, a first silicon nitride film with a thickness approximately 240 nm, a second silicon nitride film with a thickness approximately 60 nm, and a silicon oxynitride film with a thickness approximately 3 nm were deposited by a plasma CVD method and stacked.

The first silicon nitride film was deposited under the conditions where the flow rates of a silane gas, a nitrogen gas, and an ammonia gas were 290 sccm, 2000 sccm, and 2000 sccm, respectively, the pressure was 200 Pa, the deposition power was 3000 W, and the substrate temperature was 350° C.

The second silicon nitride film was deposited under the conditions where the flow rates of a silane gas, a nitrogen gas, and an ammonia gas were 200 sccm, 2000 sccm, and 100 sccm, respectively, the pressure was 100 Pa, the deposition power was 2000 W, and the substrate temperature was 350° C.

The silicon oxynitride film was deposited under the conditions where the flow rates of a silane gas and a dinitrogen monoxide gas were 20 sccm and 3000 sccm, respectively, the pressure was 40 Pa, the deposition power was 3000 W, and the substrate temperature was 350° C.

Next, a first metal oxide film with a thickness of 30 nm was formed over the first gate insulating layer and processed to obtain a semiconductor layer. Here, three samples (F, G, and H) including first metal oxide films deposited under different conditions were fabricated. In fabrication of Sample F, the first metal oxide film was deposited by a sputtering method using an In—Ga—Zn oxide target (In:Ga:Zn=5:1:3 [atomic ratio]). In fabrication of Sample G, the first metal oxide film was deposited by a sputtering method using an In—Zn oxide target (In:Zn=2:3 [atomic ratio]). In fabrication of Sample H, the first metal oxide film was deposited by a sputtering method using an In—Zn oxide target (In:Zn=4:1 [atomic ratio]).

Table 4 shows deposition conditions of the first metal oxide films of Samples F, G, and H. Note that in Table 4, Target denotes the composition of the targets; Tsub, the substrate temperature in the deposition of the first metal oxide film; $O_2/(Ar+O_2)$, the oxygen flow rate ratio; Pressure, the pressure; and Power, the power supply.

TABLE 4

| Sample | Target | Tsub | $O_2/(Ar + O_2)$ | Pressure | Power |
|---|---|---|---|---|---|
| F | In-Ga-Zn oxide (5:1:3) | RT | 10% | 0.6 Pa | 2.5 kW |
| G | In-Zn oxide (2:3) | RT | 2% | | |
| H | In-Zn oxide (4:1) | RT | 10% | | |

After the semiconductor layer was formed, heat treatment was performed at 350° C. in a nitrogen gas atmosphere for one hour. After that, another heat treatment was performed at 350° C. in a mixed gas atmosphere of a nitrogen gas and an oxygen gas for one hour. Note that the mixed gas atmosphere had a volume ratio of the nitrogen gas to the oxygen gas of 4:1.

Next, as a second gate insulating layer, a first silicon oxynitride film with a thickness approximately 5 nm, a second silicon oxynitride film with a thickness approximately 140 nm, and a third silicon oxynitride film with a thickness approximately 5 nm were each deposited by a plasma CVD method.

The first silicon oxynitride film was deposited under the conditions where the flow rates of a silane gas and a dinitrogen monoxide gas were 24 sccm and 18000 sccm, respectively, the pressure was 200 Pa, the deposition power was 130 W, and the substrate temperature was 350° C.

The second silicon oxynitride film was deposited under the conditions where the flow rates of a silane gas and a dinitrogen monoxide gas were 200 sccm and 4000 sccm, respectively, the pressure was 300 Pa, the deposition power was 750 W, and the substrate temperature was 350° C.

The third silicon oxynitride film was deposited under the conditions where the flow rates of a silane gas and a dinitrogen monoxide gas were 20 sccm and 3000 sccm, respectively, the pressure was 40 Pa, the deposition power was 500 W, and the substrate temperature was 350° C.

Next, a second metal oxide film with a thickness of 20 nm was deposited by a sputtering method over the second gate insulating layer. The second metal oxide film was deposited by a sputtering method using an In—Ga—Zn oxide target (In:Ga:Zn=4:2:4.1 [atomic ratio]). The substrate temperature in the deposition was 100° C. An oxygen gas (oxygen flow rate ratio: 100%) was used as a deposition gas. The power supply was set to 2.5 kW, and the pressure was set to 0.6 Pa.

After that, heat treatment was performed in an atmosphere containing nitrogen at 350° C. for one hour.

Next, as a conductive film, a molybdenum film with a thickness approximately 100 nm was deposited over the second metal oxide film by a sputtering method.

Then, a resist pattern was formed over the conductive film.

After that, the conductive film was etched using the resist pattern as a mask to obtain the conductive layer. A dry etching method was used for the etching, and a $SF_6$ gas was used as an etching gas.

Next, the second metal oxide film was etched to obtain a metal oxide layer. A wet etching method was used for the etching.

Next, treatment for adding an impurity element was conducted with use of the conductive layer as a mask. In the treatment, boron was used as an impurity element, and a plasma ion doping apparatus was used. A $B_2H_6$ gas was used as a gas for supplying boron.

Next, a silicon oxynitride film with a thickness approximately 300 nm was deposited by a plasma CVD method as a protective insulating layer covering the transistor.

The protective insulating layer was deposited under the conditions where the flow rates of a silane gas and a nitrogen gas were 290 sccm and 4000 sccm, respectively, the pressure was 133 Pa, the deposition power was 1000 W, and the substrate temperature was 350° C.

Next, an opening was formed in part of the protective insulating layer and part of the second gate insulating layer by etching, and a molybdenum film was deposited by a sputtering method and then processed to obtain a source electrode and a drain electrode. After that, an approximately 1.5-μm-thick acrylic film was formed as a planarization layer, and heat treatment was performed at a temperature of 250° C. in a nitrogen atmosphere for one hour.

Through the above steps, Samples F, G, and H each including the transistor formed over the glass substrate were obtained.

<ID-VG Characteristic Evaluation>

Next, the ID-VG characteristics of the transistors fabricated as above were measured.

For measuring the ID-VG characteristics of the transistors, a voltage applied to the gate electrode (hereinafter also referred to as a gate voltage (VG)) was applied from −15 V to +20 V in increments of 0.25 V. Moreover, a voltage applied to the source electrode (hereinafter also referred to as a source voltage (VS)) was 0 V (comm), and a voltage applied to the drain electrode (hereinafter also referred to as a drain voltage (VD)) was 0.1 V and 10 V.

Figure 31:
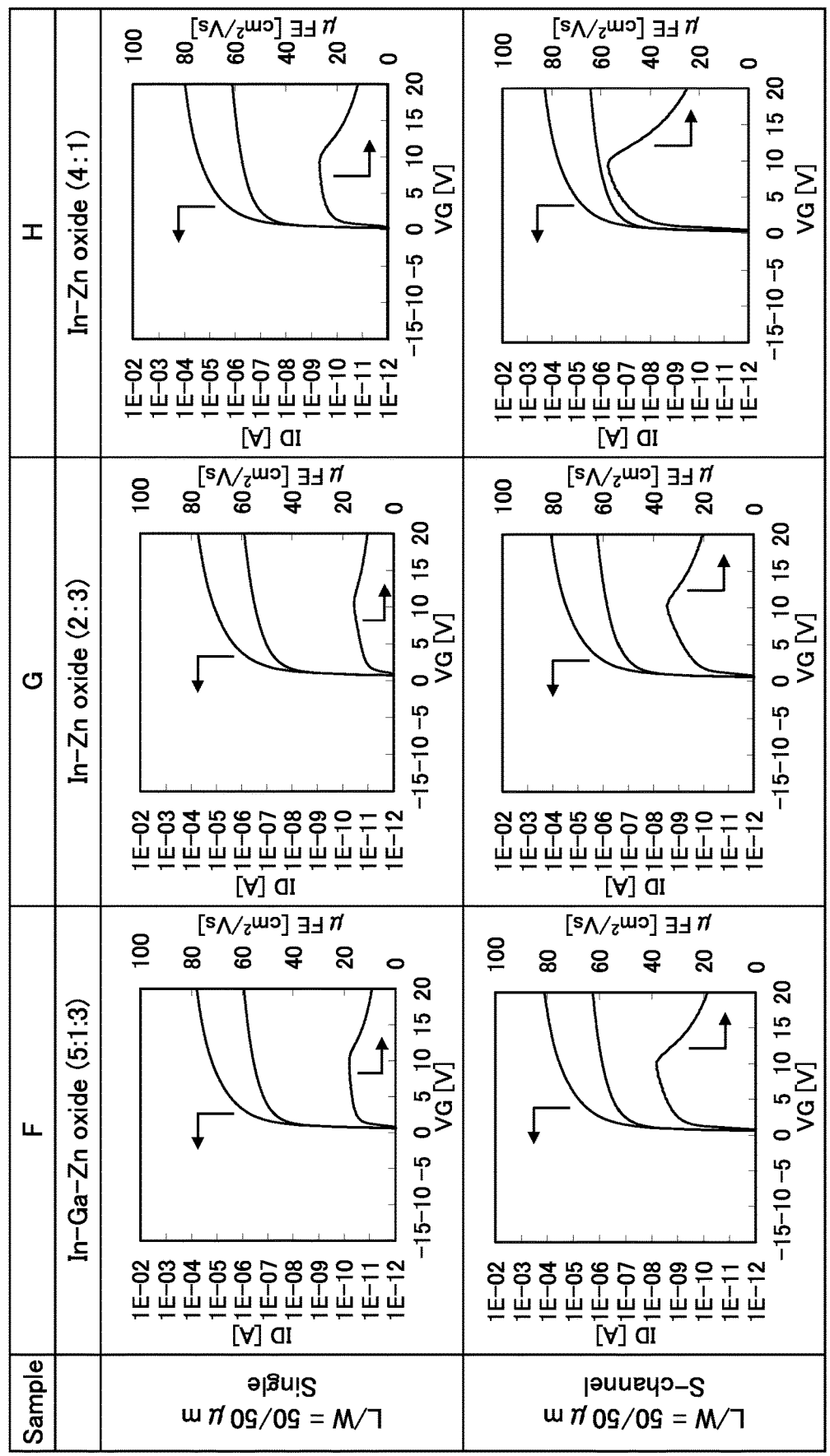
FIG. 31 is a diagram showing ID-VG characteristics of transistors.

FIG. 31 shows ID-VG characteristics of Samples F, G, and H. In FIG. 31, the samples (Sample) and the conditions for the semiconductor layer 108 are written in the lateral direction. The ID-VG characteristics under the conditions where the structures of the transistor are different are shown in the longitudinal direction. The ID-VG characteristics shown in the upper row are for the transistor corresponding to the transistor 100 illustrated in FIG. 8, and the ID-VG characteristics shown in the lower row are for the transistor corresponding to the transistor 100A illustrated in FIG. 9. Furthermore, the transistors shown here each have a channel length of 50 μm and a channel width of 50 μm. In the ID-VG characteristics of FIG. 31, each horizontal axis represents the gate voltage (VG), each left vertical axis represents the drain current (ID), and each right vertical axis represents the field-effect mobility (μFE). Note that measurement of ID-VG characteristics was conducted on one transistor in each sample.

Figure 32:
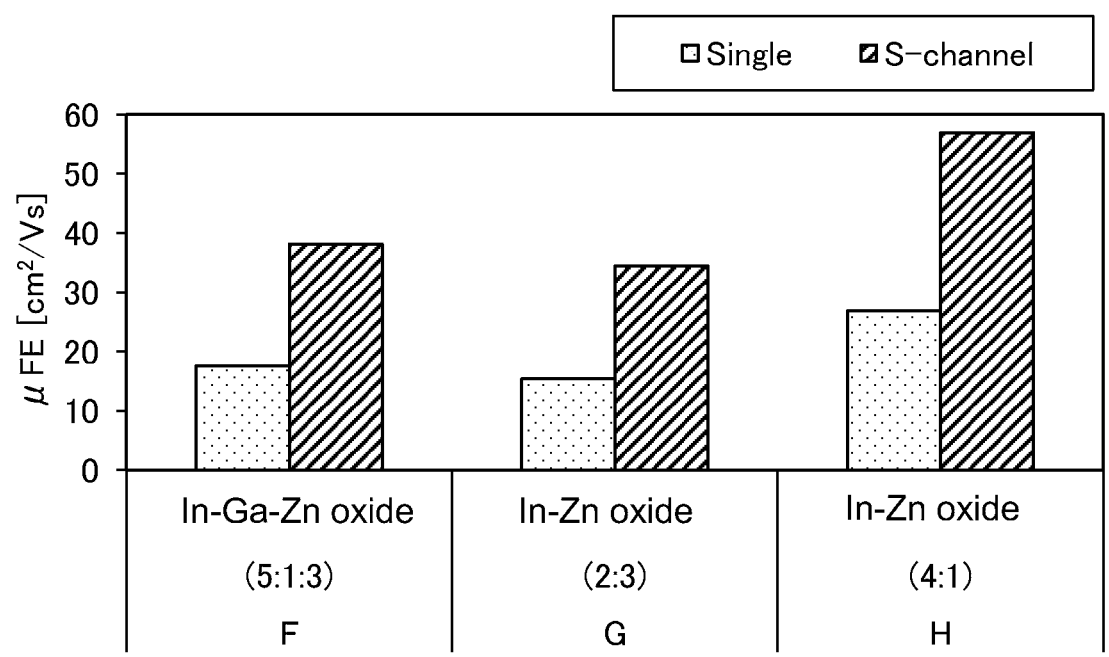
FIG. 32 is a graph showing mobility of transistors.

FIG. 32 shows the field-effect mobility (μFE) of Samples F, G, and H. In FIG. 32, the horizontal axis represents the samples and the conditions for the semiconductor layer 108, and the vertical axis represents the field-effect mobility (μFE). In FIG. 32, the transistor 100 illustrated in FIG. 8 is denoted by Single, and the transistor 100A illustrated in FIG. 9 is denoted by S-channel. The field-effect mobility (μFE) indicates the maximum value under the conditions where the transistor had a channel length of 50 μm and a channel width of 50 μm and VG was up to 10 V.

As shown in FIG. 31 and FIG. 32, each sample was demonstrated to have favorable electrical characteristics. In addition, it was found that the field-effect mobility (μFE) become high as the indium content was high.

The structures shown in this example can be used in appropriate combination with any of the other embodiments and examples.

Example 4

In this example, a transistor corresponding to the transistor 100C_a illustrated in FIG. 12D was fabricated, and drain current-gate voltage characteristics (ID-VG characteristics) and reliability thereof were evaluated. In this example, samples (J and K) including the semiconductor layers 108 with different compositions were formed. The insulating layer 110 functioning as a gate insulating layer had a single-layer structure.

<Sample Fabrication 1>

Fabrication methods for Samples J and K are described below.

First, a 30-nm-thick titanium film and a 100-nm-thick copper film were formed in this order over a glass substrate by a sputtering method, and then processed to obtain a first gate electrode (bottom gate).

Next, as a first gate insulating layer, a 50-nm-thick first silicon nitride film, a 150-nm-thick second silicon nitride film, a 100-nm-thick third silicon nitride film, and a 3-nm-thick first silicon oxynitride film were deposited in this order.

The first silicon nitride film and the third silicon nitride film were each deposited by a PECVD method using a mixed gas of a silane gas at a flow rate of 200 sccm, a nitrogen gas at a flow rate of 2000 sccm, and an ammonia gas at a flow rate of 100 sccm. The deposition pressure was 100 Pa, the deposition power was 2000 W, and the substrate temperature was 350° C.

The second silicon nitride film was deposited by a PECVD method using a mixed gas of a silane gas at a flow rate of 290 sccm, a nitrogen gas at a flow rate of 2000 sccm, and an ammonia gas at a flow rate of 2000 sccm. The deposition pressure was 200 Pa, the deposition power was 3000 W, and the substrate temperature was 350° C.

The first silicon oxynitride film was deposited by a PECVD method using a mixed gas of a silane gas at a flow rate of 20 sccm and a dinitrogen monoxide gas at a flow rate of 3000 sccm. The deposition pressure was 40 Pa, the deposition power was 3000 W, and the substrate temperature was 350° C.

Next, a first metal oxide film was deposited over the first silicon oxynitride film. Here, the two samples (Samples J and K) including the first metal oxide films deposited under different deposition conditions were fabricated. Sample K is one embodiment of the present invention, and Sample J is a comparative example.

The first metal oxide film of Sample J was deposited by a sputtering method using an In—Ga—Zn oxide target (In:Ga:Zn=1:1:1 [atomic ratio]). The deposition pressure was 0.6 Pa, the power supply was 2.5 kW, and the substrate temperature was room temperature. A mixed gas of an oxygen gas and an argon gas was used as a deposition gas, and the oxygen flow rate ratio was 30%. The thickness of the first metal oxide film was 25 nm.

The first metal oxide film of Sample K had a stacked-layer structure including a first oxide film and a second oxide film over the first oxide film. The first metal oxide film was deposited by a sputtering method using an In—Ga—Zn oxide target (In:Ga:Zn=1:1:1 [atomic ratio]). The deposition pressure was 0.6 Pa, the power supply was 2.5 kW, and the substrate temperature was room temperature. A mixed gas of an oxygen gas and an argon gas was used as a deposition gas, and the oxygen flow rate ratio was 30%. The second oxide film was deposited by a sputtering method using an In—Zn oxide target (In:Zn=4:1 [atomic ratio]). The deposition pressure was 0.6 Pa, the power supply was 3.0 kW, and the substrate temperature was room temperature. A mixed gas of an oxygen gas and an argon gas was used as a deposition gas, and the oxygen flow rate ratio was 5%. The thickness of the first oxide film was 20 nm, and the thickness of the second oxide film was 5 nm.

Then, the first metal oxide film was processed into an island shape to form a first metal oxide layer.

Subsequently, after heat treatment was performed at 370° C. in a nitrogen atmosphere for one hour, another heat treatment was performed at 370° C. in a mixed gas atmosphere of nitrogen and oxygen (nitrogen gas flow rate: oxygen gas flow rate=4:1) for one hour. An oven apparatus was used for the heat treatment.

Next, as a second gate insulating layer, a second silicon oxynitride film was formed to have a thickness of 140 nm. Note that the deposition condition where a large amount of nitrogen oxides (NOx: X is greater than or equal to 0 and less than or equal to 2) is released by heat application was used for the second silicon oxynitride film. The second silicon oxynitride film was deposited by a PECVD method using a mixed gas of a silane gas at a flow rate of 200 sccm and a dinitrogen monoxide gas at a flow rate of 8000 sccm. The deposition pressure was 250 Pa, the deposition power was 2000 W, and the substrate temperature was 240° C.

It is preferable for the second silicon oxynitride film in contact with the first metal oxide layer that the amount of nitrogen oxides released by heat application be small. Examples of nitrogen oxide include $NO_2$ and NO. A nitrogen oxide included in the second silicon oxynitride film causes formation of a level in the second silicon oxynitride film or the like. The level is positioned in the energy gap of the first metal oxide layer. Thus, when the nitrogen oxide diffuses toward an interface between the second silicon oxynitride film and the first metal oxide layer, the level traps electrons on the second silicon oxynitride film side in some cases. As a result, the trapped electrons remain in the vicinity of the interface between the second silicon oxynitride film and the first metal oxide layer, whereby the threshold voltage of the transistor is shifted in the positive direction.

In this example, with use of an insulating film from which a large amount of nitrogen oxides is released for the second silicon oxynitride film, the effect of the composition of the first metal oxide layer on characteristics of the transistor was examined under conditions of a large amount of nitrogen oxides.

To evaluate the second silicon oxynitride film itself, another sample (Sample L) different from Samples J and K was fabricated. Detailed description of Sample L will be made later.

Subsequently, heat treatment was performed at 370° C. in a nitrogen atmosphere for one hour. An oven apparatus was used for the heat treatment.

Next, a second metal oxide film with a thickness of 20 nm was deposited over the second silicon oxynitride film. The second metal oxide film was deposited by a sputtering method using an In—Zn oxide target (In:Zn=2:3 [atomic ratio]). The deposition pressure was 0.3 Pa, the power supply was 4.5 kW, and the substrate temperature was room temperature. An oxygen gas (oxygen flow rate ratio: 100%) was used as a deposition gas.

Subsequently, heat treatment was performed at 370° C. in a mixed gas atmosphere of nitrogen and oxygen (nitrogen gas flow rate:oxygen gas flow rate=4:1) for one hour. An oven apparatus was used for the heat treatment.

Next, a copper film with a thickness of 100 nm and a third metal oxide film with a thickness of 30 nm were deposited in this order over the second metal oxide film. The copper film and the third metal oxide film were deposited by a sputtering method. The copper film was deposited by a sputtering method using a Cu target. The third metal oxide film was deposited by a sputtering method using an In—Zn oxide target (In:Zn=2:3 [atomic ratio]). The deposition pressure was 0.6 Pa, the power supply was 2.5 kW, and the substrate temperature was room temperature. A mixed gas of an oxygen gas and an argon gas was used as a deposition gas, and the oxygen flow rate ratio was 30%.

Subsequently, a resist mask was formed over the third metal oxide film, and the second metal oxide film, the copper film, and the third metal oxide film were processed to form a second metal oxide layer, a copper layer, and a third metal oxide layer. A wet etching method was used for the processing.

Then, cleaning was performed. For the cleaning, an aqueous solution in which 85 weight % phosphoric acid was diluted 500 times was used. The etchant temperature at the time of etching was room temperature, and the treatment time was 15 sec.

Then, the second silicon oxynitride film was etched using the aforementioned resist mask as a mask to form a second gate insulating layer. In addition, at the time of forming the second gate insulating layer, the first silicon oxynitride film in a region that does not overlap with the resist mask was removed to expose part of the third silicon nitride film A dry etching method was used for the processing. After that, the resist mask was removed.

Then, as a protective layer covering the transistor, a 100-nm-thick fourth silicon nitride film and a 300-nm-thick third silicon oxynitride film were deposited in this order.

The fourth silicon nitride film was deposited by a PECVD method using a mixed gas of a silane gas at a flow rate of 150 sccm, a nitrogen gas at a flow rate of 5000 sccm, and an ammonia gas at a flow rate of 100 sccm. The deposition pressure was 200 Pa, the deposition power was 2000 W, and the substrate temperature was 350° C.

The third silicon oxynitride film was deposited by a PECVD method using a mixed gas of a silane gas at a flow rate of 290 sccm and a dinitrogen monoxide gas at a flow rate of 4000 sccm. The deposition pressure was 133 Pa, the deposition power was 1000 W, and the substrate temperature was 350° C.

Next, an opening was formed in part of the protective layer covering the transistor, and a 100-nm-thick molybdenum film was deposited by a sputtering method and then processed to obtain a source electrode and a drain electrode. After that, an approximately 1.5-μm-thick acrylic resin film was formed as a planarization layer, and heat treatment was performed under the conditions of a temperature of 250° C. in a nitrogen atmosphere for one hour.

Through the above steps, Samples J and K each including the transistor formed over the glass substrate were obtained.
<Sample Fabrication 2>

A fabrication method of Sample L is described.

An approximately 100-nm-thick silicon oxynitride film was formed over a glass substrate. For the silicon oxynitride film, the same deposition conditions as those for the second silicon oxynitride film used as the second gate insulating layer in each of Samples J and K were used.
<TDS Analysis>

Next, a released gas from Sample L was evaluated using thermal desorption spectrometry (TDS). In the TDS analysis, the substrate temperature was increased from approximately 50° C. to approximately 520° C. at a substrate temperature rising rate of 30° C./min.

Figure 33:
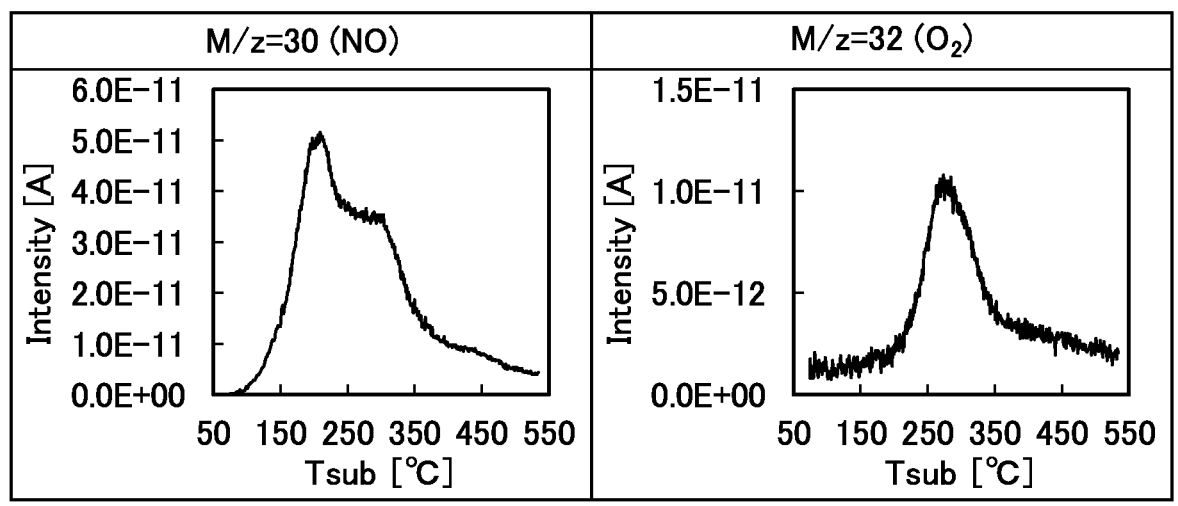
FIG. 33 is a diagram showing TDS analysis results.

TDS analysis results of Sample L are shown in FIG. 33. FIG. 33 shows a result of TDS analysis at a mass-to-charge ratio of 30 (M/z=30) on the left side and a result of TDS analysis at a mass-to-charge ratio of 32 (M/z=32) on the right side. A gas with a mass-to-charge ratio of 30 (M/z=30) is mainly a nitrogen monoxide molecule. A gas with a mass-to-charge ratio of 32 (M/z=32) is mainly an oxygen molecule. In FIG. 33, the horizontal axis represents the substrate temperature (Tsub), and the vertical axis represents the detection intensity (Intensity) at a mass-to-charge ratio of 30 (M/z=30) or the detection intensity (Intensity) at a mass-to-charge ratio of 32 (M/z=32).

As shown in FIG. 33, it was found that Sample L releases the oxygen and nitrogen oxide when heat is applied. Thus, it is considered that the second silicon oxynitride film used as the second gate insulating layer of each of the transistors (Samples J and K) releases nitrogen oxide as well as oxygen when heat is applied.

<ID-VG Characteristic Evaluation>

Next, ID-VG characteristics of the transistors (Samples J and K) were measured.

For measuring the ID-VG characteristics of the transistors, a voltage applied to the gate electrode (hereinafter also referred to as a gate voltage (VG)) was applied from −15 V to +20 V in increments of 0.25 V. The voltage applied to the source electrode (VS) was 0 V (comm), and the voltage applied to the drain electrode (VD) was 0.1 V and 5.1 V.

Figure 34:
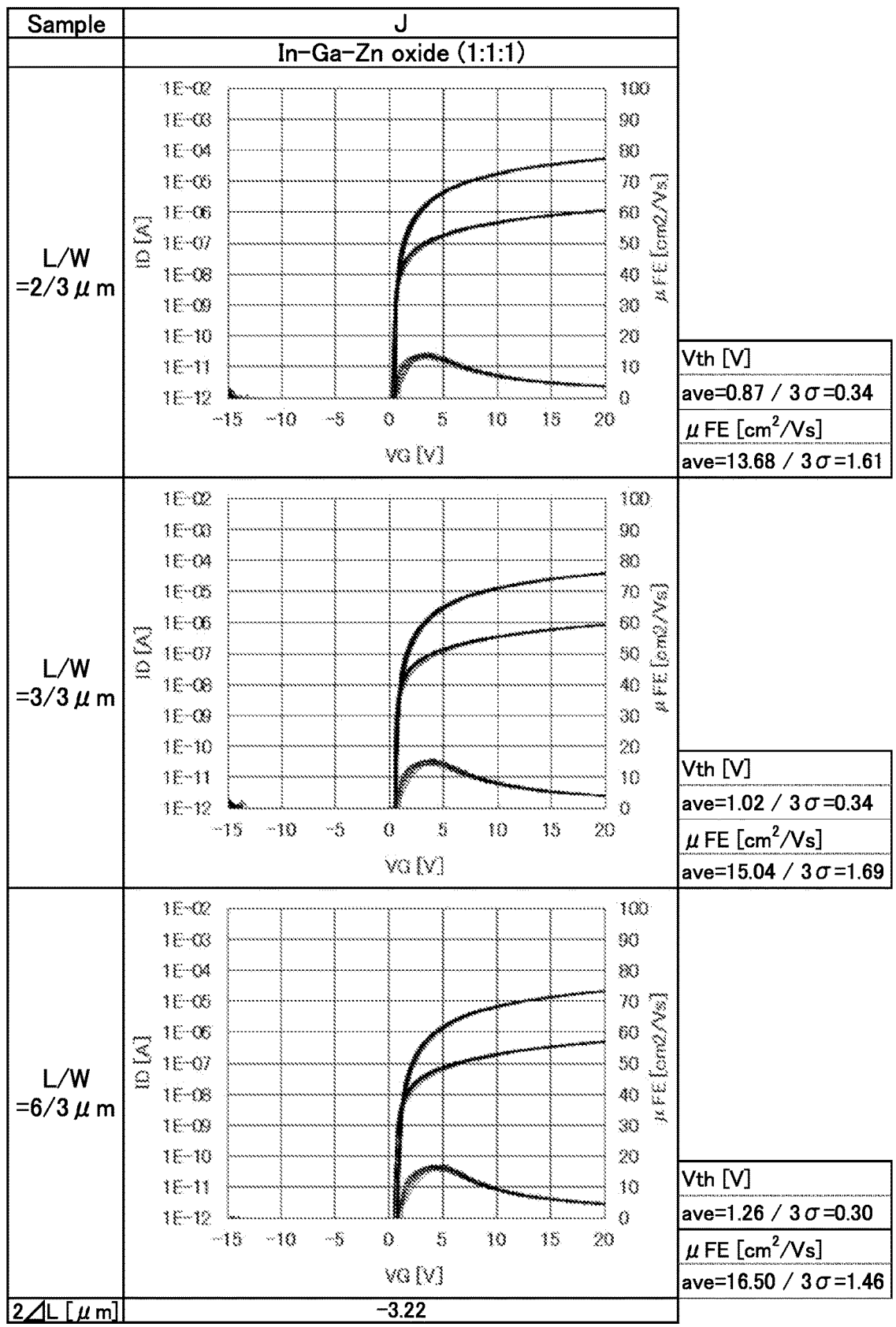
FIG. 34 is a diagram showing ID-VG characteristics of transistors.
Figure 35:
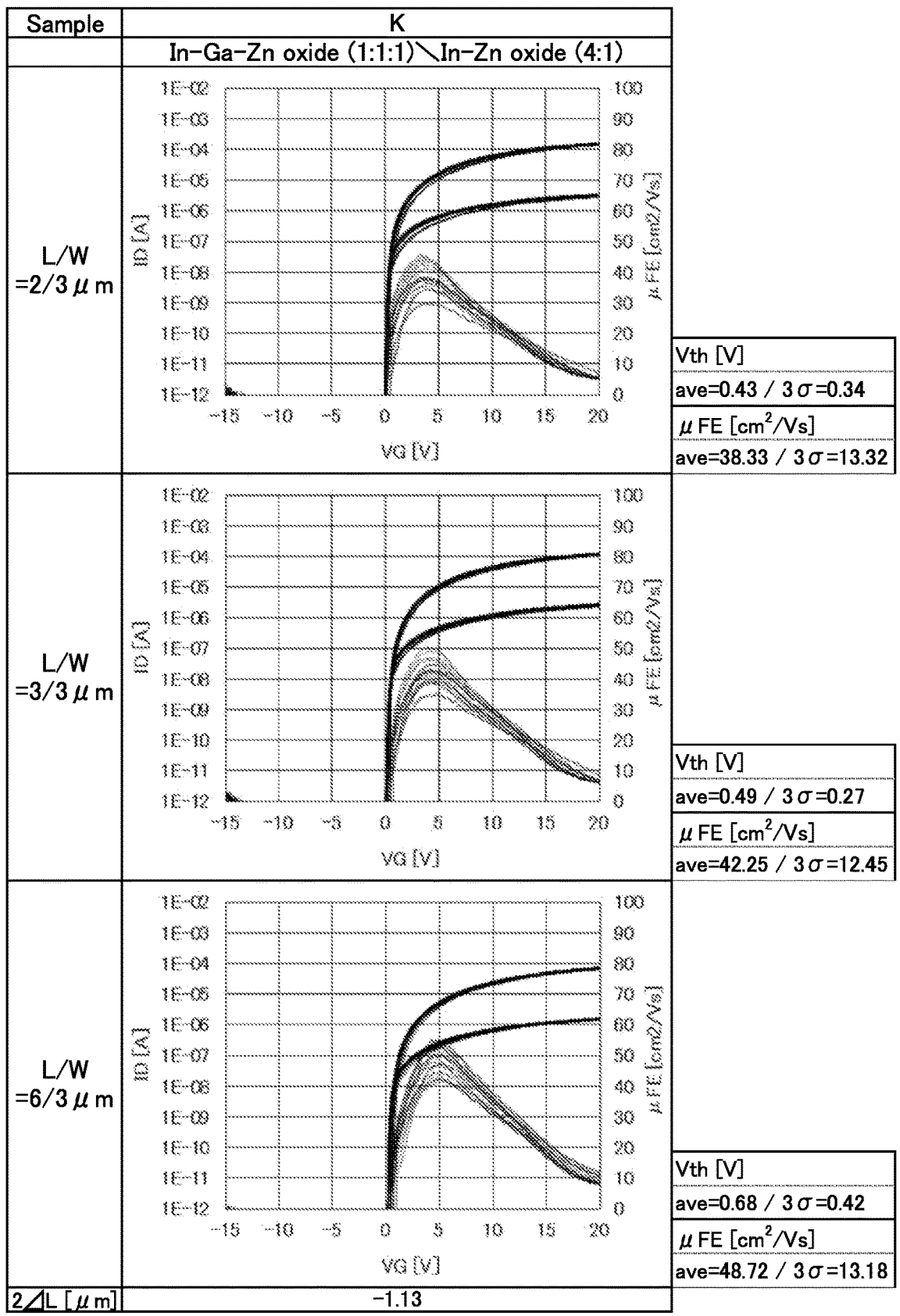
FIG. 35 is a diagram showing ID-VG characteristics of transistors.

FIG. 34 shows ID-VG characteristics of Sample J. FIG. 35 shows ID-VG characteristics of Sample K. In each of FIG. 34 and FIG. 35, the sample and the condition for the semiconductor layer 108 are written. Furthermore, in each of FIG. 34 and FIG. 35, different conditions of the channel length and the channel width of the transistor are written in the longitudinal direction; specifically, three kinds of transistors with a channel length of 2 μm and a channel width of 3 μm, a channel length of 3 μm and a channel width of 3 μm, and a channel length of 6 μm and a channel width of 3 μm are shown. Moreover, in each of FIG. 34 and FIG. 35, the horizontal axis represents the gate voltage (VG), the left vertical axis represents the drain current (ID), and the right vertical axis represents the saturation mobility (μFE) when VG=15 V. Note that ID-VG characteristics of 20 transistors were measured for each sample.

Each of FIG. 34 and FIG. 35 shows the average (ave) and 3σ of the threshold voltage (Vth) and saturation mobility (μFE) for each transistor size. Note that a represents a standard deviation. Each of FIG. 34 and FIG. 35 also shows a difference (2ΔL) between the designed channel length and the effective channel length. The effective channel length was obtained by TLM (Transmission Line Model) analysis.

<Reliability Evaluation>

Next, reliability of the transistors (Samples J and K) was evaluated. In this example, a PBTS (Positive Bias Temperature Stress) test in which a state where a positive potential relative to a source potential and a drain potential is applied to a gate is maintained at high temperatures was performed.

In the PBTS test, a substrate over which the transistor was formed was held at 60° C., a voltage of 0.1 V was applied to the drain of the transistor, and a voltage of 20 V was applied to the gate; this state was held for one hour. The test was performed in a dark environment. In the PBTS test, the transistor having a channel length of 2 μm and a channel width of 3 μm was used, and the amount of change in threshold voltage (ΔVth) before and after the gate bias stress test was evaluated.

Figure 36:
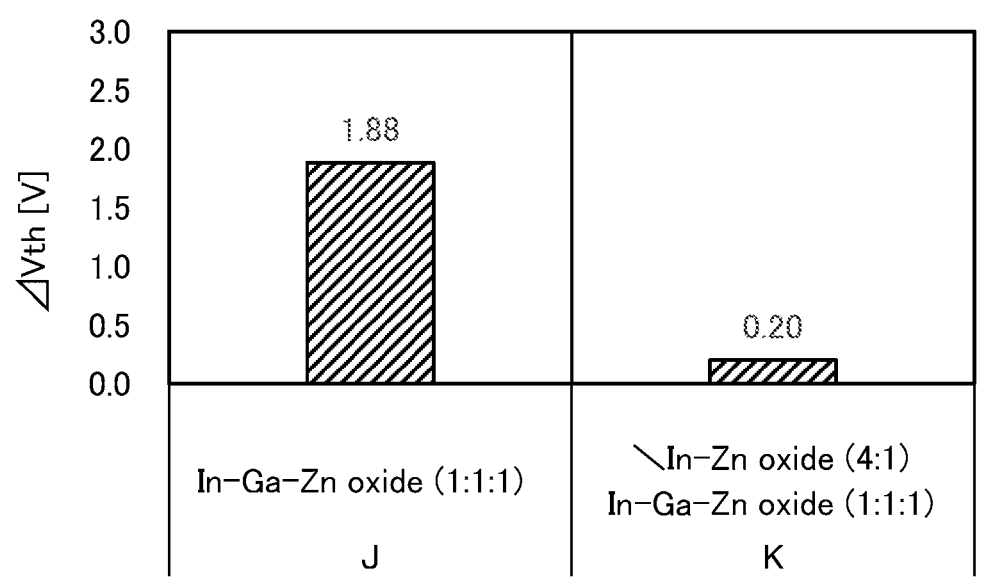
FIG. 36 is a graph showing reliability of transistors.
Figure 37:
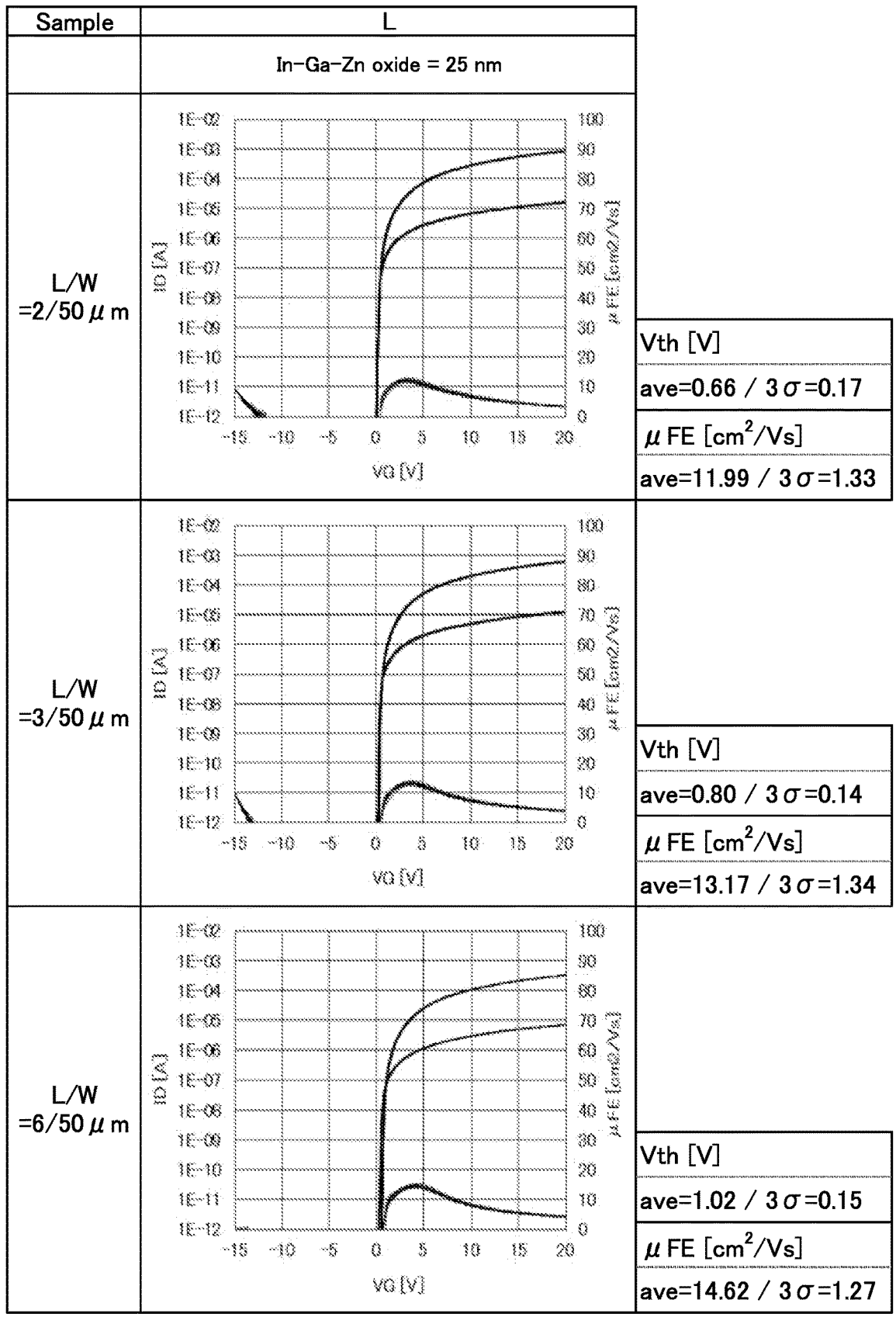
FIG. 37 is a diagram showing ID-VG characteristics of transistors.
Figure 38:
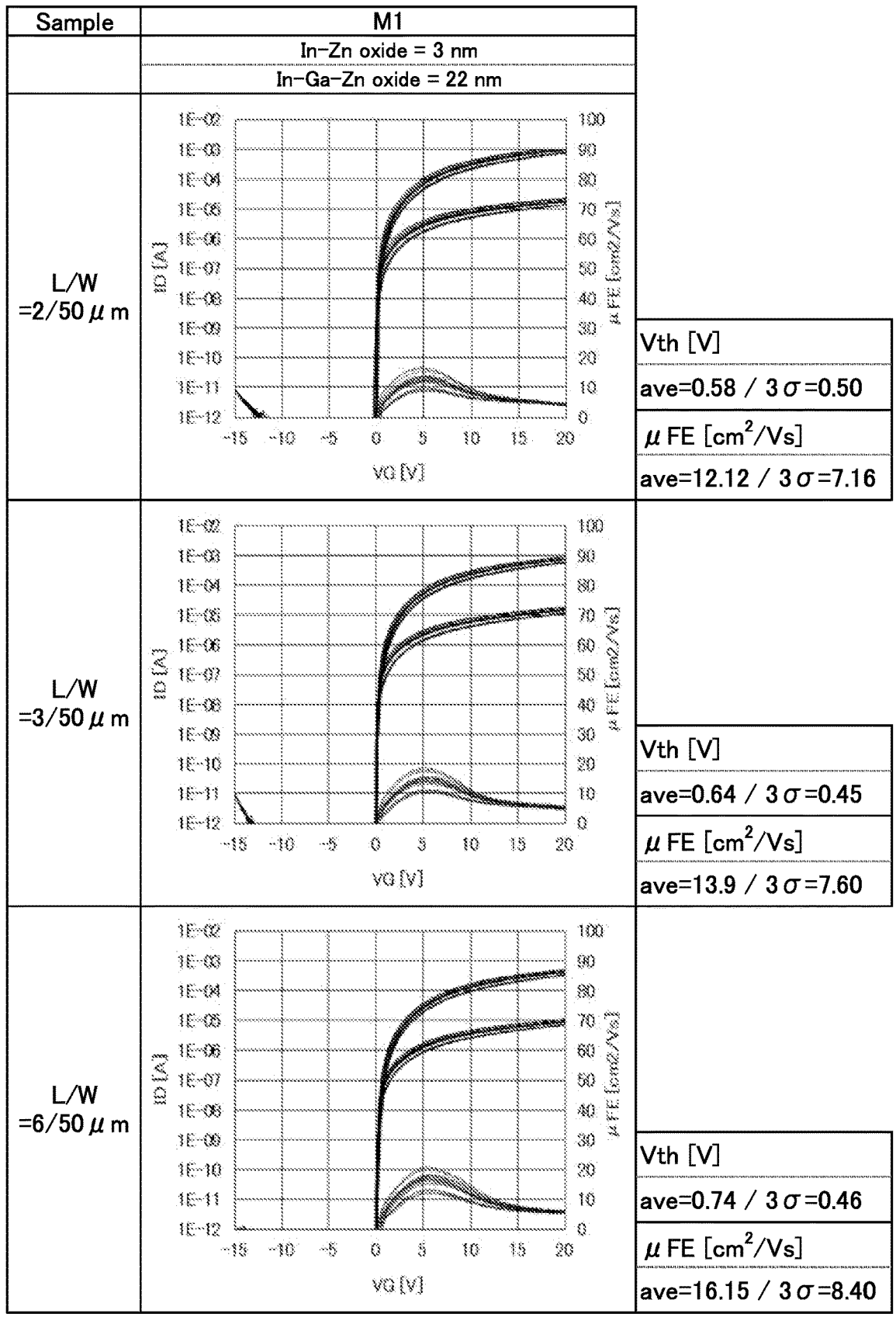
FIG. 38 is a diagram showing ID-VG characteristics of transistors.
Figure 39:
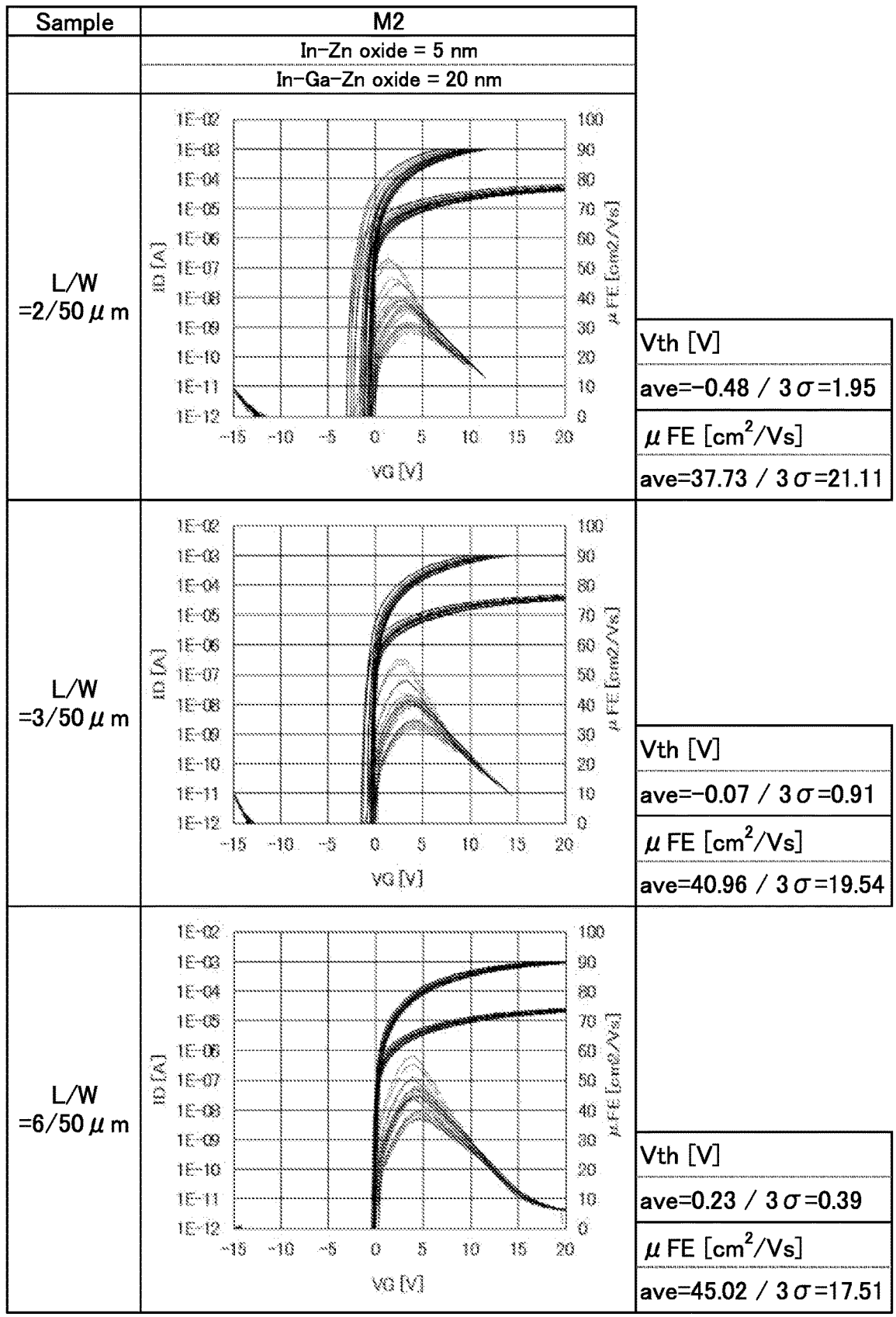
FIG. 39 is a diagram showing ID-VG characteristics of transistors.
Figure 40:
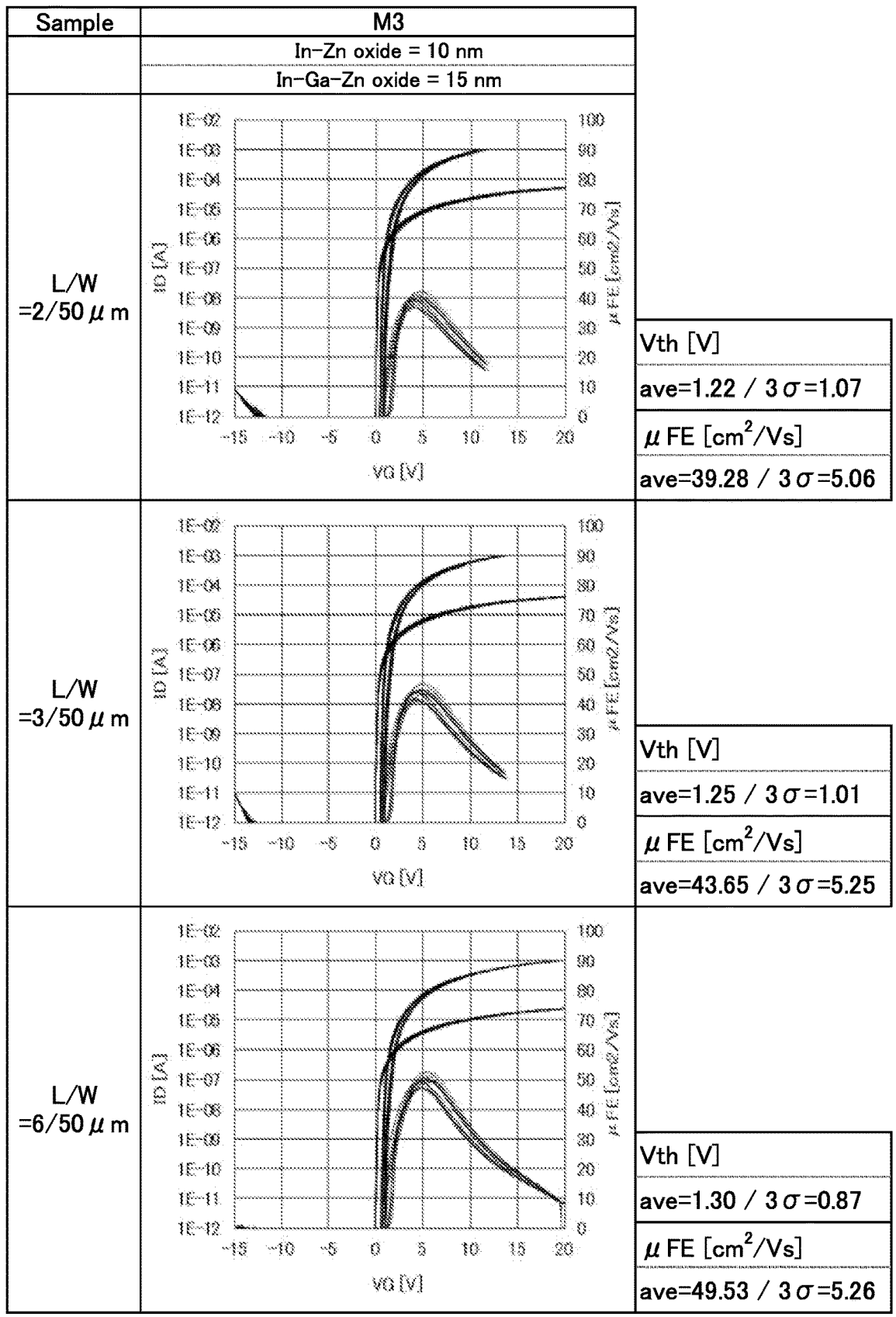
FIG. 40 is a diagram showing ID-VG characteristics of transistors.
Figure 41:
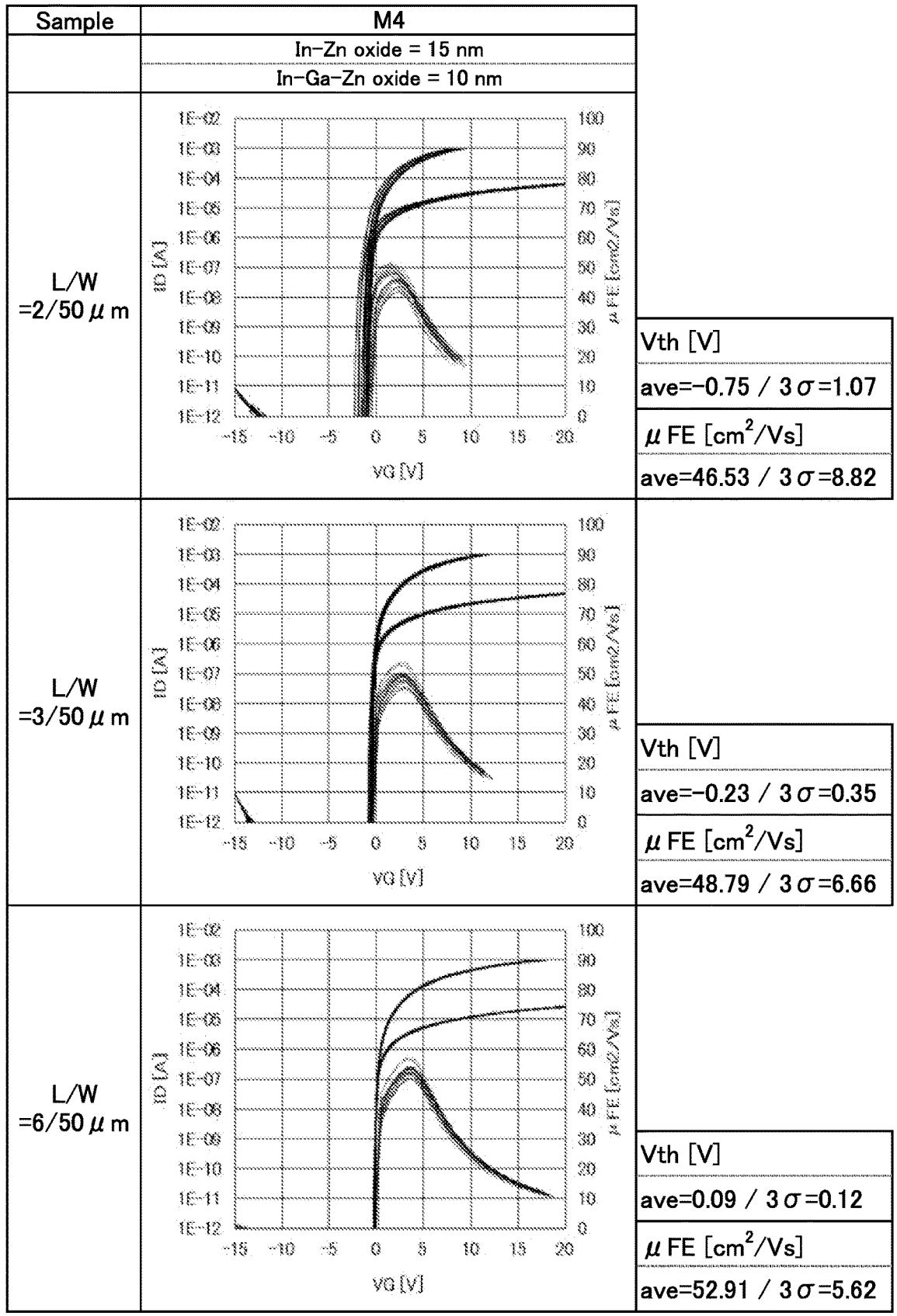
FIG. 41 is a diagram showing ID-VG characteristics of transistors.
Figure 42:
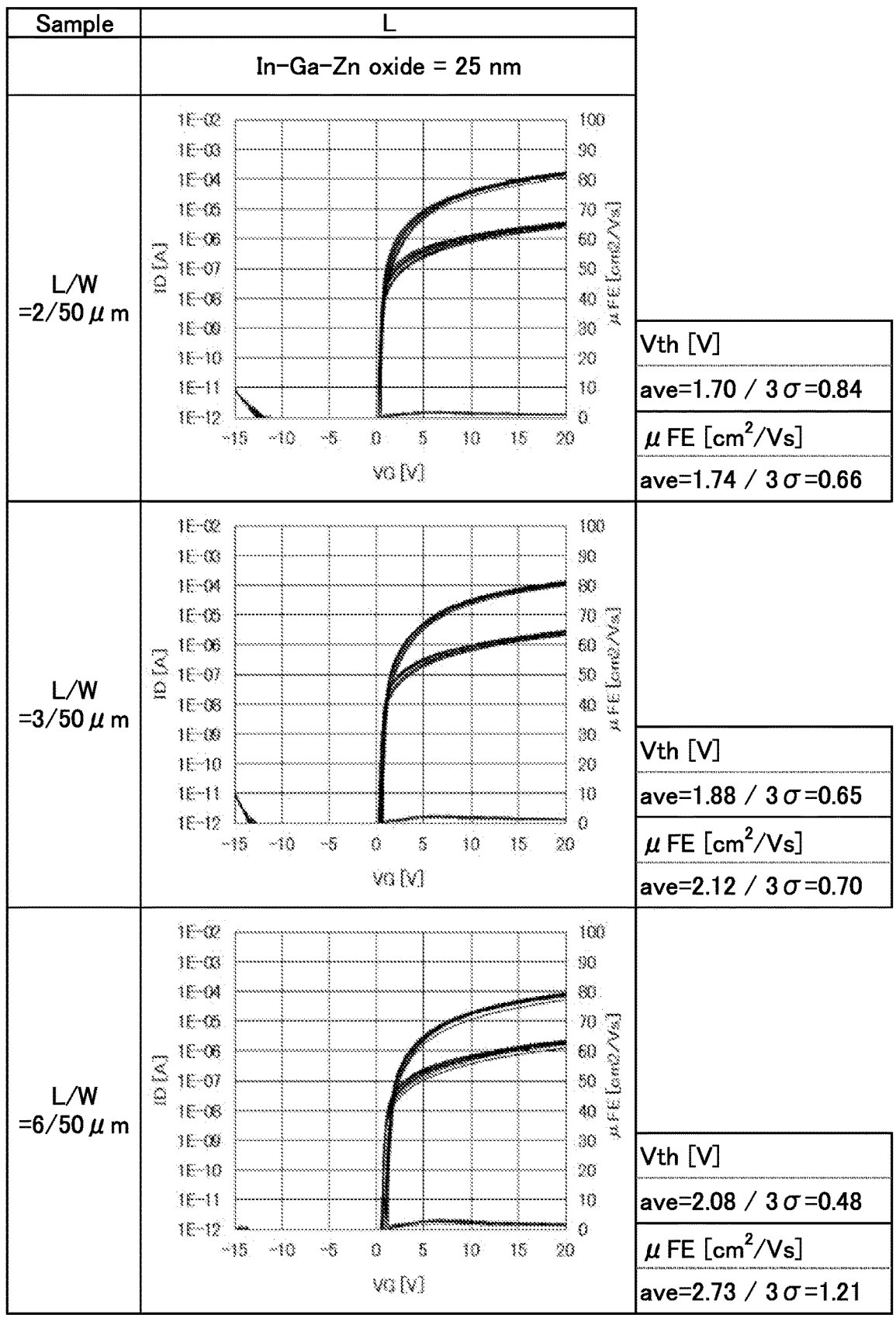
FIG. 42 is a diagram showing ID-VG characteristics of transistors.
Figure 43:
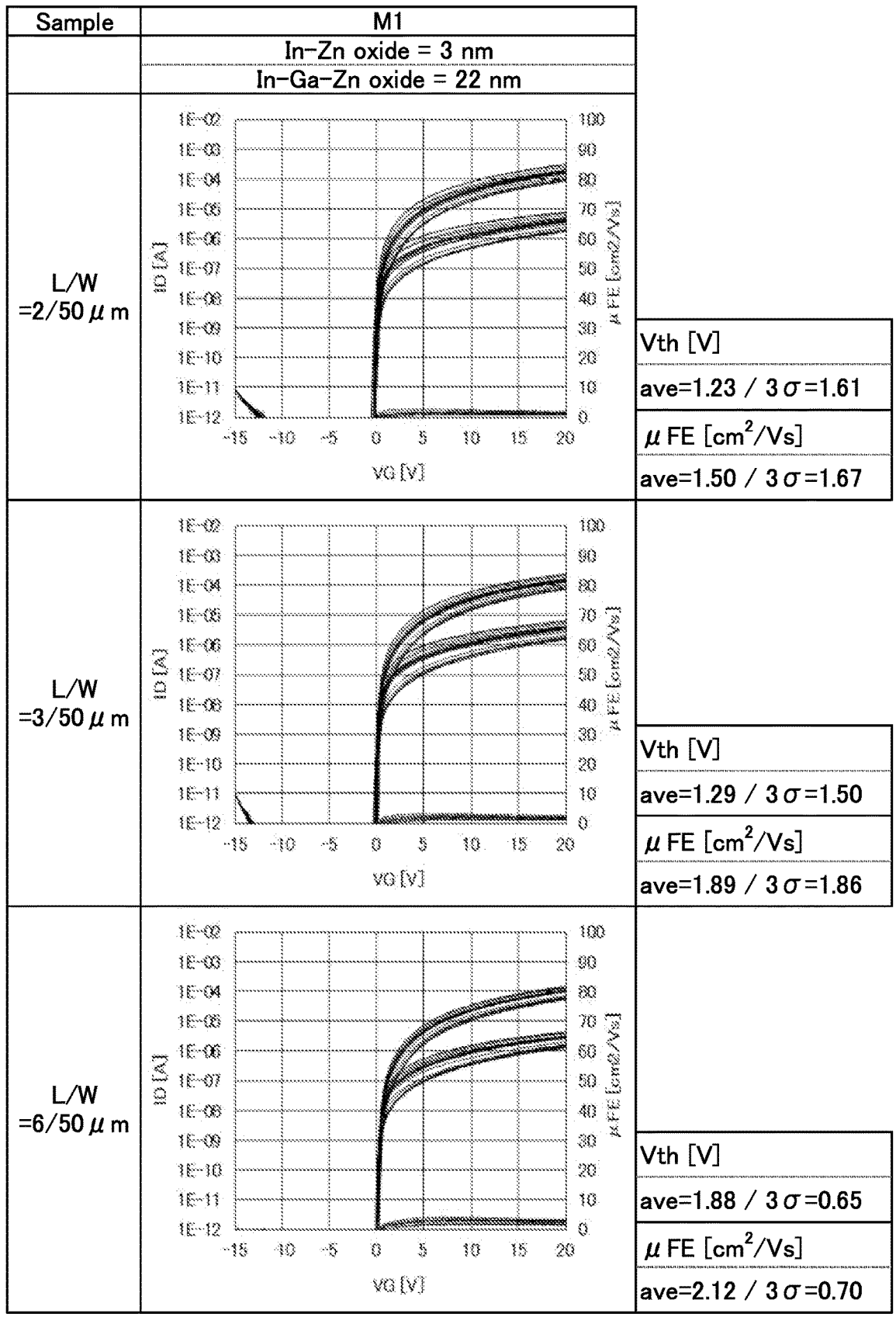
FIG. 43 is a diagram showing ID-VG characteristics of transistors.
Figure 44:
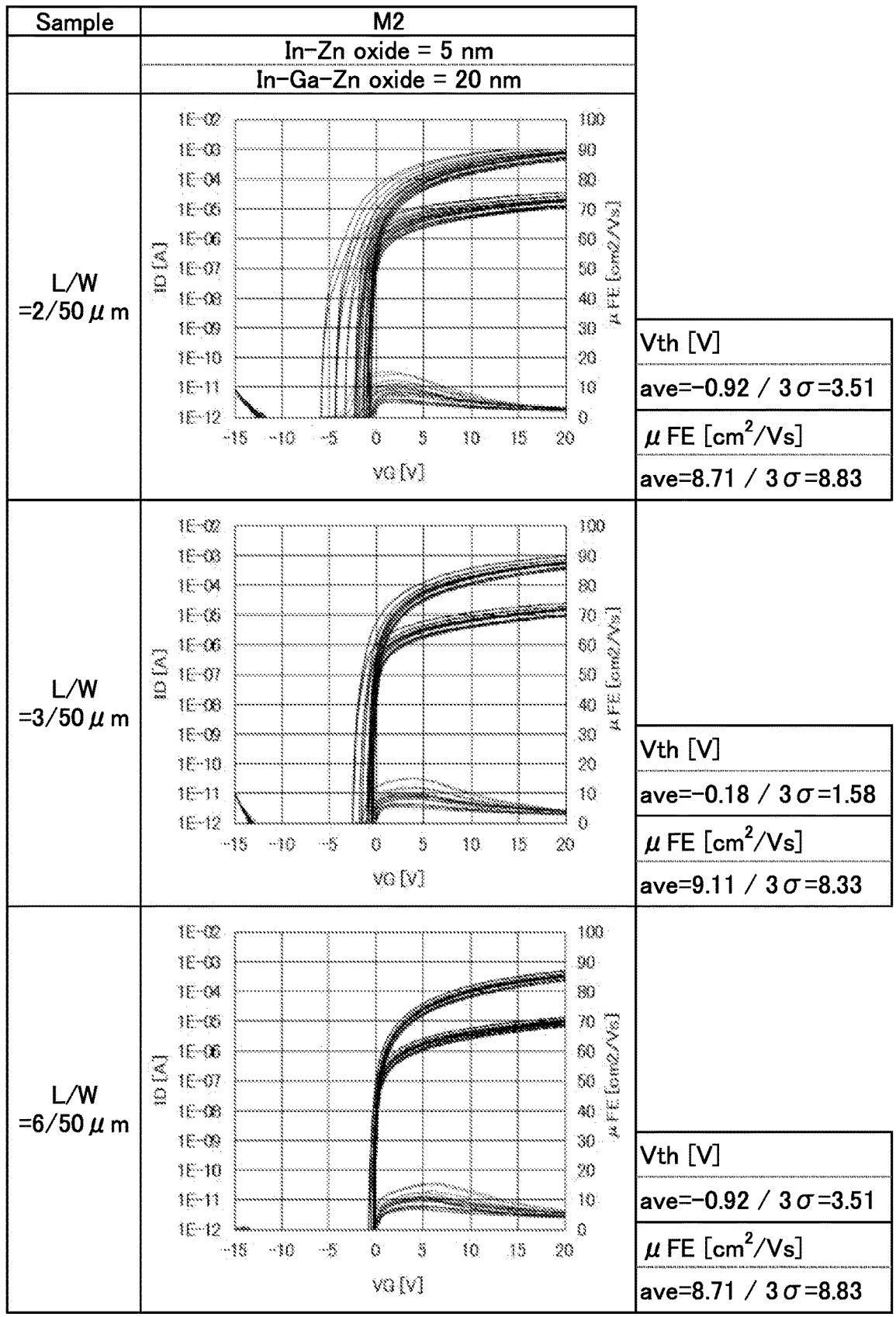
FIG. 44 is a diagram showing ID-VG characteristics of transistors.
Figure 45:
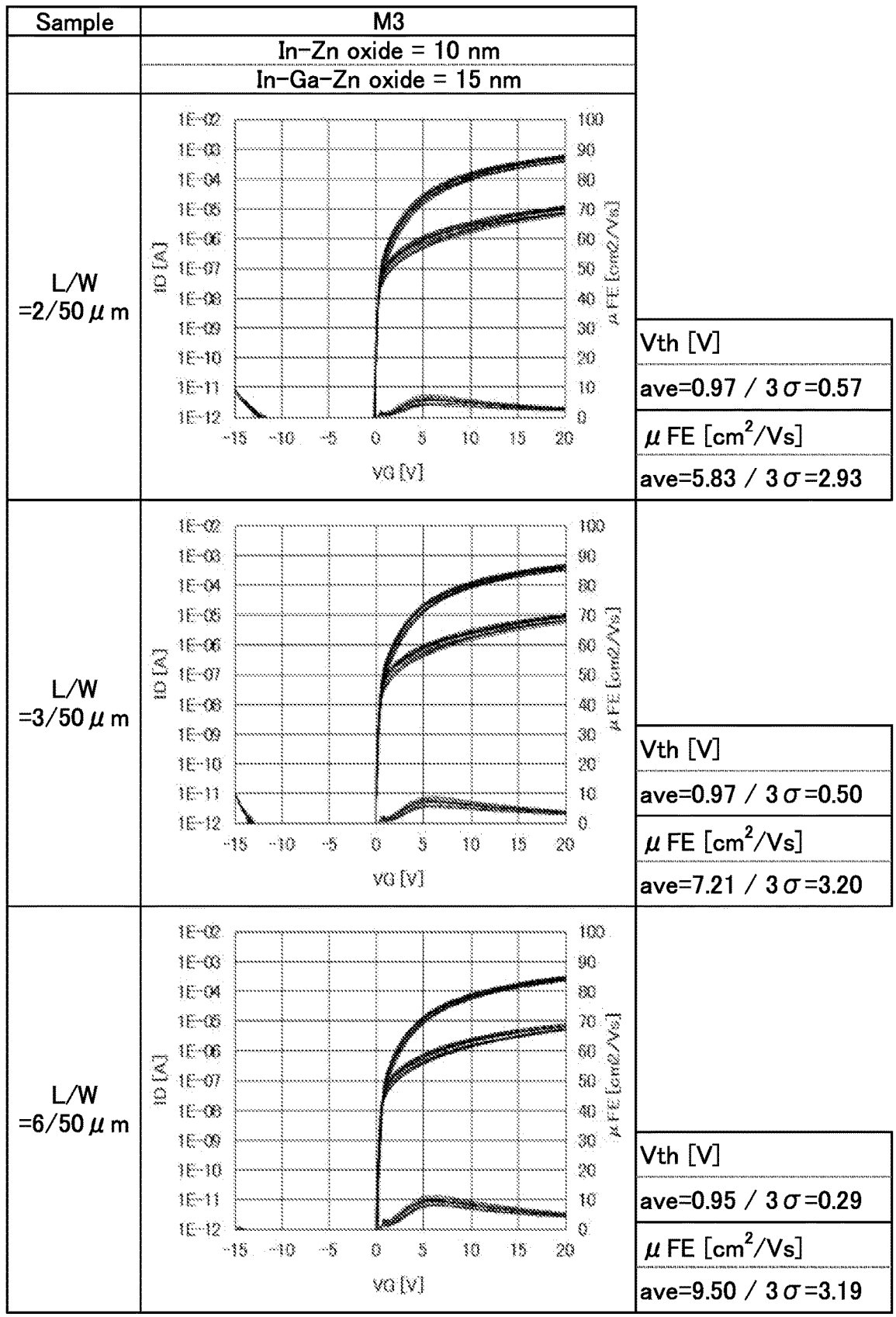
FIG. 45 is a diagram showing ID-VG characteristics of transistors.
Figure 46:
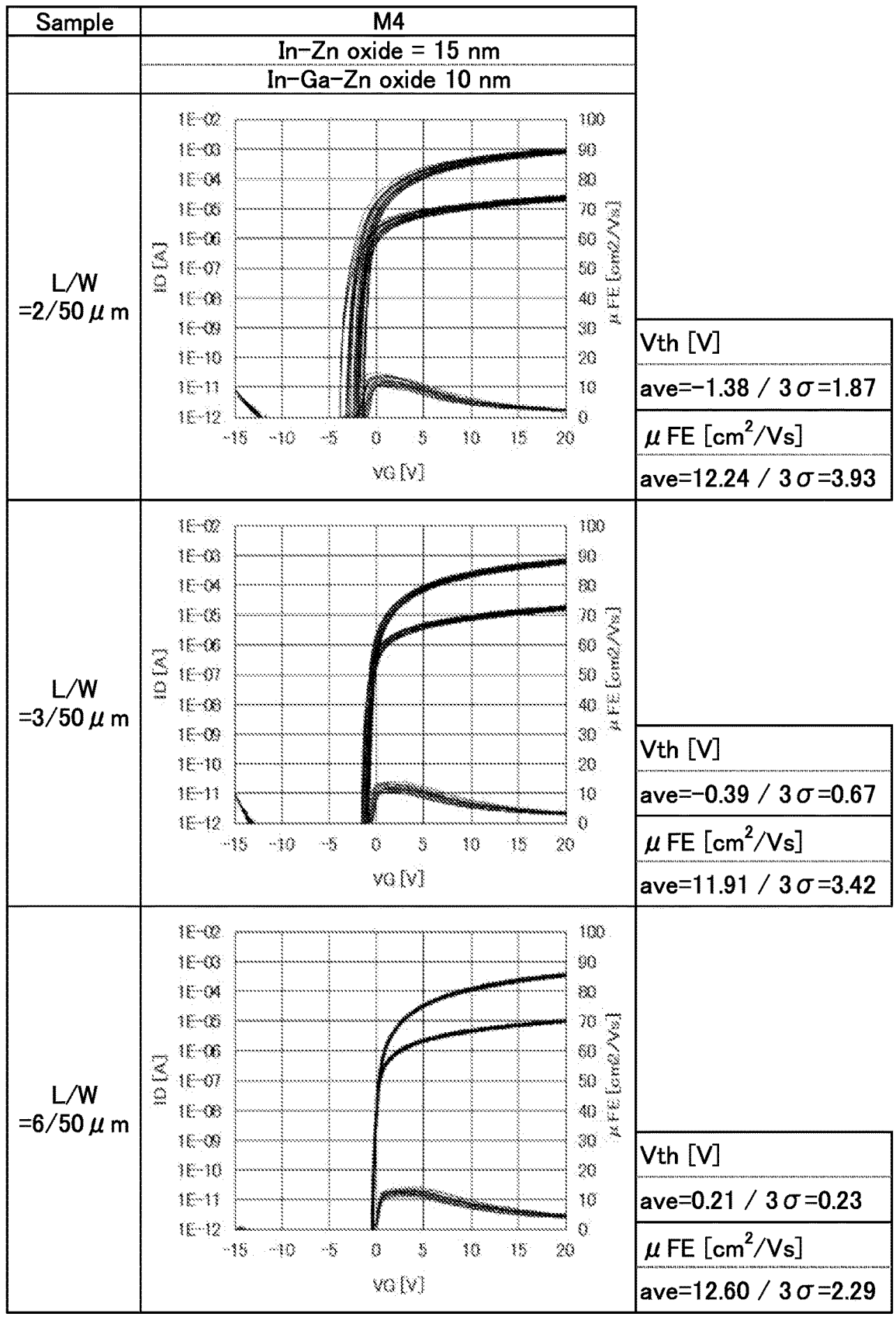
FIG. 46 is a diagram showing ID-VG characteristics of transistors.
Figure 47:
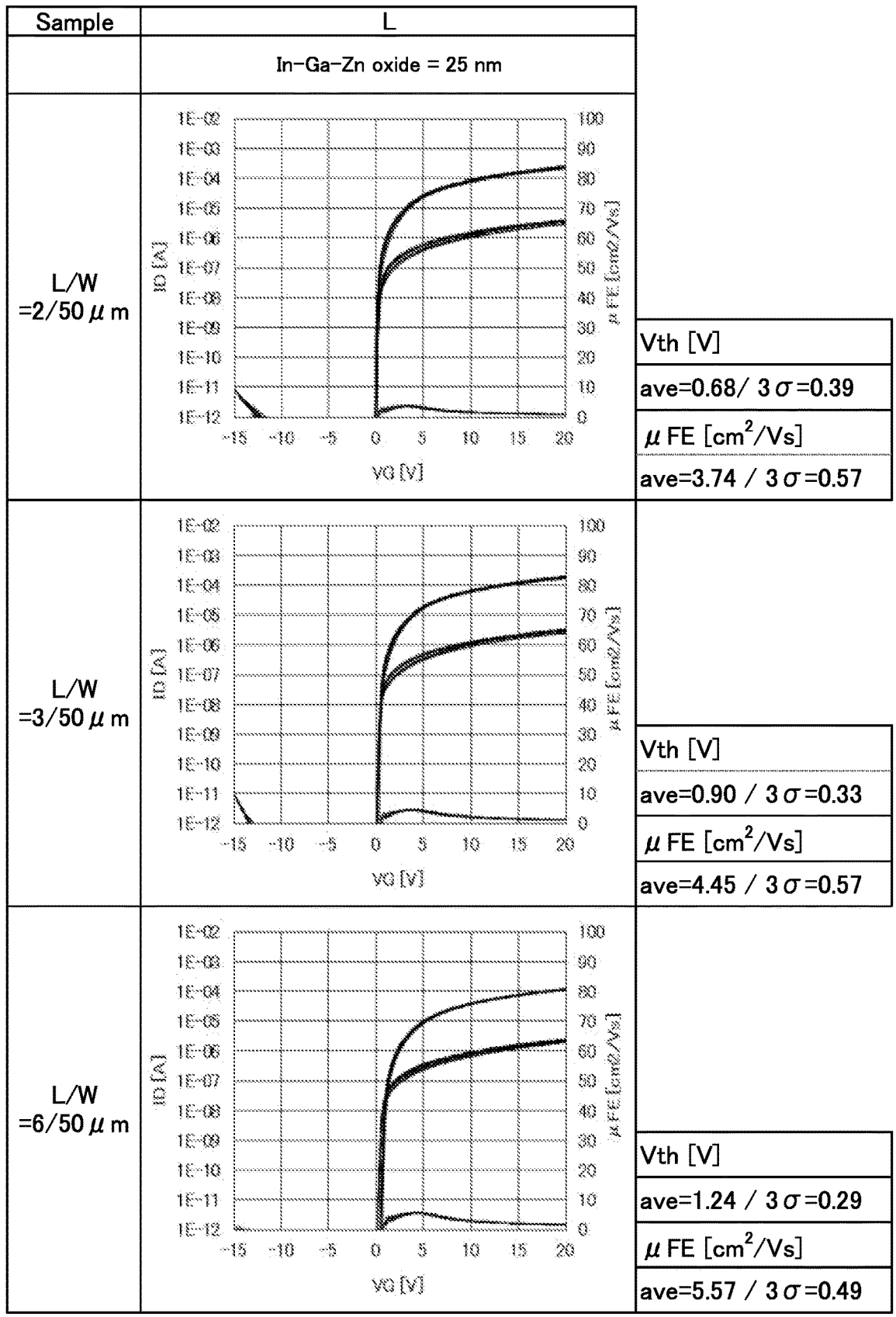
FIG. 47 is a diagram showing ID-VG characteristics of transistors.
Figure 48:
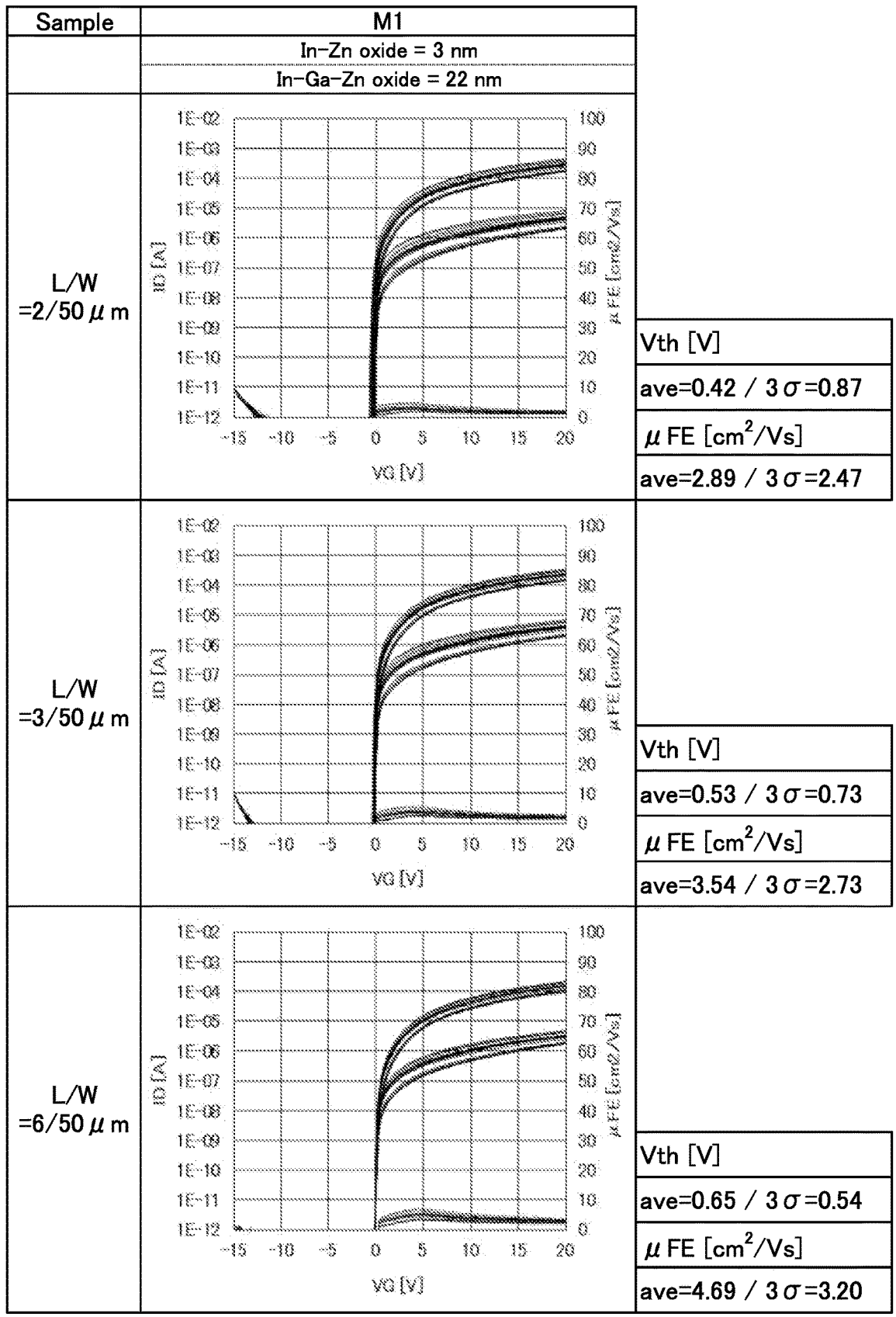
FIG. 48 is a diagram showing ID-VG characteristics of transistors.
Figure 49:
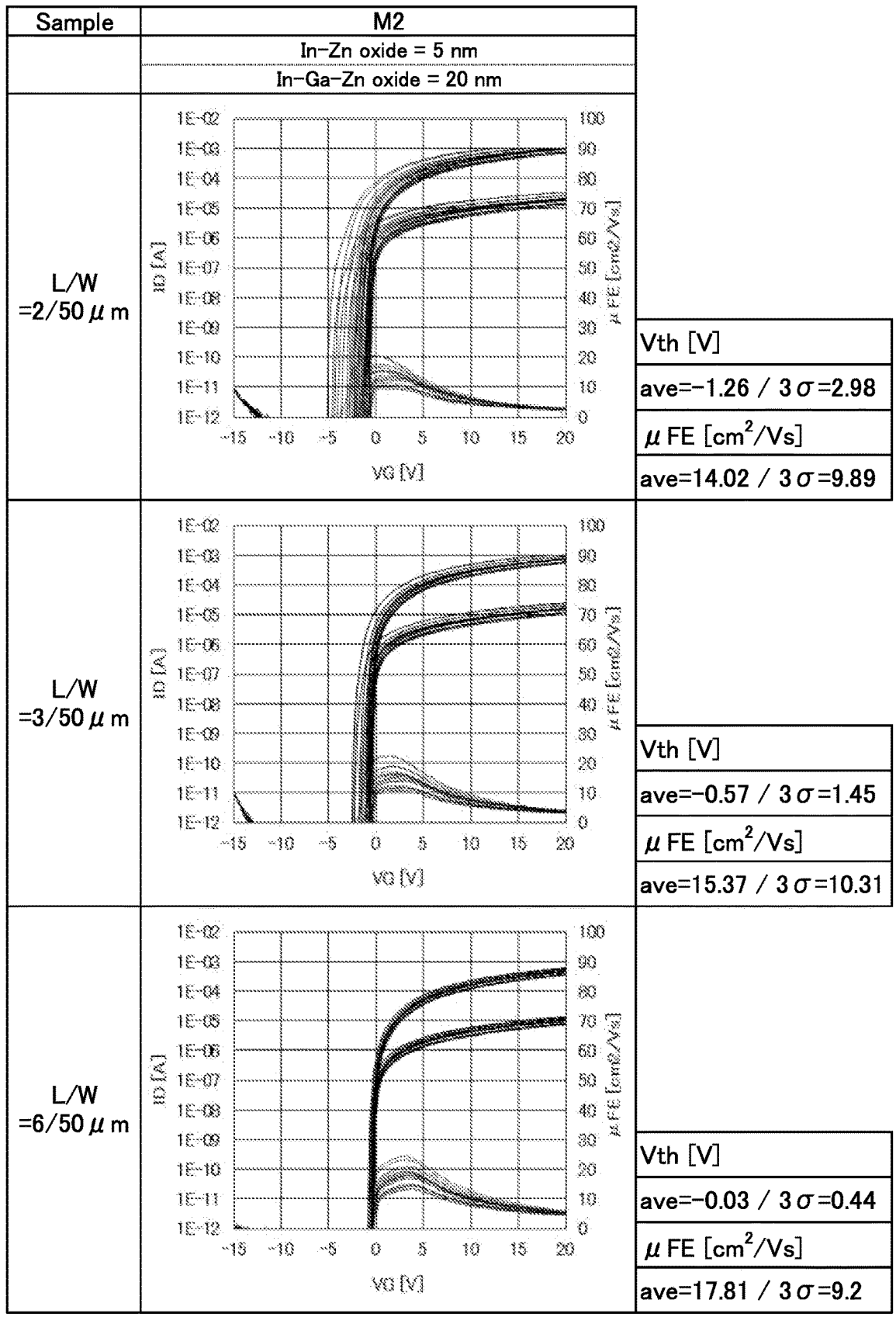
FIG. 49 is a diagram showing ID-VG characteristics of transistors.
Figure 50:
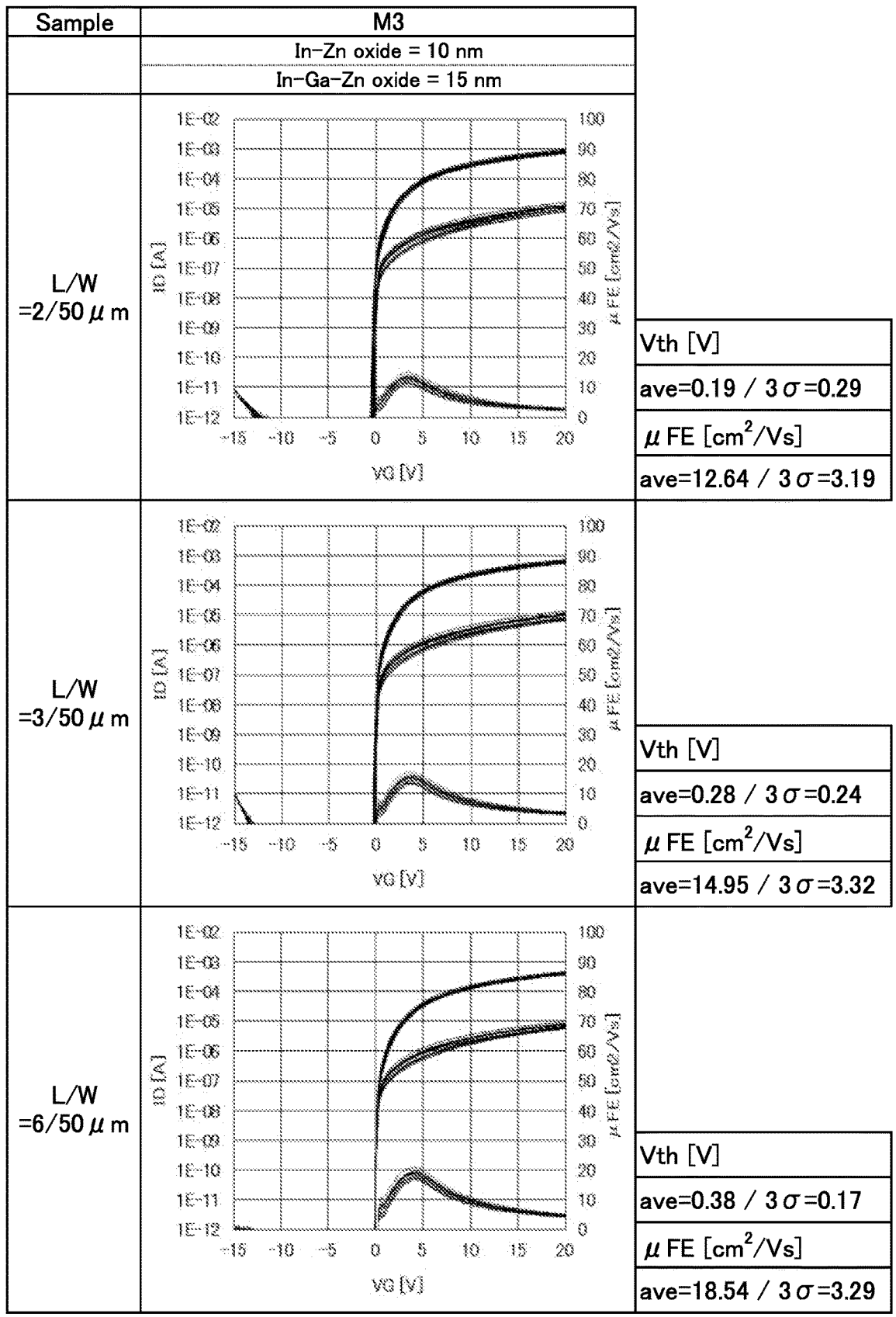
FIG. 50 is a diagram showing ID-VG characteristics of transistors.
Figure 51:
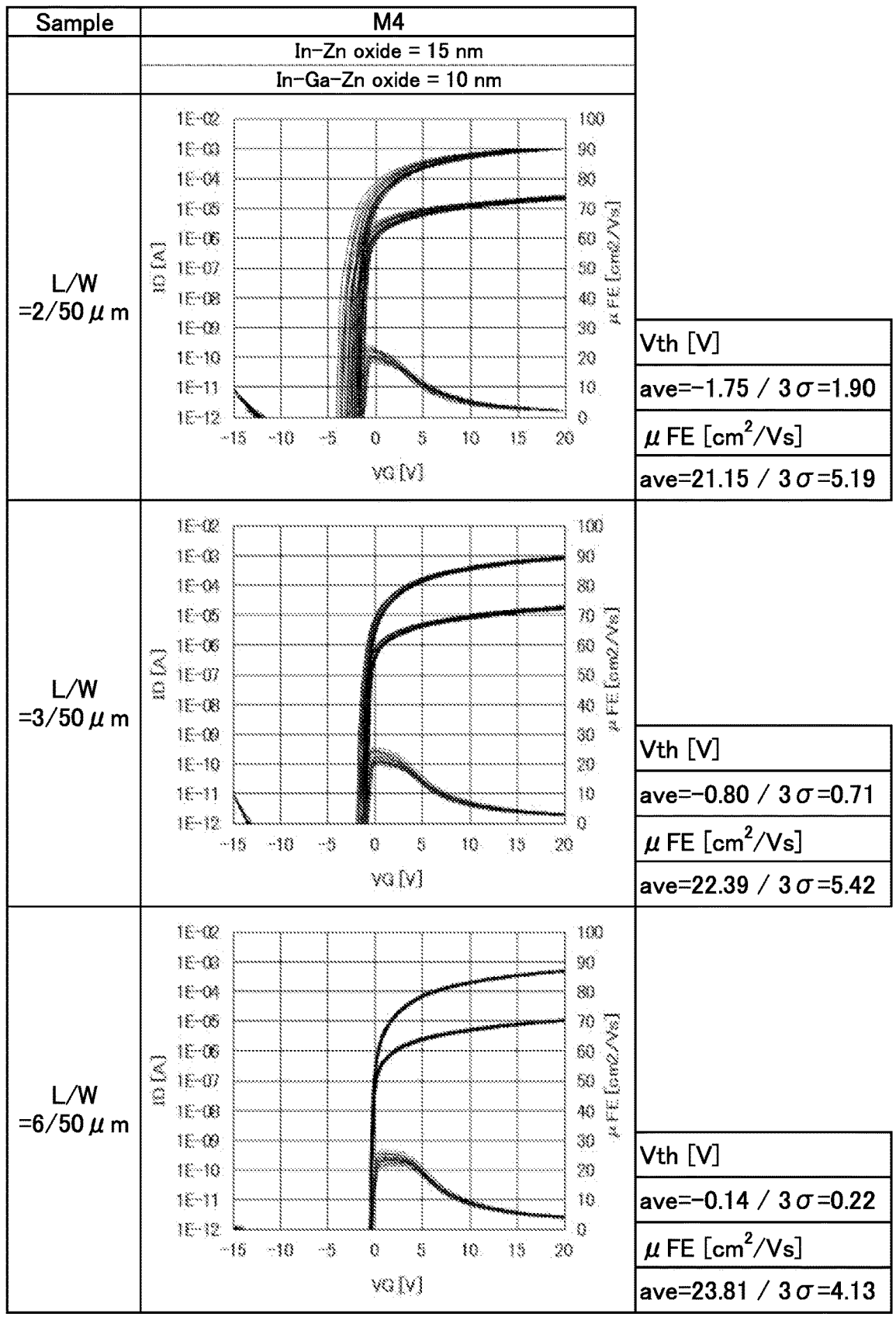
FIG. 51 is a diagram showing ID-VG characteristics of transistors.

The amount of change in the threshold voltage (ΔVth) of Samples J and K is shown in FIG. 36. In FIG. 36, the horizontal axis represents the sample and the condition for the semiconductor layer 108, and the vertical axis represents the amount of change in the threshold voltage (ΔVth) in the PBTS test.

As shown in FIG. 34, it was found that the field-effect mobility (μFE) of Sample K which is one embodiment of the present invention is higher than that of Sample J which is a comparative example. It is considered that Sample K exhibits high field-effect mobility (μFE) owing to use of the metal oxide film having the composition described in Embodiment 1 in a channel formation region.

As shown in FIG. 36, it was found that Sample K exhibits a small amount of change in the threshold voltage (ΔVth) in the PBTS test compared to Sample J.

An insulating film from which a large amount of nitrogen oxides is released was used for the second silicon oxynitride film in each of Samples J and K, which causes such a condition that the threshold voltage of the transistor is likely to be shifted in the positive direction due to a level derived from the nitrogen oxide. However, the following is considered: in Sample K of one embodiment of the present invention, with use of the metal oxide film having the composition described in Embodiment 1 for the second oxide layer in contact with the second silicon oxynitride film, electrons were inhibited from being trapped by the level derived from the nitrogen oxide and accordingly, the amount of change in the threshold voltage in the PBTS test was small.

As described above, Sample K of one embodiment of the present invention was confirmed as a transistor achieving both high electrical characteristics and high reliability.

The structures shown in this example can be used in appropriate combination with any of the other embodiments and examples.

Example 5

In this example, a transistor corresponding to the transistor 100C_a illustrated in FIG. 12D was fabricated, and drain current-gate voltage characteristics (ID-VG characteristics) and reliability thereof were evaluated. In this example, samples (Samples L and M1 to M4) including the semiconductor layers 108 with different compositions were formed. The insulating layer 110 functioning as a gate insulating layer had a single-layer structure.

In this example, three kinds of transistors, a transistor in which the conductive layer 106 (bottom gate electrode) is electrically connected to the conductive layer 112 (top gate electrode), a transistor in which the conductive layer 106 (bottom gate electrode) is electrically connected to the conductive layer 120a or the conductive layer 120b (source electrode), and a transistor without the conductive layer 106 (bottom gate electrode), were fabricated.

<Sample Fabrication>

Fabrication methods of Samples L and M1 to M4 are described.

First, a 100-nm-thick tungsten film was formed over a glass substrate by a sputtering method, and then processed to obtain a first gate electrode (bottom gate).

Next, as a first gate insulating layer, a 50-nm-thick first silicon nitride film, a 150-nm-thick second silicon nitride film, a 100-nm-thick third silicon nitride film, and a 3-nm-thick first silicon oxynitride film were deposited in this order. The description in Example 4 can be referred to for the first silicon nitride film to the third silicon nitride film and the first silicon oxynitride film; therefore, the detailed description is omitted.

Next, a first metal oxide film was deposited over the first silicon oxynitride film. Here, five samples (Samples L and M1 to M4) including the first metal oxide films with different compositions were fabricated. Samples M1 to M4 are each one embodiment of the present invention, and Sample L is a comparative example.

The first metal oxide film of Sample L was deposited by a sputtering method using an In—Ga—Zn oxide target (In:Ga:Zn=1:1:1 [atomic ratio]). The deposition pressure was 0.6 Pa, the power supply was 2.5 kW, and the substrate temperature was room temperature. A mixed gas of an oxygen gas and an argon gas was used as a deposition gas, and the oxygen flow rate ratio was 30%. The thickness of the first metal oxide film was 25 nm.

The first metal oxide films of each of Samples M1 to M4 was formed to have a stacked-layer structure of a first oxide film and a second oxide film over the first oxide film. The first metal oxide film was deposited by a sputtering method using an In—Ga—Zn oxide target (In:Ga:Zn=1:1:1 [atomic ratio]). The deposition pressure was 0.6 Pa, the power supply was 2.5 kW, and the substrate temperature was room temperature. A mixed gas of an oxygen gas and an argon gas was used as a deposition gas, and the oxygen flow rate ratio was 30%. The second metal oxide film was deposited by a sputtering method using an In—Zn oxide target (In:Zn=4:1 [atomic ratio]). The deposition pressure was 0.6 Pa, the power supply was 3.0 kW, and the substrate temperature was room temperature. A mixed gas of an oxygen gas and an argon gas was used as a deposition gas, and the oxygen flow rate ratio was 5%.

In Sample M1, the thickness of the first oxide film was 22 nm, and the thickness of the second oxide film was 3 nm. In Sample M2, the thickness of the first oxide film was 20 nm and the thickness of the second oxide film was 5 nm. In Sample M3, the thickness of the first oxide film was 15 nm and the thickness of the second oxide film was 10 nm. In Sample M4, the thickness of the first oxide film was 10 nm and the thickness of the second oxide film was 15 nm.

Next, the first metal oxide film was processed into an island shape to form a first metal oxide layer.

Subsequently, heat treatment was performed at 370° C. for two hours in dry air (CDA: Clean Dry Air). An oven apparatus was used for the heat treatment.

Then, a second silicon oxynitride film with a thickness of 140 nm was formed as a second gate insulating layer. For the second silicon oxynitride film, a deposition condition where a large amount of nitrogen oxides (NOx: X is greater than or equal to 0 and less than or equal to 2) is released by heat application was used. The description in Example 4 can be referred to for deposition of the second silicon oxynitride film; thus, the detailed description is omitted.

In this example, with use of an insulating film from which a large amount of nitrogen oxides is released for the second silicon oxynitride film, the effect of the composition of the first metal oxide layer on characteristics of the transistor was examined under the condition of a large amount of nitrogen oxides.

Subsequently, heat treatment was performed at 370° C. in a nitrogen atmosphere for one hour. An oven apparatus was used for the heat treatment.

Next, a second metal oxide film with a thickness of 20 nm was deposited over the second silicon oxynitride film. The description in Example 4 can be referred to for deposition of the second metal oxide film; therefore, the detailed description is omitted.

Subsequently, heat treatment was performed at 370° C. in a mixed gas atmosphere of nitrogen and oxygen (nitrogen gas flow rate:oxygen gas flow rate=4:1) for one hour. An oven apparatus was used for the heat treatment.

Then, a copper film with a thickness of 100 nm and a third metal oxide film with a thickness of 30 nm were deposited in this order over the second metal oxide film. The copper film and the third metal oxide film were deposited by a sputtering method. The description in Example 4 can be referred to for deposition of the copper film and the third metal oxide film; therefore, the detailed description is omitted.

Then, a resist mask was formed over the third metal oxide film, and the second metal oxide film, the copper film, and the third metal oxide film were processed to form a second metal oxide layer, a copper layer, and a third metal oxide layer. A wet etching method was used for the processing.

Subsequently, the second silicon oxynitride film was etched using the aforementioned resist mask as a mask to form a second gate insulating layer. In addition, at the time of forming the second gate insulating layer, the first silicon oxynitride film in a region that does not overlap with the resist mask was removed to expose part of the third silicon nitride film A dry etching method was used for the processing. After that, the resist mask was removed.

Then, cleaning was performed. For the cleaning, an aqueous solution in which 85 weight % phosphoric acid was diluted 500 times was used. The etchant temperature at the time of etching was room temperature, and the treatment time was 15 sec.

Then, as a protective layer covering the transistor, a 20-nm-thick fourth silicon nitride film, a 80-nm-thick fifth silicon nitride film, and a 300-nm-thick third silicon oxynitride film were deposited in this order.

The fourth silicon nitride film was deposited by a PECVD method using a mixed gas of a silane gas at a flow rate of 150 sccm and a nitrogen gas at a flow rate of 5000 sccm. The deposition pressure was 200 Pa, the deposition power was 2000 W, and the substrate temperature was 350° C.

The fifth silicon nitride film was deposited by a PECVD method using a mixed gas of a silane gas at a flow rate of 150 sccm, a nitrogen gas at a flow rate of 5000 sccm, and an ammonia gas at a flow rate of 100 sccm. The deposition pressure was 200 Pa, the deposition power was 2000 W, and the substrate temperature was 350° C.

The third silicon oxynitride film was deposited by a PECVD method using a mixed gas of a silane gas at a flow rate of 290 sccm and a dinitrogen monoxide gas at a flow rate of 4000 sccm. The deposition pressure was 133 Pa, the deposition power was 1000 W, and the substrate temperature was 350° C.

Next, an opening was formed in part of the protective layer covering the transistor, and a 100-nm-thick molybdenum film was deposited by a sputtering method and then processed to obtain a source electrode and a drain electrode. After that, an approximately 1.5-µm-thick acrylic resin film was formed as a planarization layer, and heat treatment was performed under the conditions of a temperature of 250° C. in a nitrogen atmosphere for one hour.

Through the above steps, Samples L and M1 to M4 each including the transistor formed over the glass substrates were obtained.

<ID-VG Characteristic Evaluation>

Next, ID-VG characteristics of the transistors (Samples L, M1 to M4) were measured.

For measuring the ID-VG characteristics of the transistors, a voltage applied to the gate electrode (hereinafter also referred to as a gate voltage (VG)) was applied from −15 V to +20 V in increments of 0.25 V. The voltage applied to the source electrode (VS) was 0 V (comm), and the voltage applied to the drain electrode (VD) was 0.1 V and 5.1 V.

ID-VG characteristics of Samples L and M1 to M4 are shown in FIG. 37 to FIG. 51. FIG. 37 to FIG. 41 show ID-VG characteristics of transistors in each of which the conductive layer 106 (bottom gate electrode) is electrically connected to the conductive layer 112 (top gate electrode). FIG. 42 to FIG. 46 show ID-VG characteristics of transistors in each of which the conductive layer 106 (bottom gate electrode) is electrically connected to the conductive layer

120a or the conductive layer 120b (source electrode). FIG. 47 to FIG. 51 show ID-VG characteristics of transistors without the conductive layer 106 (bottom gate electrode).

In each of FIG. 37 to FIG. 51, the sample and the condition for the semiconductor layer 108 are written. Furthermore, different conditions of the channel length and the channel width of the transistor are written in the longitudinal direction, specifically, three kinds of transistors with a channel length of 2 µm and a channel width of 50 µm, a channel length of 3 µm and a channel width of 50 µm, and a channel length of 6 µm and a channel width of 50 µm are shown. Moreover, in each of FIG. 37 to FIG. 51, the horizontal axis represents the gate voltage (VG), the left vertical axis represents the drain current (ID), and the right vertical axis represents the saturation mobility (µFE) when VG=15 V. Note that ID-VG characteristics of 20 transistors were measured for each sample.

Each of FIG. 37 to FIG. 51 show the average (ave) and 3$a$ of the threshold voltage (Vth) and saturation mobility (µFE) for each transistor size. Note that a represents a standard deviation.

<Reliability Evaluation>

Next, reliability of the transistors (Samples L, M1 to M4) was evaluated. In this example, a PBTS (Positive Bias Temperature Stress) test, in which a state where a positive potential relative to a source potential and a drain potential is applied to a gate is maintained at high temperatures, and an NBTIS (Negative Bias Temperature Illumination Stress) test, in which a state where a negative potential is applied to a gate is maintained at high temperatures in a light illumination environment, were performed.

In the PBTS test, a substrate over which the transistor was formed was held at 60° C., a voltage of 0.1 V was applied to the drain of the transistor, and a voltage of 20 V was applied to the gate; this state was held for one hour. The test was performed in a dark environment.

In the NBTIS test, a substrate over which the transistor was formed was held at 60° C., a voltage of 10 V was applied to the drain of the transistor, and a voltage of −20 V was applied to the gate; this state was held for one hour. The test was performed in a light illumination environment (irradiation with light of approximately 3400 lux by a white LED).

In the reliability tests, the transistor having a channel length of 2 µm and a channel width of 3 µm was used, and the amount of change in threshold voltage (ΔVth) before and after the gate bias stress test was evaluated. Note that the transistors used had such a structure that the conductive layer 106 (bottom gate electrode) is electrically connected to the conductive layer 120a or the conductive layer 120b (source electrode).

Figure 52:
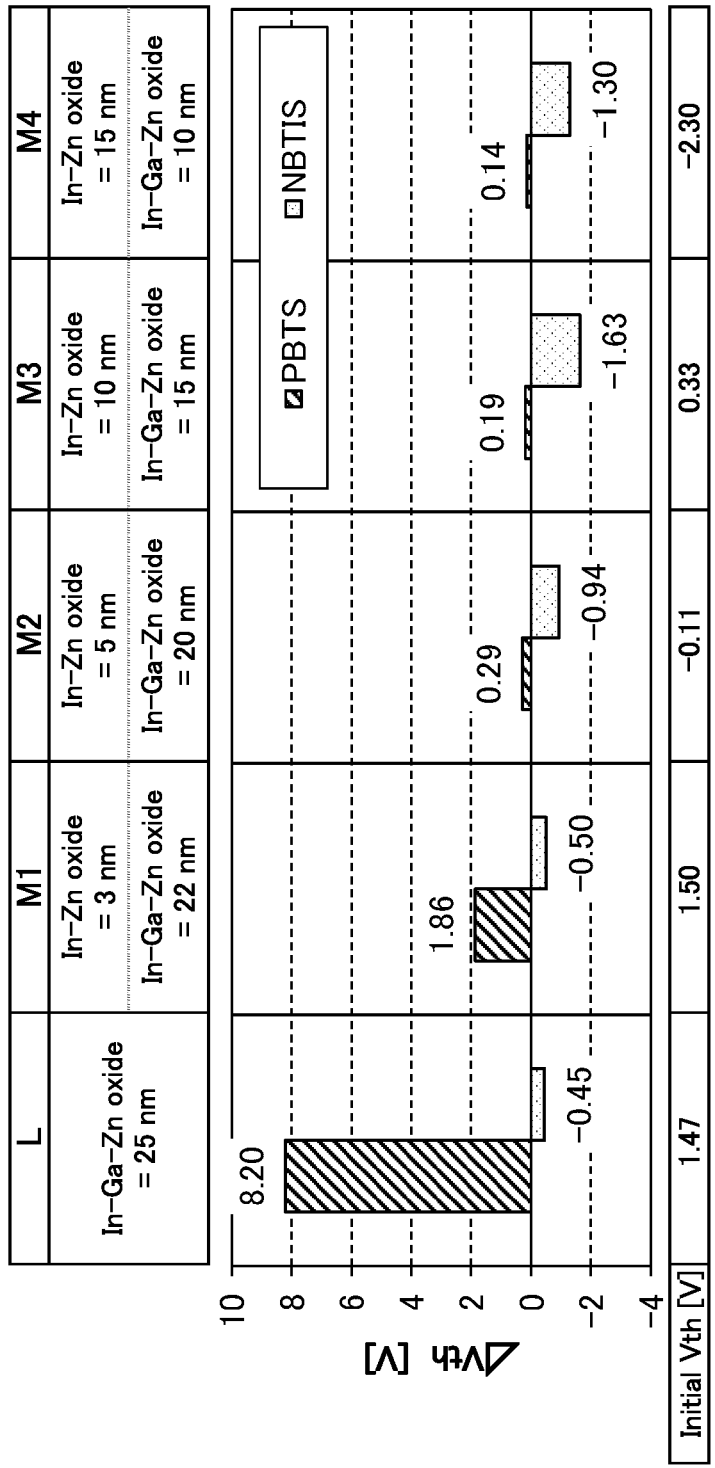
FIG. 52 is a diagram showing reliability of transistors.

FIG. 52 shows the amount of change in the threshold voltage (ΔVth) of each of Samples L and M1 to M4. In FIG. 52, the horizontal axis represents the sample and the condition for the semiconductor layer 108, and the vertical axis represents the amount of change in the threshold voltage (ΔVth) in the PBTS test and the amount of change in the threshold voltage (ΔVth) in the NBTIS test. Furthermore, FIG. 52 shows the threshold voltage of the transistor before the reliability test was performed (initial Vth).

As shown in FIG. 37 to FIG. 51, it was found that each of the field-effect mobility (µFE) of Samples M1 to M4 which are one embodiment of the present invention are higher than that of Sample L which is a comparative example. It is considered that, with use of the metal oxide film having the composition described in Embodiment 1 in a channel formation region, Samples M1 to M4 each exhibits high field-effect mobility (µFE).

As shown in FIG. 52, it was found that the amount of change in the threshold voltage (ΔVth), in the PBTS, of each of Samples M1 to M4 is smaller than that of Sample L which is a comparative example. It was also found that the amount of change in the threshold voltage (ΔVth) in the PBTS test is small particularly when the thickness of the In—Zn oxide is greater than or equal to 5 nm. It is considered that in each of Samples M1 to M4 of one embodiment of the present invention, with use of the metal oxide film having the composition described in Embodiment 1 for the second oxide layer in contact with the second silicon oxynitride film, electrons were inhibited from being trapped by the level derived from the nitrogen oxide and accordingly, the amount of change in the threshold voltage in the PBTS test was small.

As described above, Samples M1 to M4 of one embodiment of the present invention were each confirmed as a transistor achieving both high electrical characteristics and high reliability.

The structures shown in this example can be used in appropriate combination with any of the other embodiments and examples.

Example 6

In this example, the crystallinity and the band gap of a metal oxide film that can be used in a semiconductor device of one embodiment of the present invention were evaluated.

In this example, X-ray diffraction (XRD) analysis was performed on metal oxide films fabricated with different methods, so that the crystallinity was evaluated. In addition, the evaluation of band gap was conducted on the metal oxide films fabricated with different methods. For the evaluation, samples (Samples P1 to P8 and Q1 to Q8) each including a 100-nm thick metal oxide film over a glass substrate were used.

<Sample Fabrication>

In each of Samples P1 to P8, the metal oxide film was deposited by a sputtering method using an In—Ga—Zn oxide target (In:Ga:Zn=10:1:3 [atomic ratio]). In each of Samples Q1 to Q8, the metal oxide film was deposited by a sputtering method using an In—Ga—Zn oxide target (In:Ga:Zn=10:1:6 [atomic ratio]).

The substrate temperature in the deposition of the metal oxide film in each of Samples P1 and Q1 was set to room temperature (RT). An argon gas (oxygen flow rate ratio: 0%) was used as a deposition gas.

The substrate temperature in the deposition of the metal oxide film in each of Samples P2 and Q2 was set to room temperature (RT). A mixed gas of an oxygen gas and an argon gas was used as a deposition gas, and the oxygen flow rate ratio was 10%.

The substrate temperature in the deposition of the metal oxide film in each of Samples P3 and Q3 was set to room temperature (RT). A mixed gas of an oxygen gas and an argon gas was used as a deposition gas, and the oxygen flow rate ratio was 33%.

The substrate temperature in the deposition of the metal oxide film in each of Samples P4 and Q4 was set to room temperature (RT). An oxygen gas (oxygen flow rate ratio: 100%) was used as a deposition gas.

The substrate temperature in the deposition of the metal oxide film in each of Samples P5 and Q5 was set to 300° C. An argon gas (oxygen flow rate ratio: 0%) was used as a deposition gas.

The substrate temperature in the deposition of the metal oxide film in each of Samples P6 and Q6 was set to 300° C. A mixed gas of an oxygen gas and an argon gas was used as a deposition gas, and the oxygen flow rate ratio was 10%.

The substrate temperature in the deposition of the metal oxide film in each of Samples P7 and Q7 was set to 300° C. A mixed gas of an oxygen gas and an argon gas was used as a deposition gas, and the oxygen flow rate ratio was 33%.

The substrate temperature in the deposition of the metal oxide film in each of Samples P8 and Q8 was set to 300° C. An oxygen gas (oxygen flow rate ratio: 100%) was used as a deposition gas.

Note that for each sample, the pressure in the deposition of the metal oxide film was 0.4 Pa, and the power supply was 200 W (DC).

<X-Ray Diffraction Analysis>

Next, X-ray diffraction (XRD) analysis was performed on Samples P1 to P8, and Q1 to Q8.

In the XRD analysis, a θ-2θ scanning method was used. In the XRD analysis, a Cu Kα ray with (λ=0.15418 nm) was used as an X-ray source, the scanning range at 2θ was 15 deg. to 50 deg., the step width was 0.01 deg., and the scanning speed was 6.0 deg./min.

Figure 53:
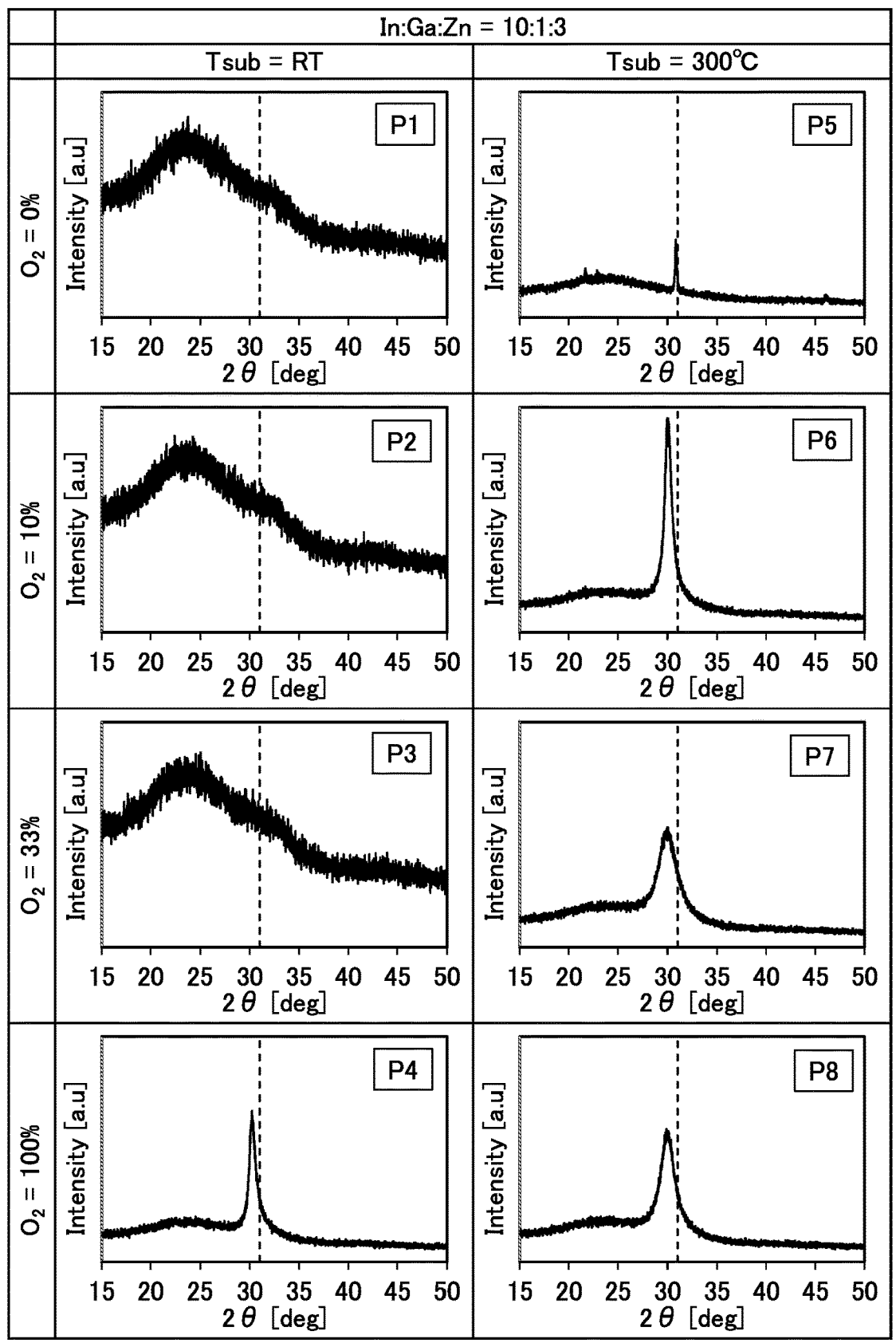
FIG. 53 is a diagram showing XRD analysis results of a metal oxide.
Figure 54:
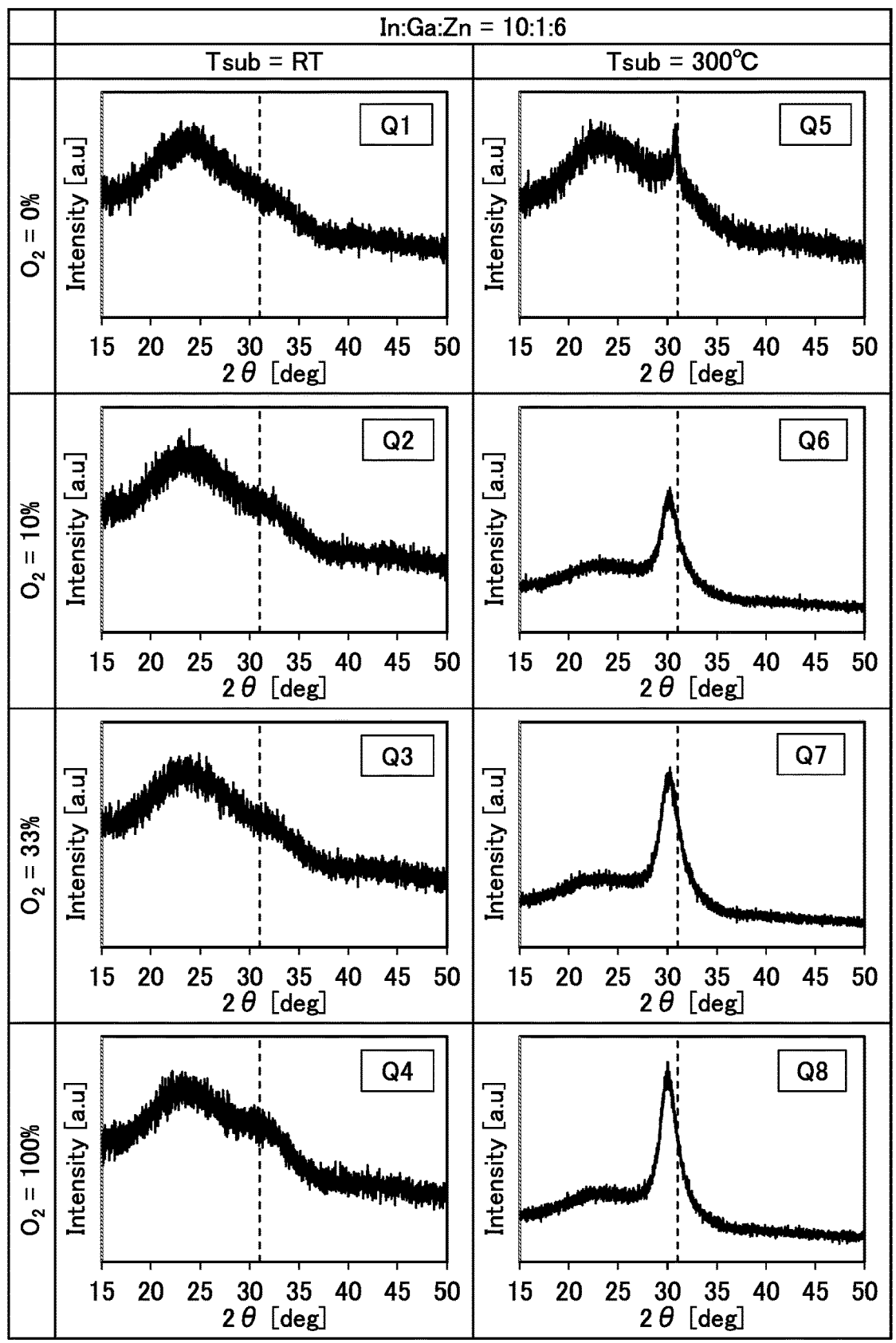
FIG. 54 is a diagram showing XRD analysis results of a metal oxide.

FIG. 53 shows results of XRD analysis of Samples P1 to P8. FIG. 54 shows results of XRD analysis of Samples Q1 to Q8. In FIG. 53 and FIG. 54, the substrate temperature (Tsub) of the metal oxide film is written in the lateral direction, the oxygen flow rate ratio ($O_2$) in the deposition of the metal oxide film is written in the longitudinal direction. In FIG. 53 and FIG. 54, the horizontal axis represents the diffraction angle 2θ and the vertical axis represents the intensity of diffraction X-ray. Note that the scale of the vertical axis differs between the samples. In FIG. 53 and FIG. 54, dashed lines representing 2θ=31 deg. are shown as auxiliary lines.

As shown in FIG. 53 and FIG. 54, a peak was observed in each sample when 2θ was around 31 deg., which demonstrates that each sample has crystallinity. Note that broad peaks where 2θ is at around 24 deg. are derived from the glass substrate.

<Band Gap Evaluation>

Next, transmittance and reflectance of Samples P1 to P3 and Q1 to Q3 were measured, and band gaps (Eg) thereof were calculated. The transmittance and the reflectance were measured using a spectrophotometer.

Figure 55:
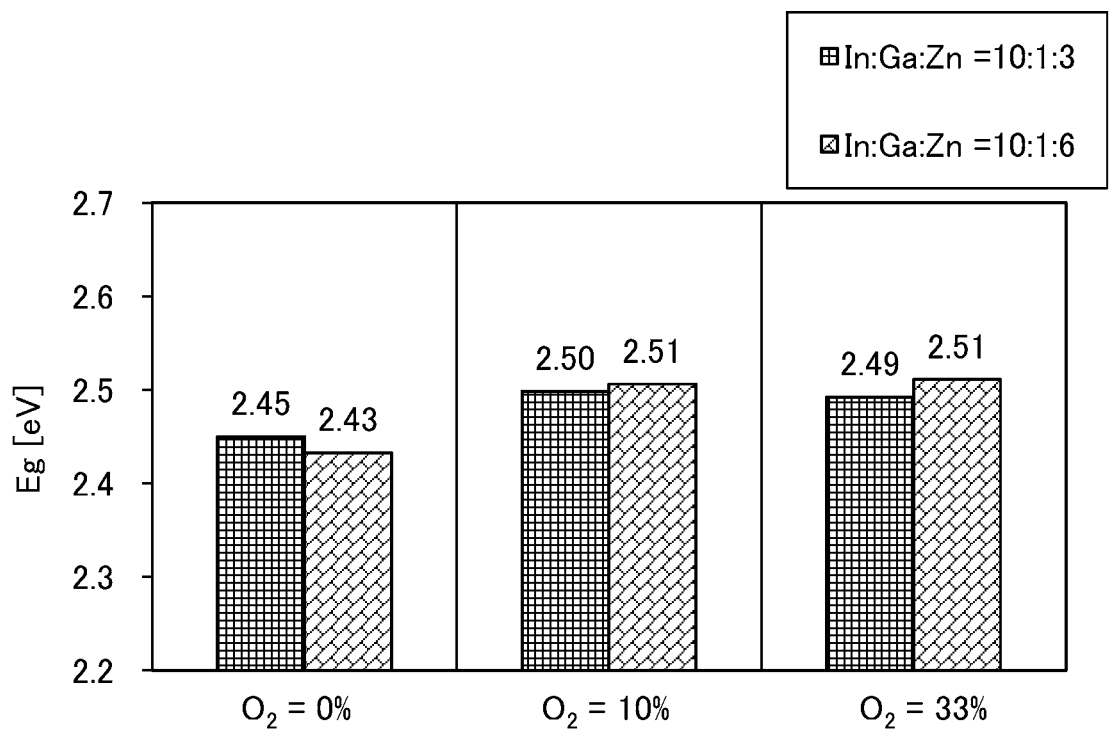
FIG. 55 is a graph showing band gaps of metal oxides.

FIG. 55 shows band gaps (Eg) of Samples P1 to P3 and Q1 to Q3. In FIG. 55, the horizontal axis represents the oxygen flow rate ratio in the deposition of the metal oxide film, and the vertical axis represents the band gap (Eg).

As shown in FIG. 55, it was found the each sample has a band gap (Eg) approximately 2.5 eV.

The structures shown in this example can be used in appropriate combination with any of the other embodiments and examples.

Example 7

In this example, the carrier concentration and the mobility of a metal oxide film that can be used in a semiconductor device that is one embodiment of the present invention were evaluated.

In this example, Hall effect measurement was performed on metal oxide films fabricated with different methods, so that the carrier concentration and the mobility were evaluated. For the evaluation, samples (Samples R1 to R12 and S1 to S12) each including a 40-nm-thick metal oxide film formed over a glass substrate were used.

<Sample Fabrication>

The metal oxide film of each of Samples R1 to R12 was deposited by a sputtering method using an In—Ga—Zn oxide target (In:Ga:Zn=10:1:3 [atomic ratio]). The metal oxide film of each of Samples S1 to S12 was deposited by a sputtering method using an In—Ga—Zn oxide target (In:Ga:Zn=10:1:6 [atomic ratio]).

The substrate temperature in the deposition of the metal oxide film in each of Samples R1 to R4 and S1 to S4 was set to room temperature (RT). An argon gas (oxygen flow rate ratio: 0%) was used as a deposition gas.

The substrate temperature in the deposition of the metal oxide film in each of Samples R5 to R8 and S5 to S8 was set to room temperature (RT). A mixed gas of an oxygen gas and an argon gas was used as a deposition gas, and the oxygen flow rate ratio was 10%.

The substrate temperature in the deposition of the metal oxide film in each of Samples R9 to R12 and S9 to S12 was set to room temperature (RT). A mixed gas of an oxygen gas and an argon gas was used as a deposition gas, and the oxygen flow rate ratio was 33%.

Note that in each of the samples, the pressure in the deposition of the metal oxide film was 0.4 Pa, and the power supply was 200 W (DC).

Next, heat treatment was performed on the samples. An oven apparatus was used for the heat treatment.

Samples R1, R5, R9, S1, S5, and S9 were subjected to heat treatment at 350° C. in a nitrogen gas atmosphere for one hour.

Samples R2, R6, R10, S2, S6, and S10 were subjected to heat treatment at 350° C. in a nitrogen gas atmosphere for one hour and then subjected to heat treatment at 350° C. in a mixed gas atmosphere of a nitrogen gas and an oxygen gas (nitrogen gas flow rate:oxygen gas flow rate=4:1) for one hour.

Samples R3, R7, R11, S3, S7, and S11 were subjected to heat treatment at 450° C. in a nitrogen gas atmosphere for one hour.

Samples R4, R8, R12, S4, S8, and S12 were subjected to heat treatment at 450° C. in a nitrogen gas atmosphere for one hour and then subjected to heat treatment at 450° C. in a mixed gas atmosphere of a nitrogen gas and an oxygen gas (nitrogen gas flow rate:oxygen gas flow rate=4:1) for one hour.

<Hall Effect Measurement>

Next, Hall effect measurement was performed on Samples R1 to R12 and S1 to S12.

Note that the Hall effect measurement is a method in which electrical characteristics such as carrier density, mobility, and resistivity are measured with use of the Hall effect that is a phenomenon where, when a magnetic field is applied to the object through which a current flows in a direction perpendicular to the direction of the current, an electromotive force is produced in directions perpendicular to both the current and the magnetic field. In this example, the Hall effect measurement using the Van der Pauw method was performed at room temperature. For the Hall effect measurement, ResiTest manufactured by TOYO Corporation was used.

Figure 56A:
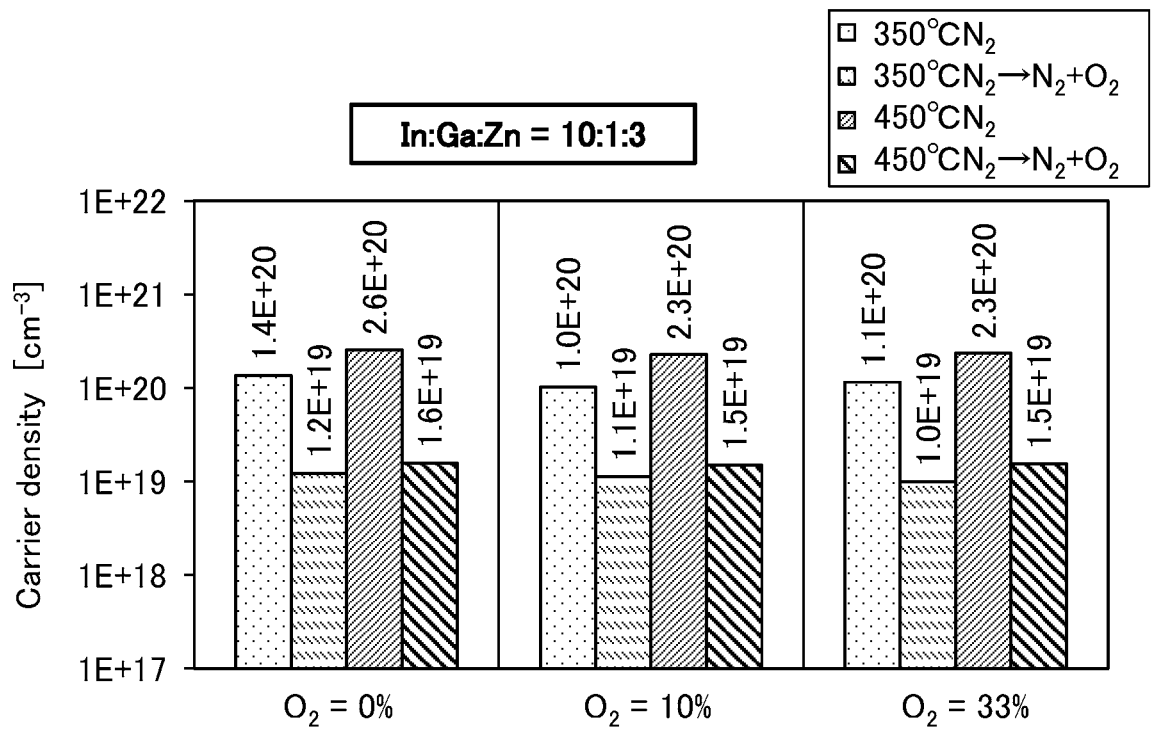
FIG. 56A is a graph showing carrier concentrations of a metal oxide.
Figure 56B:
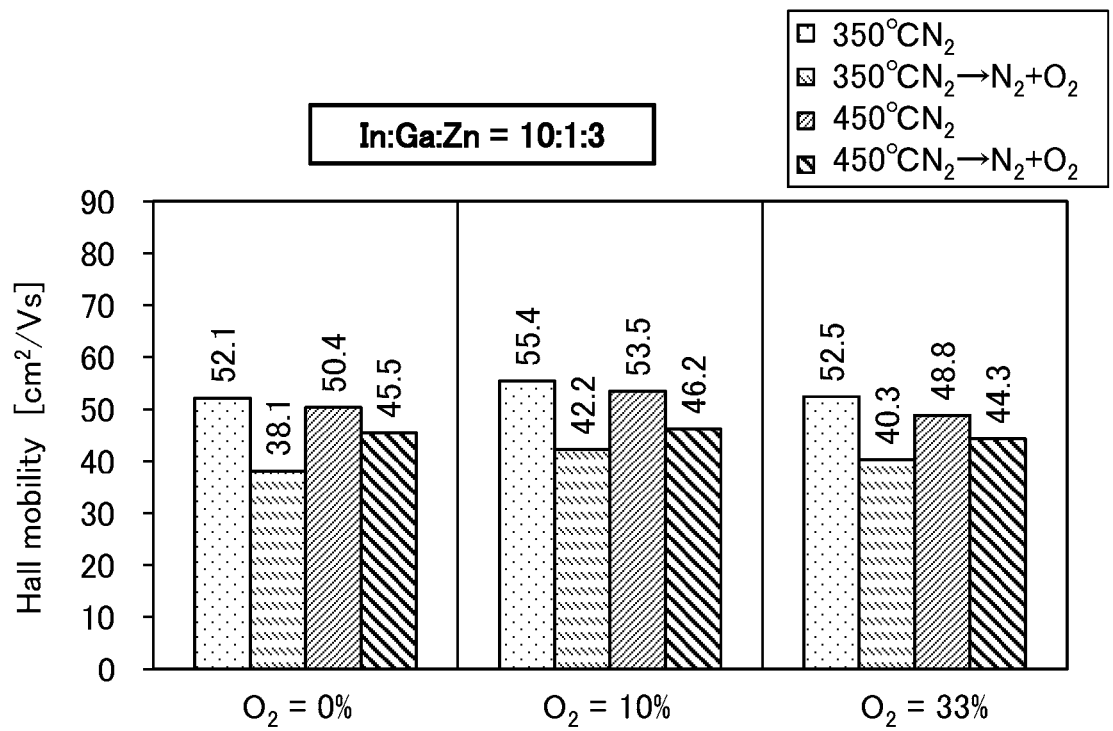
FIG. 56B is a graph showing Hall mobility of the metal oxide.
Figure 57A:
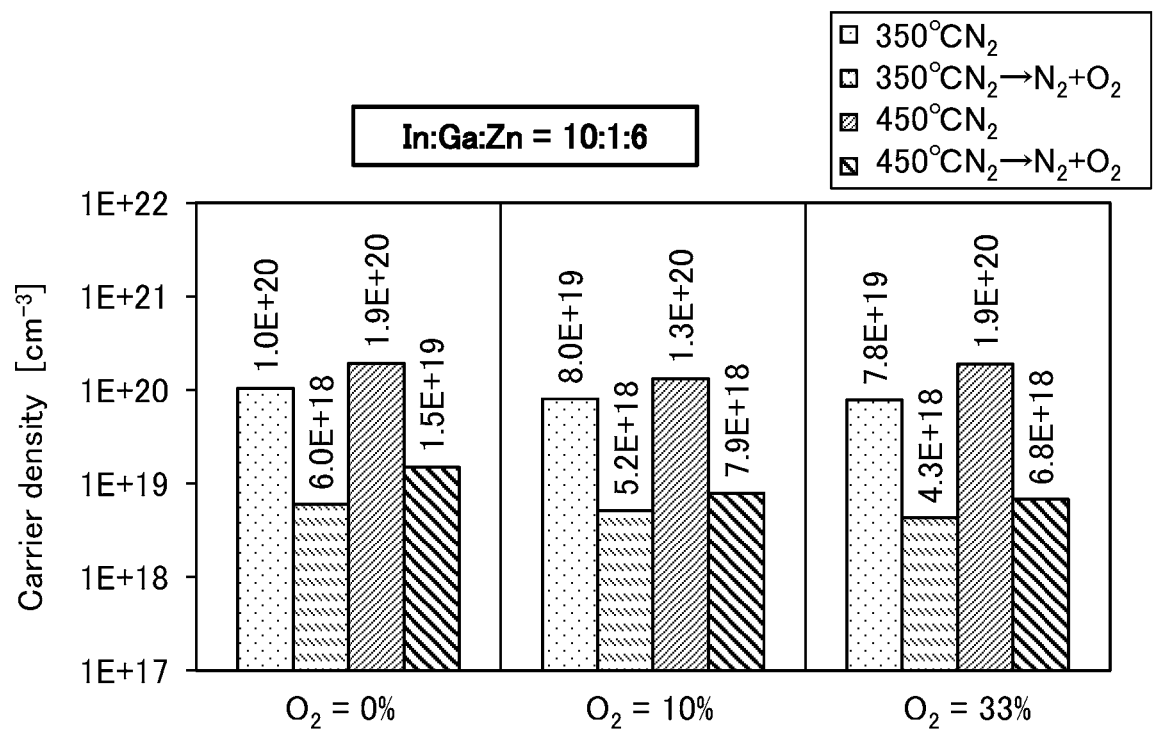
FIG. 57A is a graph showing carrier concentrations of a metal oxide.
Figure 57B:
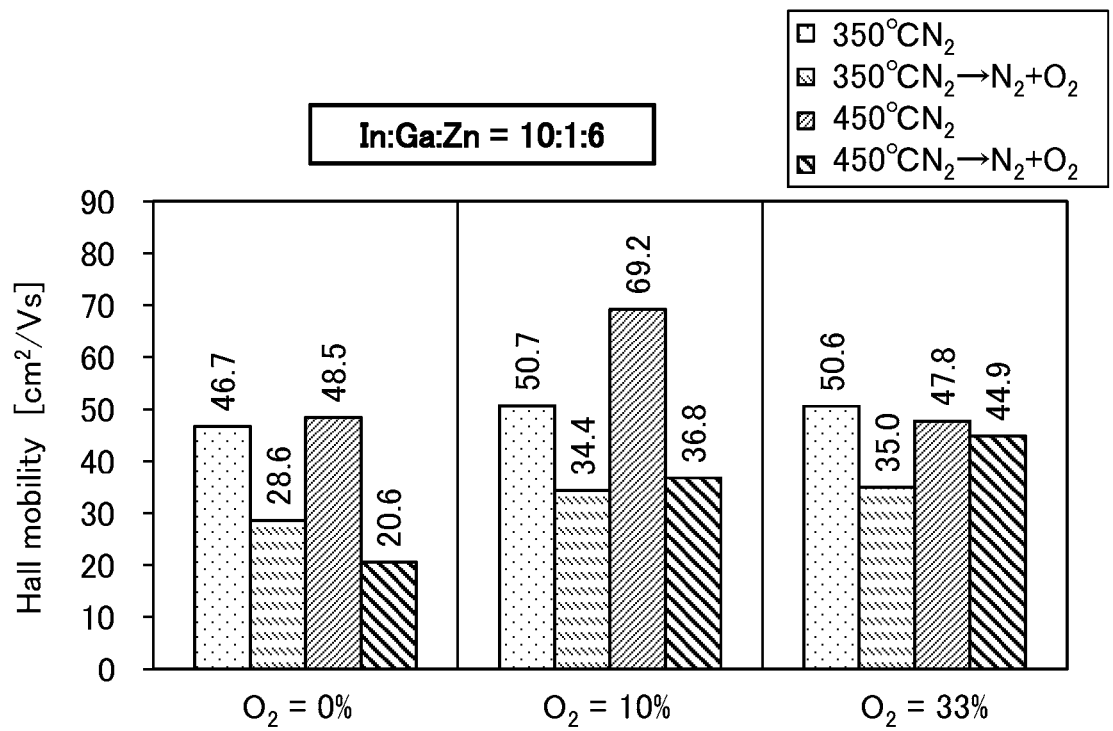
FIG. 57B is a graph showing Hall mobility of the metal oxide.

FIG. 56A shows the carrier concentrations of Samples R1 to R12. FIG. 56B shows the Hall mobility of Samples R1 to R12. FIG. 57A shows the carrier concentrations of Samples S1 to S12. FIG. 57B shows the Hall mobility of Samples S1 to S12. In each of FIG. 56A and FIG. 57A, the horizontal axis represents the oxygen flow rate ratio in the deposition of the metal oxide film, and the vertical axis represents the carrier concentration (Carrier density). In each of FIG. 56B and FIG. 57B, the horizontal axis represents the oxygen flow rate ratio in the deposition of the metal oxide film, and the vertical axis represents the Hall mobility.

As shown in FIG. 56B and FIG. 57B, it was found that the Hall mobility of the samples in this example is higher than or equal to 20 cm$^2$/Vs.

The structures shown in this example can be used in combination with any of the other embodiments and examples.

REFERENCE NUMERALS

L1: line, L2: line, L3: line, L4: line, L5: line, L6: line, L7: line, L8: line, L9: line, L10: line, L11: line, L12: line, 10: transistor, 10A: transistor, 10B: transistor, 10C: transistor, 11: range, 13: range, 15: range, 17: range, 100: transistor, 100_a: transistor, 100_b: transistor, 100A: transistor, 100A_a: transistor, 100A_b: transistor, 100B: transistor, 100B_a: transistor, 100C: transistor, 100C_a: transistor, 100C_b: transistor, 102: substrate, 103: insulating layer, 103a: insulating film, 103b: insulating film, 103c: insulating film, 103d: insulating film, 106: conductive layer, 108: semiconductor layer, 108a: semiconductor layer, 108b: semiconductor layer, 108f: metal oxide film, 108n: low-resistance region, 110: insulating layer, 110a: insulating film, 110b: insulating film, 110c: insulating film, 112: conductive layer, 112f: conductive film, 114: metal oxide layer, 114f: metal oxide film, 116: insulating layer, 118: insulating layer, 120a: conductive layer, 120b: conductive layer, 140: impurity element, 141a: opening, 141b: opening, 142: opening

The invention claimed is:

1. A semiconductor device comprising:
a first insulating layer;
a semiconductor layer over the first insulating layer;
a second insulating layer over the semiconductor layer; and
a conductive layer overlapping with a first region of the semiconductor layer with the second insulating layer provided therebetween,
wherein the semiconductor layer comprises indium and oxygen,
wherein the semiconductor layer comprises a composition falling within a range obtained by connecting first coordinates (1:0:0), second coordinates (2:1:0), third coordinates (14:7:1), fourth coordinates (7:2:2), fifth coordinates (14:4:21), sixth coordinates (2:0:3), and the first coordinates in this order with a straight line in a ternary diagram showing atomic ratios of indium to an element M and zinc,
wherein the element M is at least one of gallium, aluminum, yttrium, and tin,
wherein the semiconductor layer comprises a second region that does not overlap with the conductive layer,
wherein the second region of the semiconductor layer includes at least one of phosphorus, boron, magnesium, aluminum, and silicon, and
wherein the second insulating layer comprises a region being in contact with the first region and the second region of the semiconductor layer.

2. The semiconductor device according to claim 1, further comprising a third insulating layer,
wherein the third insulating layer is in contact with a top surface and a side surface of the conductive layer and a top surface of the second insulating layer, and
wherein the third insulating layer comprises oxygen.

3. The semiconductor device according to claim 1, wherein each of the first insulating layer and the second insulating layer comprises oxygen.

4. The semiconductor device according to claim 1, further comprising a third insulating layer,
wherein the third insulating layer is in contact with a top surface and a side surface of the conductive layer and a top surface of the second insulating layer,
wherein the second insulating layer comprises oxygen, and
wherein the third insulating layer comprises nitrogen.

5. The semiconductor device according to claim 4,
wherein the second insulating layer comprises silicon oxide, and
wherein the third insulating layer comprises silicon nitride.

6. A semiconductor device comprising:
a first insulating layer;
a semiconductor layer over the first insulating layer;
a second insulating layer over the semiconductor layer; and
a conductive layer overlapping with a first region of the semiconductor layer with the second insulating layer provided therebetween,
wherein the semiconductor layer comprises indium and oxygen,
wherein the semiconductor layer comprises a composition falling within a range obtained by connecting first coordinates (7:1:0), second coordinates (2:1:0), third coordinates (14:7:1), fourth coordinates (7:2:2), fifth coordinates (14:4:21), sixth coordinates (2:0:3), seventh coordinates (7:0:1), and the first coordinates in this order with a straight line in a ternary diagram showing atomic ratios of indium to an element M and zinc,
wherein the element M is at least one of gallium, aluminum, yttrium, and tin,
wherein the semiconductor layer comprises a second region that does not overlap with the conductive layer,
wherein the second region of the semiconductor layer includes at least one of phosphorus, boron, magnesium, aluminum, and silicon, and
wherein the second insulating layer comprises a region being in contact with the first region and the second region of the semiconductor layer.

7. The semiconductor device according to claim 6, further comprising a third insulating layer,
wherein the third insulating layer is in contact with a top surface and a side surface of the conductive layer and a top surface of the second insulating layer, and
wherein the third insulating layer comprises oxygen.

8. The semiconductor device according to claim 6, further comprising a third insulating layer,
wherein the third insulating layer is in contact with a top surface and a side surface of the conductive layer and a top surface of the second insulating layer,
wherein the second insulating layer comprises oxygen, and
wherein the third insulating layer comprises nitrogen.

9. The semiconductor device according to claim 6, wherein each of the first insulating layer and the second insulating layer comprises oxygen.

10. The semiconductor device according to claim 8,
wherein the second insulating layer comprises silicon oxide, and
wherein the third insulating layer comprises silicon nitride.

11. A semiconductor device comprising:
a first insulating layer;
a semiconductor layer over the first insulating layer;
a second insulating layer over the semiconductor layer; and
a conductive layer overlapping with a first region of the semiconductor layer with the second insulating layer provided therebetween,
wherein the semiconductor layer comprises indium, zinc, and oxygen,
wherein the semiconductor layer comprises a composition falling within a range obtained by connecting first coordinates (44:11:10), second coordinates (4:1:6), third coordinates (2:0:3), fourth coordinates (11:0:2), and the first coordinates in this order with a straight line in a ternary diagram showing atomic ratios of indium to an element M and zinc,
wherein the element M is at least one of gallium, aluminum, yttrium, and tin,
wherein the semiconductor layer comprises a second region that does not overlap with the conductive layer,
wherein the second region of the semiconductor layer includes at least one of phosphorus, boron, magnesium, aluminum, and silicon, and
wherein the second insulating layer comprises a region being in contact with the first region and the second region of the semiconductor layer.

12. The semiconductor device according to claim 11, further comprising a third insulating layer,
wherein the third insulating layer is in contact with a top surface and a side surface of the conductive layer and a top surface of the second insulating layer, and
wherein the third insulating layer comprises oxygen.

13. The semiconductor device according to claim 11, further comprising a third insulating layer,
wherein the third insulating layer is in contact with a top surface and a side surface of the conductive layer and a top surface of the second insulating layer,
wherein the second insulating layer comprises oxygen, and
wherein the third insulating layer comprises nitrogen.

14. The semiconductor device according to claim 11, wherein each of the first insulating layer and the second insulating layer comprises oxygen.

15. The semiconductor device according to claim 13,
wherein the second insulating layer comprises silicon oxide, and
wherein the third insulating layer comprises silicon nitride.

16. A semiconductor device comprising:
a first insulating layer;
a semiconductor layer over the first insulating layer;
a second insulating layer over the semiconductor layer; and
a conductive layer overlapping with a first region of the semiconductor layer with the second insulating layer provided therebetween,
wherein the semiconductor layer comprises indium, zinc, and oxygen,
wherein the semiconductor layer comprises a composition falling within a range obtained by connecting first coordinates (44:11:10), second coordinates (4:1:4), third coordinates (1:0:1), fourth coordinates (11:0:2), and the first coordinates in this order with a straight line in a ternary diagram showing atomic ratios of indium to an element M and zinc,
wherein the element M is at least one of gallium, aluminum, yttrium, and tin,
wherein the semiconductor layer comprises a second region that does not overlap with the conductive layer,
wherein the second region of the semiconductor layer includes at least one of phosphorus, boron, magnesium, aluminum, and silicon, and
wherein the second insulating layer comprises a region being in contact with the first region and the second region of the semiconductor layer.

17. The semiconductor device according to claim 16, further comprising a third insulating layer,
wherein the third insulating layer is in contact with a top surface and a side surface of the conductive layer and a top surface of the second insulating layer, and
wherein the third insulating layer comprises oxygen.

18. The semiconductor device according to claim 16, further comprising a third insulating layer,
wherein the third insulating layer is in contact with a top surface and a side surface of the conductive layer and a top surface of the second insulating layer,
wherein the second insulating layer comprises oxygen, and
wherein the third insulating layer comprises nitrogen.

19. The semiconductor device according to claim 16, wherein each of the first insulating layer and the second insulating layer comprises oxygen.

20. The semiconductor device according to claim 18,
wherein the second insulating layer comprises silicon oxide, and
wherein the third insulating layer comprises silicon nitride.

* * * * *